US011521962B1

(12) United States Patent
Rogers et al.

(10) Patent No.: US 11,521,962 B1
(45) Date of Patent: Dec. 6, 2022

(54) ESD PROTECTION CIRCUIT

(71) Applicant: Cypress Semiconductor Corporation, San Jose, CA (US)

(72) Inventors: David Michael Rogers, Sunnyvale, CA (US); Eric N. Mann, Sammamish, WA (US); Eric Lee Swindlehurst, Marysville, WA (US); Toru Miyamae, Nagoya (JP); Timothy John Williams, Kirkland, WA (US); Ryuta Nagai, Nagoya (JP); Sungkwon Lee, Saratoga, CA (US); Ravindra M. Kapre, San Jose, CA (US); Mimi Xuefeng Zhao Qian, Campbell, CA (US); Yan Yi, Mountain View, CA (US); Dung Si Ho, Sunnyvale, CA (US); Boo Chin-Hua, Penang (MY)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/475,303

(22) Filed: Sep. 14, 2021

(51) Int. Cl.
*H01L 27/02* (2006.01)

(52) U.S. Cl.
CPC ...... *H01L 27/0285* (2013.01); *H01L 27/0288* (2013.01)

(58) Field of Classification Search
CPC .................. H01L 27/0285; H01L 27/0288
USPC .......................................... 361/56
See application file for complete search history.

(56) References Cited

U.S. PATENT DOCUMENTS

| 7,719,806 | B1* | 5/2010 | Boyd | H01L 27/027 |
| | | | | 361/56 |
| 2003/0197242 | A1* | 10/2003 | Chen | H01L 27/0251 |
| | | | | 257/E21.642 |
| 2006/0250735 | A1* | 11/2006 | Kwon | H01L 27/0266 |
| | | | | 361/56 |
| 2010/0329035 | A1* | 12/2010 | Nakagaki | G11C 16/06 |
| | | | | 365/185.25 |
| 2011/0310514 | A1* | 12/2011 | Huang | H01L 27/027 |
| | | | | 257/355 |
| 2013/0342940 | A1* | 12/2013 | Taghizadeh Kaschani | |
| | | | | H02H 9/046 |
| | | | | 361/56 |

(Continued)

FOREIGN PATENT DOCUMENTS

| CN | 103078614 B | * | 8/2017 |
| JP | 08032421 A | * | 2/1996 |

(Continued)

*Primary Examiner* — Kevin J Comber

(57) ABSTRACT

An electrostatic discharge protection circuit capable of clamping both positive and negative ESD events and passing signals is provided. Generally, the circuit includes a p-channel field-effect transistor (PFET) clamp coupled to a pin to be protected, the PFET clamp including a plurality of PFETs in a DN-well, an n-channel field-effect transistors (NFET) clamp coupled between ground and the pin through the PFET clamp, the NFET clamp including a plurality of NFETs coupled in series, and a bias network for biasing a voltage of the DN well to substantially equal a voltage on the pin when the voltage on the pin is greater than ground potential, and to ground potential when the pin voltage is less than ground potential. The plurality of are PFETs coupled in parallel between the pin and the NFET clamp, each of the PFETs is coupled to the pin though one of a plurality ballast resistors.

20 Claims, 45 Drawing Sheets

(56) References Cited

U.S. PATENT DOCUMENTS

2022/0209527 A1* 6/2022 de Raad ................ H02H 9/041

FOREIGN PATENT DOCUMENTS

| JP | 2001352047 A | * | 12/2001 | ......... H01L 27/0207 |
| WO | WO-0111749 A1 | * | 2/2001 | ......... H01L 27/0255 |

* cited by examiner

ESD PROTECTION CIRCUIT

TECHNICAL FIELD

The present disclosure relates to electrostatic discharge (ESD) protection circuits, and more particularly to an ESD protection circuit with signal passage capability that is capable of clamping both positive and negative voltages, and interfacing with a Local Interconnect Network (LIN) bus.

BACKGROUND

It is well known in the design and manufacture of electrical circuits to provide protection against electro-static discharge (ESD) events. However, ESD protection for circuits combining positive and negative voltage capability can be difficult. In particular, ESD protection for systems combining positive and negative voltage capability that requires non-isolated electronic circuits to communicate with each other, such as circuits coupled to a Local Interconnect Network (LIN) system or LIN bus system increasingly used in automotive electronics, poses significant challenges.

Generally, the ESD protection circuit must stay open circuit (high impedance) while the product is functioning in normal operation to enable electronic circuits, systems and sub-systems to communicate with each other. In normal operation automotive electronics can subject a pin (Pos-Neg pin) coupled the LIN bus system to voltages in the range of −28V to +42V. Thus, during normal operation, when the Pos-Neg pin is at voltages between −28V and +42V, the protection circuitry must safely and accurately conduct signal voltages from the Pos-Neg pin to the chip's internal circuitry. Additionally, when the Pos-Neg pin is subjected to ESD events, i.e., voltages that are more negative or more positive than these voltages in the normal operation range, the ESD protection circuit must switch to a low impedance mode quickly (in a few nanoseconds) to protect other portions of the product's circuitry. Another constraint is that the ESD protection circuit should function correctly during ESD events and during normal operation without input or control from other portions of the protected system or circuitry.

Conventional ESD protection circuits are generally configured to protect against either positive or negative ESC events, not both, and incapable of operating over a broad range of voltages, such as experienced by automotive circuits coupled through a LIN bus system in normal operation, while conducting signal voltages without interference.

Accordingly, there is a need for an ESD protection system or circuit and capable of protecting against both positive and negative ESD events, and capable of passing voltage signals without interference over a broad range of normal operating voltages. It is further desirable that the circuit is capable of responding quickly to ESD events, and do so without input or control from other portions of the protected system or circuitry.

SUMMARY

An electrostatic discharge (ESD) protection circuit capable of clamping both positive and negative ESD events and passing signals is provided. Generally, the circuit includes a p-channel field-effect transistor (PFET) clamp coupled to a pin to be protected, the PFET clamp including a number of PFETs in a DN-well, an n-channel field-effect transistors (NFET) clamp coupled between ground and the pin through the PFET clamp, the NFET clamp including a number of NFETs coupled in series, and a bias network for biasing a voltage of the DN-well to substantially equal a voltage on the pin when the voltage on the pin is greater than ground potential, and to ground potential when the pin voltage is less than ground potential. The PFETs of the PFET clamp are coupled in parallel between the pin and the NFET clamp, each of the PFETs is coupled to the pin though a separate ballast resistor. In some embodiments, the biasing network includes a Voltage Higher-Driver ($V_{Higher-Driver}$) node located between the PFET and the NFET clamps through which the DN-well is biased, and which is also coupled to an internal signal node in an integrated-circuit (IC) including the ESD protection circuit to pass signals to and from the Pos-Neg pin into the IC.

In another aspect a method is provided for protecting against both positive and negative ESD events on a protected pin (Pos-Neg pin), while also passing signals to and from the Pos-Neg pin to an internal signal node in an IC including the ESD protection circuit. Generally, the method includes coupling a plurality of PFETs of a PFET clamp in parallel between a pin to be protected and a $V_{Higher-Driver}$ node in the circuit, coupling an NFET clamp including a pair of NFETs coupled in between ground and the $V_{Higher-Driver}$ node, and biasing through the $V_{Higher-Driver}$ node a first DN-well in which the plurality of PFETs are formed to a higher of a voltage ($V_{pin}$) applied to a pin or to ground potential. As described above, each of the plurality of PFETs is coupled to the pin through one of a plurality of ballast resistors. When $V_{pin}$ is a positive voltage, less than a positive trigger voltage, the circuit couples an external signal from the pin through the plurality of PFETs to an internal signal node. The internal signal node in the circuit is coupled to the $V_{Higher-Driver}$ node.

When $V_{pin}$ exceeds the positive trigger voltage the method includes pulling-up the voltage of the $V_{Higher-Driver}$ node to $V_{pin}$, clamping the voltage on the $V_{Higher-Driver}$ node to a clamping voltage of the NFET clamp, forward biasing source junctions of the plurality of PFETs to the first DN-well coupled to the $V_{Higher-Driver}$ node, and forward biasing parasitic PNP transistors formed by the source junctions of the plurality of PFETs, the first DN-well and a substrate in which the circuit is formed. The resulting MOSFET current through the plurality of PFETs and a parasitic current through the parasitic PNP transistors brings $V_{pin}$ down to the clamped voltage on the $V_{Higher-Driver}$ node.

When $V_{pin}$ exceeds a negative trigger voltage large enough to break down a drain junction of one or more of the plurality of PFETs the method includes pulling-down the voltage of the $V_{Higher-Driver}$ node to less than ground potential, forward biasing a drain terminal of a first NFET connected to the $V_{Higher-Driver}$ node, forward biasing a parasitic NPN transistor in the first NFET formed by an n+ drain junction of the first NFET, a P-well in which the n+ drain junction is formed, and a second DN-well in which the P-well is formed, and conducting current from $V_{Higher-Driver}$ node through the parasitic NPN transistor and through a junction between the second DN-well and a substrate in which the circuit is formed to the substrate and to a second NFET connected between first NFET and ground. Thus, the drain terminal of the first NFET is shorted to ground and a voltage of the $V_{Higher-Driver}$ node is substantially held to ground potential.

The ESD protection circuit and method are particularly useful for protecting non-isolated electronic circuits in a system in which the electronic circuits are required to communicate with each other, such as circuits in automotive electronic systems coupled to a Local Interconnect Network (LIN) bus.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

DETAILED DESCRIPTION

Embodiments of a positive and negative voltage electrostatic discharge (ESD) protection and signal passing circuit are disclosed.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to one embodiment or an embodiment means that a particular feature, structure, or characteristic described in connection with the embodiment is included in at least one embodiment of the invention. The appearances of the phrase in one embodiment in various places in the specification do not necessarily all refer to the same embodiment. The term to couple as used herein may include both to directly electrically connect two or more components or elements and to indirectly connect through one or more intervening components.

Figure 1:
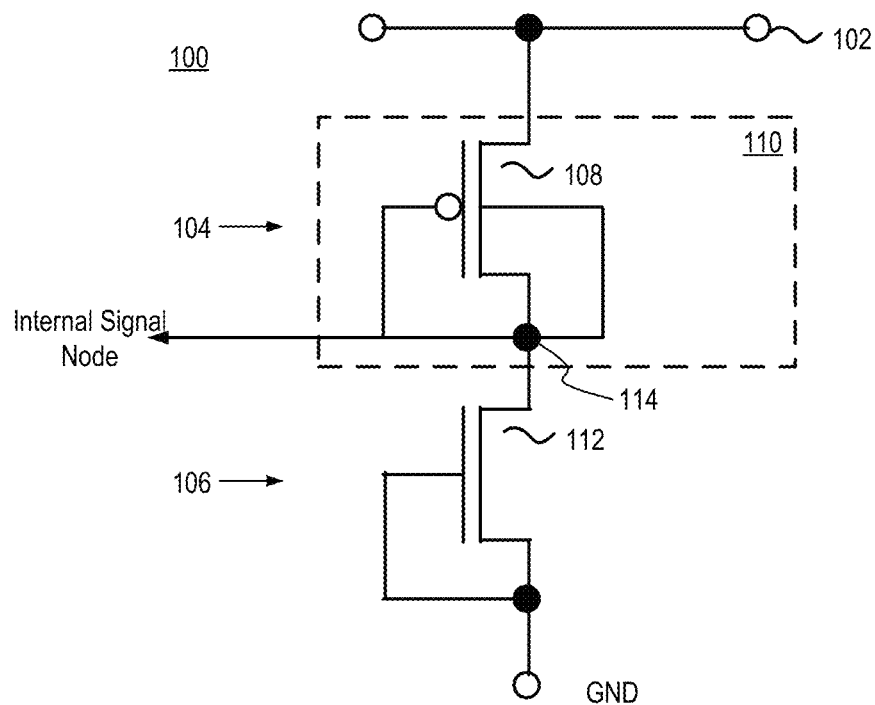
FIG. 1 is a schematic diagram illustrating an embodiment of a positive and negative voltage electrostatic discharge (ESD) protection circuit including a p-channel field effect transistor (PFET) clamp coupled in series with an n-channel FET (NFET) clamp between a pin to be protected and ground.

FIG. 1 is a schematic diagram illustrating a fundamental embodiment of a positive and negative voltage electrostatic discharge (ESD) clamping and signal passing circuit or ESD protection circuit 100. The ESD protection circuit 100 is designed to protect circuits and elements coupled to a pin to which both positive and negative voltages are applied in normal operation from both positive and negative voltage ESD events. In particular, the ESD protection circuit 100 provides ESD protection for a Pos-Neg pin 102 where voltages applied to the pin in normal operation are between a highest allowed positive voltage, for example 42V, and a lowest allowed voltage. The lowest allowed voltage can be any voltage less than the highest allowed positive voltage, including a voltage negative relative to a lowest voltage generated by a lowest most voltage power supply in a circuit or system (not shown) in which the ESD protection circuit 100 is included. In some embodiments, the circuit or system is fabricated as an integrated circuit (IC) on a chip (not shown), and the lowest most voltage power supply can be either a ground power supply or ground potential on the chip.

Referring to FIG. 1, the ESD protection circuit 100 includes a first or PFET clamp 104 coupled to the Pos-Neg pin 102, and a second or NFET clamp 106 coupled between ground (GND) and the Pos-Neg pin through the PFET clamp. In the embodiment shown the PFET clamp 104 includes a p-channel field-effect transistor (PFET 108) formed in a DN-well 110 and the NFET clamp includes n-channel field-effect transistors (NFET 112) in a p-type substrate. It will be understood however that this ESD protection circuit 100 could also be implemented as a first clamp with an NFET formed in a P-well in an n-type substrate, and a second clamp including a PFET formed directly in the n-type substrate.

The ESD protection circuit 100 further includes a voltage driver ($V_{Driver}$) node 114, joining the first or PFET clamp 104 and the NFET clamps 106. A gate of PFET 108, and the DN-well 110 of PFET 108, are coupled to this voltage driver ($V_{Driver}$) node 114. The voltage driver ($V_{Driver}$) node 114 is used to bias the DN-well 110 of the PFET. Additionally, the $V_{Driver}$ node 114 can also be coupled to an internal signal node (not shown) in the circuit or system in which the ESD protection circuit 100 is included to pass voltages to and from the Pos-Neg pin 102. Thus, the $V_{Driver}$ node 114 acts as a conduit or pathway for signal passage into and out of the circuit. The $V_{Driver}$ node 114 is biased to a potential or voltage substantially equal to the higher of either a voltage applied to the Pos-Neg pin 102 or ground.

During normal operation, when the Pos-Neg pin 102 is at a voltages between 0.0V and a highest allowed positive normal operation value (e.g. 42V), a gate of the PFET 108 is biased through $V_{Driver}$ node 114 to same potential as the Pos-Neg pin, a gate-source voltage ($V_{GS}$) of the PFET is approximately 0V and the PFET is ON. Thus, the ESD protection circuit 100 safely and accurately conducts positive signal voltages from the Pos-Neg Pin 102 through the $V_{Driver}$ node 114 to the chip's internal circuitry. Similarly, during normal operation, when the Pos-Neg pin 102 is at a voltage between 0.0V and the lowest allowed negative normal operation value (e.g. −28V), the gate of the PFET 108 is biased through the $V_{Driver}$ node 114 to ground, VGS is non-zero, PFET is OFF and the ESD protection circuit 100 is blocking negative signal voltages from passing between the Pos-Neg Pin and the chip's internal circuitry.

During both positive voltage ESD events and negative voltage ESD events in excess of the highest allowed positive normal operation value or the lowest allowed negative normal operation value, the ESD protection circuit 100 clamps both positive and negative ESD voltages to ground. In particular, during a positive ESD event PFET 108 is on, NFET 112 turns on clamping the Pos-Neg pin 102 through the $V_{Driver}$ node 114 to ground. During a negative ESD event the PFET 108 is initially OFF, however once the Pos-Neg pin 102 voltage coupled to the PFET exceeds a breakdown voltage of the DN-well 110 (e.g., about −45V), the PFET will enter breakdown conduction clamping the Pos-Neg pin 102 through the $V_{Driver}$ node 114 to ground.

In brief, during normal operation at times when the voltage on the Pos-Neg pin 102 is greater than ground, the ESD protection circuit 100 enables signal passage to occur. However, at any time when the Pos-Neg pin 102 voltage is less than 0V, i.e., at a negative voltage with respect to the chip's ground pin or potential, the ESD protection circuit 100 will block signal voltages from passing between the Pos-Neg pin and the chip's internal circuitry. Finally, at all times during ESD events, either positive or negative, the ESD protection circuit 100 will clamp the $V_{Driver}$ node 114 to ground blocking excessive ESD stress voltages from the chip's internal circuitry. By excessive ESD stress voltages it is meant any voltage whose magnitude is large enough to damage any of the chip's internal circuitry.

Figure 2:
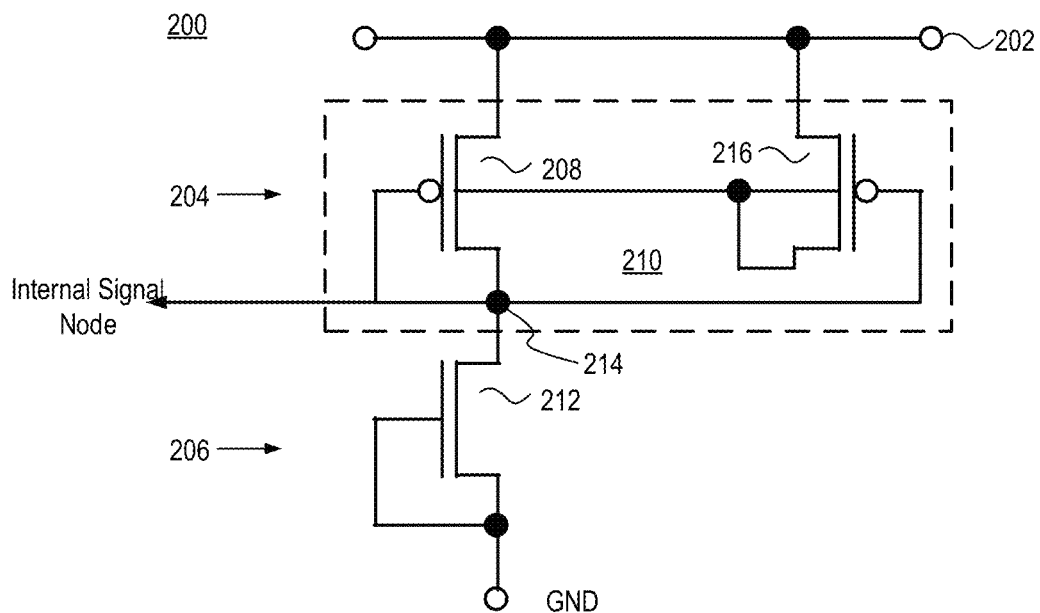
FIG. 2 is a schematic diagram illustrating an embodiment of the ESD protection circuit similar to FIG. 1 further including a DN-well biasing transistor to bias a DN-well in which a PFET of the PFET clamp is formed.

FIG. 2 is a schematic diagram illustrating another embodiment of the ESD protection and signal passing circuit (ESD protection circuit 200), similar to that of FIG. 1, further including a DN-well biasing transistor 216 to bias a DN-well 210 in which a PFET of the PFET clamp 204 is formed. In the embodiment shown the PFET clamp 204 includes a first PFET 208 coupled to a Pos-Neg pin 202, and a second PFEET (DN-well biasing transistor 216) in the DN-well 210 formed in a P-substrate. The NFET clamp 206 includes an NFET 212 formed in the P-substrate and coupled to ground (GND) and through the PFET clamp 204 to the Pos-Neg pin 202. However, it will be understood that this circuit could also be implemented as a first clamp including two NFETs in a P-well in an N-substrate with a second clamp including a PFET formed in the N-substrate.

Referring to FIG. 2, this embodiment extends the concept of using a $V_{Driver}$ node 214 to bias the DN-well 210 by the addition of the DN-well biasing transistor 216 in the shared DN-well, which aids the ESD protection circuit 200 in more quickly biasing the DN-well to correct levels. As with the embodiment of FIG. 1 the $V_{Driver}$ node 214 can also be coupled to an internal signal node to pass voltages to and from the Pos-Neg pin 202.

Figure 3:
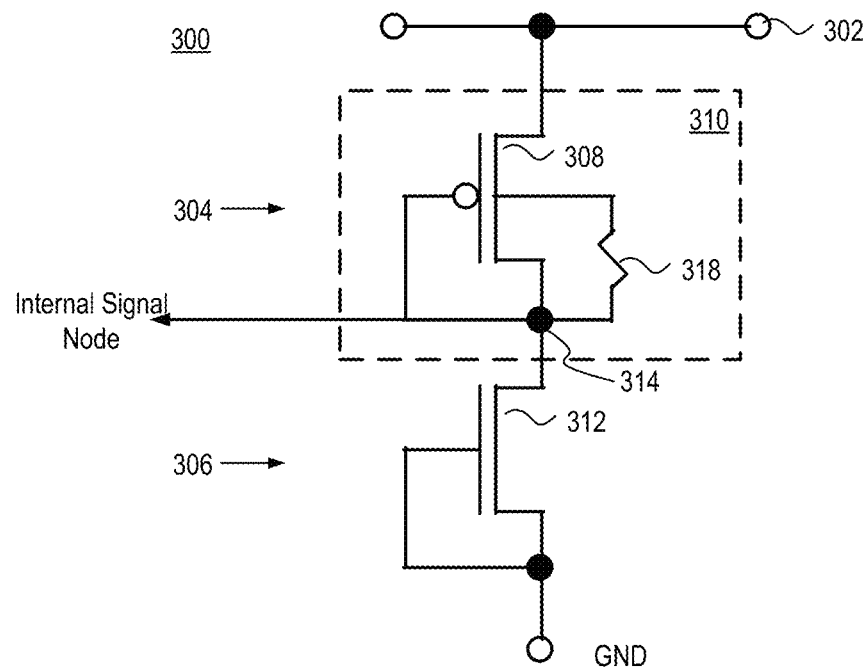
FIG. 3 is a schematic diagram illustrating an embodiment of the ESD protection circuit similar to FIG. 1 further including a DN-well biasing resistor.

FIG. 3 is a schematic diagram illustrating another embodiment of the ESD protection and signal passing circuit (ESD protection circuit 300), similar to that of FIG. 1, further including a DN-well biasing resistor 318 through which a $V_{Driver}$ node 314 is coupled to bias a DN-well 310 in which a PFET 308 of a PFET clamp 304 is formed. In the embodiment shown, the ESD protection circuit 300 includes the PFET clamp 304 with the PFET 308 coupled to a Pos-Neg pin 302 to be protected, and an NFET clamp 306 with an NFET 312 coupled between ground (GND) and the Pos-Neg pin through the PFET clamp. As with the embodiments of FIGS. 1 and 2, the $V_{Driver}$ node 414 can also be coupled to an internal signal node to pass voltages to and from the Pos-Neg pin 402. It will further be understood that this circuit could also be implemented as a first clamp including an NFET in a P-well in an N-substrate, with a second clamp including a PFET formed in the N-substrate.

Referring to FIG. 3, it is noted that this embodiment extends the concept of using the $V_{Driver}$ node 314 to bias the DN-well 310 by the addition of the DN-well biasing resistor 318 through which a $V_{Driver}$ node 314 is coupled to DN-well to adjust biasing of the DN-well. The DN-well biasing resistor 318 can be made of a doped polysilicon or from other appropriate material.

Figure 4:
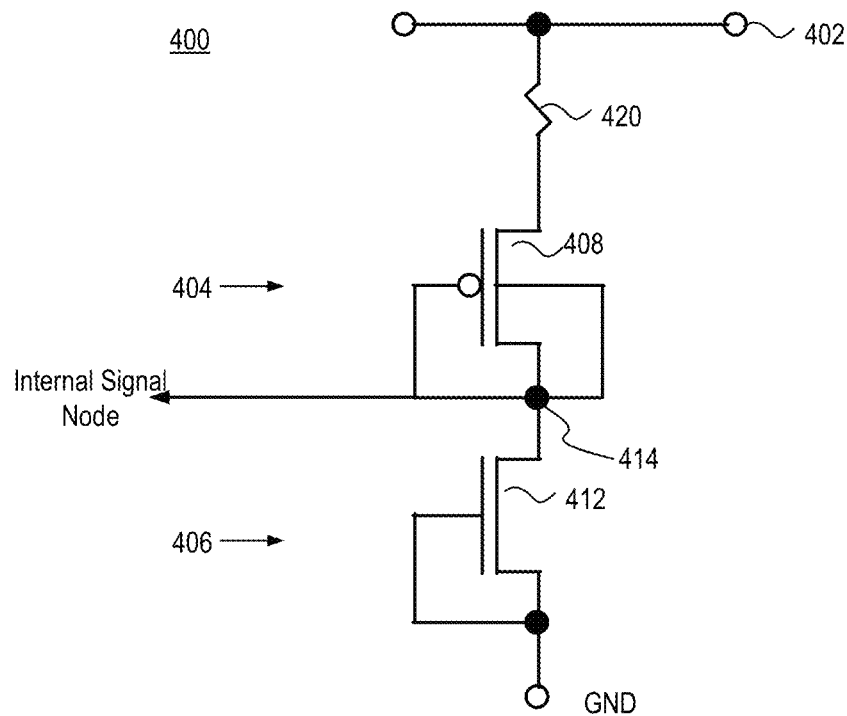
FIG. 4 is a schematic diagram illustrating an embodiment of the ESD protection circuit similar to FIG. 1 in which the PFET clamp further includes a ballasting resistor.

FIG. 4 is a schematic diagram illustrating another embodiment of the ESD protection and signal passing circuit (ESD protection circuit 400) similar to that of FIG. 1, and further including a ballasting resistor 420 through which a PFET clamp 404 is coupled to a Pos-Neg pin 402 to be protected. In the embodiment shown, the ESD protection circuit 400 includes the PFET clamp 404 with a PFET 408 coupled between a $V_{Driver}$ node 414 and the Pos-Neg pin 402 through the ballasting resistor 420, and an NFET clamp 406 with an NFET 412 coupled between ground (GND) and the Pos-Neg pin through the PFET clamp. As with the embodiments of FIGS. 1 through 3 it will understood that this circuit could also be implemented as a first clamp including an NFET in a P-Well in an N-substrate, with a second clamp including a PFET formed in the N-substrate.

Referring to FIG. 4 it is noted that the ballasting resistor 420 act as a ballast resistance to protect the PFET from excessive currents a PFET clamp 404. As with the DN-well biasing resistor 318 of FIG. 3, the ballasting resistor 420 can be made of a doped polysilicon or from other appropriate material, formed in or on a substrate in which other components of the ESD protection circuit 400 are fabricated.

Figure 5:
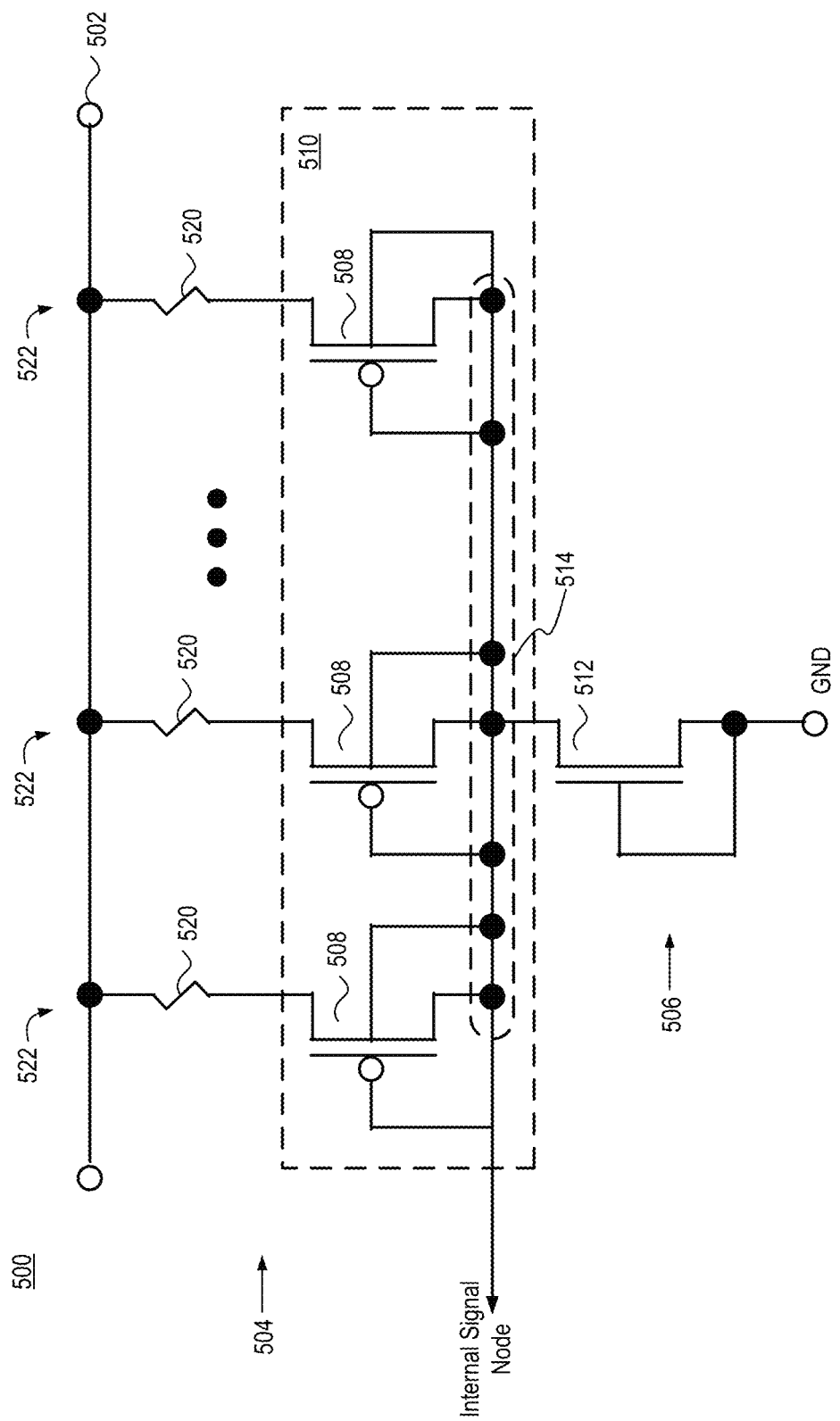
FIG. 5 is a schematic diagram illustrating an embodiment of the ESD protection circuit similar to FIG. 4 in which the PFET clamp includes a plurality of parallel circuit paths, each circuit path including a PFET and a ballasting resistor.

FIG. 5 is a schematic diagram illustrating another embodiment of the ESD protection and signal passing circuit (ESD protection circuit 500) similar that of FIG. 4, but in which a PFET clamp 504 includes a plurality of parallel circuits 522 or sets, each including at least one PFET 508 formed in a DN-well 510 and at least one ballasting resistor 520. In the embodiment shown, the ESD protection circuit 500 further includes in addition to the PFET clamp 504 with the plurality of parallel circuits 522 coupled between a $V_{Driver}$ node 514 and a Pos-Neg pin 502, an NFET clamp 506 with an NFET 512 coupled between ground (GND) and the Pos-Neg pin through the PFET clamp. It is noted that the DN-well 510 can include a shared DN-well, as shown, or one or more separate DN-wells, in which PFETs 508 of one or more of the plurality of parallel circuits 522 reside or are formed. As with the embodiments described above, the $V_{Driver}$ node 514 can also be coupled to an internal signal node to pass voltages to and from the Pos-Neg pin 502. It will further be understood that this circuit could also be implemented as a first clamp including an NFET in a P-well in an N-substrate, with a second clamp including a PFET formed in the N-substrate.

Referring to FIG. 5, it is noted that the plurality of parallel circuits 522 increases a current capacity, and therefore voltage clamping capability of the PFET clamp 504 without the need for specialized high voltage (HV) PFETs. It is often desirable to avoid or limited the use of such transistors, which can require additional processing steps to fabricate and generally require greater space or a larger footprint on a chip on which the circuit is formed.

Figure 6:
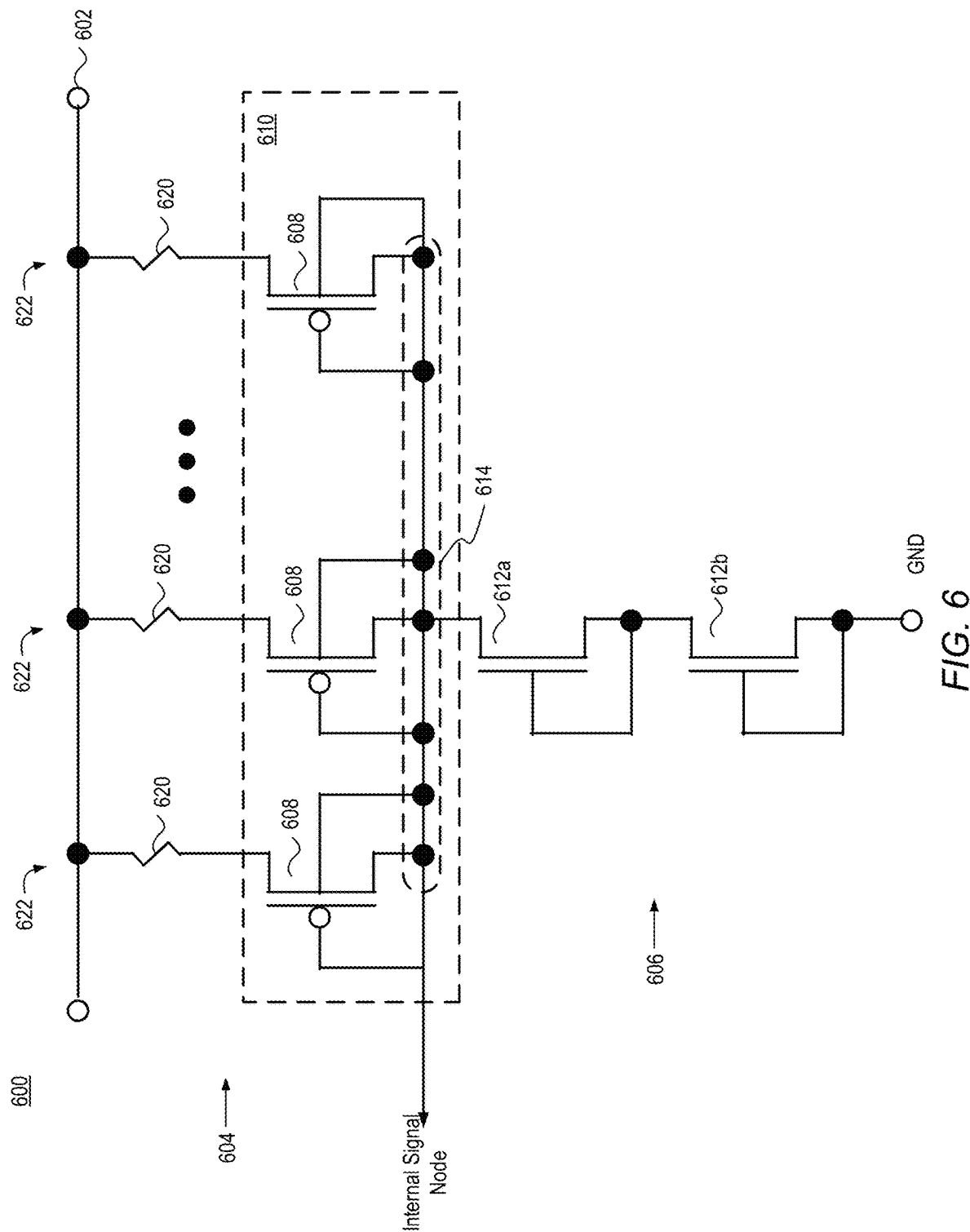
FIG. 6 is a schematic diagram illustrating an embodiment of the ESD protection circuit similar to FIG. 5 in which the NFET clamp includes a plurality of NFETs.

FIG. 6 is a schematic diagram illustrating an embodiment of the ESD protection and signal passing circuit (ESD protection circuit 600) similar that of FIG. 5, in which an NFET clamp 606 includes a plurality of NFETs coupled in series between a PFET clamp 604 and ground (GND). In the embodiment shown, NFET clamp 606 includes a first NFET 612a and a second NFET 612b coupled in series between the PFET clamp 604 and ground (GND). The PFET clamp 604 includes a plurality of parallel circuits 622 or sets coupled between a Pos-Neg pin 602 and a $V_{Driver}$ node 614, each of the plurality of parallel circuits 622 including at least one PFET 608 formed in a DN-well 610 and at least one ballasting resistor 620.

Referring to FIG. 6, this arrangement, in which two NFETs 612a, 612b, are connected in series, enables the NFET clamp 606 to provide a higher positive clamping voltage before the clamp changes to a low impedance mode, without the need for without the need for specialized high voltage (HV) NFETs. As noted previously, it is often desirable to avoid or limited the use of such transistors, which can require additional processing steps to fabricate and generally require greater space or a larger footprint on a chip on which the circuit is formed.

As with the embodiments described above, the $V_{Driver}$ node 614 is generally coupled to an internal signal node to pass voltages to and from the Pos-Neg pin 602. It will further be understood that this circuit could also be implemented as a first clamp including NFETs in a P-well in an N-substrate, and a second clamp including a plurality of series coupled PFETs formed in the N-substrate.

Figure 7:
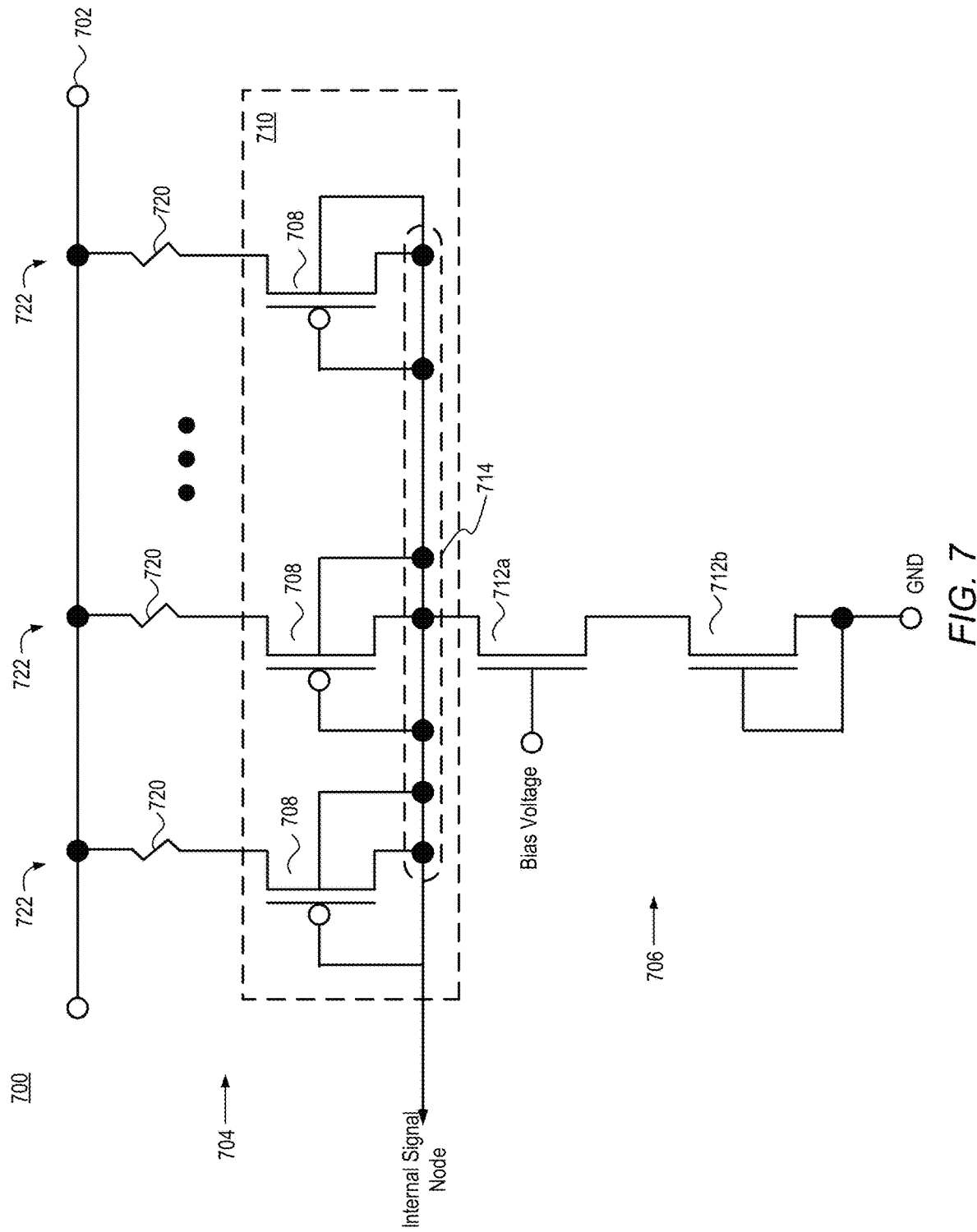
FIG. 7 is a schematic diagram illustrating an embodiment of the ESD protection circuit similar to FIG. 5 in which the NFET clamp includes a Cascoded NFET.

FIG. 7 is a schematic diagram illustrating an embodiment of the ESD protection and signal passing circuit (ESD protection circuit 700) similar that of FIG. 6, in which the series coupled NFETs (612a and 612b in FIG. 6) of an NFET clamp 706 are replaced with a Cascoded clamp arrangement. In the embodiment shown, NFET clamp 706 includes a first NFET 712a with neither a source nor drain connected to ground (GND) and having a gate coupled to a bias voltage, e.g., 5V, during normal operation, and a second NFET 712b connected between the first NFET and ground, and having a gate coupled to ground. This Cascoded arrangement gives the NFET clamp 706 the ability to go to an even higher positive voltage before changing to low impedance or clamping mode.

The ESD protection circuit 700 further includes a PFET clamp 704 having a plurality of parallel circuits 722 or sets coupled between a Pos-Neg pin 702 and a $V_{Driver}$ node 714, each of the plurality of parallel circuits 722 including at least one PFET 708 formed in a DN-well 710 and at least one ballasting resistor 720. As with the embodiments described above, the $V_{Driver}$ node 714 is generally coupled to an internal signal node to pass voltages to and from the Pos-Neg pin 702. It will further be understood that, with an appropriate selection of biasing voltage, this circuit could also be implemented as a first clamp including NFETs in a P-well in an N-substrate, and a second clamp including Cascoded PFETs formed in the N-substrate.

Figure 8:
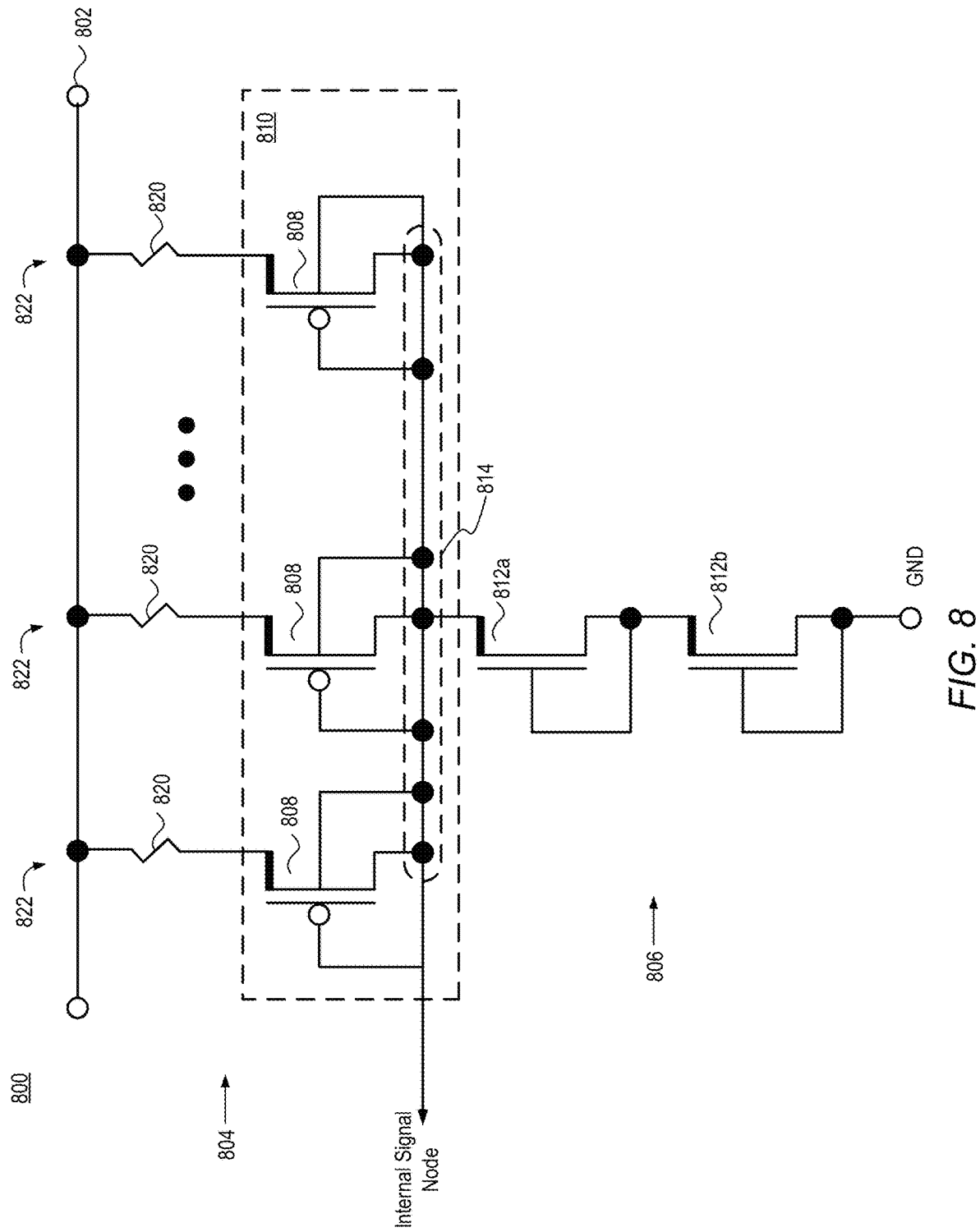
FIG. 8 is a schematic diagram illustrating an embodiment of the ESD protection circuit similar to FIG. 6 in which the NFETs include High Voltage Drain Extended NFETs (HV_DENFETs) and the PFETs include High Voltage Drain Extended PFETs (HV_DEPFETs)

FIG. 8 is a schematic diagram illustrating an embodiment of the ESD protection and signal passing circuit (ESD protection circuit 800) similar that of FIG. 6, in which the NFETs include High Voltage Drain Extended NFETs (HV_DENFETs) and the PFETs include High Voltage Drain Extended PFETs (HV_DEPFETs). The HV_DENFETs can withstand at least high drain to source voltages, and the HV_DEPFETs can withstand at least high voltages from source to drain. In FIG. 8 the high voltage ends are denoted schematically by the wider drawn legs on the transistor symbols. Embodiments of architectures for a suitable HV-DENFET and a HV_DEPFET are described below with reference to FIGS. 10A-10B and 11, respectively.

In one embodiment, a first HV_DENFET 812a is an isolated HV_DENFET having a source of that is isolated from a body of the HV_DENFET by a DN-well drain surrounding a channel and source P-well of the HV_DEN-FET. A second or lower transistor (HV_DENFET 812b in FIG. 8) is a non-isolated HV_DENFET, which is not isolated from the body but is formed directly in the P-substrate. Details of this embodiment are explained in greater detail below with reference to FIGS. 10A-10B.

Referring to FIG. 8, the ESD protection circuit 800 includes a PFET clamp 804 having a plurality of parallel circuits 822 or sets coupled between a Pos-Neg pin 802 and a $V_{Driver}$ node 814, and an NFET clamp 806 including the first HV_DENFET 812a and a second HV_DENFET 812b coupled in series between the PFET clamp 804 and ground (GND). Similarly to FIG. 6, each of the plurality of parallel circuits 822 of the PFET clamp 804 include at least one HV_DEPFET 808 formed in a DN-well 810 and at least one ballasting resistor 820. Connecting the two HV_DENFETs 812a, 812b, in series enables the NFET clamp 806 to provide an even higher positive clamping voltage before the clamp changes to a low impedance mode, than would be possible with a single HV_DENFET.

As with the embodiments described above, the $V_{Driver}$ node 814 is generally coupled to an internal signal node to pass voltages to and from the Pos-Neg pin 802. It will further be understood that this circuit could also be implemented as a first clamp including HV_DENFETs in a P-well in an N-substrate, and a second clamp including a plurality of series coupled HV_DEPFETs formed in the N-substrate.

Figure 9:
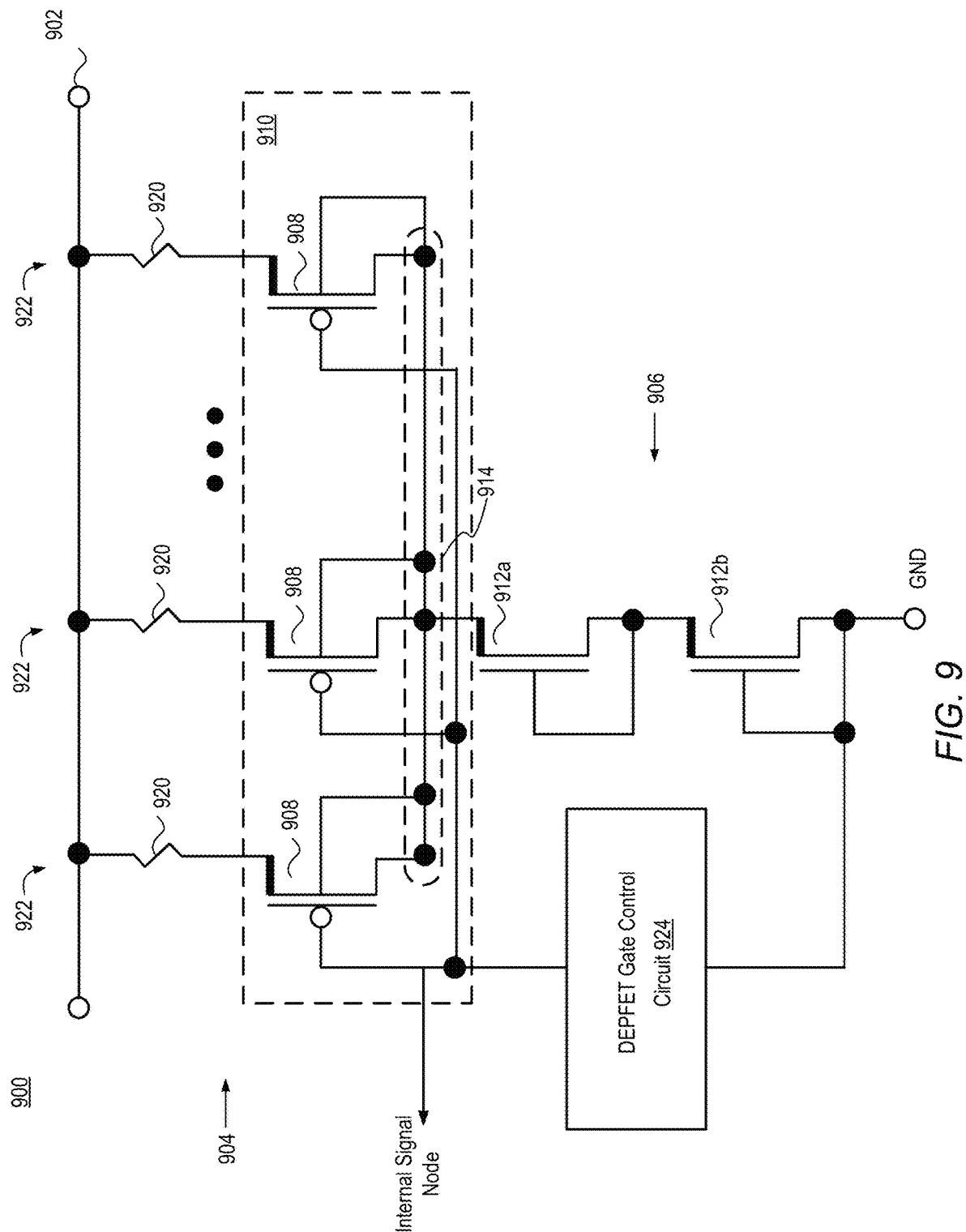
FIG. 9 is a schematic diagram illustrating an embodiment of the ESD protection circuit similar to FIG. 8 including an isolated HV_DENFET and a non-isolated HV_DENFET in the NFET clamp, and further including gate control circuitry for HV_DEPFETs of the PFET clamp.

FIG. 9 is a schematic diagram illustrating an embodiment of the ESD protection and signal passing circuit (ESD protection circuit 900) similar that of FIG. 8, further including a gate biasing or gate control circuit 924 for biasing HV_DEPFETs 908 of a PFET clamp 904. Referring to FIG. 9, in addition to the gate control circuit 924 the ESD protection circuit 900 includes a PFET clamp 904 having a plurality of parallel circuits 922 or sets coupled between a Pos-Neg pin 902 and a $V_{Driver}$ node 914, and an NFET clamp 906 including a first, isolated HV_DENFET 912a and a second, non-isolated HV_DENFET 912b coupled in series between the PFET clamp 904 and ground (GND). As in the embodiment of FIG. 8, each of the plurality of parallel circuits 922 of the PFET clamp 904 include at least one HV_DEPFET 908 formed in a DN-well 910 and at least one ballasting resistor 920. The gate control circuit 924 generally includes circuitry that is used to accelerate turning ON or OFF the HV_DEPFETs 908 in response to an ESD event. For example, in one embodiment the gate control circuit 924 generally includes acceleration circuitry to quickly pull up gate voltages of the HV_DEPFETs 908 that connect the Pos-Neg pin 902 to the DN-well 910 of the HV_DEPFETs. This quick gate pull up and shut OFF of the HV_DEPFETs 908 is particular desirable when the Pos-Neg pin 902 transitions rapidly from a positive voltage to a large negative voltage.

As with the embodiments described above, the $V_{Driver}$ node 914 is generally coupled to an internal signal node to pass voltages to and from the Pos-Neg pin 902. It will further be understood that this circuit could also be implemented as a first clamp including HV_DENFETs in a P-well in an N-substrate, and a second clamp including a plurality of series coupled HV_DEPFETs formed in the N-substrate.

Figure 10A:
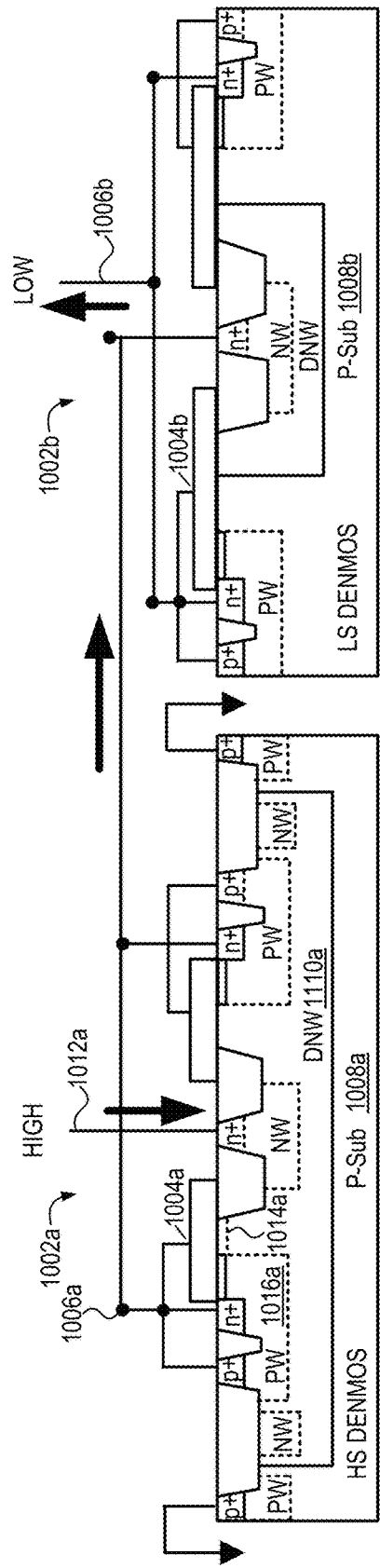
FIG. 10A is a block diagram in sectional side view of an isolated HV_DENFET and a non-isolated HV_DENFET fabricated in a shared substrate, and coupled in series and suitable for use in high voltage clamping.

FIG. 10A is a block diagram in sectional side view of a pair of HV_DENFETs, including an isolated HV_DENFET 1002a and a non-isolated HV_DENFET 1002b, coupled in series and suitable for use in an ESD protection circuit, such as shown in FIGS. 8 and 9. Referring to FIG. 10A the gates 1004a, 1004b of the HV DENFETs 1002a, 1002b, are generally kept within about 5V of a voltage applied to the sources 1006a, 1006b, of the HV_DENFETs. The source 1006a of the upper HV DENFET 1002a is isolated from a body (P-substrate 1008a) of the upper transistor by a deep N-well (DNW) 1110a surrounding the transistor's drain 1012a, channel 1014a and source P-well 1016a.

The source 1006b of the lower transistor, HV_DENFET 1002b, is not isolated from the body (P-substrate 1008b). In one embodiment, the HV_DENFETs 1002a, 1002b have a triggering voltage, $V_{Trigger}$, of about 48V, however it will be understood that the triggering voltage, as well as a holding voltage, $V_{holding}$, can be increased to as high as 70V by increasing dimensions and/or dielectric constants of elements in the HV_DENFETs. Generally, a holding current is decreased when $V_{Trigger}$ is increased. Thus, when used for higher trigger voltages, larger size HV_DENFETs (larger transistor widths) are required in order to pass the same amount of current as is passed with lower trigger voltages.

Figure 10B:
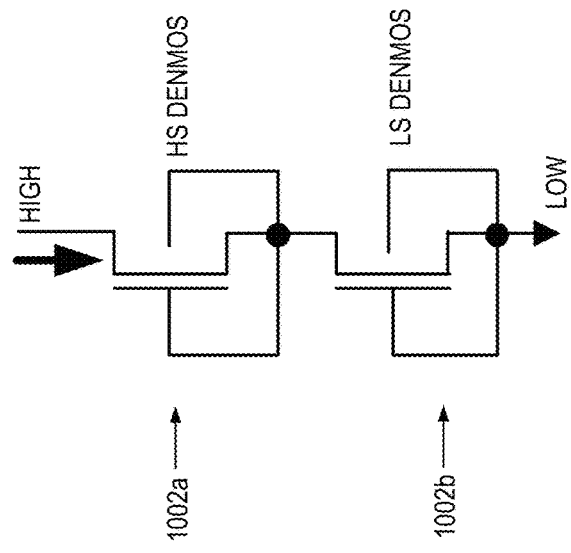
FIG. 10B is a schematic diagram illustrating the isolated and non-isolated HV_DENFETs of FIG. 10A.

FIG. 10B is a schematic diagram illustrating the isolated HV_DENFET 1002a and non-isolated HV_DENFET 1002b of FIG. 10A.

Figure 11:
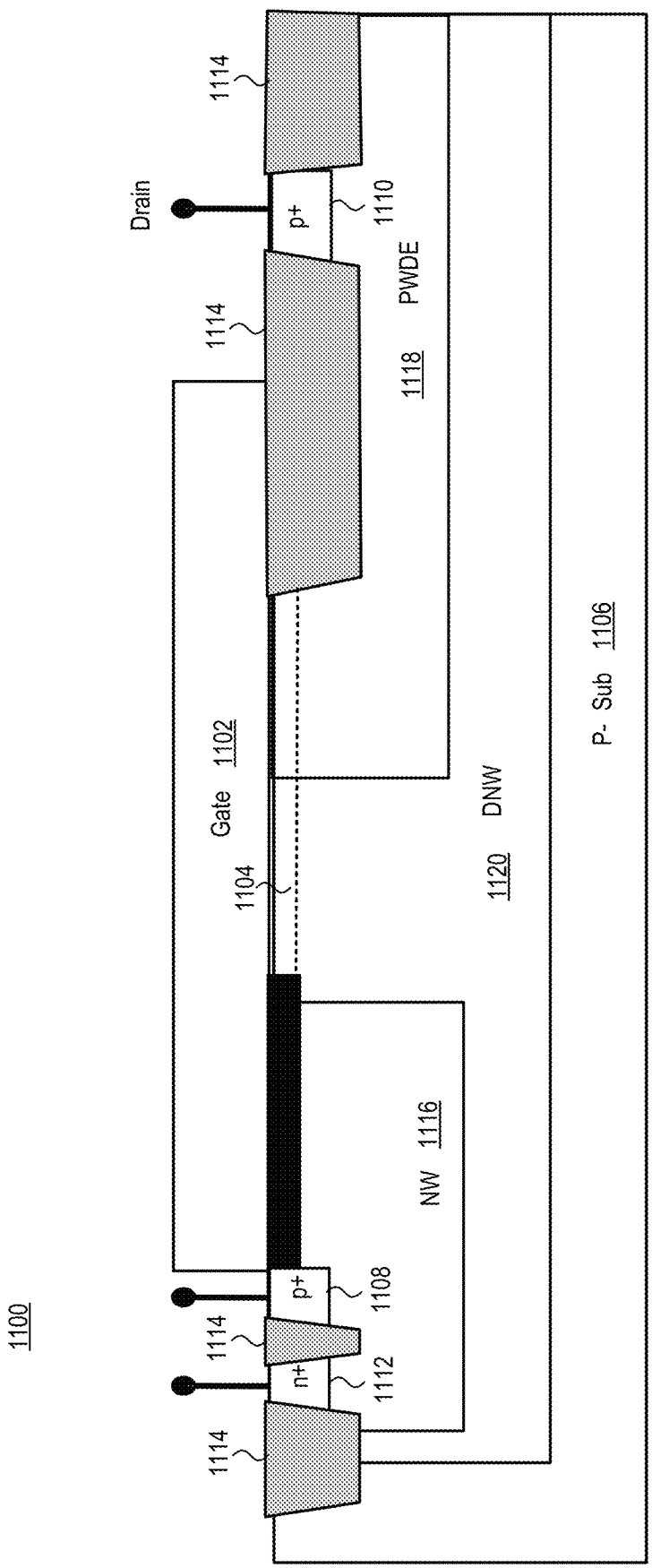
FIG. 11 is a block diagram in sectional side view of an HV_DEPFET suitable for use in high voltage clamping.

FIG. 11 is a block diagram in sectional side view of a HV_DEPFET 1100 suitable for use in an ESD protection and signal passing circuit, such as shown in FIGS. 8 and 9. Referring to FIG. 11 the HV_DEPFET 1100 generally includes a gate 1102 overlying a channel region 1104 in a p-type substrate 1106, a p+ source 1108, a p+ drain 1110, and an n+ deep N-well or body contact 1112, all separated by a number of isolation structures 1114. The p+ source 1108 and deep N-well contact 1112 are formed in an N-well 1116 on one side of the channel region 1104. The p+ drain 1110 is formed in a drain extension P-well (PWDE) 1118 on the other side of the channel region 1104 and is separated from the channel region by an extended isolation structure that partially underlies the gate 1102 and has a lateral length of about 3 times that of the channel. Substantially the entire HV_DEPFET 1100 is formed in a deep N-well (DNW) 1120 underlying both the N-well 1116 and the PWDE 1118. For example, in the embodiment shown the channel region 1104 has a total length of about 1p m, divided equally between DNW and the PWDE.

The gate 1102 of the HV_DEPFET 1100 is generally kept within about 5V of a voltage applied to the p+ source 1108, but because the p+ drain 1110 is isolated from the p-type substrate 1106 by the DNW 1120 can withstand high source to drain voltages of 42V or more, and a voltage from the DNW to the substrate can safely be as much as 60V.

Figure 12:
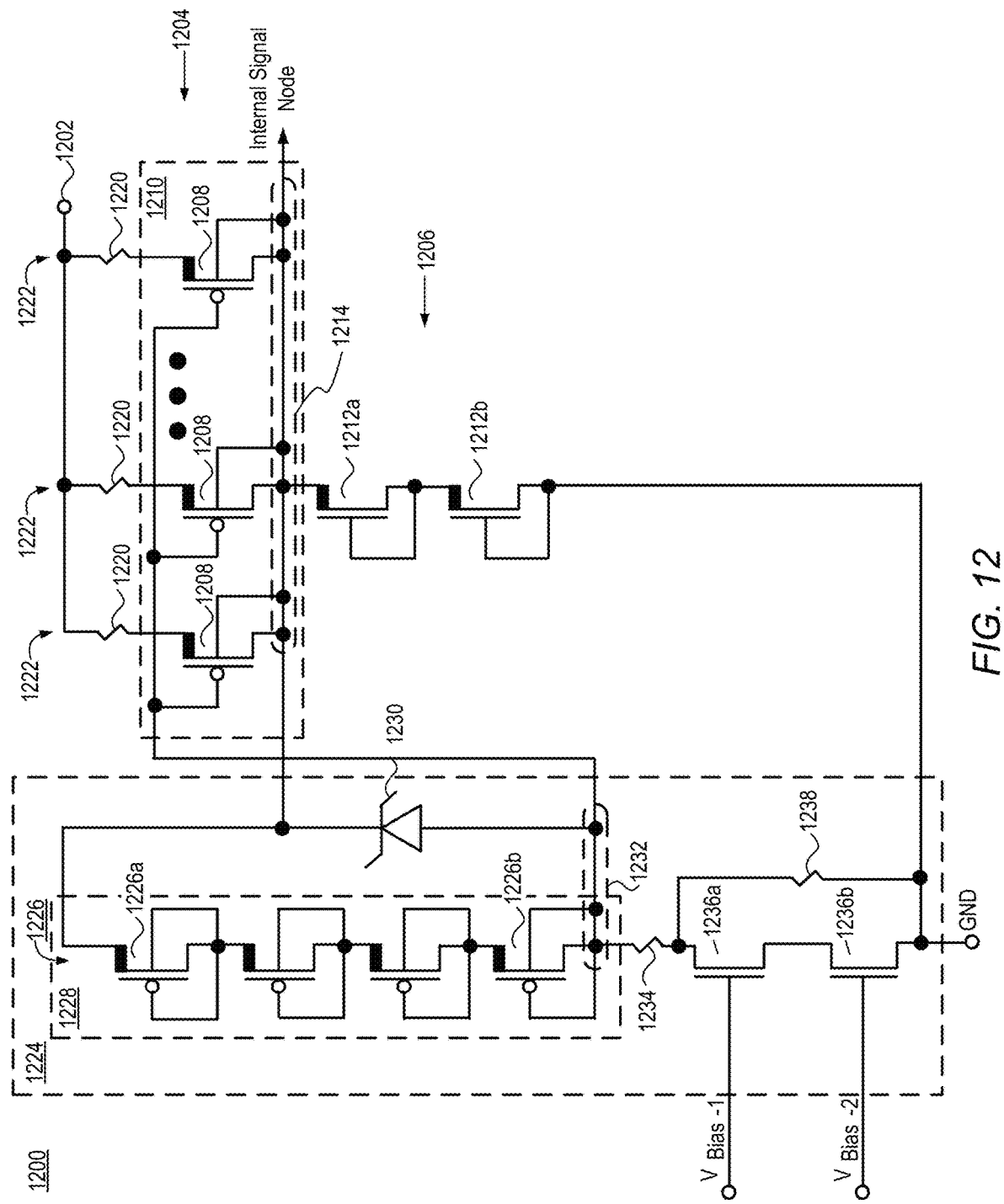
FIG. 12 is a schematic diagram illustrating an embodiment of the ESD protection circuit similar to FIG. 9 and further including a gate biasing circuit for the HV_DEPFETs.

FIG. 12 is a schematic diagram illustrating an embodiment of the ESD protection and signal passing circuit (ESD protection circuit 1200) similar that of FIG. 9, further including a gate biasing or gate control circuit 1224 for biasing HV_DEPFETs 1208 of a PFET clamp 1204. The gate control circuit 1224 includes a series string of HV_DEPFETs 1226 formed in a DN-well 1228 and coupled in parallel with a Zener diode 1230. A top HV_DEPFET 1226a of the series string of HV_DEPFETs 1226 and one terminal of the Zener diode connects to a $V_{Driver}$ node 1214 in the ESD protection circuit 1200, and a node (Vgate node 1232) of a lower HV_DEPFET 1226b couples to gates of the HV_DEPFETs 1208 of the PFET clamp 1204. The Zener diode 1230 and series string of HV_DEPFETs 1226 substantially prevent voltages greater than about 5V being developed between the $V_{Driver}$ node 1214 and the Vgate node 1232, since larger voltages could damage gate dielectrics of the HV_DEPFETs 1208 of the PFET clamp 1204.

The gate control circuit 1224 further includes a biasing resistor 1234 coupled between the Vgate node 1232 and ground (GND) through a pair of series connected NFETs 1236a, 1236b, gated by biasing voltages $V_{Bias-1}$ and $V_{Bias-2}$, respectively, and coupled in parallel a with a second resistor 1238 connected between the biasing resistor and ground. As with embodiments described above, the biasing resistor 1234 and the second resistor 1238 can be made of a doped polysilicon formed in or on a substrate in which other components of the ESD protection circuit 1200 are fabricated. The biasing resistor 1234 can have a resistance, for example, of about 20 KΩ, and the second resistor 1238 can have a resistance, for example, of about 1,000Ω (non-limiting exemplary value). However, the resistance value of the second resistor 1238 can range from 15Ω to 5M Ω (non-limiting exemplary values).

Generally, as in the embodiment shown, the ESD protection circuit 1200 further includes the PFET clamp 1204 having a plurality of parallel circuits 1222 or sets coupled between a Pos-Neg pin 1202 and a $V_{Driver}$ node 1214, and an NFET clamp 1206 including a first, isolated HV_DENFET 1212a and a second, non-isolated HV_DENFET 1212b coupled in series between the PFET clamp 1204 and ground (GND). As in the embodiment of FIG. 9, each of the plurality of parallel circuits 1222 of the PFET clamp 1204 include at least one HV_DEPFET 1208 formed in a DN-well 1210 and at least one ballasting resistor 1220. The DN-well 1210 can include a DN-well shared with the DN-well 1228 in which the plurality of series connected HV_DEPFETS 1226 of the gate control circuit 1224 are formed, or one or more separate DN-wells, as in the embodiment shown.

Referring to FIG. 12, in ESD protection operation when the Pos-Neg pin 1202 has risen from ground to a voltage greater than ground, the $V_{Driver}$ node 1214 has a voltage less than that of the Pos-Neg pin, a voltage of the Vgate node 1232 will be less than that of the Pos-Neg pin and the HV_DEPFETs 1208 of the PFET clamp 1204 connected to the Pos-Neg pin 1202 will turn ON. This will raise the $V_{Driver}$ node 1214 voltage to that of the Pos-Neg pin 1202. The $V_{Driver}$ node 1214 voltage will be applied to the HV_DENFETs 1212a, 1212b, of the NFET clamp 1206. If the voltage of the Pos-Neg pin 1202 exceeds a trigger voltage of the NFET clamp 1206, i.e., an ESD event, then the $V_{Driver}$ node 1214 node will be clamped, by the HV_DENFETs 1212a, 1212b, of the NFET clamp, and the terminals of the HV_DEPFETs 1208 that are connected to the Pos-Neg pin will forward bias to the DN-wells 1210 in which they are formed causing current flow. Additionally, the HV_DEPFETs 1208 will be turned ON and also causing current in a MOSFET mode, pulling down the voltage on the Pos-Neg pin 1202.

When voltages on the Pos-Neg pin 1202 go negative, or below ground, the Vgate node 1232 will be pulled toward ground potential, turning OFF the HV_DEPFETs 1208 connected to the Pos-Neg pin. If the Pos-Neg pin 1202 voltage is below ground by more than the drain to DN-well 1210 breakdown voltage of the HV_DEPFETs 1208, for example −45V, the HV_DEPFETs will breakdown and clamp the voltage of the Pos-Neg pin at about −45V.

As with the embodiments described above, the $V_{Driver}$ node 1214 is generally coupled to an internal signal node to pass voltages to and from the Pos-Neg pin 1202. During normal operation, when the Pos-Neg pin 1202 is not driven by a signal that is external to the chip, any positive voltage that is applied to the $V_{Driver}$ node 1214 by the chip's internal circuitry is transferred to the Pos-Neg pin. This is because the HV_DEPFET 1208 with ballast resistors 1220 will be turned ON when the $V_{Driver}$ node 1214 is positive, passing the $V_{Driver}$ node 1214 voltage to the Pos-Neg pin 1202.

It will further be understood that the circuit the ESD protection circuit 1200 could also be implemented with a PFET clamp including HV_DENFETs in a P-well in an N-substrate, an NFET clamp including a plurality of series coupled HV_DEPFETs formed in the N-substrate, by replacing the HV_PFETs 1226 of the gate control circuit 1224 with HV NFETs and the NFETs with PFETs.

Figure 13A:
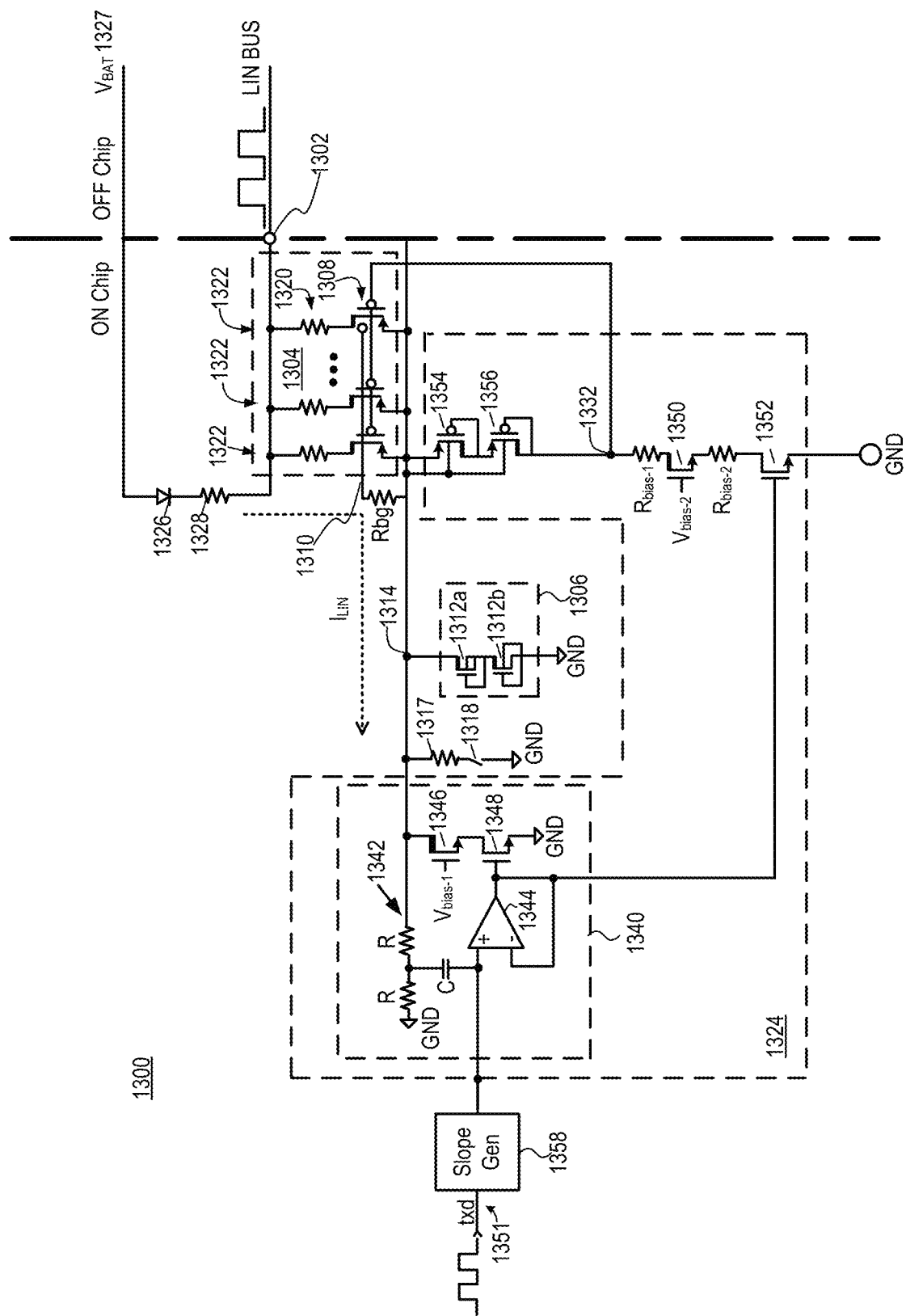
FIG. 13A is a schematic diagram illustrating another embodiment of the ESD protection circuit similar to FIG. 9 and further including a driver circuit and gate biasing circuit for the HV_DEPFETs.

FIG. 13A is a schematic diagram illustrating another embodiment of the ESD protection and signal passing circuit (ESD protection circuit 1300) similar to that of FIG. 9, further including a gate biasing or gate control circuit 1324 for biasing HV_DEPFETs 1308 of a PFET clamp 1304.

Referring to FIG. 13A, the gate biasing or control circuit 1324 generally includes a driver circuit 1340 for driving or biasing a DN-well 1310 for HV_DEPFETs 1308 of a PFET clamp 1304 though a $V_{Driver}$ node 1314 and DN-well biasing resistor (Rbg). The control circuit 1324 further includes a number of HV_DENFETs and NFETs coupled in series with a number of biasing resistors ($R_{bias\text{-}1}$, $R_{bias\text{-}2}$) between a Vgate node 1332 and ground for biasing the HV_DEPFETs 1308 of the PFET clamp. The driver circuit 1340 includes a resistor-capacitor (RC) filter 1342 coupled between a first, non-inverting input of a differential amplifier 1344, ground (GND), and an HV_DENFET 1346 connected in series with an NFET 1348. The HV_DENFET 1346 and NFET 1348 are coupled between the $V_{Driver}$ node 1314 and ground. The HV_DENFET 1346 is gated by a first biasing voltage ($V_{Bias\text{-}1}$) and NFET 1348 is gated by an output of the differential amplifier 1344.

The number of NFETs and HV_DENFETs of the gate biasing or control circuit 1324 includes a first HV_DENFET 1350 coupled to the Vgate node 1332 through a first biasing resistor ($R_{bias\text{-}1}$) and gated by a second biasing voltage ($V_{Bias\text{-}2}$). A second HV_DENFET 1352 coupled in series with the first HV_DENFET 1350 through a second biasing resistor ($R_{bias\text{-}2}$) and to ground is gated by the output of the inverting differential amplifier 1344. Generally, as in the embodiment shown, the gate biasing or control circuit 1324 further includes a pair of series diode-connected HV_DEPFETs 1354, 1356, connected to the sources of the HV_DEPFETs 1308 and the $V_{Driver}$ node 1314, and to the Vgate node 1332 to limit the voltage developed between the $V_{Driver}$ node 1314 and the Vgate node 1332 to prevent damage to the gate dielectrics of the HV_DEPFETs 1308 of the PFET clamp 1304.

Generally, the ESD protection circuit 1300 further includes, in addition to the gate biasing or control circuit 1324 and the PFET clamp 1304, an NFET clamp 1306 including a first, isolated HV_DENFET 1312a and a second, non-isolated HV_DENFET 1312b coupled in series between the PFET clamp 1304 and ground (GND). As in the embodiments described above, the PFET clamp 1304 includes a plurality of parallel circuits 1322 or sets coupled between the Pos-Neg pin 1302 and the $V_{Driver}$ node 1314, each of the plurality of parallel circuits 1322 of the PFET clamp 1304 having a plurality of HV_DEPFET 1308 formed in a DN-well 1310 and at least one ballasting resistor 1320. The DN-well 1310 in which the HV_DEPFETs 1308 are formed can include a shared DN-well, wherein the DN-well is shared among the HV_DEPFETS 1308. The other HV_DEPFETS of the gate control circuit 1324 may share one or more other separate DN-wells, as in the embodiment shown.

Additionally, the ESD protection circuit 1300 can further include a DN-well biasing resistor (Rbg), through which a $V_{Driver}$ node 1314 is coupled to the DN-well 1310 in which the HV_DEPFETs 1308 of the PFET clamp 1304 is formed. The resistance of the biasing resistor (Rbg) is selected to reduce current from a parasitic bipolar junction transistor formed between the P+ drain nodes of at least one of the HV_DEPFETs 1308, the DN-well 1310, and the underlying P-substrate. The value of the resistor can be, by way of a non-limiting example, about 100Ω. Common non-limiting exemplary values may also range from 0Ω to 1,000Ω.

The chip on which the ESD protection circuit 1300 resides can further include a signal receiving or transmitting circuit, such as a slope generator 1358, coupled to an internal signal node, and to or from which a voltage signal can be passed through the ESD protection circuit 1300 to the Pos-Neg pin 1302.

On the left side of FIG. 13A, resistor 1317, and switch 1318 can be used to ground the voltage on the $V_{Driver}$ node 1314. This grounding step is used during testing of the circuit 1300 and of the part in which the circuit resides is done after manufacture and prior to the shipping of the part.

On the right side of the FIG. 13A, diode 1326 and series resistor 1328 are used to pull up the voltage on the $V_{Driver}$ node 1314 when it is desired that the ESD protection circuit 1300 outputs a logic "one" on the LIN BUS pin (Pos-Neg pin 1302), under certain conditions as described below.

Referring to FIG. 13A, in operation when a voltage applied to the Pos-Neg pin 1302 (LIN bus pin) is greater than ground potential, the HV_DEPFETs 1308 in the plurality of parallel circuits 1322 are turned ON and are maintained in the ON state by the two HV_DENFETs 1350, 1352, gated by the VBias-2 node and by the output node of the differential amplifier 1344. In normal operation, a transmit or 'txd' node 1351 and slope generator 1358 provide a voltage to the differential amplifier 1344 that is greater than ground. The output voltage of the differential amplifier 1344 is also greater than ground. The HV_DENFETs 1350, 1352, gated by the VBias-2 node and by the output node of the differential amplifier 1344, and the two series diode-connected HV_DEPFETs 1354, 1356, combine to provide the gates of the HV_DEPFETs 1308 with a voltage that is less than the voltage of the Pos-Neg pin 1302 (LIN bus system). Note, that the designation of the sources of the HV_DEPFETs 1308 is not determined by bias polarity but instead is chosen by the internal structure of the HV_DEPFETs 1308, which are not symmetrical. The use of asymmetrical HV_DEPFETs 1308 is merely exemplary, and the HV_DEPFETs could instead be symmetrical devices. Thus, when the voltage on the Pos-Neg pin 1302 (LIN bus system) is greater than ground potential, the Pos-Neg pin (LIN bus system) is connected, through the HV_DEPFETs 1308 and the associated ballast resistors 1320, to the $V_{Driver}$ node 1314, and as a result the voltage of the $V_{Driver}$ node 1314 is raised and approaches the voltage of the Pos-Neg pin.

As shown in FIG. 13A and noted above, resistor Rbg is connected between the DN-well 1310 of the HV_DEPFETs 1308 and the $V_{Driver}$ node 1314. The resistor Rbg can have an exemplary and non-limiting value of about 100Ω. The resistor Rbg reduces parasitic bipolar junction transistor currents when the voltage of the $V_{Driver}$ node is less than a voltage on the Pos-Neg pin 1302 (LIN bus system). In such forward biasing instances, the forward biasing of a junction formed between the p-type drains of the HV_DEPFETs 1308 (coupled to the Pos-Neg pin 1302), and the DN-well 1310 ($V_{Driver}$ node 1314), turns ON two parasitic PNP transistors formed there between.

The output of the ESD protection circuit 1300 to a LIN BUS system is an open drain output or open collector output. When a LIN BUS circuit or signal path through the driver circuit 1340, and PFET clamp 1304 is putting a signal on the LIN BUS pin (Pos-Neg pin 1302), the LIN BUS circuit is configured to only pull down on the LIN BUS pin. The circuit is unable to pull up on the LIN BUS pin. Thus, when the ESD protection circuit 1300 outputs a logic "zero" on the LIN BUS pin (Pos-Neg pin 1302), the LIN BUS circuit path through the driver circuit 1340 and PFET clamp 1304 pulls down on the LIN BUS pin. When the LIN BUS circuit outputs a logic "one" on the LIN BUS pin (Pos-Neg pin 1302), the LIN BUS circuit stops pulling down on the LIN BUS pin by turning off NFET 1348 of the driver circuit 1340, thereby also turning off HV_DENFET 1346. In this way, nothing is pulling down the voltage of the $V_{Driver}$ node 1314 1314, and under this condition the diode 1326 and series resistor 1328 are able to pull up the voltage on the $V_{Driver}$ node 1314 via HV_DEPFETs 1308 and ballasting resistors 1320 of the PFET clamp 1304, thereby pulling up the voltage on the LIN BUS pin (Pos-Neg pin 1302).

Figure 13B:
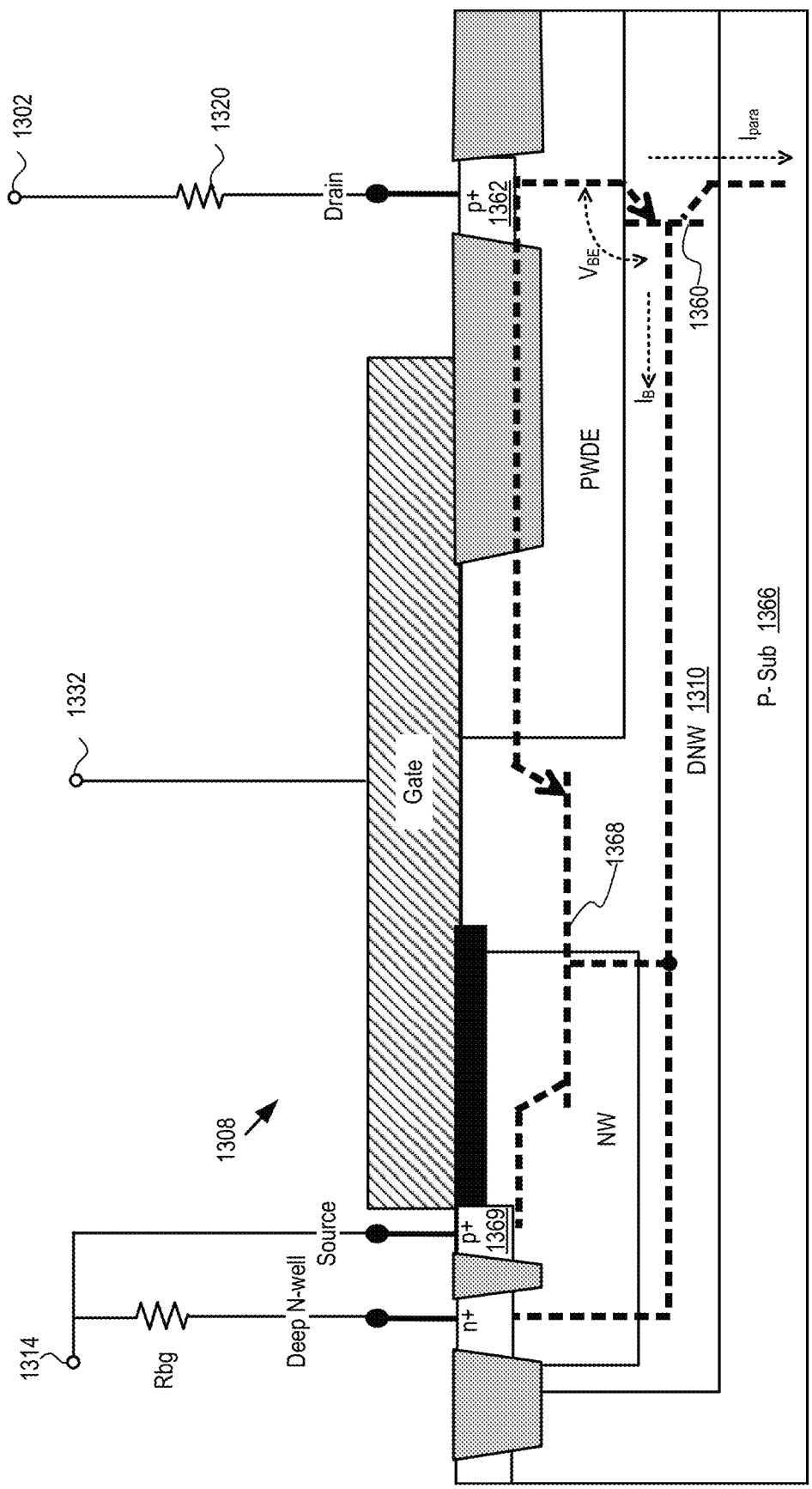
FIG. 13B is a block diagram in sectional side view of a HV_DEPFET suitable for use in the ESD protection circuit of FIG. 13A and illustrating parasitic PNP bipolar junction transistors formed between wells of the HV_DEPFET.
Figure 13C:
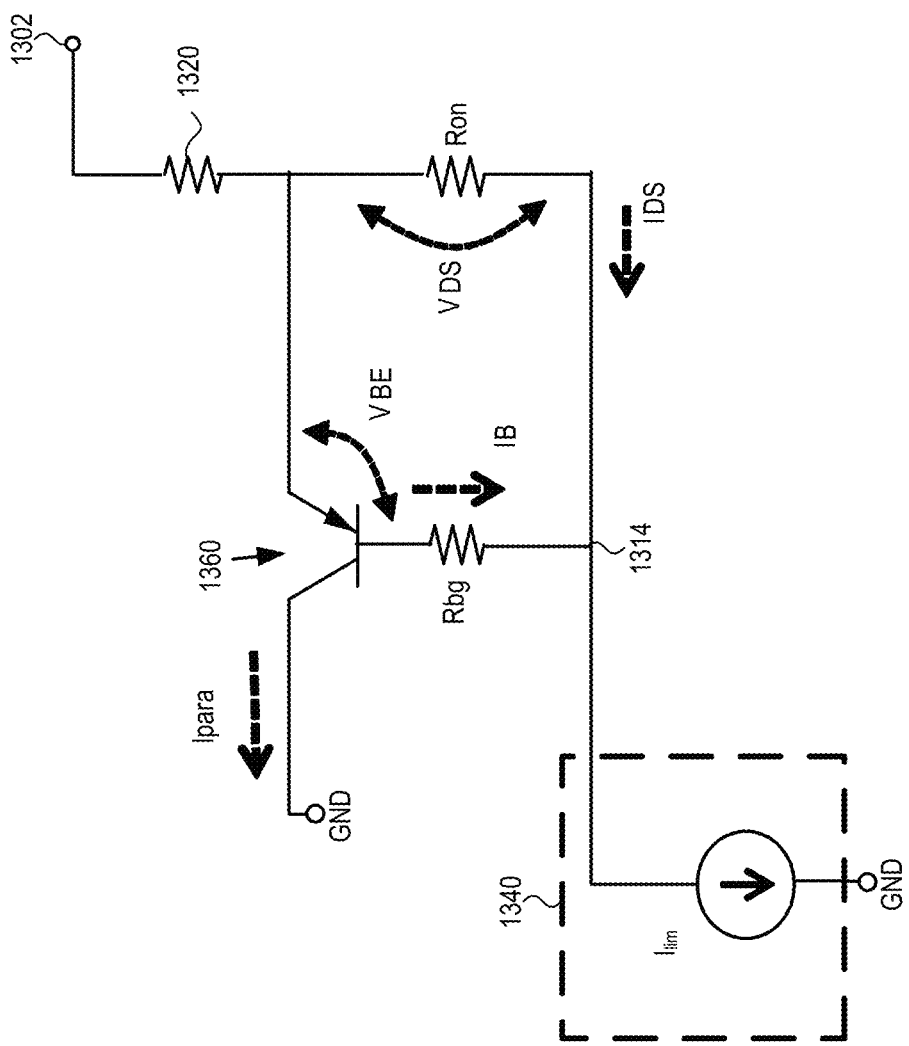
FIG. 13C is a schematic diagram illustrating equivalent circuit formed by the parasitic transistors of FIG. 13B.

FIG. 13B is a block diagram in sectional side view of one of the HV_DEPFETs 1308 in Pos-Neg pin 1302 of FIG. 13A, and illustrates the two parasitic PNP bipolar junction transistors formed therein. FIG. 13C is a schematic diagram illustrating equivalent circuit formed by the parasitic transistors of FIG. 13B. Referring to FIGS. 13B and 13C, the first of these two parasitic transistors is a vertical PNP transistor 1360, formed by a p-type drain 1362 of a HV_DEPFET 1308, a body of the HV_DEPFET formed in a DN-well (DN-well 1310), and a p-type substrate 1366. The second of the two transistors is a lateral PNP transistor 1368 that is formed by the p-type drain (p+ drain 1362) of the HV_DEPFET 1308, the DN-well 1310, and by a p-type source (p+ source 1369) of the HV_DEPFET.

Referring to FIG. 13A, the LIN bus system, commonly has multiple components such as pull-up resistors 1328, diodes 1326 and or capacitors (not shown) connected between the Pos-Neg Pin 1302 (LIN bus system pin) and a high voltage VBAT pin 1327. Such components and or other components in other devices that are connected between the Pos-Neg Pin 1302 (LIN bus system pin) and the VBAT pin 1327 may occasionally malfunction and develop short circuits between the Pos-Neg Pin 1302 (LIN bus system pin) and the VBAT pin 1327. In such situations, the driver circuit 1340 turns on and draws large amounts of current from the $V_{Driver}$ node 1314. These large currents may damage portions of the driver circuit 1340 and/or other portions of the ESD protection circuit 1300 residing in the current path. As shown in FIG. 13A, the Rbg resistor used to connect the DN-well 1310 of the HV_DEPFET 1308 to the $V_{Driver}$ node 1314 will limit current to prevent damage to the driver circuit 1340 and/or other portions of the ESD protection circuit 1300. Also, during fast positive voltage transitions of the Pos-Neg Pin 1302 (LIN bus system pin), where the voltage of the $V_{Driver}$ node 1314 may lag the voltage of the Pos-Neg Pin 1302 (LIN bus system pin), using the Rbg resistor instead of a direct connection, allows the N+, NW, and DN-well to not forward bias as much to the P+ drain, 1362, as would otherwise occur. Under such a condition, the Rbg resistor decreases the emitter to base current ($I_B$) (P+ drain 1362 to DN-well 1310) in parasitic PNP transistors 1360, 1368, the emitter to collector current (P+ drain 1362 to P-substrate) of the first, vertical PNP transistor 1360, and the emitter to collector current (P+ drain 1362 to source 1369) of the second, lateral PNP transistor 1368.

Using the Rbg resistor to raise the voltage of the DN-well 1310 also reduces the current through MOSFET portions of the HV_DEPFETs 1308. This is done through making less negative a voltage between a source 1369 of the HV_DEPFETs (coupled to the $V_{Driver}$ node 1314) and the DN-well 1310 or body node of the HV_DEPFETs. Doing this raises the voltage of the DN-well 1310 to a value that approaches that of the drain node (P+ drain 1362). Raising the body voltage, the DN-well voltage (1310), of the HV_DEPFETs 1308, also increases the body effect of the HV_DEPFETs. This increases a magnitude of the HV_DEPFET's threshold voltage, reducing the HV_DEPFET's current. Limiting this current avoids overheating of the HV_DEPFETs 1308, and prevents the parasitic PNP bipolar transistors 1360, 1368, that are resident in the HV_DEPFETs, from going into thermal runaway, and thermally damaging the HV_DEPFETs.

The advantages of resistor Rbg's current limiting action are provided both during ESD events and also in the presence of high voltages during normal operation. Again, in normal operation, a component malfunction can short the Pos-Neg Pin 1302 (LIN bus system) to the high voltage VBAT pin 1327 (in FIG. 13A), and can cause high voltages to appear across the HV_DEPFET 1308. Resistor Rbg prevents the high currents, through the HV_DEPFET 1308, that would otherwise occur due to the high voltages across the HV_DEPFET. The value of resistor Rbg is optimized for current limiting and for also making an effective connection between the $V_{Driver}$ node 1314 and the DN-well 1310. A non-limiting, exemplary value for the resistance of resistor Rbg is 100Ω. Common non-limiting exemplary values may also range from 0Ω to 1,000Ω.

Referring to FIG. 13A, in normal operation, when the Pos-Neg pin 1302 (LIN bus system) is driven, by external biasing, to voltages that are less than ground potential, the voltage of the Vgate node 1332 will be at or above ground potential. The voltage of the Vgate node 1332 cannot go appreciably negative, otherwise it would forward bias, to the grounded P-substrate, a drain node of the first HV_DENFET 1350 that is driven by the node VBias-2. If the $V_{Driver}$ node 1314 has a voltage that is greater than ground (or greater, by at least a threshold voltage, than the voltage of the Vgate node 1332), the HV_DEPFET 1308 will conduct and pull down the voltage of the $V_{Driver}$ node to a level that will be a threshold voltage above the voltage of the Vgate node (normally a threshold voltage above ground). Once the voltage on the $V_{Driver}$ node 1314 falls to near that of the Vgate node 1332, the HV_DEPFETs 1308 will turn OFF. The two series diode-connected HV_DEPFETs 1354, 1356, coupled to sources of the HV_DEPFETs 1308, will cease conduction because the gate of the HV_DEPFET 1356, connected to Vgate node 1332 and to the VBias-2-connected HV_DENFET 1350, is held at or near ground potential. With the $V_{Driver}$ node 1314 and the Vgate node 1332 both at ground and with the Pos-Neg pin 1302 (LIN bus system) voltage below ground, the HV_DEPFET 1308 are OFF, and the $V_{Driver}$ node is effectively disconnected from the Pos-Neg pin (LIN bus system).

In normal operation, during times when the Pos-Neg pin 1302 (LIN bus system) is not driven by a signal that is external to the chip, positive voltages that are applied to the $V_{Driver}$ node 1314 by the chip's internal circuitry, are transferred to the Pos-Neg pin (LIN bus system). This is because the HV_DEPFET 1308 with ballast resistors 1320 will be turned ON when the $V_{Driver}$ node 1314 is positive, and will pass the $V_{Driver}$ voltage 1314 to the Pos-Neg pin 1302 (LIN bus system).

If, during an ESD event, the positive voltage of the Pos-Neg pin 1302 (LIN bus system) exceeds a trigger voltage of the second, NFET clamp 1306, then the $V_{Driver}$ node 1314 voltage will be clamped by the isolated HV_DENFET 1312a and non-isolated HV_DENFET 1312b of the clamp. The drain ends of the HV_DEPFET 1308 that are connected to the Pos-Neg pin 1302 (LIN bus system), will forward bias to the voltage-clamped DN-wells 1310 beneath the HV_DEPFETs 1308. The HV_DEPFETs will be turned ON and passing current in a MOSFET mode (with Vgate node 1332 having a voltage between the voltage of the Pos-Neg pin 1302 or LIN bus system and ground). The HV_DEPFETs' P+ drains 1362 (see FIG. 13B) to DN-well 1310 diodes will also be forward biased and will be passing current in a diode mode from the HV_DEPFETs' P+ drains to the DN-well and from the DN-well to the NFET clamp 1306.

When, during an ESD event, the Pos-Neg pin 1302 (LIN bus system) goes to voltages that are less than ground, the voltage of the Vgate node 1332 will be at or above ground potential. The Vgate node 1332 will not go to voltages that are more negative than a volt below ground potential because the Vgate node is connected to a drain of the first HV_DENFET 1350 that is gated by VBias-2, and could forward bias to the substrate 1366. Similarly, the $V_{Driver}$ node 1314 will not go to voltages that are more than a volt below ground potential because the $V_{Driver}$ node is connected to a drain of HV_DENFET 1346 that is gated by VBias-1 and could forward bias to the grounded substrate 1366. With both the Vgate node 1332 and $V_{Driver}$ node 1314 at or near ground potential and with the Pos-Neg pin 1302 (LIN bus system) voltage substantially below ground, the HV_DEPFET 1308 will be turned OFF. If the Pos-Neg pin 1302 (LIN bus system) voltage goes below ground by more than the P-type drain 1362 (FIG. 13B) to DN-well 1310 breakdown voltage of the HV_DEPFETs 1308, (for example −45V), the HV_DEPFETs will breakdown and clamp the voltage of the Pos-Neg pin 1302 (LIN bus system) to about −45V, relative to the voltage on the $V_{Driver}$ node 1314. Even in the presence of large ESD event currents (2 amps for example), the voltage of the $V_{Driver}$ node 1314 will be no lower than about −5V, because the node is connected to the drain of the isolated HV_DENFET 1312a in second, NFET clamp 1306. Thus, the Pos-Neg pin 1302 (LIN bus system) voltage will be clamped at approximately −50V.

As shown in FIG. 13B, the HV_DEPFETs 1308 include parasitic PNP transistors 1360, 1368. When the Pos-Neg pin 1302 (LIN bus system) voltage goes to a large positive value, without the Rbg resistor, even when the HV_DEPFETs 1308 are turned ON, the drain to source voltage (VDS) of the HV_DEPFETs will increase if a large current flows through a current path $I_{LIN}$ as shown in FIG. 13A. This increase in VDS can prevent the $V_{Driver}$ 1314 voltage and the DN-well 1310 voltage from quickly rising to the same voltage as the voltage of the Pos-Neg pin 1302 (LIN bus system). Referring to FIG. 13B, if this VDS exceeds the turn on voltage VEB (emitter to base voltage or the negative of the base to emitter voltage) of the parasitic PNP transistors 1360, 1368, the base current, $I_B$, of the parasitic PNP transistors will flow, and a parasitic emitter to collector current will flow from the P+ drain 1362 to the p-doped substrate 1366, and from the P+ drain 1362 to the source (p+ source 1369) of the HV_DEPFET 1308. By connecting the resistor Rbg between the DN-well 1310 and the $V_{Driver}$ node 1314 these parasitic currents can be reduced. Resistor Rbg will allow the DN-well 1310 to forward bias to the P+ drain of the HV_DEPFET 1308 and more quickly rise in voltage. With Rbg, the voltage difference between the DN-well 1310 voltage and the HV_DEPFET 1308 P+ drain voltage will be smaller.

In a situation in which a large DC current flows through the $I_{LIN}$ current path shown in FIG. 13A, Rbg serves to limit current. This is particularly true when the LIN bus connected to the Pos-Neg pin 1302 is shorted through external circuitry, (e.g. through resistor 1328 and diode 1326 in FIG. 13A), to the high positive voltage supply, VBAT pin 1327. The driver circuit 1340 in FIG. 13A can tolerate current levels from 40 mA to 200 mA before it will be damaged.

FIG. 13C is a schematic diagram illustrating equivalent circuit formed by the parasitic transistors of FIG. 13B. Referring to FIG. 13C with the LIN bus pin (Pos-Neg pin 1302) shorted to VBAT pin 1327, the high current that would otherwise flow through the parasitic PNP transistor 1360, is suppressed with the addition of resistor Rbg. This is shown in a parasitic current equation (equation 5) given below.

$$I_{lim} = I_{DS} + I_B \qquad (1)$$

$$I_{DS} = V_{DS} / R_{on} \qquad (2)$$

$$V_{DS} = V_{BE} + I_B \times R_{bg} \qquad (3)$$

$$I_B = \frac{I_{lim} \times R_{on} - V_{BE}}{R_{bg} + R_{on}} \qquad (4)$$

$$I_{para} = I_B \times \beta = \left(\frac{I_{lim} \times R_{on} - V_{BE}}{R_{bg} + R_{on}}\right) \times \beta \qquad (5)$$

Referring to FIG. 13C and equation (1) the current through the driver circuit 1340 to be limited ($I_{lim}$) is shown to be a sum of a current from the $V_{Driver}$ node 1314, $I_{ds}$, and a current from the base of the parasitic PNP transistor 1360, $I_B$. Referring to equation (2) the current from the $V_{Driver}$ node 1314, $I_{ds}$, is shown to be a quotient of a drain to source voltage ($V_{DS}$) across the HV_DEPFET 1308 divided by the resistance of the HV_DEPFET in an ON state (represented here by $R_{on}$). Referring to equation (3) $V_{DS}$ is shown to be a sum of a turn on voltage ($V_{BE}$) of the parasitic PNP transistor 1360 and a product of $I_B$ and Rbg. Solving the above equations for $I_B$ it is shown in equation (4) that $I_B$ is equal to the quotient of the product of $I_{lim}$ and $R_{on}$ minus $V_{BE}$, divided by a sum of Rbg and $R_{on}$. The resulting parasitic current, $I_{para}$, through the substrate 1366 is shown in equation (5), where f is the gain of the parasitic PNP transistor 1360.

In an example, the case is considered where there is no Rbg present, and the $V_{Driver}$ node 1314 draws a current, $I_{lim}$, of 100 mA. If the parasitic PNP transistor 1360 has a turn on voltage, $V_{BE}$ of 0.6V, and a gain factor β of 2, and if the HV_DEPFET 1308 has an on resistance, $R_{on}$, of 20 ohms, then the parasitic substrate current Ipara is 140 mA (equation 5). The total current into the LIN pin, $I_{LIN}$ is equal to $I_{lim}+I_{para}$ or 240 mA, which can exceed the allowed current in the standard LIN BUS specification. However, if an Rbg resistor of 100 ohms is present, the parasitic substrate current is reduced to 23 mA (equation 5), and the total parasitic current is dropped to an acceptable 123 mA.

Figure 14:
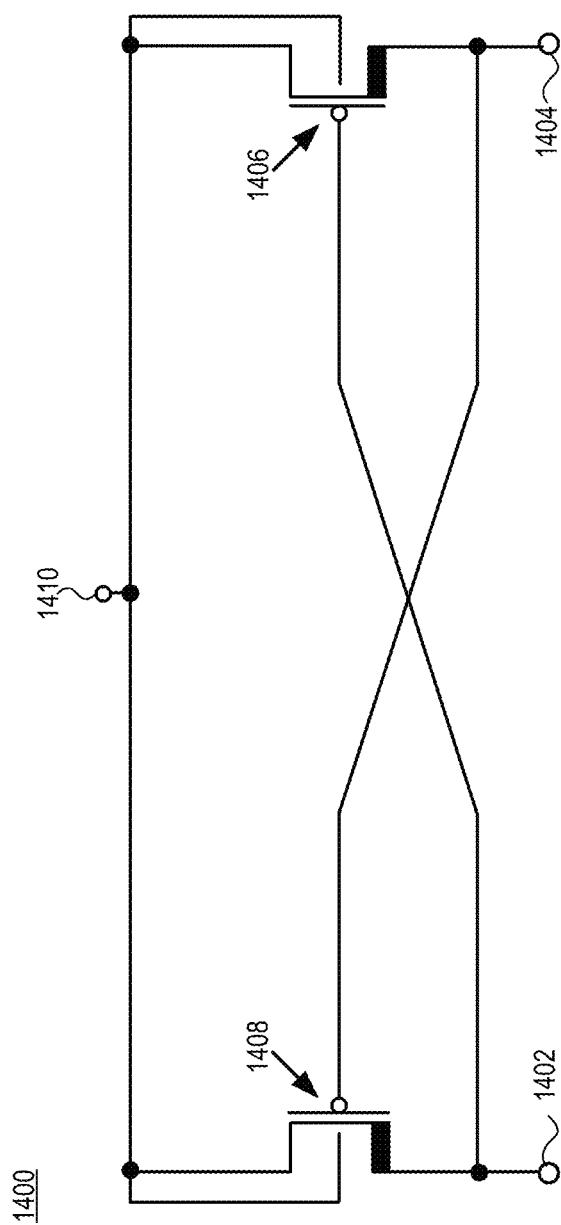
FIG. 14 is a schematic diagram illustrating a higher-of-two-voltages circuit suitable for use in a positive and negative voltage ESD protection circuit including HV_DEPFETs controlled by a gate control circuit.

FIG. 14 is a schematic diagram illustrating a simplified embodiment of a higher-of-two-voltages circuit 1400 suitable for use in a gate bias circuit of an ESD protection circuit of the ESD protection circuit, such as one of those described above, to select the higher of a voltage applied to a first input node 1402, for example a Pos-Neg pin, and that applied to a second input node 1404, for example ground. Referring to FIG. 14 the circuit 1400 includes two PFETs 1406, 1408, which can be HV_DEPFETs, and is intended to output the higher voltage of two input voltages. The two PFETs 1406, 1408, are connected at their sources to the higher circuit output 1410 ($V_{Higher}$). The higher circuit output 1410 also provides an N-well voltage for the two PFETs 1406, 1408. A gate of the first PFET 1406 and a drain of the second PFET 1408 are coupled to form the first input node 1402. The gate of the second PFET 1408 and the drain of the first PFET 1406 are coupled to form the second input node 1404. In operation, a voltage applied to the first input 1402 higher than that applied to the second input will turn ON the first PFET 1406 and turn OFF the second PFET 1408 causing the voltage applied to the first input to be coupled to the higher circuit output 1410. A voltage applied to the second input 1404 higher than that applied to the first input 1402 will turn ON the second PFET 1408 and turn OFF the first PFET 1406 causing the voltage applied to the second input to be coupled to the higher circuit output 1410.

Figure 15:
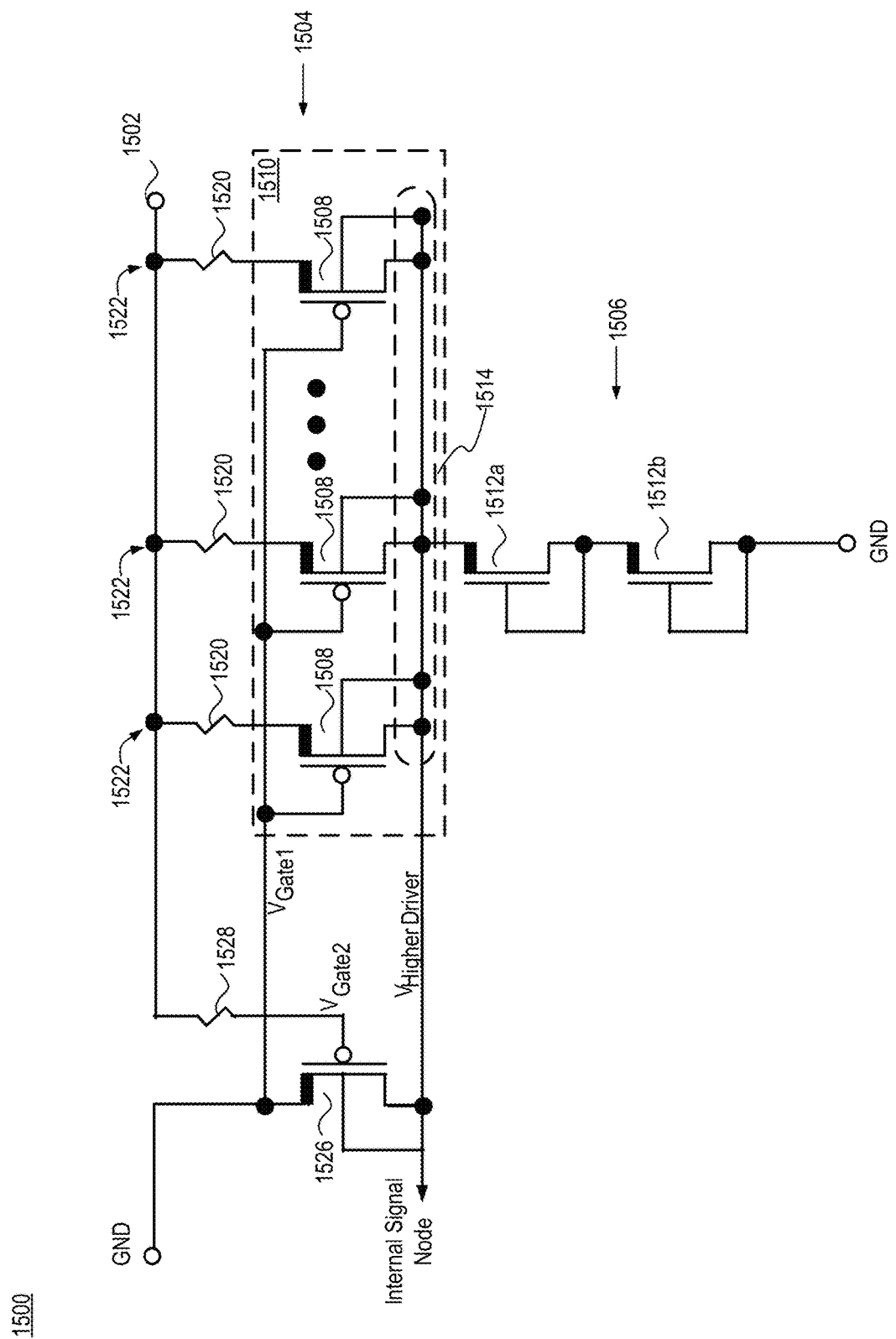
FIG. 15 is a schematic diagram illustrating an embodiment of the ESD protection circuit similar to FIG. 9 and further including a bias network based on the circuit of FIG. 14.

FIG. 15 is a schematic diagram illustrating an embodiment of the ESD protection similar to that of FIG. 9 further including a bias network based on the higher-of-two-voltages circuit of FIG. 14. Referring to FIG. 15, the ESD protection circuit 1500 generally includes a PFET clamp 1504 having a plurality of parallel circuits 1522 or sets coupled between a Pos-Neg pin 1502 and a $V_{Higher-Driver}$ node 1514, and an NFET clamp 1506 including a first, isolated HV_DENFET 1512a and a second, non-isolated HV_DENFET 1512b coupled in series between the PFET clamp 1504 and ground (GND). As in the embodiments described above, each of the plurality of parallel circuits 1522 of the PFET clamp 1504 include at least one HV_DEPFET 1508 formed in a DN-well 1510 and at least one ballasting resistor 1520. The $V_{Higher-Driver}$ node 1514 is generally coupled to an internal signal node to pass voltages to and from the Pos-Neg pin 1502.

Gate voltages of the HV_DEPFET 1508 are provided by a bias network that is based upon the higher-of-two-voltages circuit of FIG. 14. Generally, the bias network includes an DN-well biasing transistor 1526, a relatively high impedance resistor 1528 through which a gate of the DN-well biasing transistor is connected to the Pos-Neg pin 1502, corresponding to the first input 1402 of FIG. 14, and the HV_DEPFETs 1508. The drain of the N well biasing transistor 1526 is connected to ground, corresponding to the second input 1404 of FIG. 14. The gates of the HV_DEPFETs 1508 are connected to ground. The source of the DN-well biasing transistor 1526 and the source/drain of the left most HV_DEPFET are coupled to form the higher circuit output or $V_{Higher-Driver}$ node 1514. The bias network functions by placing the higher of the ground potential or voltage of the Pos-Neg pin 1502, on the $V_{Higher-Driver}$ node 1514 coupled to the DN-well 1510. Thus the DN-well 1510 of all of the HV_DEPFETs 1508 have a voltage that is at least as high as the voltage of the Pos-Neg pin 1502. When the voltage on the Pos-Neg pin 1502 goes negative, the DN-well 1510 stays at ground potential.

Ensuring the voltage of the DN-well 1510 is at least as high as the voltage of the Pos-Neg pin 1502 provides significant advantages. When the Pos-Neg pin 1502 has risen from ground to a voltage greater than ground, the voltage of the $V_{Higher-Driver}$ node 1514 becomes equal to that of the Pos-Neg pin. When a voltage ($V_{Gate1}$) applied to the gates of the HV_DEPFETs 1508 is at ground potential the HV_DEPFETs will be turned ON, raising the $V_{Higher-Driver}$ node 1514 to that of the Pos-Neg pin 1502. The $V_{Higher-Driver}$ node 1514 voltage will be applied to a drain of the upper HV_DENFET 1512a of the NFET clamp 1506 and to sources of the HV_DEPFETs 1508. If the voltage of the Pos-Neg pin 1502 exceeds the trigger voltage of the NFET clamp 1506, i.e., a positive voltage ESD event, then the $V_{Higher-Driver}$ node 1514 will be clamped at a voltage that is lower than that of the Pos-Neg pin 1502. The drains of the HV_DEPFETs 1508 connected to the Pos-Neg pin 1502 will forward bias to the DN-well 1510, causing the HV_DEPFETs to turn ON and pass run current in a MOSFET mode.

When the Pos-Neg pin 1502 goes to voltages below ground, the $V_{Gate1}$ will remain at ground potential turning OFF the HV_DEPFET 1508 that are connected to the Pos-Neg pin. If the Pos-Neg pin 1502 voltage is below ground by more than the drain to DN-well 1510 breakdown voltage of the HV_DEPFET 1508, (about 45V), the HV_DEPFETs will breakdown and clamp the voltage of the Pos-Neg pin 1502 at −45V.

In breaking down, the HV_DEPFETs 1508 will attempt to pull the voltage on the DN-well 1510 to that of the negative going Pos-Neg pin 1502. However, the drain of the upper HV_DENFET 1512a, that is connected to the $V_{Higher-Driver}$ node 1514 and to the HV_DEPFETs 1508, will forward bias to a grounded substrate in which the ESD protection circuit 1500 is formed. In doing so, the forward biased drain of the upper HV_DENFET 1512a will prevent the $V_{Higher-Driver}$ node 1514 voltage from going much below ground. Parasitic diodes (not shown) formed between the DN-well 1510 and substrate residing beneath the HV_DEPFETs 1508 will also forward bias causing the parasitic PNP bipolar junction transistor(s) (not shown in this figure) to be forward biased and to turn ON. This parasitic PNP transistor will assist in pulling the Pos-Neg pin 1502 voltage up toward ground potential.

During normal operation, at times when the Pos-Neg pin 1502 is not driven by a signal that is external to the chip, positive voltages that are applied to the $V_{Higher-Driver}$ node 1514 by the chip's internal circuitry, are transferred to the Pos-Neg pin. This is because the HV_DEPFETs 1508 will be turned ON when the $V_{Higher-Driver}$ node 1514 is positive. These HV_DEPFETs 1508 will pass the $V_{Higher-Driver}$ node 1514 voltage to the Pos-Neg pin 1502.

FIG. 16 is a schematic diagram illustrating an embodiment of the ESD protection and signal passing circuit similar to FIG. 15 mirrored or flipped horizontally and further including a shut off acceleration transistor. Referring to FIG. 16, the ESD protection circuit 1600 generally includes a PFET clamp 1604 having a plurality of parallel circuits 1622 or sets coupled between a Pos-Neg pin 1602 and a $V_{Higher-Driver}$ node 1614, and an NFET clamp 1606 including a first, isolated HV_DENFET 1612a and a second, non-isolated HV_DENFET 1612b coupled in series between the PFET clamp 1604 and ground (GND). As in the embodiments described above, each of the plurality of parallel circuits 1622 of the PFET clamp 1604 includes at least one HV_DEPFET 1608 formed in a DN-well 1610 and at least one ballasting resistor 1620. The $V_{Higher-Driver}$ node 1614 is generally coupled to an internal signal node to pass voltages to and from the Pos-Neg pin 1602 during normal operation. Additionally, the ESD protection circuit 1600 further includes a shut off-acceleration transistor 1632 and a bias network with a higher-of-two-voltages circuit including DN-well biasing transistors M2, M4, and a relatively high impedance (1.25MΩ, non-limiting example) resistor 1634 through which the gate of the DN-well biasing transistors M2, and the gate of the shut off-acceleration transistor 1632 are connected to the Pos-Neg pin 1602.

Figure 16A:
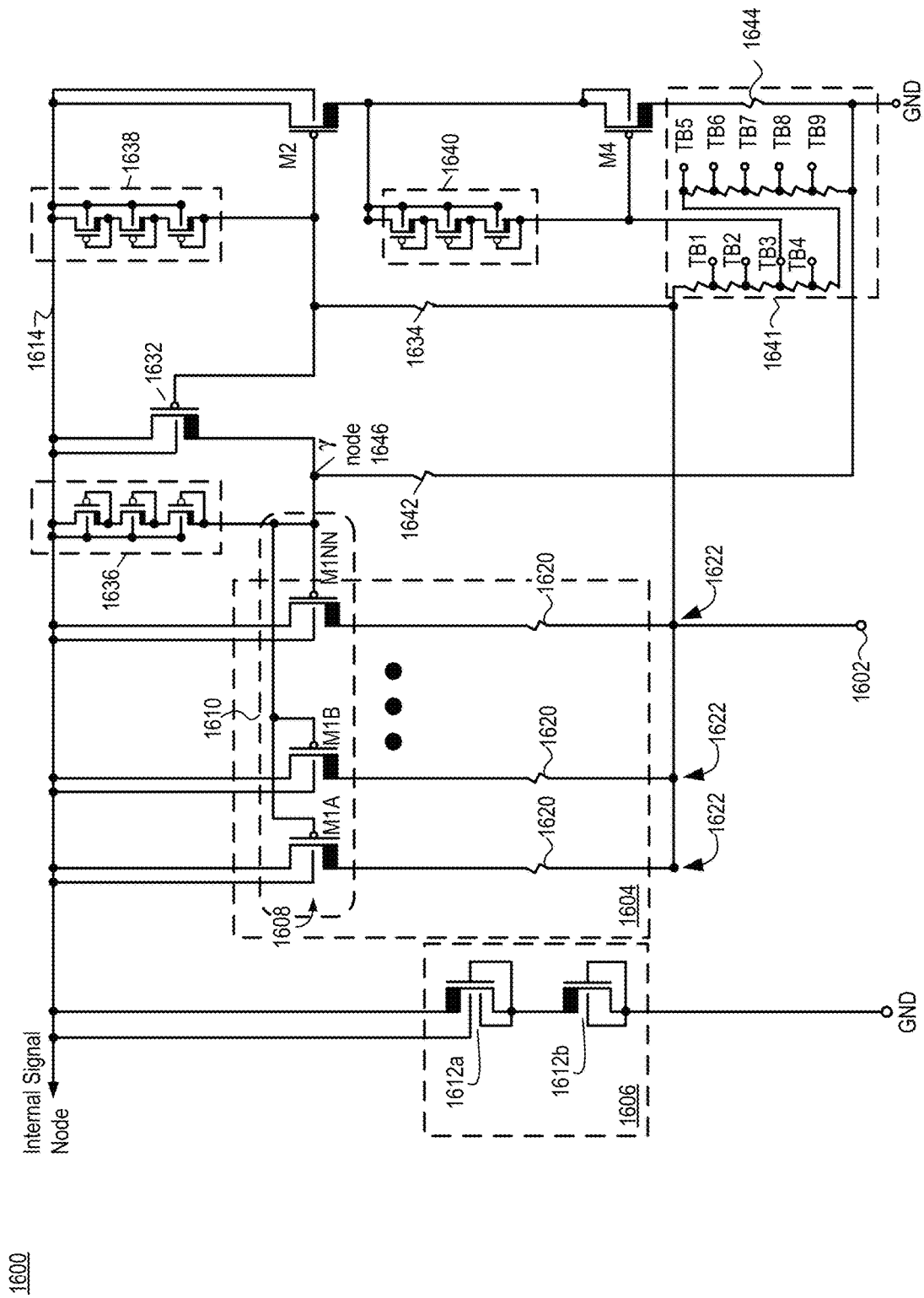
FIG. 16A is a schematic diagram illustrating an embodiment of the ESD protection circuit similar to FIG. 15, and further including Cascoded control transistors and a shut OFF acceleration transistor.

FIG. 16A first differs from the circuit of FIG. 15 in that it is flipped horizontally, and further adapted for use in high voltage conditions. In normal operation, the Pos-Neg Pin 1602 product must span a voltage range of −28V to +42V (non-limiting examples). The HV_DEPFETs 1608 are nearly at their drain to source voltage limit at the maximum voltage that will appear across the transistors in the ESD protection circuit 1600. During ESD events, the voltage across the circuit will be even greater than the normal operating voltage extremes. Thus, the DN-well biasing transistor 1526 is replaced by a Cascoded pair of HV_DEPFETs M2 and M4. This Cascoding is necessary in order avoid having a non-Cascoded single HV_DEPFET damaged by excessive drain to source, drain to gate, or drain to body voltage.

It is noted however, that the HV_DEPFETs 1608 do not require Cascoding because when the Pos-Neg pin 1602 voltage goes to the high end of the range, i.e., 42V (non-limiting example) during normal operation, or, during ESD events as high as +56V (non-limiting example), the voltage on the $V_{Higher-Driver}$ node 1514 will follow the voltage on the Pos-Neg pin 1602. During normal operation, when the Pos-Neg pin 1602 goes to negative voltages, the magnitudes of the negative voltages will be small enough that the HV_DEPFETs 1608 will tolerate the negative voltage excursion. Each of these HV_DEPFETs 1608, M1A through M1NN, retains its individual drain-connected ballast resistor 1620. M1A through M1NN have to carry large currents during normal operation and also carry most of the current that passes into or passes out of the Pos-Neg pin 1602 during ESD events.

As noted above, the transistors M1A through M1NN are partitioned into a plurality of parallel circuits 1622, with each HV_DEPFET 1608 having a ballast resistor 1620 associated therewith. In one exemplary embodiment the ESD protection circuit 1600 includes 168 parallel circuits 1622. The ballasting is done this way so that the HV_DEPFETs 1608 and ballast resistors 1620 can both safely carry large amounts of current in MOSFET mode, and can also safely go into drain to body breakdown. Each ballast resistor 1620 can be made from polysilicon, and, preferably, has a resistance of not less than 500 Ωs. Having 168 ballast resistors 1620, of 500 Ωs each, in parallel with each other, yields an effective overall transistor to pin resistance of only 3 Ωs. It is noted however that this number (168) of parallel circuits 1622 and the resistance (500Ω) of ballast resistor 1620 are exemplary values, and the ESD protection circuit 1600 may alternatively include any number of parallel circuits, and resistance values depending on the expected normal operating and ESD voltages, and on-chip size limitations of the circuit.

Using a large resistance ballast resistor 1620 in series with each of the HV_DEPFETs 1608 is desirable during an ESD event. If during an ESD event a low impedance hot spot develops in one of the HV_DEPFET 1608 drain to body junctions, the 500Ω drain ballast resistor 1620 will limit the current to the associated transistor and to the transistor's drain hot spot. Such a hot spot can start as a small point, perhaps at a small (atomic scale) lattice defect site, where the local reverse junction breakdown voltage may be less than the average reverse junction breakdown voltage. Once a small point begins to run reverse current (via diode breakdown), the point can heat. MOS transistor breakdown (snap-back) commonly involves parasitic bipolar junction transistors. With bipolar-junction-transistor collector-to-base breakdown and accompanying collector-junction avalanche, any heating at a hot spot will cause the involved parasitic bipolar junction transistors to become more conductive and increase the local current flow. In such a parasitic bipolar junction transistor, local thermal run away can greatly increase and focus the heating at a point of local breakdown. Using plurality of parallel circuits 1622, each with its own ballast resistor 1620, can significantly reduce the problems of local heating and thermal runaway.

The ESD protection circuit 1600 further includes a number of pull-up strings, each having three series connected transistors that are connected in series with the gates of M1A through M1NN, M2 and M4. In the embodiment shown a first pull-up string 1636 is coupled to the gates of M1A through M1NN, a second pull-up string 1638 is coupled to the gate of M2, and a third pull-up string 1640 is coupled to the gate of M4. These pull-up strings 1636, 1638, 1640, limit the source to gate voltages of transistors M1A through M1NN, M2 and M4, to no more than 5V to prevent gate dielectric failure of the transistors.

The ESD protection circuit 1600 further includes a voltage divider 1641 including a number of relatively high impedance (1.25MΩ, non-limiting example) resistors with transistor bias points TB1 through TB9 to adjust or optimize a voltage applied to the gate of HV_DEPFET M4 that comes from between the Pos-Neg pin 1602 voltage and the ground. A limiting resistor 1644 coupled between a drain of the HV_DEPFET M4 and ground enables the DN-well 1610 to be pulled slightly below ground potential when the Pos-Neg pin 1602 goes below ground. Generally, the limiting resistor 1644 has a resistance of between 0 and 20 Ωs determined from simulations based on assumed voltages and predetermined or selected values for other resistances in the ESD protection circuit 1600. An exemplary, non-limiting value for the limiting resistor 1644 can be about 16 Ωs.

The gates of transistors M1A through M1NN are connected to ground through a high impedance (8MΩ, non-limiting example) resistor 1642. The resistor 1642 helps to avoid having more than 5V across the gate oxides of transistors M1A through M1NN. The resistor 1642 has a high impedance in order to avoid having too much current pass from the Pos-Neg pin 1602 to ground during normal operation. The shut-off acceleration transistor 1632 is used to help shut off transistors M1A through M1NN when the Pos-Neg Pin voltage drops below the ground potential.

The Cascoded isolated and non-isolated HV_DENFETs 1612a, 1612b, of the NFET clamp 1606 clamp the voltage of the $V_{Higher-Driver}$ node 1614 to the clamping voltage of the Cascoded HV_DENFETs or approximately 50V (non-limiting example). The NFET clamp 1606 also provides forward biased drain diode clamping and gate-turned-on clamping if the $V_{Higher-Driver}$ node 1614 voltage gets pulled below ground. As with the embodiments of the ESD protection circuits described above, during normal operation with positive voltages on the Pos-Neg pin 1602, the voltage on the $V_{Higher-Driver}$ node 1614 closely tracks the voltage on the Pos-Neg pin and the $V_{Higher-Driver}$ node can be used to pass signals to and from the interior of the chip with an accurate un-attenuated voltage.

During normal operation, when the Pos-Neg pin 1602 is not driven by a signal that is external to the chip, positive voltages that are applied to the $V_{Higher-Driver}$ node 1614 by the chip's internal circuitry, are transferred to the Pos-Neg pin. This is because the plurality of parallel circuits 1622 will be turned ON when the $V_{Higher-Driver}$ node 1614 voltage is positive.

In performing ESD event protection, if the Pos-Neg pin 1602 voltage exceeds a positive clamping voltage of the NFET clamp 1606, the Pos-Neg pin will pull up the voltage of the $V_{Higher-Driver}$ node 1614 to the voltage of the Pos-Neg pin. The high positive voltage on the $V_{Higher-Driver}$ node 1614 will then cause the HV_DENFETs 1612a, 1612b, of the NFET clamp 1606 to clamp the voltage on the $V_{Higher-Driver}$ node to approximately 50V (non-limiting example). With the $V_{Higher-Driver}$ node 1614 voltage clamped, any further increase in the positive voltage on the Pos-Neg pin 1602 will forward bias sources of the HV_DEPFETs 1608 to the DN-wells 1610 that are connected to the $V_{Higher-Driver}$ node 1614. In addition to the parasitic current through the parasitic PNP transistors formed between the HV_DEPFET sources, DN-well and P-substrate that this forward biasing will cause, the HV_DEPFETs 1608 operating in MOSFET mode will also contribute to clamping and bringing down the voltage on the Pos-Neg pin 1602.

In a similar fashion, when a negative voltage on the Pos-Neg pin 1602 becomes large enough to break down the drain junction or drain junctions of one or more of the HV_DEPFETs 1608, the voltage of the $V_{Higher-Driver}$ node 1614 is pulled to below ground potential, forward biasing the drain junctions of isolated HV_DENFET 1612a. This forward biasing can be from a parasitic NPN bipolar junction transistor in the HV_DENFET 1612a formed by a deep N-well connected to the drain of the HV_DENFET, a P-well residing in a deep N-well (connected to the drain), and an n+ source region of the HV_DENFET in the P-well. The parasitic NPN transistor and the deep N-well to substrate junction will conduct current to the substrate and also to the drain of the non-isolated HV_DENFET 1612b of the NFET clamp 1606. The forward bias to the substrate, and the NPN action to the lower transistor in the Cascoded HV_DENFET clamp, will prevent the voltage of the $V_{Higher-Driver}$ node 1614 from going much below ground potential. Thus, the forward biasing will short the HV_DENFET 1612a n-type drain to the ground node.

In general, the ESD protection circuit 1600 shown in FIG. 16A accomplishes both clamping and normal operation functions. When the Pos-Neg pin 1602 voltage drops below ground, transistors M2 and M4 turn on and pull the $V_{Higher-Driver}$ node 1614 voltage up to ground. Transistors M2 and M4 turn on because the gate voltages of transistors M2 and M4 are pulled below ground potential by the low going voltage on the Pos-Neg pin 1602 and the connections from the M2 and M4 gates to the Pos-Neg pin 1602 through resistor 1634 and voltage divider 1641. The shut off acceleration transistor 1632 pulls the voltage of the γ node 1646 up to ground potential and that shuts off the HV_DEPFETs 1608. Taking the Pos-Neg pin 1602 voltage to below approximately −44V (non-limiting example) during an ESD event, causes the drain junctions of the HV_DEPFETs 1608 to breakdown to the DN-wells 1610.

When the Pos-Neg pin voltage is raised to less than 40V (non-limiting example), the voltage of the γ node 1646 is capacitively coupled to approximately two thirds of the voltage on the Pos-Neg Pin. This voltage allows the Pos-Neg Pin to charge the $V_{Higher-Driver}$ node to a positive voltage that approaches the voltage of the Pos-Neg Pin. This charging comes through HV_DEPFETs M1A-M1NN. As the $V_{Higher-Driver}$ node charges to a voltage approaching that of the Pos-Neg Pin, the voltage of the γ node 1646 is capacitively coupled to nearly the voltage of the Pos-Neg Pin. The $V_{Higher-Driver}$ node takes on the same voltage level as the voltage level of the Pos-Neg Pin.

The high impedance (8MΩ) resistor 1642 from the γ node to ground pulls down the voltage on the γ node 1646 by approximately 10 percent in about 40 μsec. For example, if the Pos-Neg pin 1602 voltage is raised to 14V the γ node 1646 voltage will be dropped from nearly the voltage of the Pos-Neg pin to 1.4V less than the voltage of the Pos-Neg pin in 40 μSec. This discharging time is also approximately the amount of time required for the $V_{Higher-Driver}$ node 1614 to become stable. When the Pos-Neg pin 1602 voltage is above ground potential, transistors M2 and M4 turn off and do not affect the voltage on the $V_{Higher-Driver}$ node 1614. Transistors M2 and M4 turn off because the gate voltages of transistors M2 and M4 are pulled to high voltage by the high going voltage on the Pos-Neg pin 1602 and the connections from the M2 and M4 gates to the Pos-Neg pin 1602 through resistor 1634 and voltage divider 1641. Resistor divider 1641 pulls the voltage on the gate of transistor M4 to an intermediate level between the voltage of the Pos-Neg pin 1602 and the ground voltage (GND).

Similarly, if the Pos-Neg pin 1602 voltage is raised to more than 54V during an ESD event, the voltage of the γ node 1646 is capacitively coupled to approximately two thirds of the voltage on the Pos-Neg pin. However, most of the conduction from the Pos-Neg pin 1602 to the $V_{Higher-Driver}$ node 1614 is via forward biasing of the HV_DEPFET 1608 drain junctions to the DN-well 1610. This DN-well 1610 voltage is applied to the drains of the HV_DENFETs 1612a, 1612b, of the NFET clamp 1606 via the $V_{Higher-Driver}$ node 1614, generally to about 50V. The voltage drop from the Pos-Neg pin 1602 to the $V_{Higher-Driver}$ node 1614 is likely less than 5V under clamping conditions, resulting in an overall Pos-Neg pin clamping voltage of approximately 55V or less (non-limiting example).

Figure 16B:
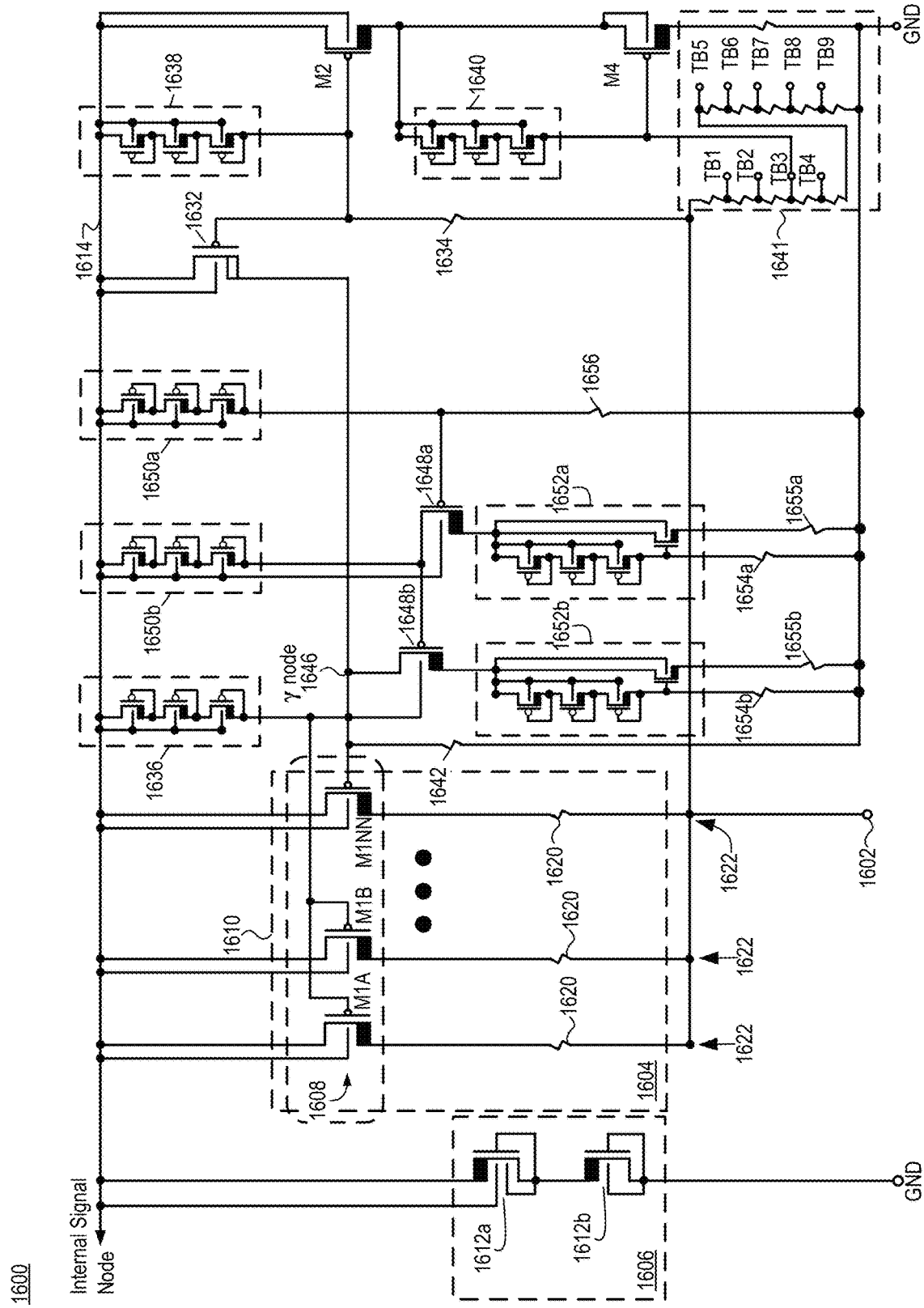
FIG. 16B is a schematic diagram illustrating an embodiment of the ESD protection circuit similar to FIG. 16A, and further including a turn on acceleration network for the HV_DEPFETs.

FIG. 16B is a schematic diagram illustrating an embodiment of the ESD protection circuit similar to that of FIG. 16A. The ESD protection circuit 1600 of FIG. 16B differs from that of FIG. 16A in that it further includes a turn on acceleration circuit for the HV_DEPFETs 1608 of the PFET clamp 1604. Generally, the acceleration circuit includes a first stage having a first HV_DEPFET 1648a, and a second stage having a second HV_DEPFET 1648b. Gates of the HV_DEPFETs 1648a, 1648b, are coupled to $V_{Higher-Driver}$ node 1614 through pull-up strings 1650a, 1650b, and coupled between the γ node 1646 and ground through Cascode transistors 1652a, 1652b, high impedance (8MΩ, non-limiting example) resistors 1654a, 1654b and 500Ω (non-limiting example) ballast resistors 1655a, 1655b. Each pull-up string 1650a, 1650b, includes three diode connected HV_DEPFETs. The gate of the first HV_DEPFET 1648a is further coupled to ground through a high impedance (8MΩ, non-limiting example) resistor 1656. The DN-well of the first HV_DEPFET 1648a is couple to the $V_{Higher-Driver}$ node 1614. The gate of the second HV_DEPFET 1648b is coupled to the source of the first HV_DEPFET 1648a. The source and DN-well of the second HV_DEPFET 1648b is coupled to the γ node 1646.

The source and DN-well of first cascode HV_DEPFET 1652a is connected to the drain of HV_DEPFET 1648a, and the drain of first cascode HV_DEPFET 1652a is connected to ground through resistor 1655a. The source of first cascode HV_DEPFET 1652a is further connected to ground through second, third, and fourth cascode HV_DEPFETs 1652a and resistor 1654a. The DN-wells of second, third, and fourth cascode HV_DEPFETs 1652a are connected to the source of first cascode HV_DEPFETs 1652a. The gates of second, third, and fourth cascode HV_DEPFETs 1652a are connected to their respective drains. The source of second cascode HV_DEPFET 1652a is connected to the source of first cascode HV_DEPFET 1652a. The drain of second cascode HV_DEPFET 1652a is connected to the source of third cascode HV_DEPFET 1652a. The drain of third cascode HV_DEPFET 1652a is connected to the source of fourth cascode HV_DEPFET 1652a. The drain of fourth cascode HV_DEPFET 1652a is connected to resistor 1654a. The other end of resistor 1654a is connected to ground.

Similarly, the source and DN-well of first cascode HV_DEPFET 1652b is connected to the drain of HV_DEPFET 1648b, and the drain of first cascode HV_DEPFET 1652b is connected to ground through resistor 1655b. The source of first cascode HV_DEPFET 1652b is further connected to ground through second, third, and fourth cascode HV_DEPFETs 1652b and resistor 1654b.

The DN-wells of second, third, and fourth cascode HV_DEPFETs 1652b are connected to the source of first cascode HV_DEPFETs 1652b. The gates of second, third, and fourth cascode HV_DEPFETs 1652b are connected to their respective drains. The source of second cascode HV_DEPFET 1652b is connected to the source of first cascode HV_DEPFET 1652b. The drain of second cascode HV_DEPFET 1652b is connected to the source of third cascode HV_DEPFET 1652b. The drain of third cascode HV_DEPFET 1652b is connected to the source of fourth cascode HV_DEPFET 1652b. The drain of fourth cascode HV_DEPFET 1652b is connected to resistor 1654b. The other end of resistor 1654b is connected to ground.

When the voltage on the Pos-Neg pin 1602 goes to voltages above ground, resistor 1656 pulls the voltage on the gate of HV_DEPFETs 1648a, and 1648b toward ground and controls the turn on acceleration circuit for the HV_DEPFETs 1608. When the voltage on the Pos-Neg pin 1602 goes to voltages above ground, resistor 1656 pulls the voltage on the gate of HV_DEPFET 1648a toward ground, turns on HV_DEPFET 1648a and, through HV_DEPFET 1648a, turns on HV_DEPFET 1648b. HV_DEPFET 1648b then pulls down on the gates of HV_DEPFETs 1608, thus accelerating the turn on of HV_DEPFETs 1608.

Referring to FIG. 16B, when the Pos-Neg pin 1602 voltage rises quickly, the HV_DEPFETs 1608 need to stay on and pass the voltage from the Pos-Neg pin to the $V_{Higher-Driver}$ node 1614. The γ node 1646 should stay low in order to ensure the HV_DEPFETs 1608 stay ON. During a first part of a rise in voltage of the Pos-Neg pin 1602, when the $V_{Higher-Driver}$ node 1614 voltage is rising to equalize with the increased Pos-Neg pin voltage, the gates of the HV_DEPFETs 1608 (γ node 1646) are capacitively coupled through the gates of HV_DEPFETs 1608 to the DN-well 1610. The gates of the HV_DEPFETs 1608 (γ node 1646) are also capacitively coupled to the sources and drains HV_DEPFETs 1608. These capacitances are small enough, and couple little enough charge and voltage, to allow the HV_DEPFETs 1608 to remain turned ON. In other words, before the $V_{Higher-Driver}$ node 1614 voltage rises up to the level of the Pos-Neg pin 1602 voltage, the $V_{Higher-Driver}$ node 1614 voltage will not be high enough to couple enough charge into the gates of the HV_DEPFETs 1608 to raise the gate voltages to the level of the Pos-Neg pin. Again, the voltage on the γ node 1646 will remain low enough to allow the HV_DEPFETs 1608 to remain turned ON.

As noted above, the voltage on the γ node 1646 stays low enough to allow the HV_DEPFETs to remain ON. The capacitances that raise HV_DEPFETs' 1608 gate voltage are the HV_DEPFETs' gate to DN-well 1610 capacitances, and gate to source P+ capacitances. Here the deep N-wells and the source P+'s are each connected to the $V_{Higher-Driver}$ node. Referring to FIG. 13B it is noted that in the process technology being used, these HV_DEPFETs 1308 are not symmetrical. The source ends of the transistors are the end connected to the $V_{Higher-Driver}$ node 1314. The DN-wells 1310 and source P+'s 1369 connected to the $V_{Higher-Driver}$ node 1314 tend to capacitively couple to the Vgate node 1332 (γ node 1646). This coupling continues until the Pos-Neg pin 1602 pulls up the voltage on the $V_{Higher-Driver}$ node 1614 to a level that approaches the voltage on the Pos-Neg pin.

A problem, that slows the rise of voltage on the $V_{Higher-Driver}$ node 1614 in the circuit the ESD protection circuit 1600 of FIG. 16A, comes about when the voltage on the $V_{Higher-Driver}$ node 1614 rises up enough that it approaches the voltage of the Pos-Neg pin 1602, that is during a final portion of the rise in the $V_{Higher-Driver}$ voltage. As the $V_{Higher-Driver}$ node 1614 voltage approaches the voltage of the Pos-Neg pin 1602, the voltage on the γ node 1646 is no longer coupled low enough to support the HV_DEPFETs' 1608 remaining turned ON. When the HV_DEPFETs 1608 turn OFF, the voltage on the $V_{Higher-Driver}$ node 1614 does not quickly rise up to fully equal the voltage on the Pos-Neg pin 1602. The high impedance (8MΩ) resistor 1642 connected from the γ node 1646 to ground is primarily intended to pull down the voltage of the γ node when the Pos-Neg pin 1602 voltage is above ground potential. Had HV_DEPFETs 1608 gate capacitance been small, an RC time constant of the gate capacitances and the resistor 1642 would have been in the range of about a micro-second. However, with 168 HV_DEPFETs 1608 connected in parallel in the plurality of parallel circuits 1622, the gate capacitance is large and the total fall time of the γ node 1646 is large. It would be possible to reduce this RC time constant by decreasing the resistance of the high impedance resistor 1642, however, due to the low leakage current requirements on the Pos-Neg pin 1602, it is desirable that the γ node 1646 to be connected to ground through a high impedance (8MΩ) resistor 1642 resistor.

The combination of the gate capacitance produced by 168 parallel HV_DEPFETs 1608 and the high impedance resistor 1642, yields about a 120 μsec RC time constant, or a 360 μsec 5 percent to 95 percent fall time. As the voltage on the γ node 1646 is clamped to a maximum of about 5V below the voltage of $V_{Higher-Driver}$ node 1614, often only part of the 5 percent to 95 percent fall time comes into play. This happens when the voltage on the Pos-Neg pin 1602 is well above 5V. Thus, approximately 10 percent of the total voltage fall can occur in about 10 percent of the 5 percent to 95 percent fall time. In this case, 10 percent of the 5 percent to 95 percent fall time is about 40 μsec. This is a substantial part of the 100 μsec period of a 10 KHz signal that typically could be expected to be applied to the Pos-Neg pin 1602 in normal signal passing operations. Thus, the final pull up of the $V_{Higher-Driver}$ node 1614 voltage to the voltage of the Pos-Neg pin 1602 may take longer than is desired, and hence the PW to DN-well junctions of the HV_DEPFETs 1608, shown in FIG. 13B for example, may be forward biased for longer than is desired. Additionally, analog circuit accuracy may be impaired by delays in equalizing the $V_{Higher-Driver}$ node 1614 voltage to the voltage of the Pos-Neg pin 1602.

The ESD protection circuit 1600 of FIG. 16B overcomes the $V_{Higher-Driver}$ node 1614 slow-voltage equalization problem, while also maintaining minimal normal operation leakage currents. The turn on acceleration circuit of FIG. 16B will quickly pull down the γ node 1646 voltage when the Pos-Neg pin 1602 voltage is greater than ground. Where the Pos-Neg pin 1602 voltage is positive and high, the Pos-Neg pin voltage and the $V_{Higher-Driver}$ node 1614 voltage should stabilize to the same high level. The first HV_DEPFET 1648a in the first stage of the turn on acceleration circuit will have a gate voltage that will settle at approximately 5V lower than the $V_{Higher-Driver}$ 1614 voltage. The first HV_DEPFET 1648a, can be modified to have a larger transistor width if necessary. This settled gate voltage is determined by the HV_DEPFET gate pull-up string 1650a and the high impedance (8MΩ) resistor 1656 that are each connected to the gate of the second HV_DEPFET. With 15V on the Pos-Neg pin 1602, the current through the gate pull-up string and the high impedance resistor 1656 will be about 1.25 μA.

The gate of the second HV_DEPFETs 1648b in the second stage of the turn on acceleration circuit will also be at approximately 5V lower than the $V_{Higher\text{-}Driver}$ node 1614 voltage plus the magnitude of the second HV_DEPFET's threshold voltage. Thus, the second HV_DEPFET 1648*b* gate voltage will be about 4.6V lower than the $V_{Higher\text{-}Driver}$ node voltage. Similarly, the voltage on the γ node 1646 will settle at approximately 5V lower than the $V_{Higher\text{-}Driver}$ node 1614 voltage plus the magnitude of two HV_DEPFET threshold voltages, or about 4.2V lower than the $V_{Higher\text{-}Driver}$ node voltage.

Because the first and second stage HV_DEPFETs 1648*a*, 1648*b*, only have Cascode transistors 1652*a*, 1652*b*, and 500Ω ballast resistors 1654*a*, 1654*b* in series with their drains, there may be concern of excessive leakage from the Pos-Neg pin 1602 through the $V_{Higher\text{-}Driver}$ node 1614 and then through the first and second stage HV_DEPFETs 1648*a*, 1648*b*. However, with their elevated gate voltages, the pair of second HV_DEPFETs 1648*b* will have lower voltages across their respective source pull-up strings 1650*b* than the voltage that will appear across the gate pull-up string of the first stage connected to the gate of the first HV_DEPFET 1648*a*. Thus, the pair of second HV_DEPFETs 1648*b* will have less leakage current than the first stage's gate pull-up string 1650*a*. If need be, in order to further reduce leakage, the number of diode-connected transistors in the string connected to the second HV_DEPFETs' 1648*b* source and the number of diode-connected transistors in the string connected to the first HV_DEPFETs 1648*a* source may each be increased from three transistors to four.

When the Pos-Neg pin 1602 voltage is positive, the turn on acceleration circuit shown in FIG. 16B is expected to limit the delay in equalizing the $V_{Higher\text{-}Driver}$ node 1614 voltage and Pos-Neg pin 1602 voltage to about 4 µSec.

An alternative embodiment, for pulling down the γ node 1646 involves using the ground path to the $V_{Higher\text{-}Driver}$ node 1614 through DN-well biasing transistors M2 and M4. The transistors in this path have an estimated time to turn on of about 5 µSec when the Pos-Neg pin 1602 is pulsed low. During normal operation, that time is likely acceptable.

Finally, as in embodiments of the ESD protection circuit described above, during normal operation, at times when the Pos-Neg pin 1602 is not driven by a signal that is external to the chip, positive voltages that are applied to the $V_{Higher\text{-}Driver}$ node 1614 by the chip's internal circuitry, are transferred to the Pos-Neg pin 1602. This is because the partitioned HV_DEPFETs 1608 with ballast resistors 1620 will be turned ON when the $V_{Higher\text{-}Driver}$ node 1614 is positive. Those HV_DEPFETs 1608 will pass the $V_{Higher\text{-}Driver}$ node 1614 voltage to the Pos-Neg pin 1602.

Figure 16C:
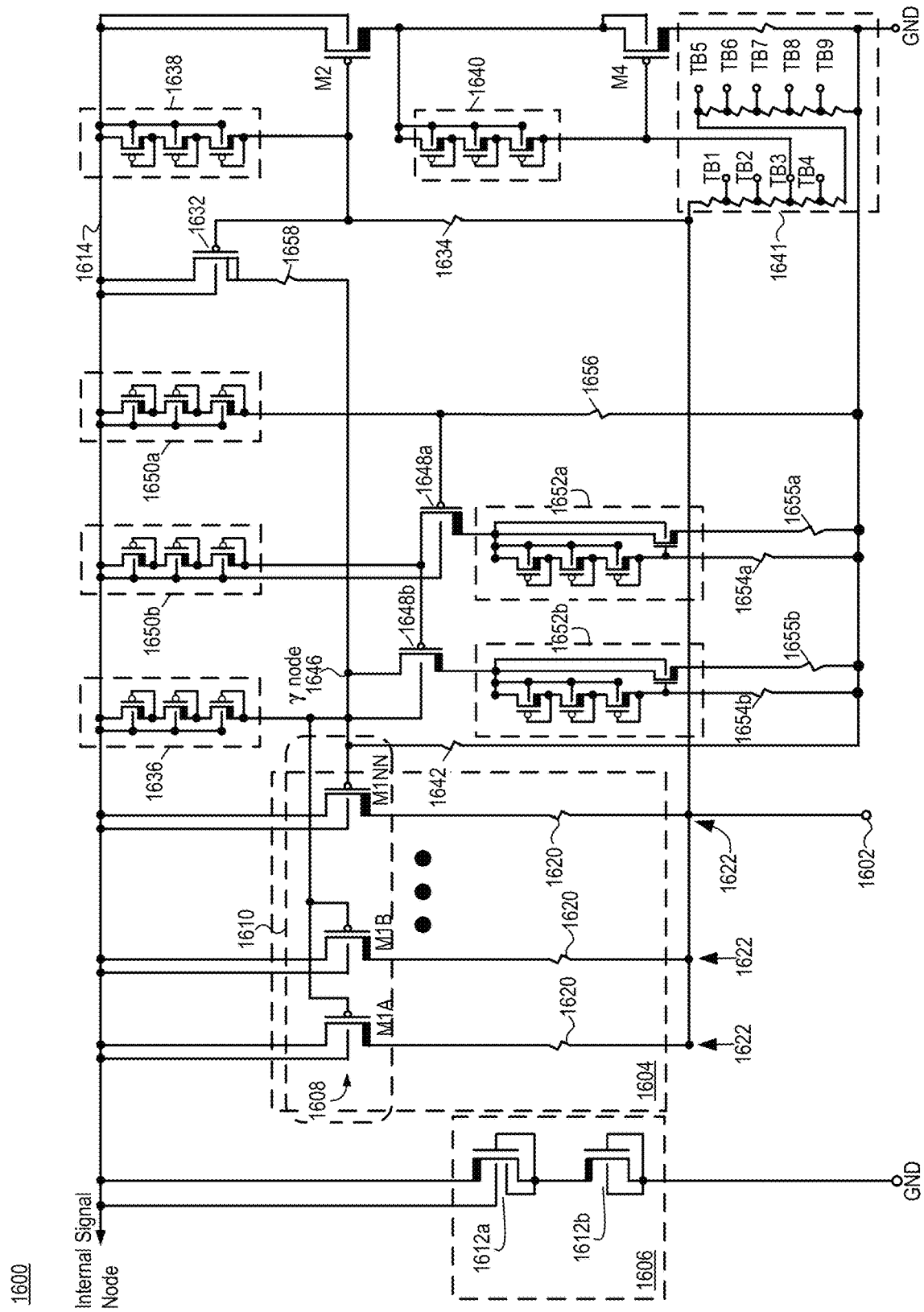
FIG. 16C is a schematic diagram illustrating an embodiment of the ESD protection circuit similar to FIG. 16B and further including a turn on acceleration network modified for negative voltage clamping.
Figure 17A:
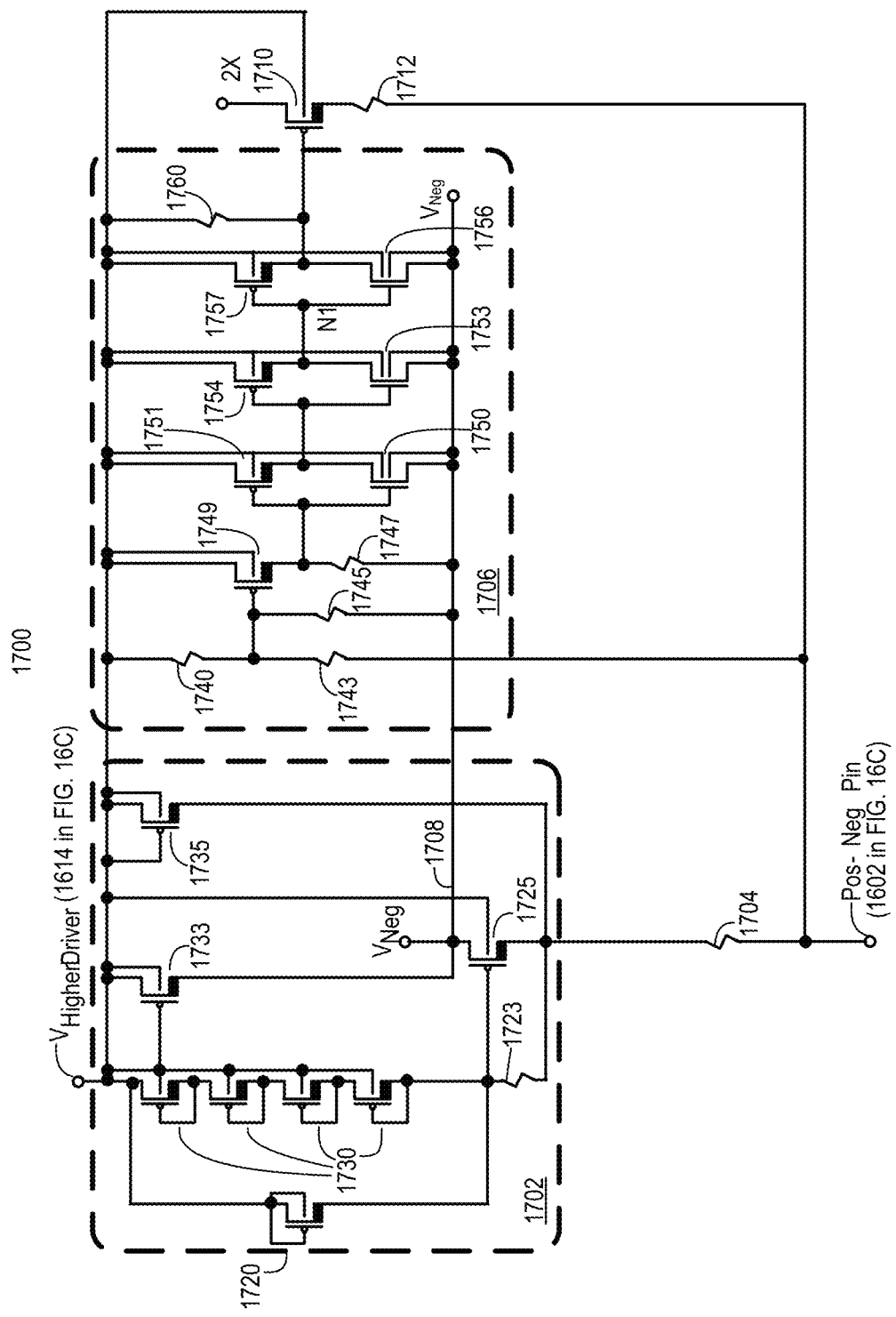
FIG. 17A is a schematic diagram illustrating an embodiment of a sensor circuit for sensing large negative pulses, and suitable for use with the ESD protection circuit of FIG. 16C.

FIG. 16C is a schematic diagram illustrating an embodiment of the ESD protection circuit similar to that of FIG. 16B further including a turn on acceleration network modified for negative voltage clamping. FIG. 17A is a schematic diagram illustrating an embodiment of a sensor 1700 for large negative pulses suitable for use with the ESD protection circuit of FIG. 16C. The ESD protection circuit 1600 of FIG. 16C and sensor circuit of FIG. 17A provide clamping for smaller negative voltages than do the circuits shown in FIGS. 16A and or 16B. Clamping at smaller (smaller magnitude) negative voltages may, for example, be useful if clamping is required at voltages that are not as negative as would be needed for causing the diodes from the p-type drains of HV_DEPFETs 1608 to go into junction breakdown with their underlying DN-wells 1610.

Referring to FIG. 17A the sensor circuit 1700 generally includes a $V_{Higher\text{-}Driver}$ acceleration bias portion 1702 coupled between the $V_{Higher\text{-}Driver}$ node 1614 of ESD protection circuit 1600 of FIG. 16C and the Pos-Neg pin 1602 through a large, 125KΩ ballast resistor 1704, a multi-stage detector 1706 coupled between the $V_{Higher\text{-}Driver}$ node 1614 and a negative voltage ($V_{Neg}$) node 1708, and an output pull-down transistor 1710 and series resistor 1712, the series combination of the output pull-down transistor 1710 and series resistor 1712, coupled between the Pos-Neg pin 1602 and the γ node 1646 of the circuit of FIG. 16C. Note that the γ node 1646 of the circuit of FIG. 16C is coupled to the gates of FIG. 16C's plural HV_DEPFETs 1608.

When the Pos-Neg Pin 1602 voltage is more than 8 volts below ground (non-limiting example), the $V_{Higher\text{-}Driver}$ acceleration bias portion 1702 uses the Pos-Neg Pin 1602 voltage and the $V_{Higher\text{-}Driver}$ 1614 voltage to create the $V_{Neg}$ 1708 voltage. The circuitry in the $V_{Higher\text{-}Driver}$ acceleration bias portion 1702 is commonly adjusted to make the voltage on the $V_{Neg}$ node 1708 roughly 5 volts below ground (non-limiting example). $V_{Higher\text{-}Driver}$ acceleration bias portion 1702 comprises a HV_DEPFET 1720 that prevents the gate of bias output HV_DEPFET 1725 from attaining a voltage that is appreciably higher than that of the $V_{Higher\text{-}Driver}$ node 1614. HV_DEPFETs 1730 provide a plurality of threshold voltage drops from the $V_{Higher\text{-}Driver}$ node 1614 to the gate of bias output HV_DEPFET 1725. The gates of each of the HV_DEPFETs 1730 are connected to their respective drains while the DNWells of each of the HV_DEPFETs 1730 are connected to the $V_{Higher\text{-}Driver}$ node 1614. The source of the first HV_DEPFET 1730 is connected to the $V_{Higher\text{-}Driver}$ node 1614. The drain of the first HV_DEPFET 1730 is connected to the source of the second HV_DEPFET 1730. The drain of the second HV_DEPFET 1730 is connected to the source of the third HV_DEPFET 1730. The drain of the third HV_DEPFET 1730 is connected to the source of the fourth HV_DEPFET 1730. And, the drain of the fourth HV_DEPFET 1730 is connected to the gate of bias output HV_DEPFET 1725. The gate of bias output HV_DEPFET 1725 is pulled down and further biased by a resistor, 1723. Resistor 1723 connects from the gate of bias output HV_DEPFET 1725 to the drain of bias output HV_DEPFET 1725. The drain of bias output HV_DEPFET 1725 is further pulled down in voltage by bias resistor, 1704, connecting from the drain of bias output HV_DEPFET 1725 to the Pos-Neg Pin 1602.

HV_DEPFET 1733 prevents the $V_{Neg}$ node 1708 from attaining a voltage that is appreciably higher than that of the $V_{Higher\text{-}Driver}$ node 1614. HV_DEPFET 1735 prevents the drain of bias output HV_DEPFET 1725 from attaining a voltage that is appreciably higher than that of the $V_{Higher\text{-}Driver}$ node 1614. The DN-well bodies of HV_DEPFETs 1720, 1730, 1725, 1733, and 1735 all connect to the $V_{Higher\text{-}Driver}$ node 1614.

Resistors in the sensor's 1700 multi-stage detector 1706 act together to determine the voltage on the gate of HV_DEPFET 1749. This gate voltage is made up of contributions by the voltages on the $V_{Higher\text{-}Driver}$ node 1614, the Pos-Neg Pin 1602, and the $V_{Neg}$ 1708 node. When the voltage on the Pos-Neg Pin 1602 is appreciably below the voltage of the $V_{Higher\text{-}Driver}$ node 1614, the voltage on the gate of HV_DEPFET 1749 will have dropped enough to turn on the HV_DEPFET 1749. Resistor 1740 (with a non-limiting exemplary value of 10K ohms), resistor 1743 (with a non-limiting exemplary value of 320K ohms), and resistor 1745 (with a non-limiting exemplary value of 160K ohms) determine the voltage on the gate of HV_DEPFET 1749. Resistor 1740 connects from the gate of detector HV_DEPFET 1749 to the $V_{Higher\text{-}Driver}$ node 1614, resistor 1743 connects from the gate of detector HV_DEPFET 1749 to the Pos-Neg Pin 1602, and resistor 1745 connects from the gate of detector HV_DEPFET 1749 to the $V_{Neg}$ node 1708. HV_DEPFET 1749 turns on if its gate voltage goes more than a HV_DEPFET transistor threshold voltage below the voltage of $V_{Higher\text{-}Driver}$ node 1614. This turn on condition will happen if the voltage of the Pos-Neg pin 1602 goes to a large enough negative voltage to pull down on the gate of HV_DEPFET 1749 through resistor 1743. Again, the resistors 1740, 1743, and 1745 act together to determine the voltage on the gate of HV_DEPFET 1749.

HV_DEPFET 1749 has its source and DN-well connected to $V_{Higher\text{-}Driver}$ node 1614, and its drain connected to one end of resistor 1747 (with a non-limiting exemplary value of 200K ohms). The other end of resistor 1747 is connected to the $V_{Neg}$ node 1708. HV_DEPFET 1749, resistor 1747, and their connections form the first stage of the multi-stage detector 1706. Again, when the voltage on the Pos-Neg pin 1602 goes to a value that is appreciably negative relative to the voltage on the $V_{Higher\text{-}Driver}$ node 1614, HV_DEPFET 1749 turns on and pulls up the voltage on the end of resistor 1747 that is connected to the drain of HV_DEPFET 1749.

A first inverter, comprised of HV_DEPFET 1751 and NFET 1750, takes its input from the drain of HV_DEPFET 1749. This inverter is the second stage of the multi-stage detector. The source and DN-well body of HV_DEPFET 1751 are connected to the $V_{Higher\text{-}Driver}$ node 1614. As noted, the gate of HV_DEPFET 1751 is connected to the gate of NFET 1750. The drains of HV_DEPFET 1751 and NFET 1750 are connected to each other and form the output of the detector second stage and the first inverter, the inverter comprised of HV_DEPFET 1751 and NFET 1750. The NFET 1750 is an N-channel MOSFET formed in a PWell. The PWell is itself formed in a deep N-well (DN-well). The deep N-well is formed in the technology's p-substrate. The source and P-well of NFET 1750 are connected to the $V_{Neg}$ node 1708. The NFET's 1750 deep N-well is connected to the $V_{Higher\text{-}Driver}$ node 1614.

Likewise, a second inverter, the third stage of the multi-stage detector, is comprised of HV_DEPFET 1754 and NFET 1753, and takes its input from the drain of HV_DEPFET 1751 and the drain of NFET 1750. The source and DN-well body of HV_DEPFET 1754 are connected to the $V_{Higher\text{-}Driver}$ node 1614. The gate of HV_DEPFET 1754 is connected to the gate of NFET 1753 and forms the input to the third stage of the multi-stage detector, which is also the input to the second inverter. The second inverter is comprised of HV_DEPFET 1754 and NFET 1753. The drains of HV_DEPFET 1754 and NFET 1753 are connected to each other and form the output of the second inverter, comprised of HV_DEPFET 1754 and NFET 1753. This output of the second inverter is the output of the third stage of the multi-stage detector. The NFET 1753 is an N-channel MOSFET formed in a PWell. That PWell is itself formed in a deep N-well. The deep N-well is formed in the technology's p-substrate. The source and P-well of NFET 1753 are connected to the $V_{Neg}$ node 1708. The NFET's 1753 deep N-well is connected to the $V_{Higher\text{-}Driver}$ node 1614.

A third inverter, the fourth stage of the multi-stage detector, is comprised of HV_DEPFET 1757 and NFET 1756, and takes its input from the drain of HV_DEPFET 1754 and the drain of NFET 1753. The source and DN-well body of HV_DEPFET 1757 are connected to the $V_{Higher\text{-}Driver}$ node 1614. The gate of HV_DEPFET 1757 is connected to the gate of NFET 1756 and forms the input to the fourth stage of the multi-stage detector, which is also the input to the third inverter. The third inverter is comprised of HV_DEPFET 1757 and NFET 1756. The drains of HV_DEPFET 1757 and NFET 1756 are connected to each other and form the output of the third inverter, comprised of HV_DEPFET 1757 and NFET 1756. This output of the third inverter is the output of the fourth stage of the multi-stage detector. The NFET 1756 is an N-channel MOSFET formed in a PWell. That PWell is itself formed in a deep N-well. The deep N-well is formed in the technology's p-substrate. The source and P-well of NFET 1756 are connected to the $V_{Neg}$ node 1708. The NFET's 1756 deep N-well is connected to the $V_{Higher\text{-}Driver}$ node 1614.

The widths of the transistors in the detector third stage and second inverter are larger than the widths of the transistors in the detector second stage and first inverter. The widths of the transistors in the detector fourth stage and third inverter are larger than the widths of the transistors in the detector third stage and second inverter. This widening of the transistors in going from the first inverter to the second inverter and from the second inverter to the third inverter (and from the detector second stage to the detector third stage and from the detector third stage to the detector fourth stage) is done so that the output impedance of the third inverter (detector fourth stage) is small. This is done so that the output drive strength of the third inverter (detector fourth stage) will be strong and can adequately drive the gate of the output transistor HV_DEPFET 1710.

The output of the third inverter (detector fourth stage) drives the gate of HV_DEPFET 1710. The source of HV_DEPFET 1710 connects to the γ node 1646, which is connected to the gates of the HV_DEPFETs 1608 in the circuit of FIG. 16C. The drain of HV_DEPFET 1710 is connected to resistor 1712. The other end of resistor 1712 is connected to the Pos-Neg pin 1602. Resistor 1712 has a non-limiting exemplary value of 500 ohms.

Resistor 1760 is connected from the output of the third inverter (detector fourth stage), the inverter that is comprised of HV_DEPFET 1757 and NFET 1756, to the $V_{Higher\text{-}Driver}$ node 1614. Resistor 1760 has a non-limiting exemplary value of 125K ohms.

When, during an ESD event, the voltage on the Pos-Neg pin 1602 goes to a value, for example −32V (non-limiting example), that is appreciably negative relative to the voltage on the $V_{Higher\text{-}Driver}$ node 1614, HV_DEPFET 1749 turns on and pulls up the voltage on the end of resistor 1747 that is connected to the drain of HV_DEPFET 1749. This drain node is also connected to the gates of HV_DEPFET 1751 and NFET 1750, the input of the first inverter (and detector second stage), the inverter comprised of HV_DEPFET 1751, and NFET 1750. So, when the voltage on the Pos-Neg pin 1602 goes to a value that is appreciably negative relative to the voltage on the $V_{Higher\text{-}Driver}$ node 1614, the voltage on the gates of HV_DEPFET 1751 and NFET 1750, the input of the first inverter (and detector second stage), are pulled up to a voltage that is at least an NFET threshold voltage above the voltage on the $V_{Neg}$ node 1708, and up to a voltage that is to within an HV_DEPFET threshold voltage of the voltage on the $V_{Higher\text{-}Driver}$ node 1614.

The voltage on the output of the first inverter (detector second stage), the voltage on the drains of HV_DEPFET 1751 and of NFET 1750, goes to the voltage on the $V_{Neg}$ node 1708, or to about −5 volts below the voltage of the $V_{Higher\text{-}Driver}$ node 1614. This output voltage of the first inverter (detector second stage) pulls down the input voltage of the second inverter (comprised of HV_DEPFET 1754, and NFET 1753) (detector third stage) and causes the output voltage of the second inverter (detector third stage), the voltage on the drains of HV_DEPFET 1754, and NFET 1753, to go to the voltage of the $V_{Higher\text{-}Driver}$ node 1614. With the output voltage of the second inverter, (output voltage of the detector third stage, and the voltage on the drains of HV_DEPFET 1754, and NFET 1753), going to the voltage of the $V_{Higher\text{-}Driver}$ node 1614, the output voltage of the third inverter (output voltage of the detector fourth stage, and the voltage on the drains of HV_DEPFET 1757, and NFET 1756), goes to the voltage on the $V_{Neg}$ node 1708. The voltage on the $V_{Neg}$ node 1708 is about −5 volts below the voltage of the $V_{Higher\text{-}Driver}$ node 1614. This third inverter output (detector fourth stage output) goes to the $V_{Neg}$ 1708 voltage because the input of the third inverter (detector fourth stage input) is connected to the output of the second inverter (detector third stage output).

Taking the output of the third inverter (output of the detector fourth stage of the multi-stage detector) to the voltage of the $V_{Neg}$ node 1708, or to about −5 volts below the voltage of the $V_{Higher\text{-}Driver}$ node 1614, causes HV_DEPFET 1710 to turn on and pull down the voltage on the γ node 1646. This pulls down the voltage on the gates of the HV_DEPFETs 1608 in the circuit of FIG. 16C. Pulling down the voltage of the gates of the HV_DEPFETs 1608, in the circuit of FIG. 16C, to a level that is negative relative to the voltage of the $V_{Higher\text{-}Driver}$ node 1614, by at least an HV_DEPFET threshold voltage causes the HV_DEPFETs 1608 in the circuit of FIG. 16C to turn on and clamp the voltage of the Pos-Neg pin 1602 to the voltage of the $V_{Higher\text{-}Driver}$ node 1614.

Further, note that, in the circuit of FIG. 16C, the $V_{Higher\text{-}Driver}$ node 1614 is connected to the NFET clamp 1606. Again, NFET clamp 1606 includes a first, isolated HV_DENFET 1612a and a second, non-isolated HV_DENFET 1612b coupled in series between the PFET clamp 1604 and ground (GND). The above sequence, that of turning on HV_DEPFET 1710 and HV_DEPFET transistors 1608, leads to the N-type drain of NFET clamp transistor 1612a being indirectly connected to Pos-Neg pin 1602. This connection leads to any excessive negative voltage on the Pos-Neg pin 1602 being shunted to ground through the NFET clamp 1606.

In the circuit of FIG. 17A, the role of resistor 1760 is to pull up the gate of HV_DEPFET 1710, and shut off HV_DEPFET 1710 when the voltage on the Pos-Neg pin 1602, the voltage on the $V_{Higher\text{-}Driver}$ node 1614, and the voltage on the $V_{Neg}$ node 1708 are close enough together that the transistors in the circuit of FIG. 17A will not operate. This non-operating condition occurs when the voltage on the Pos-Neg pin 1602, the voltage on the $V_{Higher\text{-}Driver}$ node 1614, and the voltage on $V_{Neg}$ node 1708 are within a HV_DEPFET threshold voltage or an NFET threshold voltage of each other. This condition can happen (for example) when the Pos-Neg pin 1602 voltage is greater than ground voltage.

It is important to note that, like the circuits of FIGS. 16A, 16B, and 16C, the circuit of FIG. 17A does not connect any N-type diffusions (neither N+ nor N-wells) to the Pos-Neg pin 1602. By avoiding connections of N-type diffusions to the Pos-Neg pin 1602, and by avoiding connections of N-wells to the Pos-Neg pin 1602, the circuit of FIGS. 16C and 17A avoid problems associated with forward biasing n-type diffusions to a p-substrate, and forward biasing n-type diffusions to P-wells. Otherwise, forward biasing of such junctions could, occur with fast ramp applications of negative voltages to the Pos-Neg pin 1602.

Additionally, FIGS. 16C, and 17A further enable the use of an explicit negative ESD pulse protection capability to the circuit of FIG. 16B by adding a resistor 1658 to the γ node 1646 end of the shut off acceleration transistor 1632. This resistor, 1658, allows the circuit in FIG. 17A to more easily pull down the voltage on FIG. 16C's γ node 1646.

When the Pos-Neg pin 1602 goes to approximately 32V below ground potential (non-limiting example), the sensor circuit 1700 in FIG. 17A attempts to pull the γ node 1646 to a voltage that is approximately 5V below $V_{GND}$. Note that, with the Pos-Neg pin's 1602 voltage below ground potential, the $V_{Higher\text{-}Driver}$ node 1614 voltage will also go to ground potential. So, when the Pos-Neg pin 1602 goes to −32V below $V_{GND}$, the Pos-Neg pin's 1602 voltage will also be at −32V below the voltage of the $V_{Higher\text{-}Driver}$ node 1614. Similarly, when the Pos-Neg pin 1602 goes to −32V below $V_{GND}$, the sensor circuit 1700 in FIG. 17A attempts to pull the γ node 1646 to a voltage that is approximately 5V below the voltage of the $V_{Higher\text{-}Driver}$ node 1614. The shut off acceleration transistor 1632 will counteract this γ node 1646 pull down so the actual pull-down voltage of the γ node may be as little as 2.5V below $V_{Higher\text{-}Driver}$ node 1614.

The voltage pull-down capability of the circuits of FIGS. 16C and 17 can be increased by adding more output pull-down transistors 1710, and their associated 500Ω ballast resistors 1712, in parallel with the output pull-down transistors 1710, and their associated 500Ω ballast resistors 1712, shown in FIG. 17A.

Adding the resistor 1658 to the γ node 1646 in FIG. 16C and adding the sensor circuit 1700 of FIG. 17A incur a relatively small increase, of from 15 to 25%, in total circuit layout area to the ESD protection circuit 1600. These modifications add only a minimal number of control transistors to the circuit of FIG. 16B. The layout area of the overall circuit is more compact because the HV_DEPFETs 1608 and HV_DENFETs 1612a, 1612b of the circuits of FIGS. 16C, and 17A are used for both positive and negative voltage clamping.

Like the circuits of FIGS. 15, and 16A, the ESD protection circuit 1600 of FIG. 16C, combined with the sensor circuit 1700 of FIG. 17A, enables use of the clamping HV_DEPFETs 1608 in passing signals between the chip's interior circuitry and the Pos-Neg pin 1602 during normal operation. In this way, the ESD protection circuit 1600 of FIG. 16C, combined with the sensor circuit 1700 of FIG. 17A, serve as a bidirectional interface.

In normal operation, with the Pos-Neg pin 1602 voltage between ground and 40V, the ESD protection circuit 1600 of FIG. 16C operates in substantially the same way as the ESD protection circuit in FIG. 16B, and also largely in the same way as the ESD protection circuit of FIG. 16A. Under these same conditions, the sensor circuit 1700 in FIG. 17A will have a Pos-Neg pin voltage and a $V_{Higher\text{-}Driver}$ node voltage at very close to the same level as each other. Thus, during normal operation, there will be little to no voltage dropped across the sensor circuit. The gate, of the sensor circuit 1700 output transistor HV_DEPFET 1710 (FIG. 17A), will also be at approximately the Pos-Neg pin voltage when the circuit is in steady-state. Under normal operation steady state conditions, the output transistor HV_DEPFET 1710 will be OFF. In steady state, the FIG. 16C circuit's turn on acceleration network will pull-down the voltage of the γ node 1646 to approximately 5V below the voltage of the $V_{Higher\text{-}Driver}$ node 1614. With the output transistor 1710 of FIG. 17A turned OFF, the sensor circuit 1700 will have little to no effect upon the ESD protection circuit 1600 of FIG. 16C other than to add a minor amount of capacitance to FIG. 16C's γ node 1646.

Also, during normal operation, during times when the Pos-Neg pin 1602 is not driven by a signal that is external to the chip, positive voltages that are applied to the $V_{Higher-Driver}$ node 1614 by the chip's internal circuitry, are transferred to the Pos-Neg pin. This is because the HV_DEPFETs 1608 will be turned on when the $V_{Higher-Driver}$ node is positive, and will pass the $V_{Higher-Driver}$ voltage to the Pos-Neg pin 1602.

During transients, when the Pos-Neg pin 1602 voltage is quickly rising, the voltage rise of the $V_{Higher-Driver}$ node 1614 may lag the voltage rise of the Pos-Neg pin. Under such conditions, the source voltage (γ node 1646 voltage) of the output transistor, HV_DEPFET 1710, in the circuit of FIG. 17A, will be limited to the $V_{Higher-Driver}$ node 1614 voltage or to a lesser voltage by a source to DN-well junction diode formed in the output transistor, HV_DEPFET 1710, and by the 500Ω resistor 1712, between the drain of the transistor and the Pos-Neg pin 1602. Note, that the DN-well body of the output transistor 1710 is connected to the $V_{Higher-Driver}$ node 1614. In the FIG. 16C portion of the circuit, the γ node 1646 voltage will tend to be pulled down by the turn on acceleration network.

When the Pos-Neg pin 1602 voltage is positive and somewhat higher than the voltage on the $V_{Higher-Driver}$ node 1614, and if it is determined that the lateral parasitic PNP transistor, formed in the sensor circuit's 1700 output transistor 1710, is allowing the Pos-Neg pin 1602 voltage to pull up too much on the γ node 1646 voltage, then the second HV_DEPFET 1648b of the turn on acceleration circuit's second stage can be strengthened by placing more transistors and or resistors in parallel with that second stage.

In ESD events, where the Pos-Neg pin 1602 voltage is pulled to above positive 55V, the voltage on the $V_{Higher-Driver}$ node 1614 will rise to a level that is high enough to trigger the cascoded HV_DENFETs 1612a, 1612b of the NFET clamp 1606 at about 50V. Under such conditions, the HV_DEPFETs 1608 will forward bias to the underlying DN-well and the voltage on the Pos-Neg pin 1602 will either discharge via the HV_DENFETs 1612a, 1612b of the NFET clamp 1606, or to the substrate via the vertical PNP transistor 1360 in the HV_DEPFETs 1608. Thus, to ensure proper functioning of the above circuits, adequate local substrate tapping is desirable.

In steady state normal operation, when the Pos-Neg pin 1602 voltage is between ground and −28V, the circuit in FIG. 16C will operate similarly to the circuits in FIGS. 16A and 16B. In the circuit of FIG. 17A, a $V_{Neg}$ node voltage will pull down to approximately 5V below the ground potential on the $V_{Higher-Driver}$ node. When the Pos-Neg pin 1602 voltage is less than ground, the $V_{Neg}$ node supplies a logic low level to the inverter buffers at the right side of the sensor circuit 1700 (multi-stage detector 1706 stages two, three and four). Also, in normal operation, i.e., with the Pos-Neg Pin voltage between ground (GND) and −28V, 10KΩ resistor 1740, 320KΩ resistor 1743, and 160 KΩ resistor 1745 of the sensor circuit 1700 provide a near ground potential to the gate of the HV_DEPFET 1749. The HV_DEPFET 1749 remains turned off, and the following inverter stages supply a near ground potential to the gate of output transistors HV_DEPFET 1710. Placing a ground potential on the gate of this transistor keeps the transistor turned OFF (this is because the source of the transistor, γ node 1646, is also at ground potential).

With the Pos-Neg pin 1602 subjected to fast-fall-time negative voltages that remain above −28V, the sensor circuit of FIG. 17A's responses are limited by the circuit's resistances and capacitances. It is expected that the sensor circuit will respond and stabilize in a matter of less than about a micro-second (non-limiting example).

In a negative voltage ESD event, the Pos-Neg pin 1602 voltage will drop to 32V (non-limiting example) or more below the voltage of the $V_{Higher-Driver}$ node 1614 (nominally at ground potential). In the sensor circuit 1700 of FIG. 17A, the $V_{Neg}$ node 1708 voltage will pull down to approximately 5V below the $V_{Higher-Driver}$ node 1614 voltage (approximately 5V below ground). When the Pos-Neg Pin voltage is less than ground, the $V_{Neg}$ node 1708 supplies a logic low level to the inverter buffers (NFETs 1750, 1753, and 1756, and HV_DEPFETs 1751, 1754, and 1757). In response to the voltage drop of 32 volts or more below the voltage of the $V_{Higher-Driver}$ node, the 10KΩ resistor 1740, 160KΩ resistor 1745, and the 320KΩ resistor 1743, apply a pulled down voltage to the gate of the HV_DEPFET 1749 in the first stage of the multi-stage detector. That pulled down voltage is negative relative to the voltage of the $V_{Higher-Driver}$ node 1614. This HV_DEPFET 1749, and the 200KΩ resistor 1747, connected thereto, form the first stage of the four stages of the multi-stage detector's output transistor gate control. When the negative voltage on the Pos-Neg pin becomes large enough (below −32V), the gate of the HV_DEPFET 1749 in FIG. 17A's detector first stage is pulled low enough to raise the voltage across the detector first stage's 200KΩ resistor 1747. The increasing voltage across the 200KΩ resistor 1747 becomes large enough to flip (change the logical polarity of) the output voltage of the detector second stage (NFET 1750 ON, and HV_DEPFET 1751 OFF). The detector third and fourth stages (comprising HV_DEPFETs 1754, and 1757, and NFETs 1753, and 1756) also flip and the output transistor is turned on. Turning on the output transistor pulls down the voltage, of the FIG. 16C circuit's γ node 1646. This turns on the HV_DEPFETs 1608 that connect the Pos-Neg Pin 1602 to the $V_{Higher-Driver}$ node 1614. The $V_{Higher-Driver}$ node 1614 is indirectly connected to the chip ground through the $V_{Higher-Driver}$ node's 1614 deep N-well to p-substrate junctions, and also through the upper of the HV_DENFET clamp transistors 1612a. The clamp transistor 1612a drain is formed from deep N-well. That deep N-well's junction to the substrate also grounds the $V_{Higher-Driver}$ node 1614 when the voltage on the $V_{Higher-Driver}$ node 1614 begins to move to a value that is less than ground.

Figure 17B:
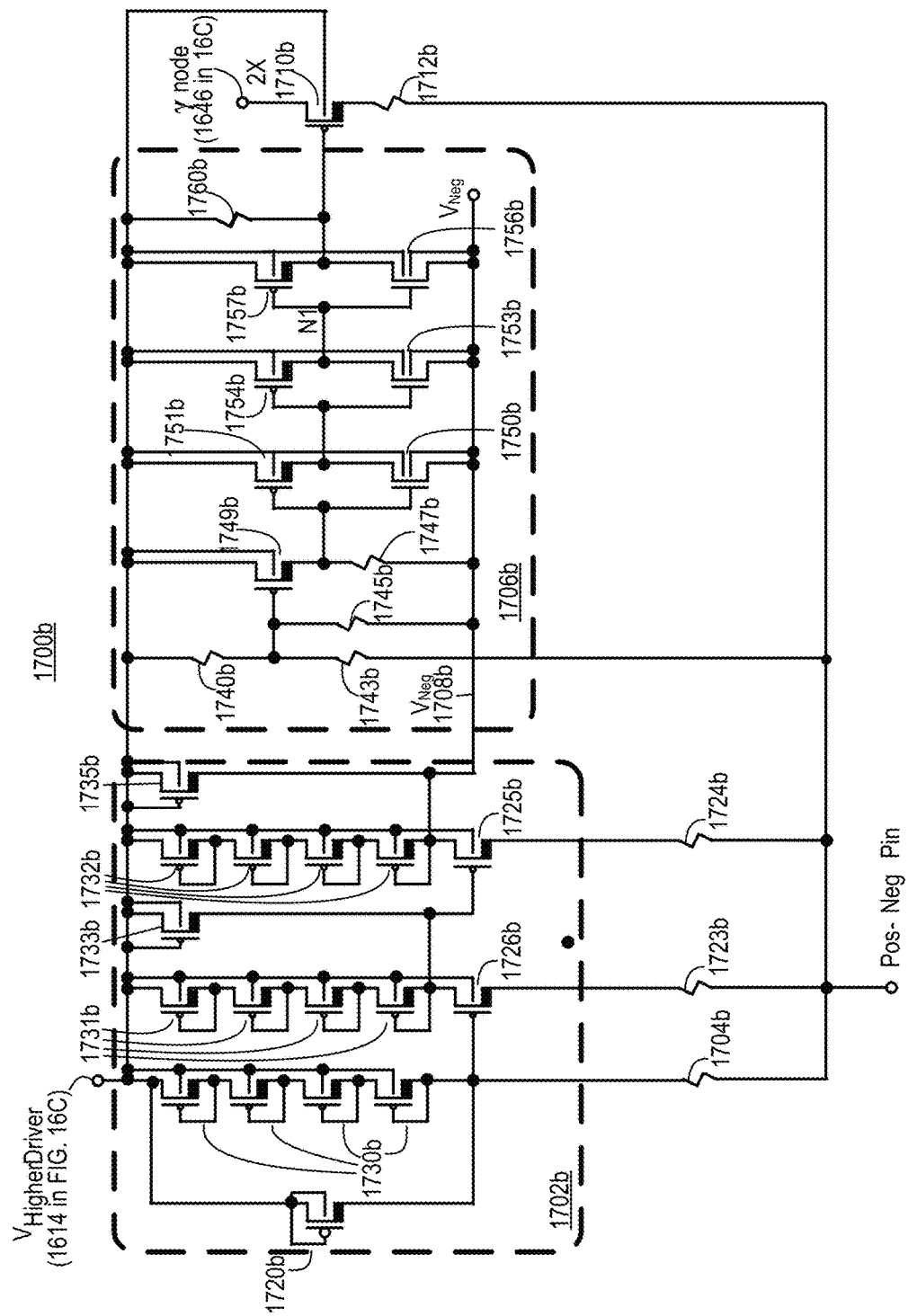
FIG. 17B is a schematic diagram illustrating an embodiment of an accelerated sensor circuit similar to that of FIG. 17A further including additional transistors in an acceleration bias portion of the sensor circuit.

FIG. 17B is a schematic diagram illustrating another embodiment of an accelerated sensor similar to that of FIG. 17A further including additional transistors in an acceleration bias portion 1702b of the sensor circuit 1700b. Referring to FIG. 17B, the additional transistors and resistors (1731b, 1732b, 1726b, 1725b, 1723b, and 1724b) in the acceleration bias portion 1702b will bring the $V_{Neg}$ 1708b bias to a stable level below that of the $V_{Higher-Driver}$ node 1614 voltage in a much shorter time than will the acceleration bias portion (1702) of the circuit 1700 of FIG. 17A. Generally, the sensor circuit 1700b of FIG. 17B is capable of stabilizing the $V_{Neg}$ 1708b bias at a voltage level below that of the $V_{Higher-Driver}$ node 1614 in about 55 nsec, as compared to about 475 nsec for the circuit shown in FIG. 17A. Although the 55 nSec time is a longer delay time than the shortest delay time that could be achieved, the longer delay time is desirable in order to keep the value of the first bias stage pull-down resistor 1704b at a resistance value, (100KΩ), that will not admit an unacceptably large leakage current during normal operation.

With the Pos-Neg Pin (Pos-Neg Pin 1602 in FIG. 16C) at −28 volts, the Pos-Neg pin leakage through the resistance will be 230 uA. Leakages in the second and third bias stages should be somewhat less than 230 uA each because their strings of diode-connected HV_DEPFETs (four HV_DEPFETs in each string) will have less voltage across them than will the diodes in the detector first stage's string of diode-connected HV_DEPFETs. The gate voltages of the bottom-most HV_DEPFETs in the second and third stages will be at higher voltages than the detector first stage bias node. This detector first stage bias node is the node that is at the upper end of the detector first stage's 100KΩ resistor. The 320 KΩ and 10 KΩ resistances in the detection string should leak about 85 uA. Altogether, the circuit is roughly estimated to leak 500 uA to 700 uA when the Pos-Neg Pin voltage is at −28 volts. When the Pos-Neg Pin voltage is greater than the ground voltage, the $V_{Higher-Driver}$ voltage and the Pos-Neg Pin voltage will stabilize to the same level. There should be very little leakage under this condition.

Referring to FIG. 17B the sensor circuit 1700b generally includes a $V_{Higher-Driver}$ acceleration bias portion 1702b coupled between the $V_{Higher-Driver}$ node 1614 of ESD protection circuit 1600 of FIG. 16C and the Pos-Neg pin 1602 through a 125KΩ ballast resistor 1704b, two 500Ω resistors 1723b and 1724b, a multi-stage detector 1706b coupled between the $V_{Higher-Driver}$ node 1614 and a negative voltage ($V_{Neg}$) node 1708b, and an output pull-down transistor 1710b and series resistor 1712b, the series combination of the output pull-down transistor 1710b and series resistor 1712b, coupled between the Pos-Neg pin 1602 and the γ node 1646 of the circuit of FIG. 16C. Note that the γ node 1646 of the circuit of FIG. 16C is coupled to the gates of FIG. 16C's plural HV_DEPFETs 1608.

When the Pos-Neg Pin 1602 voltage is more than 8 volts below ground (non-limiting example), the $V_{Higher-Driver}$ acceleration bias portion 1702b uses the Pos-Neg Pin 1602 voltage and the $V_{Higher-Driver}$ 1614 voltage to create the $V_{Neg}$ 1708b voltage. The circuitry in the $V_{Higher-Driver}$ acceleration bias portion 1702b is commonly adjusted to make the voltage on the $V_{Neg}$ node 1708b roughly 5 volts below ground (non-limiting example).

HV_DEPFETs 1730b provide a plurality of threshold voltage drops from the $V_{Higher-Driver}$ node 1614 to the gate of bias HV_DEPFET 1726b. The gates of each of the HV_DEPFETs 1730b are connected to their respective drains while the DNWells of each of the HV_DEPFETs 1730b are connected to the $V_{Higher-Driver}$ node 1614. The source of the first HV_DEPFET 1730b is connected to the $V_{Higher-Driver}$ node 1614. The drain of the first HV_DEPFET 1730b is connected to the source of the second HV_DEPFET 1730b. The drain of the second HV_DEPFET 1730b is connected to the source of the third HV_DEPFET 1730b. The drain of the third HV_DEPFET 1730b is connected to the source of the fourth HV_DEPFET 1730b. And, the drain of the fourth HV_DEPFET 1730b is connected to the gate of bias HV_DEPFET 1726b.

The gate of bias HV_DEPFET 1726b is pulled down and further biased by a resistor, 1704b. A non-limiting exemplary value of resistor 1704b is 100KΩ. The drain of bias HV_DEPFET 1726b is further pulled down in voltage by bias resistor, 1723b, connecting from the drain of bias HV_DEPFET 1726b to the Pos-Neg Pin 1602. A non-limiting exemplary value of resistor 1723b is 500Ω.

HV_DEPFETs 1731b provide a plurality of threshold voltage drops from the $V_{Higher-Driver}$ node 1614 to the source of bias HV_DEPFET 1726b. The gates of each of the HV_DEPFETs 1731b are connected to their respective drains while the DNWells of each of the HV_DEPFETs 1731b are connected to the $V_{Higher-Driver}$ node 1614. The source of the first HV_DEPFET 1731b is connected to the $V_{Higher-Driver}$ node 1614. The drain of the first HV_DEPFET 1731b is connected to the source of the second HV_DEPFET 1731b. The drain of the second HV_DEPFET 1731b is connected to the source of the third HV_DEPFET 1731b. The drain of the third HV_DEPFET 1731b is connected to the source of the fourth HV_DEPFET 1731b. And, the drain of the fourth HV_DEPFET 1731b is connected to the source of bias HV_DEPFET 1726b.

The voltage on the gate of bias output HV_DEPFET 1725b is pulled down by bias output HV_DEPFET's 1725b connection to the source of bias HV_DEPFET 1726b. The drain of bias HV_DEPFET 1725b is further pulled down in voltage by bias resistor, 1724b, connecting from the drain of bias HV_DEPFET 1725b to the Pos-Neg Pin 1602. A non-limiting exemplary value of resistor 1724b is 500Ω.

HV_DEPFETs 1732b provide a plurality of threshold voltage drops from the $V_{Higher-Driver}$ node 1614 to the source of bias HV_DEPFET 1725b. The gates of each of the HV_DEPFETs 1732b are connected to their respective drains while the DNWells of each of the HV_DEPFETs 1732b are connected to the $V_{Higher-Driver}$ node 1614. The source of the first HV_DEPFET 1732b is connected to the $V_{Higher-Driver}$ node 1614. The drain of the first HV_DEPFET 1732b is connected to the source of the second HV_DEPFET 1732b. The drain of the second HV_DEPFET 1732b is connected to the source of the third HV_DEPFET 1732b. The drain of the third HV_DEPFET 1732b is connected to the source of the fourth HV_DEPFET 1732b. And, the drain of the fourth HV_DEPFET 1732b is connected to the source of bias HV_DEPFET 1725b.

Generally, the widths of HV_DEPFETs 1731b are made wider than the widths of HV_DEPFETs 1731b, and the widths of HV_DEPFETs 1732b are made wider than the widths of HV_DEPFETs 1731b. Also, the width of HV_DEPFET 1725b is made wider than the width of HV_DEPFET 1726b. In this way, the output impedance of the node that is the drain of HV_DEPFET 1725b, which is also the $V_{Neg}$ node 1708b, is made low. This contributes to the node reaching a stable bias in a relatively short time (shorter time than in the circuit of FIG. 17A). Again, the sensor circuit 1700b of FIG. 17B is capable of stabilizing the $V_{Neg}$ 1708b bias at a voltage level below that of the $V_{Higher-Driver}$ node 1614 in about 55 nsec, as compared to about 475 nsec for the circuit shown in FIG. 17A.

The source of bias output HV_DEPFET 1725b provides a bias voltage to the $V_{Neg}$ node 1708b.

HV_DEPFET's 1735b gate, source and DN-well are connected to the $V_{Higher-Driver}$ node 1614. The drain of HV_DEPFET 1735b connects to the $V_{Neg}$ node 1708b. HV_DEPFET's 1735b prevents the $V_{Neg}$ node 1708b from attaining a voltage that is appreciably higher than that of the $V_{Higher-Driver}$ node 1614.

HV_DEPFET's 1733b gate, source and DN-well are connected to the $V_{Higher-Driver}$ node 1614. The drain of HV_DEPFET 1733b connects to the gate of HV_DEPFET 1725b, and prevents the gate of HV_DEPFET 1725b from attaining a voltage that is appreciably higher than that of the $V_{Higher-Driver}$ node 1614.

HV_DEPFET's 1720b gate, source and DN-well are connected to the $V_{Higher-Driver}$ node 1614. The drain of HV_DEPFET 1720b connects to the gate of HV_DEPFET 1726b, and prevents the gate of HV_DEPFET 1726b from attaining a voltage that is appreciably higher than that of the $V_{Higher-Driver}$ node 1614.

Similar to operation in the sensor circuit 1700 of FIG. 17A, resistors in FIG. 17B's sensor circuit 1700b multi-stage detector 1706b act together to determine the voltage on the gate of HV_DEPFET 1749b. This gate voltage is made up of contributions by the voltages on the $V_{Higher-Driver}$ node 1614, the Pos-Neg Pin 1602, and the $V_{Neg}$ 1708b node. When the voltage on the Pos-Neg Pin 1602 is appreciably below the voltage of the $V_{Higher-Driver}$ node 1614 (non-limiting exemplary value of −32V), the voltage on the gate of HV_DEPFET 1749b will have dropped enough to turn on the HV_DEPFET 1749b. Resistor 1740b (with a non-limiting exemplary value of 10K ohms), resistor 1743b (with a non-limiting exemplary value of 320K ohms), and resistor 1745b (with a non-limiting exemplary value of 160K ohms) determine the voltage on the gate of HV_DEPFET 1749b. Resistor 1740b connects from the gate of detector HV_DEPFET 1749b to the $V_{Higher-Driver}$ node 1614, resistor 1743b connects from the gate of detector HV_DEPFET 1749b to the Pos-Neg Pin 1602, and resistor 1745b connects from the gate of detector HV_DEPFET 1749b to the $V_{Neg}$ node 1708b. HV_DEPFET 1749b turns on if its gate voltage goes more than an HV_DEPFET transistor threshold voltage below the voltage of $V_{Higher-Driver}$ node 1614. This turn on condition will happen if the voltage of the Pos-Neg pin 1602 goes to a large enough negative voltage to pull down on the gate of HV_DEPFET 1749b through resistor 1743b. Again, the resistors 1740b, 1743b, and 1745b act together to determine the voltage on the gate of HV_DEPFET 1749b.

HV_DEPFET 1749b has its source and DN-well connected to $V_{Higher-Driver}$ node 1614, and its drain connected to one end of resistor 1747b (with a non-limiting exemplary value of 200K ohms). The other end of resistor 1747b is connected to the $V_{Neg}$ node 1708b. HV_DEPFET 1749b, resistor 1747b, and their connections form the first stage of the multi-stage detector 1706b. Again, when the voltage on the Pos-Neg pin 1602 goes to a value that is appreciably negative relative to the voltage on the $V_{Higher-Driver}$ node 1614, HV_DEPFET 1749b turns on and pulls up the voltage on the end of resistor 1747b that is connected to the drain of HV_DEPFET 1749b.

A first inverter, comprised of HV_DEPFET 1751b and NFET 1750b, takes its input from the drain of HV_DEPFET 1749b. This inverter is the second stage of the multi-stage detector. The source and DN-well body of HV_DEPFET 1751b are connected to the $V_{Higher-Driver}$ node 1614. As noted, the gate of HV_DEPFET 1751b is connected to the gate of NFET 1750b. The drains of HV_DEPFET 1751b and NFET 1750b are connected to each other and form the output of the detector second stage and the first inverter, the inverter comprised of HV_DEPFET 1751b and NFET 1750b. The NFET 1750b is an N-channel MOSFET formed in a PWell. The PWell is itself formed in a deep N-well (DN-well). The deep N-well is formed in the technology's p-substrate. The source and P-well of NFET 1750b are connected to the $V_{Neg}$ node 1708b. The NFET's 1750b deep N-well is connected to the $V_{Higher-Driver}$ node 1614.

Likewise, a second inverter, the third stage of the multi-stage detector, is comprised of HV_DEPFET 1754b and NFET 1753b, and takes its input from the drain of HV_DEPFET 1751b and the drain of NFET 1750b. The source and DN-well body of HV_DEPFET 1754b are connected to the $V_{Higher-Driver}$ node 1614. The gate of HV_DEPFET 1754b is connected to the gate of NFET 1753b and forms the input to the third stage of the multi-stage detector, which is also the input to the second inverter. The second inverter is comprised of HV_DEPFET 1754b and NFET 1753b. The drains of HV_DEPFET 1754b and NFET 1753b are connected to each other and form the output of the second inverter, the inverter comprised of HV_DEPFET 1754b and NFET 1753b. This output of the second inverter is the output of the third stage of the multi-stage detector. The NFET 1753b is an N-channel MOSFET formed in a PWell. That PWell is itself formed in a deep N-well. The deep N-well is formed in the technology's p-substrate. The source and P-well of NFET 1753b are connected to the $V_{Neg}$ node 1708b. The NFET's 1753b deep N-well is connected to the $V_{Higher-Driver}$ node 1614.

A third inverter, the fourth stage of the multi-stage detector, is comprised of HV_DEPFET 1757b and NFET 1756b, and takes its input from the drain of HV_DEPFET 1754b and the drain of NFET 1753b. The source and DN-well body of HV_DEPFET 1757b are connected to the $V_{Higher-Driver}$ node 1614. The gate of HV_DEPFET 1757b is connected to the gate of NFET 1756b and forms the input to the fourth stage of the multi-stage detector, which is also the input to the third inverter. The third inverter is comprised of HV_DEPFET 1757b and NFET 1756b. The drains of HV_DEPFET 1757b and NFET 1756b are connected to each other and form the output of the third inverter, the inverter comprised of HV_DEPFET 1757b and NFET 1756b. This output of the third inverter is the output of the fourth stage of the multi-stage detector. The NFET 1756b is an N-channel MOSFET formed in a PWell. That PWell is itself formed in a deep N-well. The deep N-well is formed in the technology's p-substrate. The source and P-well of NFET 1756b are connected to the $V_{Neg}$ node 1708b. The NFET's 1756b deep N-well is connected to the $V_{Higher-Driver}$ node 1614.

The widths of the transistors in the detector third stage and second inverter are larger than the widths of the transistors in the detector second stage and first inverter. The widths of the transistors in the detector fourth stage and third inverter are larger than the widths of the transistors in the detector third stage and second inverter. This widening of the transistors in going from the first inverter to the second inverter and from the second inverter to the third inverter (and from the detector second stage to the detector third stage and from the detector third stage to the detector fourth stage) is done so that the output impedance of the third inverter (detector fourth stage) is small. This is done so that the output drive strength of the third inverter (detector fourth stage) will be strong and can adequately drive the gate of the output transistor HV_DEPFET 1710b.

The output of the third inverter (detector fourth stage) drives the gate of HV_DEPFET 1710b. The source of HV_DEPFET 1710b connects to the γ node 1646, which is connected to the gates of the HV_DEPFETs 1608 in the circuit of FIG. 16C. The drain of HV_DEPFET 1710b is connected to resistor 1712b. The other end of resistor 1712b is connected to the Pos-Neg pin 1602. Resistor 1712b has a non-limiting exemplary value of 500 ohms.

Resistor 1760b is connected from the output of the third inverter (detector fourth stage), the inverter that is comprised of HV_DEPFET 1757b and NFET 1756b, to the $V_{Higher-Driver}$ node 1614. Resistor 1760b has a non-limiting exemplary value of 125K ohms.

When, during an ESD event, the voltage on the Pos-Neg pin 1602 goes to a value, for example −32V (non-limiting example), that is appreciably negative relative to the voltage on the $V_{Higher-Driver}$ node 1614, HV_DEPFET 1749b turns on and pulls up the voltage on the end of resistor 1747b that is connected to the drain of HV_DEPFET 1749b. This drain node is also connected to the gates of HV_DEPFET 1751b and NFET 1750b, the input of the first inverter (and detector second stage), the inverter comprised of HV_DEPFET 1751b, and NFET 1750b. So, when the voltage on the Pos-Neg pin 1602 goes to a value that is appreciably negative relative to the voltage on the $V_{Higher-Driver}$ node 1614, the voltage on the gates of HV_DEPFET 1751b and NFET 1750b, the input of the first inverter (and detector second stage), are pulled up to a voltage that is at least an NFET threshold voltage above the voltage on the $V_{Neg}$ node 1708b, and up to a voltage that is to within an HV_DEPFET threshold voltage of the voltage on the $V_{Higher-Driver}$ node 1614.

The voltage on the output of the first inverter (detector second stage), the voltage on the drains of HV_DEPFET 1751b and of NFET 1750b, goes to the voltage on the $V_{Neg}$ node 1708b, or to about −5 volts below the voltage of the $V_{Higher-Driver}$ node 1614. This output voltage of the first inverter (detector second stage) pulls down the input voltage of the second inverter (comprised of HV_DEPFET 1754b, and NFET 1753b) (detector third stage) and causes the output voltage of the second inverter (detector third stage), the voltage on the drains of HV_DEPFET 1754b, and NFET 1753b, to go to the voltage of the $V_{Higher-Driver}$ node 1614. With the output voltage of the second inverter, (output voltage of the detector third stage, and the voltage on the drains of HV_DEPFET 1754b, and NFET 1753b), going to the voltage of the $V_{Higher-Driver}$ node 1614, the output voltage of the third inverter (output voltage of the detector fourth stage, and the voltage on the drains of HV_DEPFET 1757b, and NFET 1756b), goes to the voltage on the $V_{Neg}$ node 1708b. The voltage on the $V_{Neg}$ node 1708b is about −5 volts below the voltage of the $V_{Higher-Driver}$ node 1614. This third inverter output (detector fourth stage output) goes to the $V_{Neg}$ 1708b voltage because the input of the third inverter (detector fourth stage input) is connected to the output of the second inverter (detector third stage output).

Taking the output of the third inverter (output of the detector fourth stage of the multi-stage detector) to the voltage of the $V_{Neg}$ node 1708b, or to about −5 volts below the voltage of the $V_{Higher-Driver}$ node 1614, causes HV_DEPFET 1710b to turn on and pull down the voltage on the γ node 1646. This pulls down the voltage on the gates of the HV_DEPFETs 1608 in the circuit of FIG. 16C. Pulling down the voltage of the gates of the HV_DEPFETs 1608, in the circuit of FIG. 16C, to a level that is negative relative to the voltage of the $V_{Higher-Driver}$ node 1614, by at least an HV_DEPFET threshold voltage causes the HV_DEPFETs 1608 in the circuit of FIG. 16C to turn on and clamp the voltage of the Pos-Neg pin 1602 to the voltage of the $V_{Higher-Driver}$ node 1614.

It is important to note that, in the circuit of FIG. 16C, the $V_{Higher-Driver}$ node 1614 is connected to the NFET clamp 1606. Again, NFET clamp 1606 includes a first, isolated HV_DENFET 1612a and a second, non-isolated HV_DENFET 1612b coupled in series between the PFET clamp 1604 and ground (GND). The above sequence, that of turning on HV_DEPFET 1710b and HV_DEPFET transistors 1608, leads to the N-type drain of NFET clamp transistor 1612a being indirectly connected to Pos-Neg pin 1602. This connection leads to any excessive negative voltage on the Pos-Neg pin 1602 being shunted to ground through the NFET clamp 1606.

In the circuit of FIG. 17B, the role of resistor 1760b is to pull up the gate of HV_DEPFET 1710b, and shut off HV_DEPFET 1710b when the voltage on the Pos-Neg pin 1602, the voltage on the $V_{Higher-Driver}$ node 1614, and the voltage on the $V_{Neg}$ node 1708b are close enough together that the transistors in the circuit of FIG. 17b will not operate. This non-operating condition occurs when the voltage on the Pos-Neg pin 1602, the voltage on the $V_{Higher-Driver}$ node 1614, and the voltage on $V_{Neg}$ node 1708b are within an HV_DEPFET threshold voltage or an NFET threshold voltage of each other. This condition can happen (for example) when the Pos-Neg pin 1602 voltage is greater than ground voltage.

It is important to note that, like the circuits of FIGS. 16A, 16B, 16C, and 17A, the circuit of FIG. 17B does not connect any N-type diffusions (neither N+ nor N-wells) to the Pos-Neg pin 1602. By avoiding connections of N-type diffusions to the Pos-Neg pin 1602, and by avoiding connections of N-wells to the Pos-Neg pin 1602, the circuit of FIGS. 16C and 17B avoid problems associated with forward biasing n-type diffusions to a p-substrate, and forward biasing n-type diffusions to P-wells. Otherwise, forward biasing of such junctions could, occur with fast ramp applications of negative voltages to the Pos-Neg pin 1602.

Additionally, FIGS. 16C, and 17B further enable the use of an explicit negative ESD pulse protection capability to the circuit of FIG. 16B by adding a resistor 1658 to the γ node 1646 end of the shut off acceleration transistor 1632. This resistor, 1658, allows the circuit in FIG. 17B to more easily pull down the voltage on FIG. 16C's γ node 1646.

When the Pos-Neg pin 1602 goes to approximately 32V below ground potential (non-limiting example), the sensor circuit 1700b in FIG. 17B attempts to pull the γ node 1646 to a voltage that is approximately 5V below $V_{GND}$. Note that, with the Pos-Neg pin's 1602 voltage below ground potential, the $V_{Higher-Driver}$ node 1614 voltage will also go to ground potential. So, when the Pos-Neg pin 1602 goes to −32V below $V_{GND}$, the Pos-Neg pin's 1602 voltage will also be at −32V below the voltage of the $V_{Higher-Driver}$ node 1614. Similarly, when the Pos-Neg pin 1602 goes to −32V below $V_{GND}$, the sensor circuit 1700b in FIG. 17B attempts to pull the γ node 1646 to a voltage that is approximately 5V below the voltage of the $V_{Higher-Driver}$ node 1614. The shut off acceleration transistor 1632 will counteract this γ node 1646 pull down so the actual pull-down voltage of the γ node may be as little as 2.5V below $V_{Higher-Driver}$ node 1614.

The voltage pull-down capability of the circuits of FIGS. 16C and 17B can be increased by adding more output pull-down transistors 1710b, and their associated 500Ω ballast resistors 1712b, in parallel with the output pull-down transistors 1710b, and their associated 500Ω ballast resistors 1712b, shown in FIG. 17B.

Adding the resistor 1658 to the γ node 1646 in FIG. 16C and adding the sensor circuit 1700b of FIG. 17B incur a relatively small increase, of from 15 to 25%], in total circuit layout area to the ESD protection circuit 1600. These modifications add only a minimal number of control transistors to the circuit of FIG. 16B. The layout area of the overall circuit is more compact because the HV_DEPFETs 1608 and HV_DENFETs 1612a, 1612b of the circuits of FIGS. 16C, and 17B are used for both positive and negative voltage clamping.

Like the circuits of FIGS. 15, and 16A, the ESD protection circuit 1600 of FIG. 16C, combined with the sensor circuit 1700b of FIG. 17B, enables use of the clamping HV_DEPFETs 1608 in passing signals between the chip's interior circuitry and the Pos-Neg pin 1602 during normal operation. In this way, the ESD protection circuit 1600 of FIG. 16C, combined with the sensor circuit 1700b of FIG. 17B, serve as a bidirectional interface.

In normal operation, with the Pos-Neg pin 1602 voltage between ground and 40V, the ESD protection circuit 1600 of FIG. 16C operates in substantially the same way as the ESD protection circuit in FIG. 16B, and also largely in the same way as the ESD protection circuit of FIG. 16A. Under these same conditions, the sensor circuit 1700b in FIG. 17B will have a Pos-Neg pin voltage and a $V_{Higher-Driver}$ node voltage at very close to the same level as each other. Thus, during normal operation, there will be little to no voltage dropped across the sensor circuit. The gate, of the sensor circuit 1700b output transistor HV_DEPFET 1710b (FIG. 17B), will also be at approximately the Pos-Neg pin voltage when the circuit is in steady-state. Under normal operation steady state conditions, the output transistor HV_DEPFET 1710b will be OFF. In steady state, the FIG. 16C circuit's turn on acceleration network will pull-down the voltage of the γ node 1646 to approximately 5V below the voltage of the $V_{Higher-Driver}$ node 1614. With the output transistor 1710b of FIG. 17B turned OFF, the sensor circuit 1700b will have little to no effect upon the ESD protection circuit 1600 of FIG. 16C other than to add a minor amount of capacitance to FIG. 16C's γ node 1646.

Also, during normal operation, during times when the Pos-Neg pin 1602 is not driven by a signal that is external to the chip, positive voltages that are applied to the $V_{Higher-Driver}$ node 1614 by the chip's internal circuitry, are transferred to the Pos-Neg pin. This is because the HV_DEPFETs 1608 will be turned on when the $V_{Higher-Driver}$ node is positive, and will pass the $V_{Higher-Driver}$ voltage to the Pos-Neg pin 1602.

During transients, when the Pos-Neg pin 1602 voltage is quickly rising, the voltage rise of the $V_{Higher-Driver}$ node 1614 may lag the voltage rise of the Pos-Neg pin. Under such conditions, the source voltage (γ node 1646 voltage) of the output transistor, HV_DEPFET 1710b, in the circuit of FIG. 17B, will be limited to the $V_{Higher-Driver}$ node 1614 voltage or to a lesser voltage by a source to DN-well junction diode formed in the output transistor, HV_DEPFET 1710b, and by the 500Ω resistor 1712b, between the drain of the transistor and the Pos-Neg pin 1602. Note, that the DN-well body of the output transistor 1710b is connected to the $V_{Higher-Driver}$ node 1614. In the FIG. 16C portion of the circuit, the γ node 1646 voltage will tend to be pulled down by the turn on acceleration network.

When the Pos-Neg pin 1602 voltage is positive and somewhat higher than the voltage on the $V_{Higher-Driver}$ node 1614, and if it is determined that the lateral parasitic PNP transistor, formed in the sensor circuit's 1700b output transistor 1710b, is allowing the Pos-Neg pin 1602 voltage to pull up too much on the γ node 1646 voltage, then the second HV_DEPFET 1648b of the turn on acceleration circuit's second stage can be strengthened by placing more transistors and or resistors in parallel with that second stage.

In ESD events, where the Pos-Neg pin 1602 voltage is pulled to above positive 55V, the voltage on the $V_{Higher-Driver}$ node 1614 will rise to a level that is high enough to trigger the cascoded HV_DENFETs 1612a, 1612b of the NFET clamp 1606 at about 50V. Under such conditions, the HV_DEPFETs 1608 will forward bias to the underlying DN-well and the voltage on the Pos-Neg pin 1602 will either discharge via the HV_DENFETs 1612a, 1612b of the NFET clamp 1606, or to the substrate via the vertical PNP transistor 1360 in the HV_DEPFETs 1608. Thus, to ensure proper functioning of the above circuits, adequate local substrate tapping is desirable.

In steady state normal operation, when the Pos-Neg pin 1602 voltage is between ground and −28V, the circuit in FIG. 16C will operate similarly to the circuits in FIGS. 16A and 16B. In the circuit of FIG. 17B, a $V_{Neg}$ node voltage will pull down to approximately 5V below the ground potential on the $V_{Higher-Driver}$ node. When the Pos-Neg pin 1602 voltage is less than ground, the $V_{Neg}$ node supplies a logic low level to the inverter buffers at the right side of the sensor circuit 1700b (multi-stage detector 1706b stages two, three and four). Also, in normal operation, i.e., with the Pos-Neg Pin voltage between ground (GND) and −28V, 10KΩ resistor 1740B, 320KΩ resistor 1743B, and 160 KΩ resistor 1745b of the sensor circuit 1700b provide a near ground potential to the gate of the HV_DEPFET 1749b. The HV_DEPFET 1749b remains turned off, and the following inverter stages supply a near ground potential to the gate of output transistors HV_DEPFET 1710b. Placing a ground potential on the gate of this transistor keeps the transistor turned OFF (this is because the source of the transistor, γ node 1646, is also at ground potential).

With the Pos-Neg pin 1602 subjected to fast-fall-time negative voltages that remain above −28V, the sensor circuit of FIG. 17B's responses are limited by the circuit's resistances and capacitances. It is expected that the sensor circuit will respond and stabilize in a matter of less than about a micro-second (non-limiting example).

In a negative voltage ESD event, the Pos-Neg pin 1602 voltage will drop to 32V (non-limiting example) or more below the voltage of the $V_{Higher-Driver}$ node 1614 (nominally at ground potential). In the sensor circuit 1700b of FIG. 17B, the $V_{Neg}$ node 1708b voltage will pull down to approximately 5V below the $V_{Higher-Driver}$ node 1614 voltage (approximately 5V below ground). When the Pos-Neg Pin voltage is less than ground, the $V_{Neg}$ node 1708b supplies a logic low level to the inverter buffers (NFETs 1750b, 1753b, and 1756b, and HV_DEPFETs 1751b, 1754b, and 1757b). In response to the voltage drop of 32 volts or more below the voltage of the $V_{Higher-Driver}$ node, the 10KΩ resistor 1740b, 160KΩ resistor 1745b, and the 320KΩ resistor 1743b, apply a pulled down voltage to the gate of the HV_DEPFET 1749b in the first stage of the multi-stage detector. That pulled down voltage is negative relative to the voltage of the $V_{Higher-Driver}$ node 1614. This HV_DEPFET 1749b, and the 200KΩ resistor 1747b, connected thereto, form the first stage of the four stages of the multi-stage detector's output transistor gate control. When the negative voltage on the Pos-Neg pin becomes large enough (below −32V), the gate of the HV_DEPFET 1749b in FIG. 17B's detector first stage is pulled low enough to raise the voltage across the detector first stage's 200KΩ resistor 1747b. The increasing voltage across the 200KΩ resistor 1747b becomes large enough to flip (change the logical polarity of) the output voltage of the detector second stage (NFET 1750b ON, and HV_DEPFET 1751b OFF). The detector third and fourth stages (comprising HV_DEPFETs 1754b, and 1757b, and NFETs 1753b, and 1756b) also flip and the output transistor is turned on. Turning on the output transistor pulls down the voltage, of the FIG. 16C circuit's γ node 1646. This turns on the HV_DEPFETs 1608 that connect the Pos-Neg Pin 1602 to the $V_{Higher-Driver}$ node 1614. The $V_{Higher-Driver}$ node 1614 is indirectly connected to the chip ground through the $V_{Higher-Driver}$ node's 1614 deep N-well to p-substrate junctions, and also through the upper of the HV_DENFET clamp transistors 1612a. The clamp transistor 1612a drain is formed from deep N-well. That deep N-well's junction to the substrate also grounds the $V_{Higher-Driver}$ node 1614 when the voltage on the $V_{Higher-Driver}$ node 1614 begins to move to a value that is less than ground.

Figure 18:
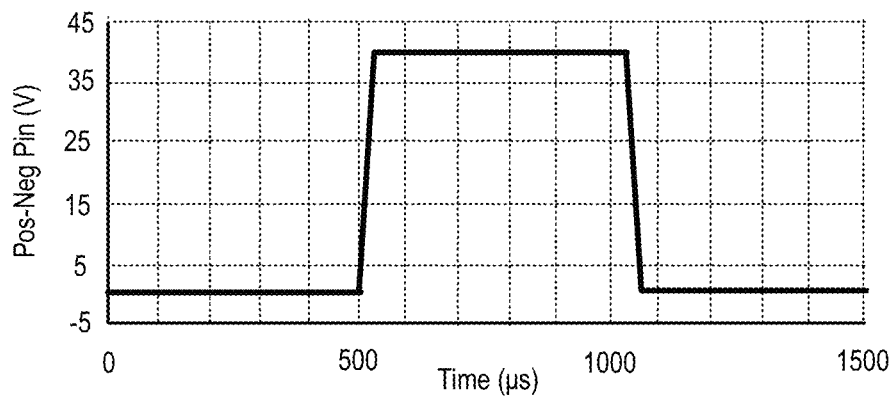
FIG. 18-26 are waveforms showing behavior of a Pos-Neg pin voltage, $V_{Higher-Driver}$ node voltage, and γ node voltage, in the ESD protection circuit of FIG. 16A in normal operation when a positive voltage is coupled to the Pos-Neg pin.
Figure 19:
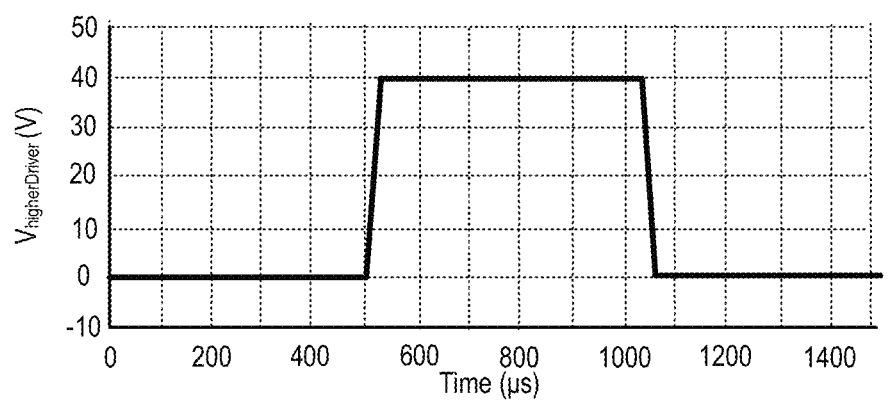
Figure 20:
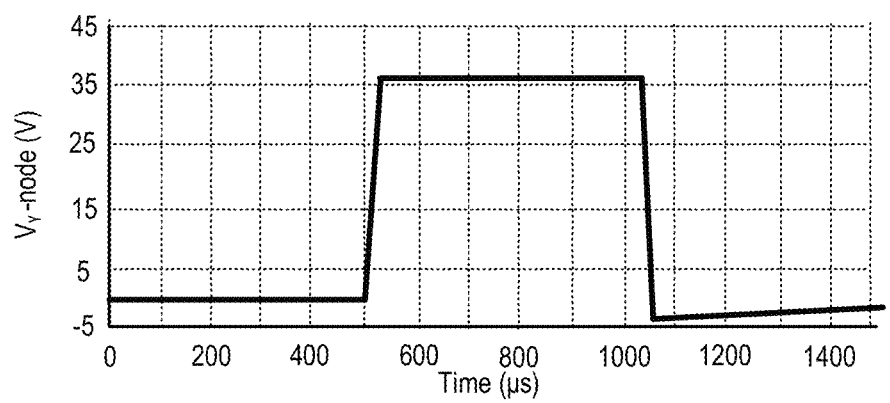

FIGS. 18-26 are waveforms showing behavior of a Pos-Neg pin voltage, $V_{Higher-Driver}$ node voltage, and γ node voltage, in the ESD protection circuit 1600 of FIG. 16A in normal operation when a positive voltage is coupled to the Pos-Neg pin 1602. FIG. 18 is a waveform showing a rise in an external, positive voltage applied to the Pos-Neg pin 1602 from 0V to 40V at 500 μsec followed by a fall at substantially the same slope. FIG. 19 is a waveform showing the rise and fall in the $V_{Higher-Driver}$ node 1614 voltage resulting from the voltage applied to the Pos-Neg pin. FIG. 20 is a waveform showing the rise and fall in the γ node 1646 voltage. Referring to FIG. 20, it is seen that the high impedance (8MΩ) resistor 1642 pulls down the voltage on the γ node 1646 by approximately 10 percent in about 40 μsec shutting OFF the HV_DEPFETs 1608. At about 1050 μsec the γ node 1646 voltage begins dropping quickly tracking the fall in the Pos-Neg pin 1602 voltage and the $V_{Higher-Driver}$ node 1614 voltage, overshooting by about 10% and slowly recovering.

Figure 21:
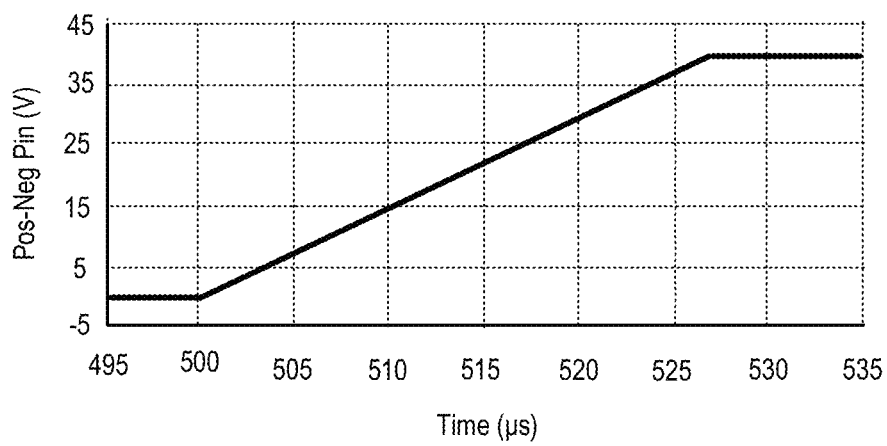
Figure 22:
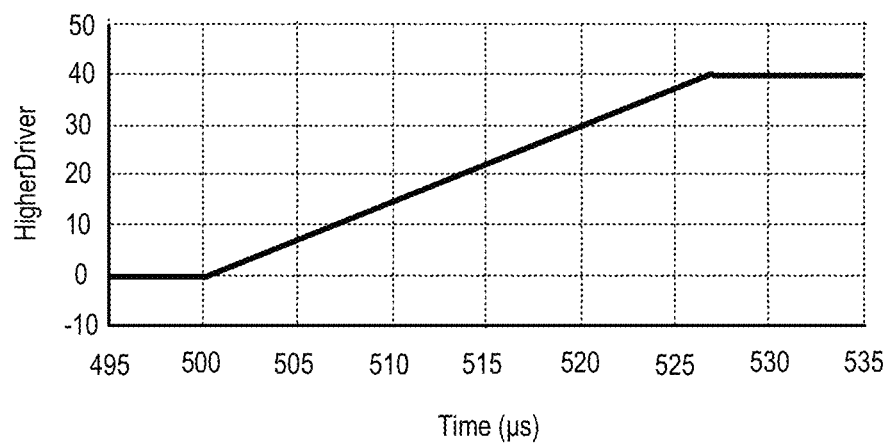
Figure 23:
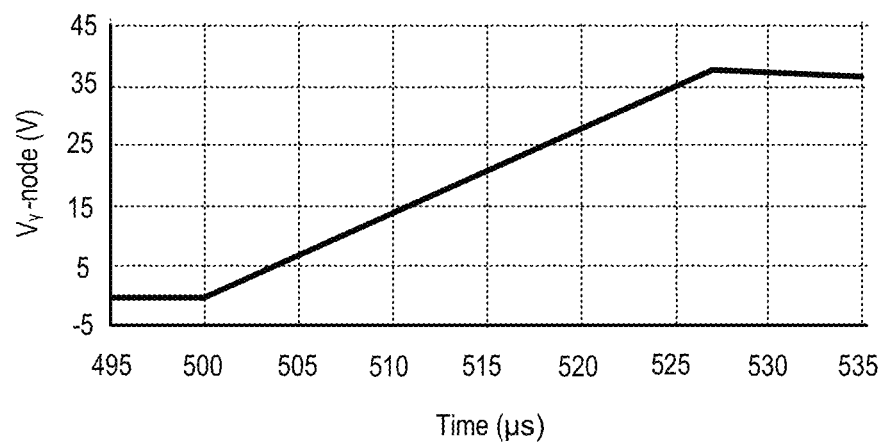

FIG. 21 is an expanded, more detailed view of the rise in the external, positive voltage applied to the Pos-Neg pin 1602 and shown in FIG. 18. Similarly, FIG. 22 is an expanded, more detailed view of the resulting rise in the $V_{Higher-Driver}$ node 1614 voltage and shown in FIG. 19, and FIG. 23 is an expanded, more detailed view of the rise in the γ node 1646 voltage and shown in FIG. 20.

Figure 24:
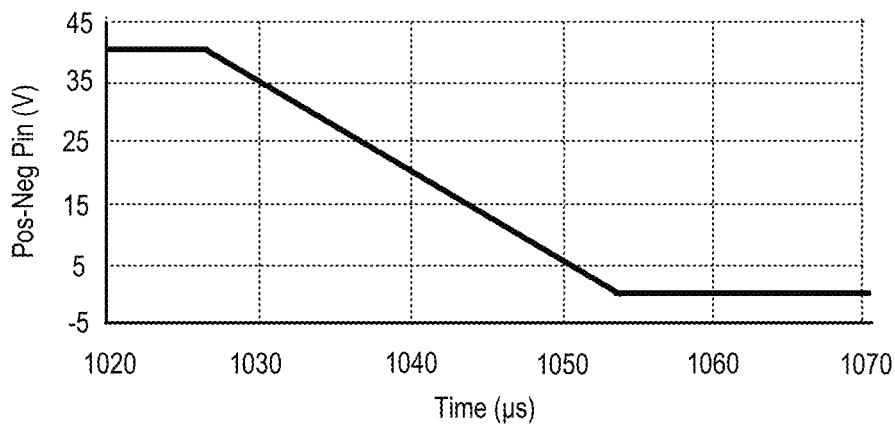
Figure 25:
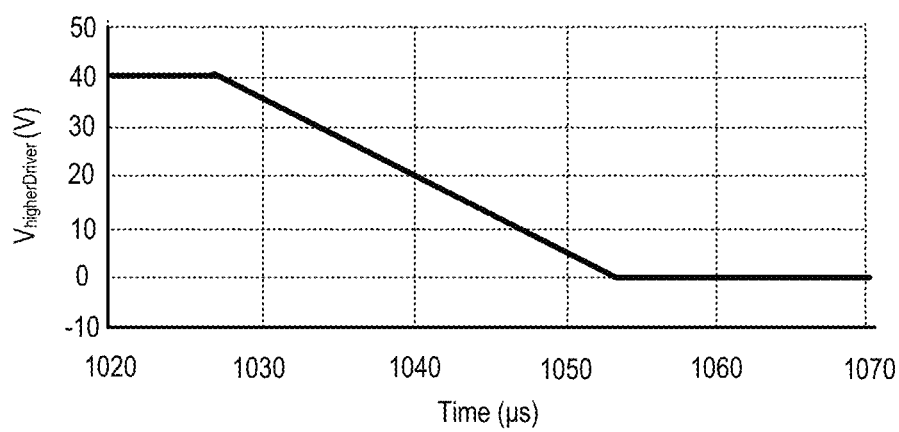
Figure 26:
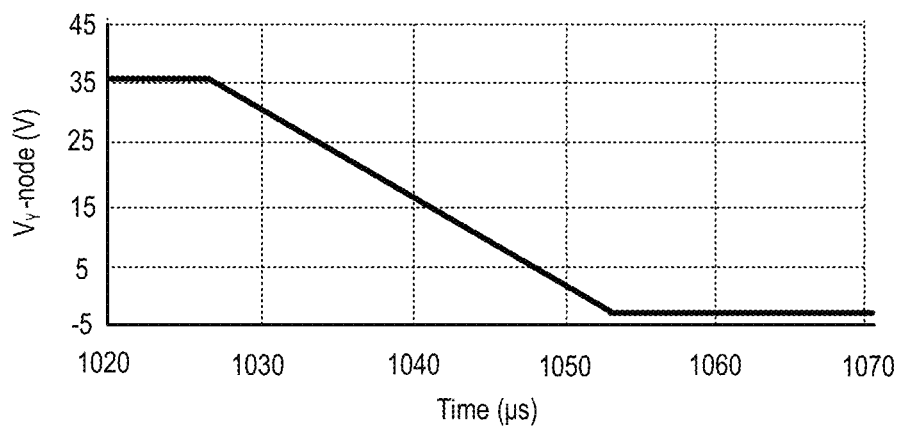

FIG. 24 is an expanded, more detailed view of the fall in the external, positive voltage applied to the Pos-Neg pin 1602 and shown in FIG. 18. Similarly, FIG. 25 is an expanded, more detailed view of the resulting fall in the $V_{Higher-Driver}$ node 1614 voltage and shown in FIG. 19, and FIG. 26 is an expanded, more detailed view of the fall in the γ node 1646 voltage and shown in FIG. 20.

Figure 27:
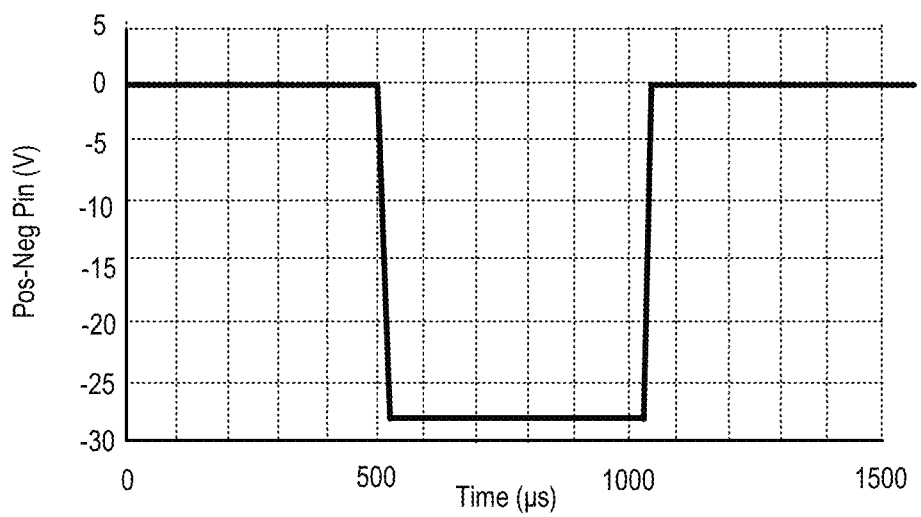
FIGS. 27-35 are waveforms showing behavior of the Pos-Neg pin voltage, $V_{Higher-Driver}$ node voltage, and γ node voltage, in the ESD protection circuit of FIG. 16A in normal operation when a negative voltage is coupled to the Pos-Neg pin.
Figure 28:
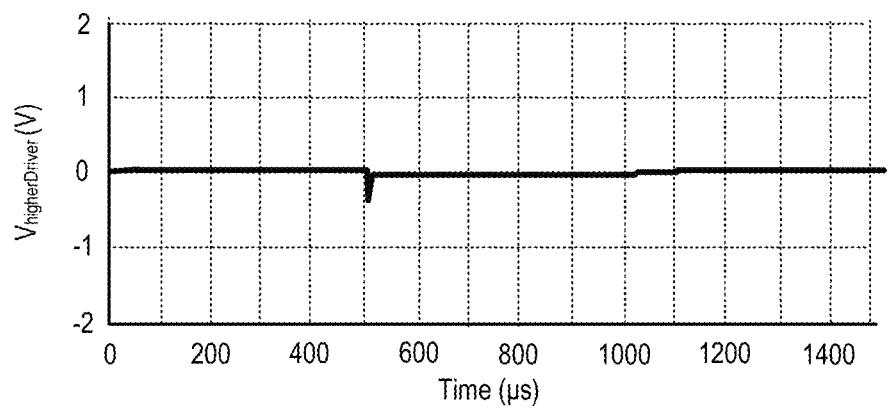
Figure 29:
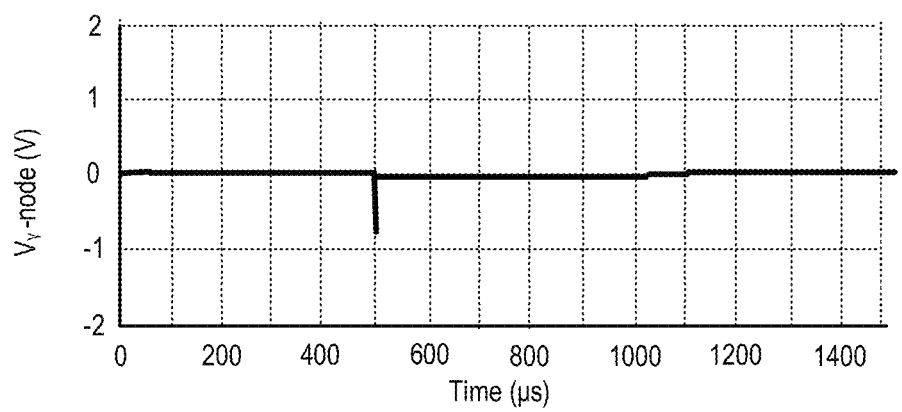

FIGS. 27-35 are waveforms showing behavior of the Pos-Neg pin voltage, $V_{Higher-Driver}$ node voltage, and γ node voltage, in the ESD protection circuit 1600 of FIG. 16A in normal operation when a negative voltage is coupled to the Pos-Neg pin 1602. FIG. 27 shows a fall in an external, negative voltage applied to the Pos-Neg pin 1602 from 0V to about −28V at 500 μsec followed by a rise at substantially the same slope at about 1050 μsec. FIG. 28 is a waveform showing the resulting change in the $V_{Higher-Driver}$ node 1614 voltage as transistors M2 and M4 turn on and pull the $V_{Higher-Driver}$ node 1614 voltage up to ground, switching the coupling of the DN-well 1610 through the $V_{Higher-Driver}$ node from the Pos-Neg pin 1602 to ground potential following a brief dip in voltage at about 500 μsec. FIG. 29 is a waveform showing the γ node 1646 voltage. Referring to FIG. 29, it is seen that the shut off acceleration transistor 1632 pulls the voltage of the γ node 1646 up to ground potential shutting off the HV_DEPFETs 1608 following a sharp, brief negative spike at about 1050 μsec.

Figure 30:
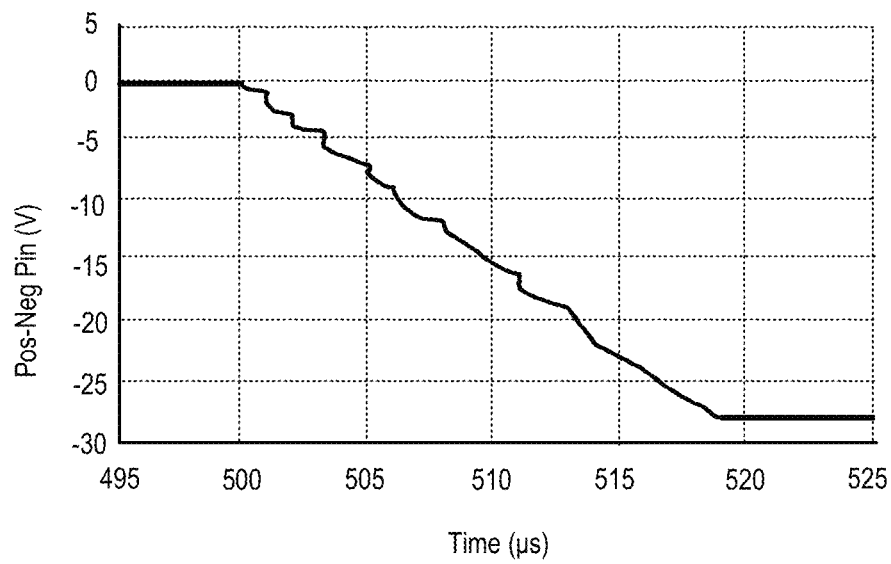
Figure 31:
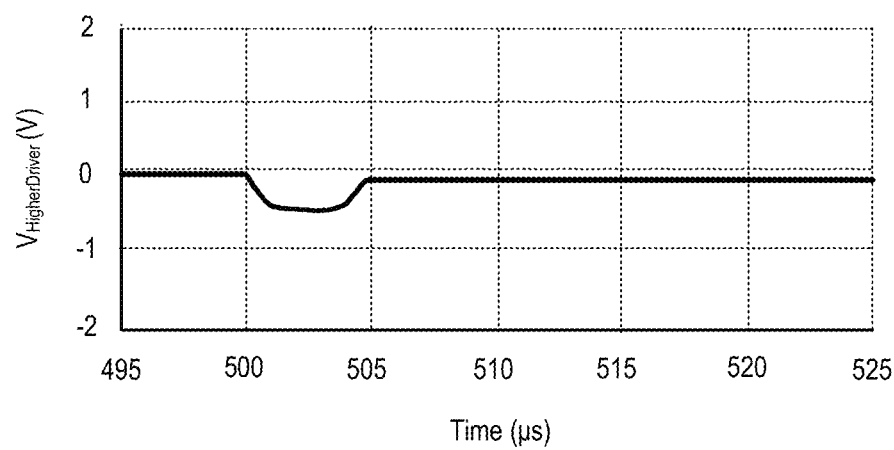
Figure 32:
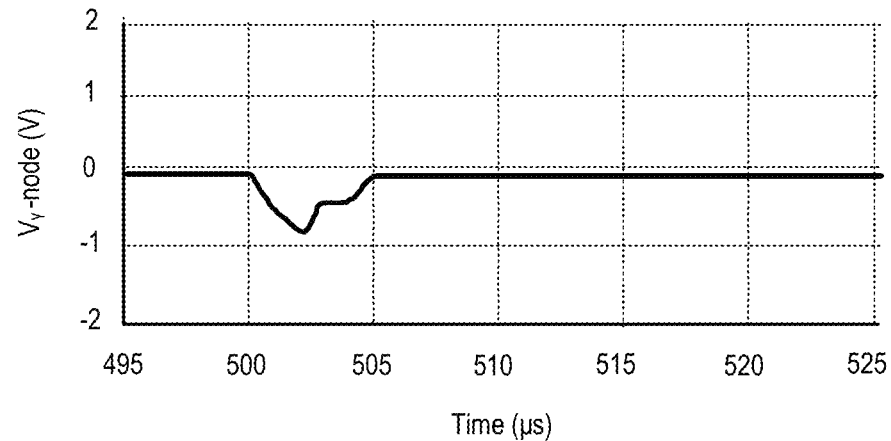

FIG. 30 is an expanded, more detailed view of the fall in the external, negative voltage applied to the Pos-Neg pin 1602 and shown in FIG. 27. FIG. 31 is an expanded, more detailed view of the resulting change in the $V_{Higher-Driver}$ node 1614 voltage, illustrating the voltage dropping less than about 0.5V for less than about 5 μsec, and FIG. 32 is an expanded, more detailed view of the fall in the γ node 1646 voltage and shown in FIG. 29.

Figure 33:
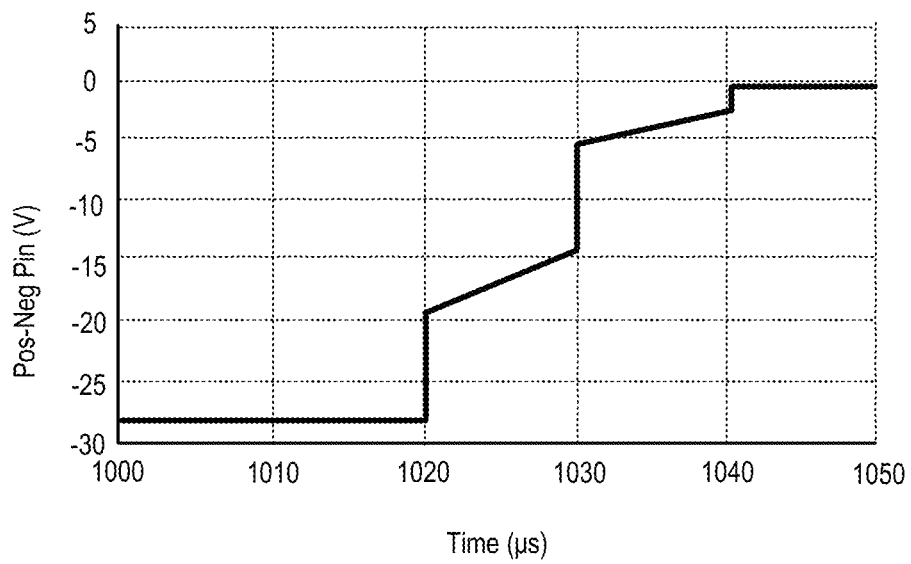
Figure 34:
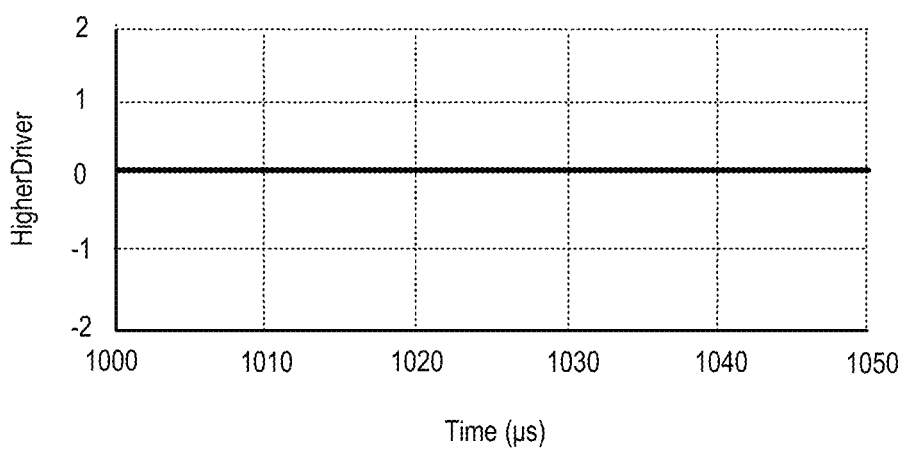
Figure 35:
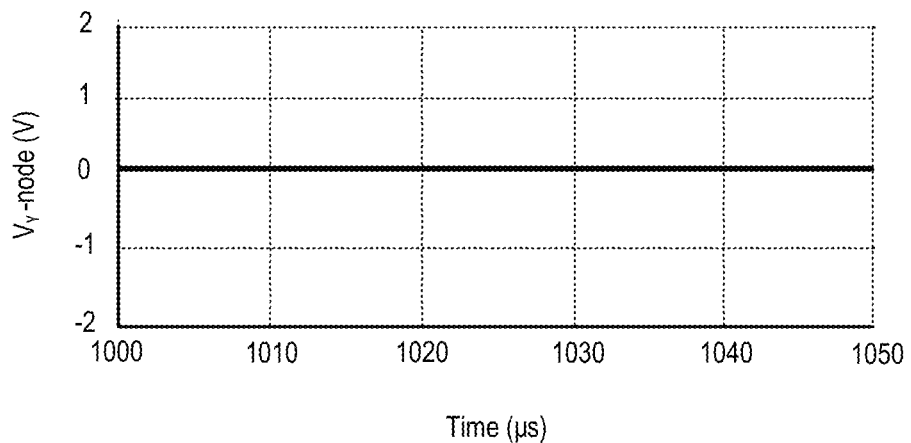

FIG. 33 is an expanded, more detailed view of the rise in the external, negative voltage applied to the Pos-Neg pin 1602 back to 0V and shown in FIG. 27. Similarly, FIG. 34 is an expanded, more detailed view of the $V_{Higher-Driver}$ node 1614 voltage shown in FIG. 28, and FIG. 35 is an expanded, more detailed view of the γ node 1646 voltage shown in FIG. 29, both showing a substantially constant 0V.

Figure 36:
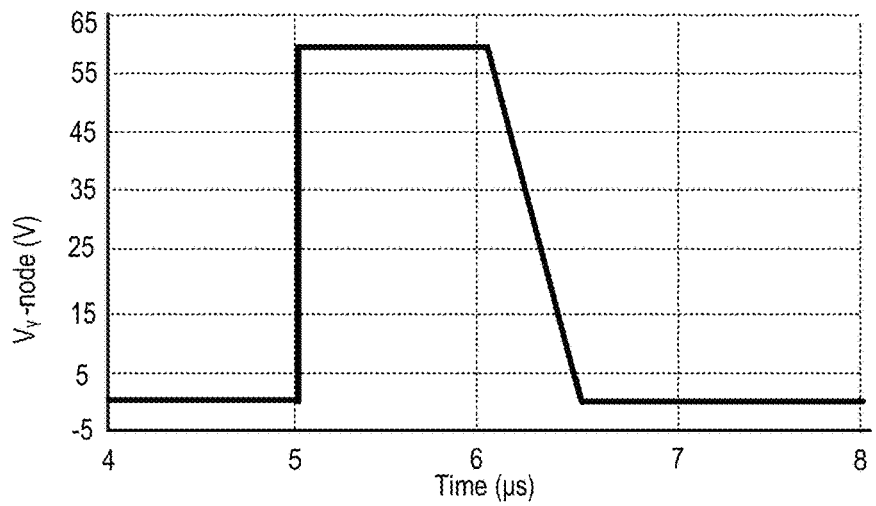
FIGS. 36-44 are waveforms showing behavior of the Pos-Neg pin voltage, $V_{Higher-Driver}$ node voltage, and γ node voltage, in the ESD protection circuit of FIG. 16A during a positive ESD event on the Pos-Neg pin.

FIG. 36-44 are waveforms showing behavior of the Pos-Neg pin voltage, $V_{Higher-Driver}$ node voltage, and γ node voltage, in the ESD protection circuit 1600 of FIG. 16A during a positive ESD event on the Pos-Neg pin 1602. FIG. 36 is a waveform showing the sharp rise in an external, positive voltage applied to the Pos-Neg pin 1602 from 0V to 68V at about 5 μsec caused by positive ESD event, followed by a slight less rapid fall at about time 6.5 μsec.

Figure 37:
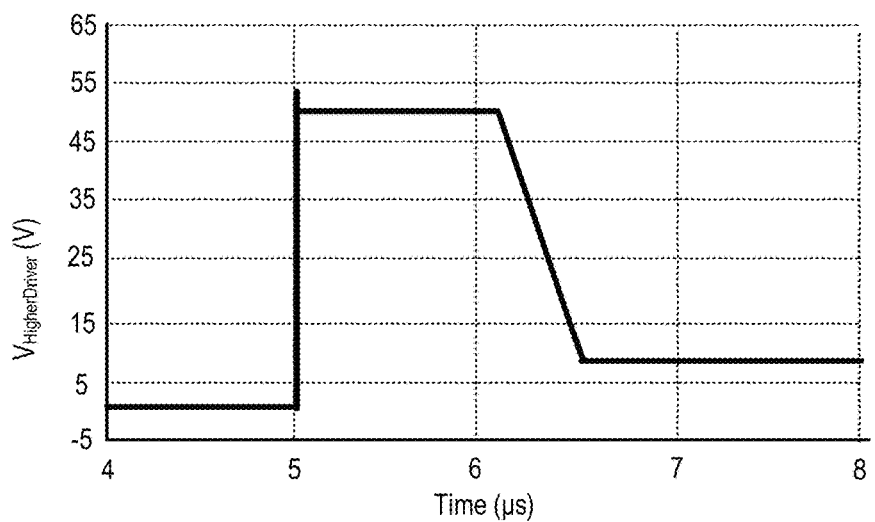

FIG. 37 is a waveform showing the resulting change in the $V_{Higher-Driver}$ node 1614 voltage. Referring to FIG. 37 it is seen that the $V_{Higher-Driver}$ node 1614 voltage initially follows the Pos-Neg pin 1602 voltage. The high positive voltage on the $V_{Higher-Driver}$ node 1614 will then cause the HV_DENFETs 1612a, 1612b, of the NFET clamp 1606 to clamp the voltage on the $V_{Higher-Driver}$ node to a clamping voltage, determined by characteristics of the NFET clamp as described above, of approximately 50V, substantially preventing any further increase in positive voltage. In particular, with the $V_{Higher-Driver}$ node 1614 voltage clamped, any further increase in the positive voltage on the Pos-Neg pin 1602 will forward bias sources of the HV_DEPFETs 1608 to the DN-wells 1610 that are connected to the $V_{Higher-Driver}$ node 1614. In addition to the parasitic current through the parasitic PNP transistors formed between the HV_DEPFET sources, DN-well and P-substrate that this forward biasing will cause, the HV_DEPFETs 1608 operating in MOSFET mode will also contribute to clamping and bringing down the voltage on the Pos-Neg pin 1602.

Figure 38:
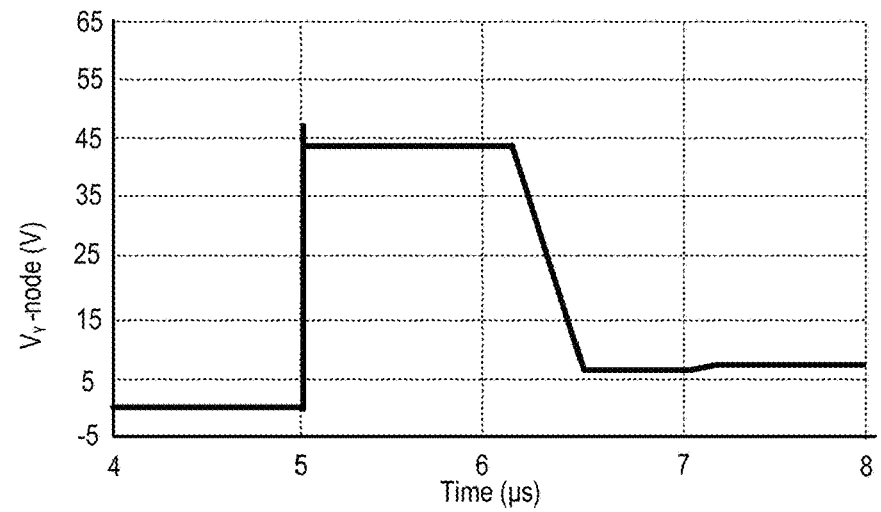

FIG. 38 is a waveform showing the γ node 1646 voltage during the positive ESD event. Referring to FIG. 38, it is seen that the γ node 1646 voltage, like the $V_{Higher-Driver}$ node 1614 voltage, initially follows the Pos-Neg pin 1602 voltage. However, as noted above the γ node 1646 voltage is capacitively coupled through gate to DN-well 1610 capacitances and gate to source P+ capacitances, such that the voltage of the γ node 1646 is capacitively coupled to approximately two thirds of the voltage on the Pos-Neg pin 1602, shown here as a DC plateau of from about 45V to about 47V.

Figure 39:
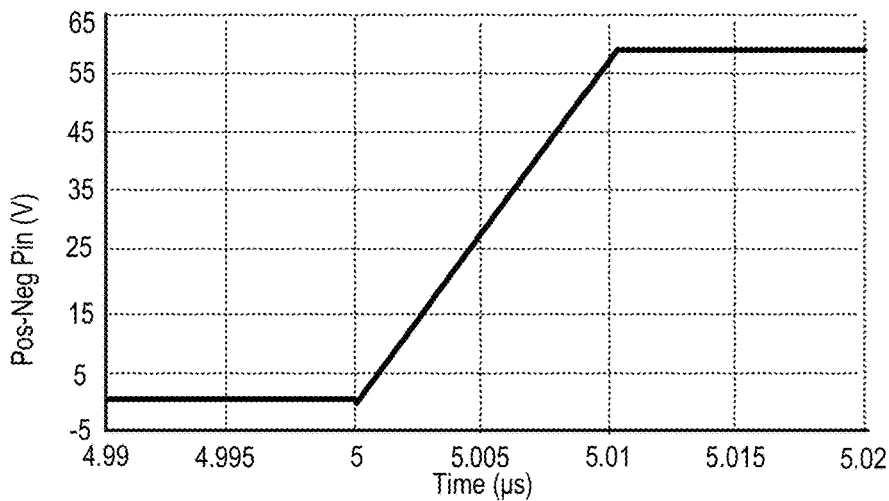
Figure 40:
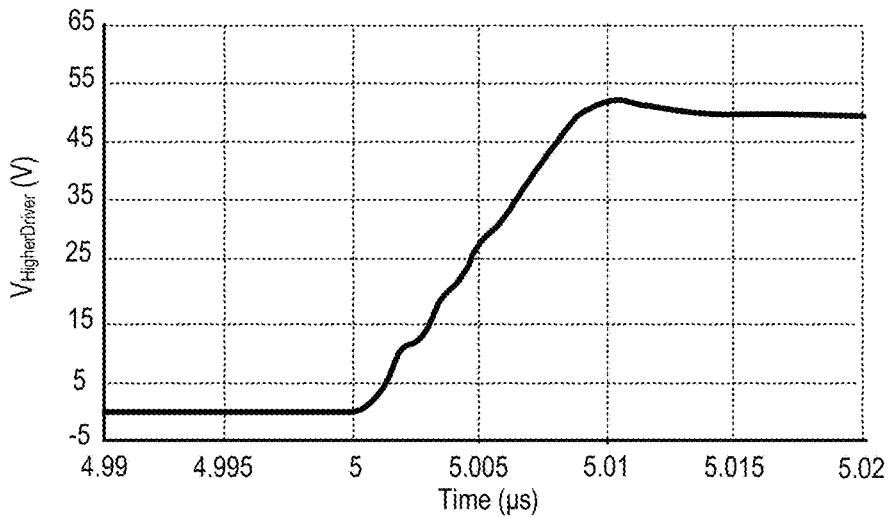
Figure 41:
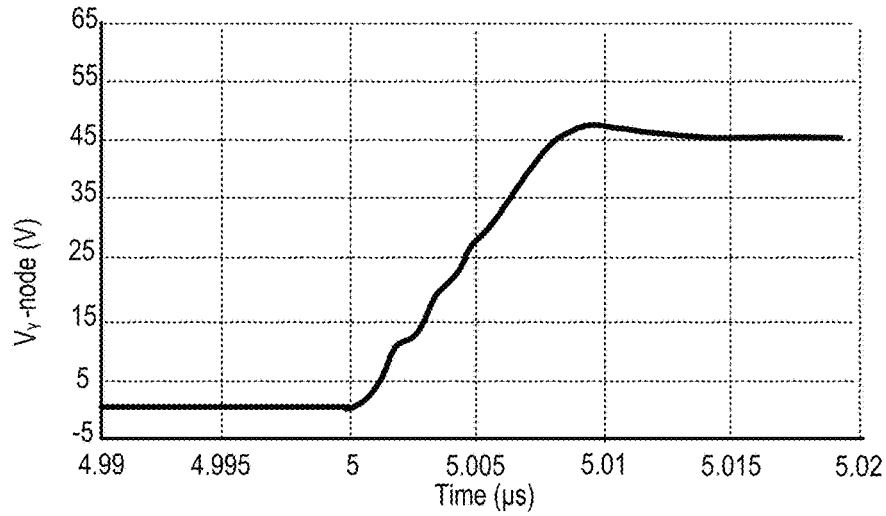

FIG. 39 is an expanded, more detailed view of the positive ESD event shown in FIG. 36. Similarly, FIG. 40 is an expanded, more detailed view of the resulting rise in the $V_{Higher-Driver}$ node 1614 voltage and subsequent clamping by the NFET clamp 1606 shown in FIG. 37, and FIG. 41 is an expanded, more detailed view of the rise in the γ node 1646 voltage and shown in FIG. 38.

Figure 42:
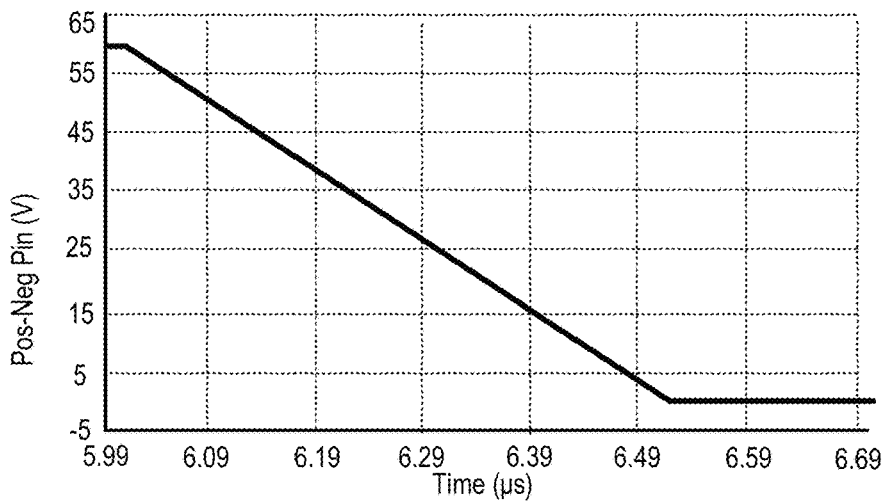
Figure 43:
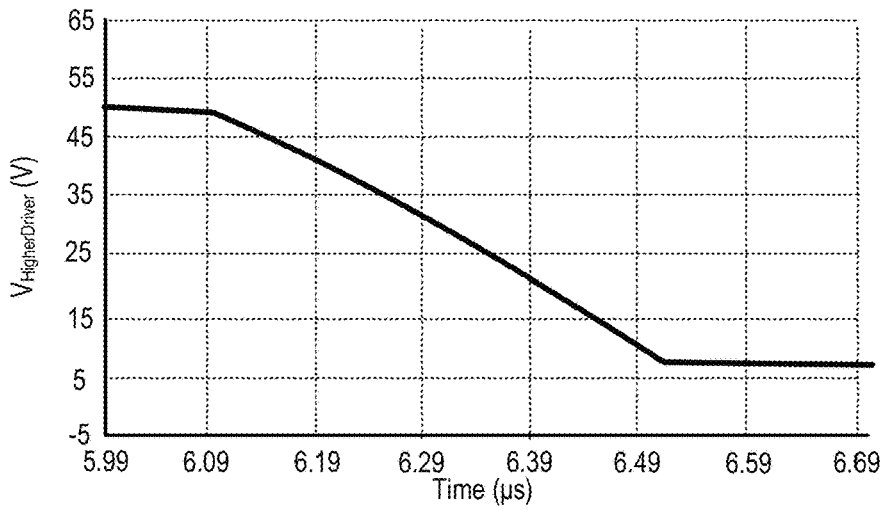
Figure 44:
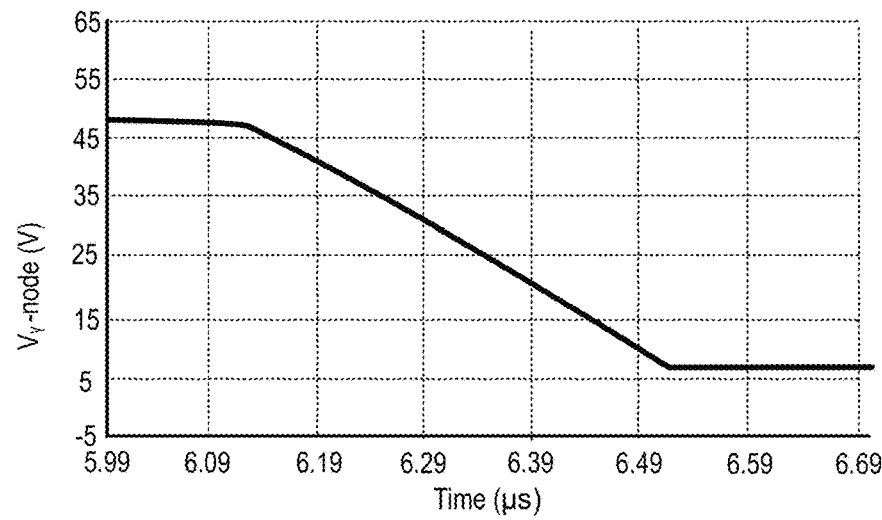

FIG. 42 is an expanded, more detailed view of the fall in voltage applied to the Pos-Neg pin 1602 during the positive ESD event shown in FIG. 36. FIG. 43 is an expanded, more detailed view of the fall in the $V_{Higher-Driver}$ node 1614 voltage shown in FIG. 37, and FIG. 44 is an expanded, more detailed view of the fall in the γ node 1646 voltage shown in FIG. 38.

Figure 45:
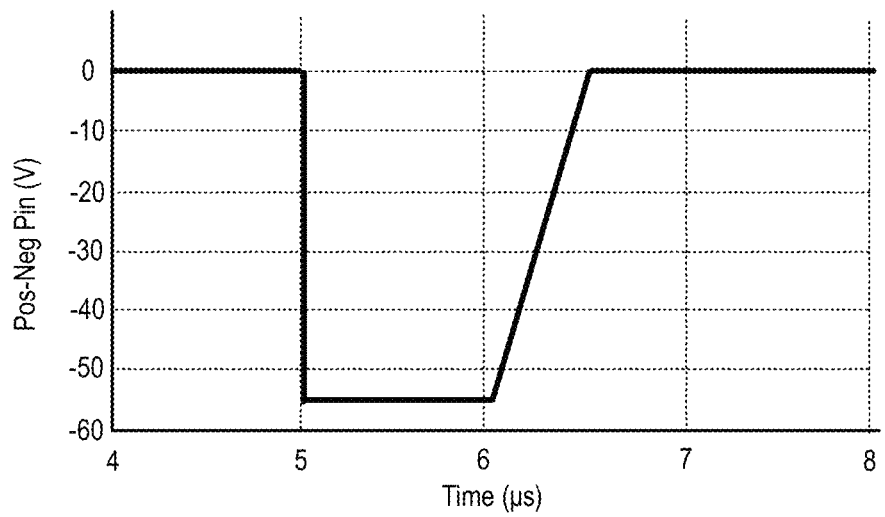
FIGS. 45-53 are waveforms showing behavior of the Pos-Neg pin voltage, $V_{Higher-Driver}$ node voltage, and γ node voltage, in the ESD protection circuit of FIG. 16A during a positive ESD event on the Pos-Neg pin.

FIGS. 45-54 are waveforms showing behavior of the Pos-Neg pin voltage, $V_{Higher-Driver}$ node voltage, and γ node voltage, in the ESD protection circuit of FIG. 16A during a negative ESD event. FIG. 45 is a waveform showing the sharp fall in an external, voltage applied to the Pos-Neg pin 1602 from 0V to about −55V at about 5 μsec caused by a negative ESD event, followed by a less rapid rise beginning at about time 6.5 μsec.

Figure 46:
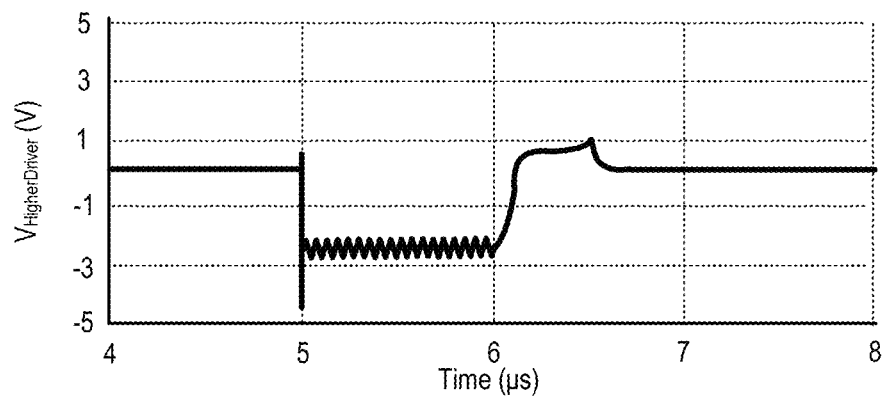

FIG. 46 is a waveform showing the resulting change in the $V_{Higher-Driver}$ node 1614 voltage. Referring to FIG. 46 it is seen that the $V_{Higher-Driver}$ node 1614 voltage initially at about 0V follows the Pos-Neg pin 1602 voltage at time 5 μsec. In normal, operation, when the Pos-Neg pin 1602 voltage drops below ground, the transistors M2 and M4 turn ON and pull the $V_{Higher-Driver}$ node 1614 voltage up to ground. However, during a negative ESD event, the large negative voltage on the Pos-Neg pin 1602 becomes large enough to break down the drain junction or drain junctions of one or more of the HV_DEPFETs 1608, the voltage of the $V_{Higher-Driver}$ node 1614 is pulled to below ground potential, shown here as about −3V, forward biasing the drain junctions of isolated HV_DENFET 1612a. This forward biasing is from a parasitic NPN bipolar junction transistor in the HV_DENFET 1612a formed by a deep N-well connected to the drain of the HV_DENFET, a P-well residing in a deep N-well (connected to the drain), and an n+ source region of the HV_DENFET in the P-well, and will cause current to be conducted to the p-substrate preventing the voltage of the $V_{Higher-Driver}$ node 1614 from going much below ground potential as shown.

Figure 47:
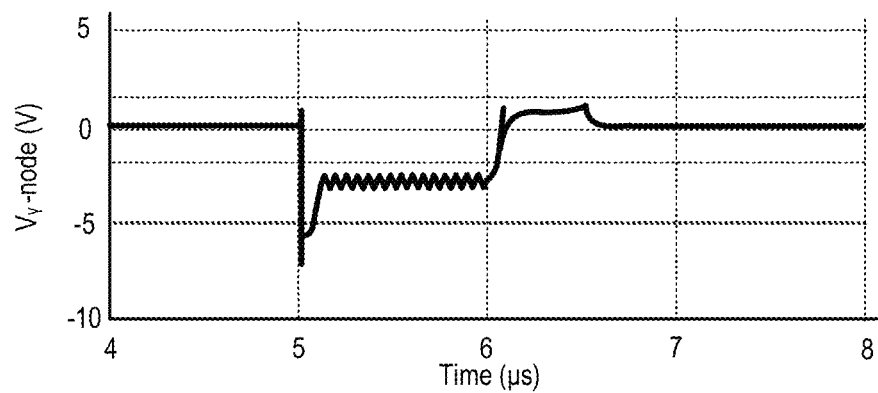

FIG. 47 is a waveform showing the γ node 1646 voltage during the positive ESD event. Referring to FIG. 47, it is seen that the γ node 1646 voltage, like the $V_{Higher-Driver}$ node 1614 voltage, initially at about 0V follows the Pos-Neg pin 1602 voltage beginning at time 5 μsec. The shut off acceleration transistor 1632 turns ON pulling the γ node 1646 up to about ground potential (−3V) shutting off the HV_DEPFETs 1608, and causing the drain junctions of the HV_DEPFETs 1608 to breakdown to the DN-wells 1610.

Figure 48:
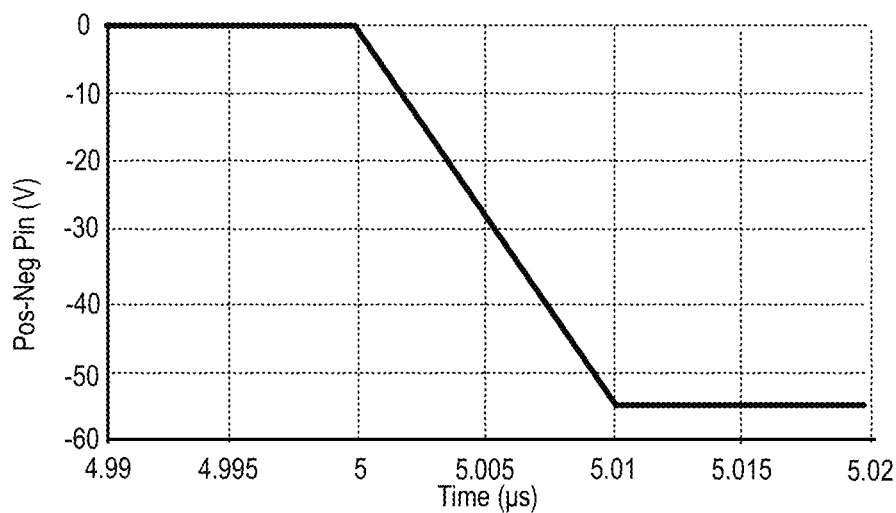
Figure 49:
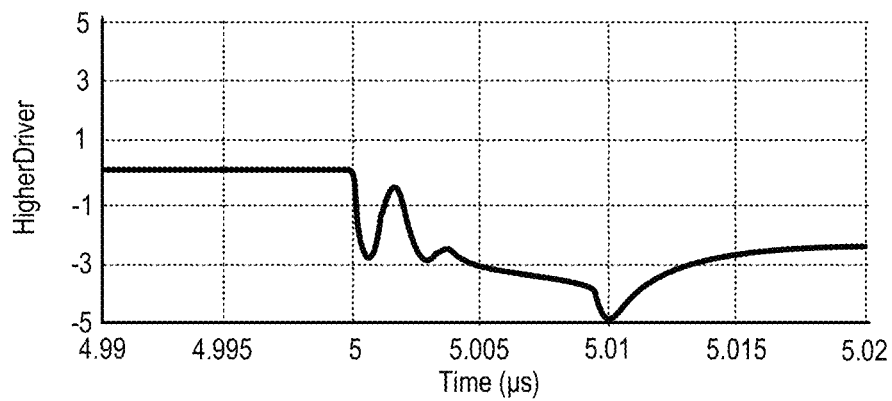
Figure 50:
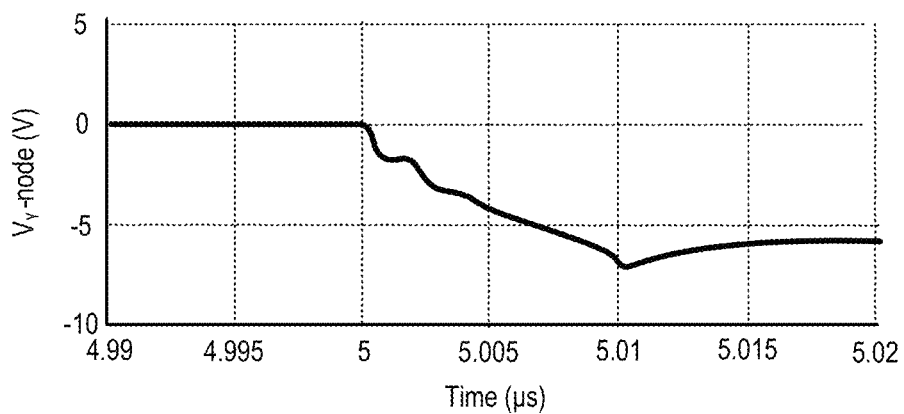

FIGS. 48, 49 and 50 are expanded, more detailed views of voltages on the Pos-Neg pin 1602, the $V_{Higher-Driver}$ node 1614, and the γ node 1646, during the falling voltage of the negative ESD event respectively.

Figure 51:
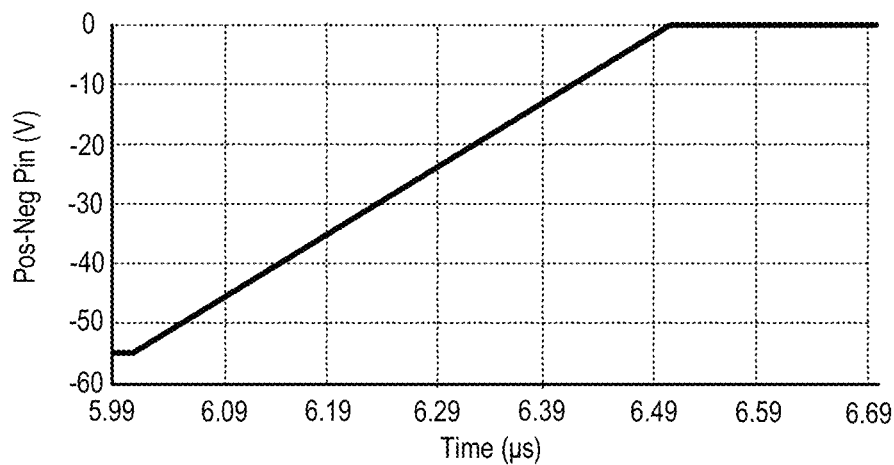
Figure 52:
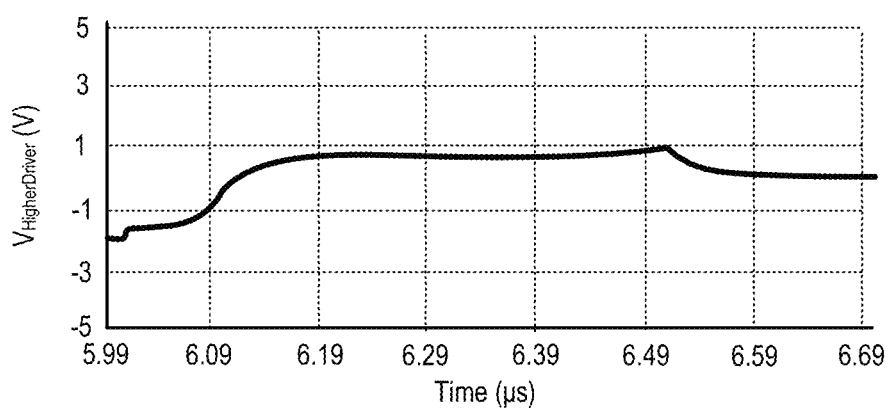
Figure 53:
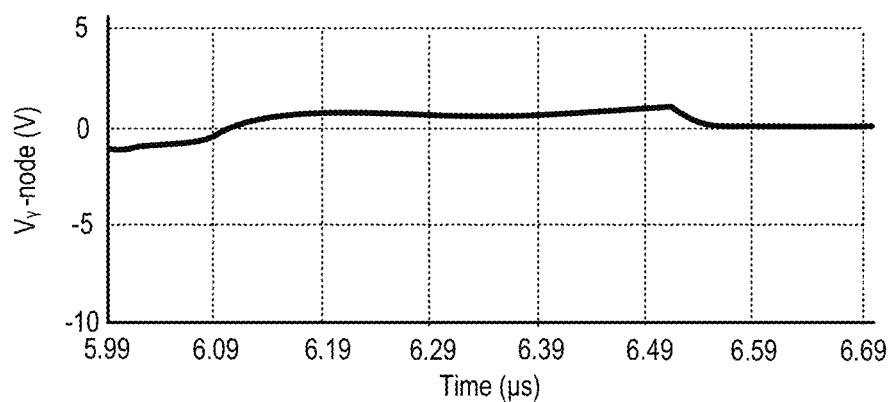

FIGS. 51, 52 and 53 are expanded; more detailed views, respectively, of voltages on the Pos-Neg pin 1602, the $V_{Higher-Driver}$ node 1614, and the γ node 1646, during a rising or recovery of voltage following the negative ESD event.

Figure 54:
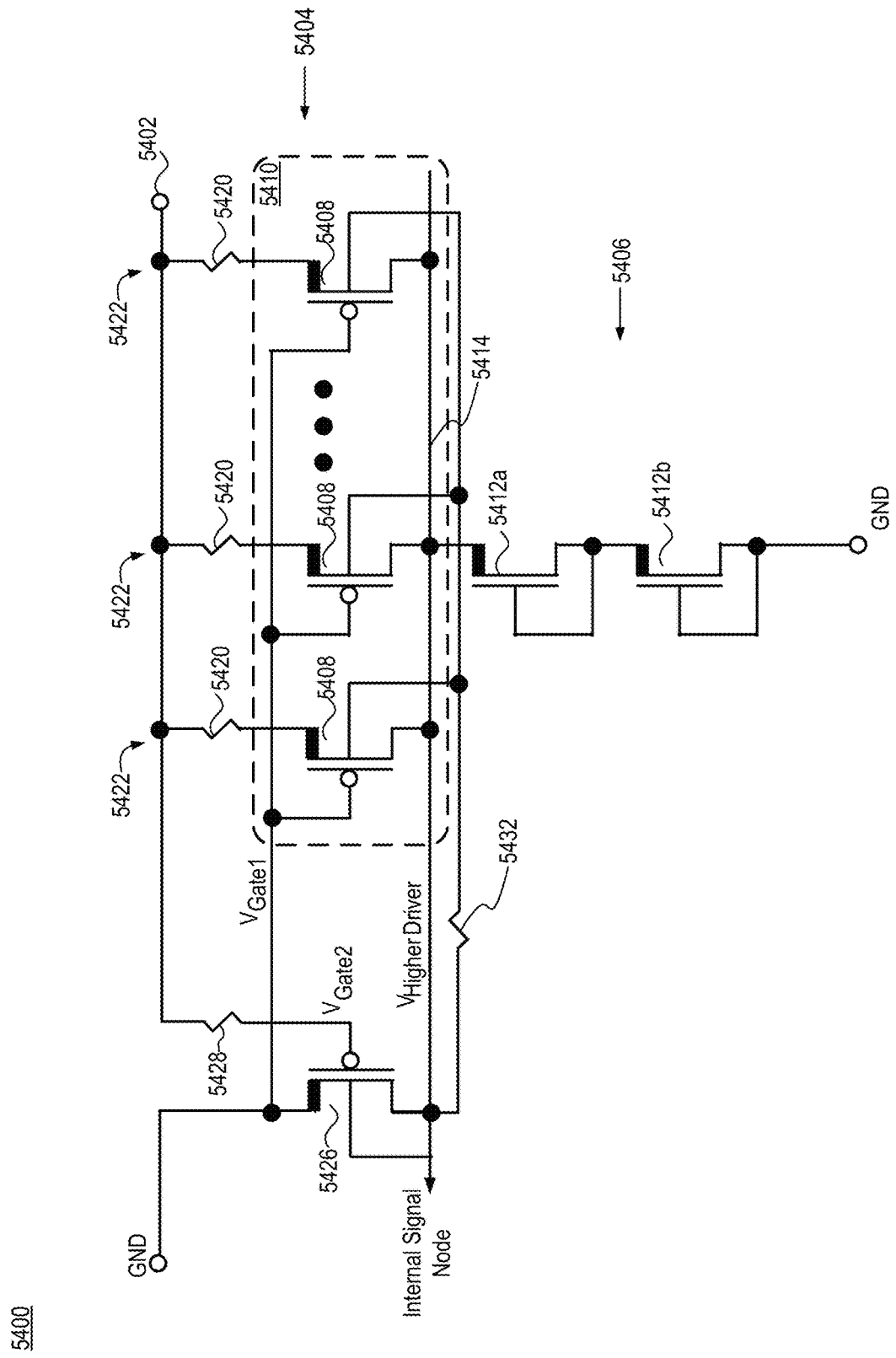
FIG. 54 is a schematic diagram illustrating an embodiment of the ESD protection circuit similar to FIG. 9 including a bias network based on the circuit of FIG. 14, and further including a DN-well resistor to facilitate low voltage operation.

FIG. 54 is a schematic diagram illustrating an embodiment of the ESD protection circuit including a bias network based on the circuit of FIG. 14 and further including a DN-well resistor between the $V_{Higher-Driver}$ node and the DN-wells underlying the HV_DEPFET 1308 to facilitate low voltage operation. The ESD protection circuit 5400 of FIG. 54 is similar to that of FIG. 15, and like that ESD protection circuit combines the ESD protection circuit of FIG. 8 with the biasing benefits of the higher circuit shown in FIG. 14.

Referring to FIG. 54, the ESD protection circuit 5400 generally includes a PFET clamp 5404 having a plurality of parallel circuits 5422 or sets coupled between a Pos-Neg pin 5402 and a $V_{Higher-Driver}$ node 5414, and an NFET clamp 5406 including a first, isolated HV_DENFET 5412a and a second, non-isolated HV_DENFET 5412b coupled in series between the PFET clamp 5404 and ground (GND). As in the embodiments described above, each of the plurality of parallel circuits 5422 of the PFET clamp 5404 include at least one HV_DEPFET 5408 formed in a DN-well 5410 and at least one ballasting resistor 5420. The $V_{Higher-Driver}$ node 5414 is generally coupled to an internal signal node to pass voltages to and from the Pos-Neg pin 5402.

The bias network generally includes a DN-well biasing transistor 5426, a relatively high impedance resistor 5428 through which a gate of the DN-well biasing transistor is connected to the Pos-Neg pin 5402, and the HV_DEPFETs 5408. The gates of the HV_DEPFETs 5408 are connected to ground. The source of the DN-well biasing transistor 5426 and the sources of the HV_DEPFET are coupled to form the higher circuit output or $V_{Higher-Driver}$ node 5414. The bias network functions by placing the higher of the ground potential or voltage of the Pos-Neg pin 5402, on the $V_{Higher-Driver}$ node 5414 coupled to the DN-well 5410. Thus the DN-well 5410 of all of the HV_DEPFETs 5408 have a voltage that is at least as high as the voltage of the Pos-Neg pin 5402. When the voltage on the Pos-Neg pin 5402 goes negative, the DN-well 5410 stays at ground potential.

The ESD protection circuit 5400 of FIG. 54 differs from the circuit 1500 of FIG. 15 in that the ESD protection circuit 5400 of FIG. 54 includes a resistor 5433 between the $V_{Higher-Driver}$ node 5414 and the DN-well 5410 underlying the HV_DEPFETs 5408 that connect the Pos/Neg pin 5402 and the $V_{Higher-Driver}$ node. This resistor can have, for example, a value of 100Ω. The resistor 5433 reduces parasitic bipolar junction transistor currents when the voltage of the $V_{Higher-Driver}$ node 5414 is less than a voltage of the Pos-Neg pin 5402. In such forward biasing instances, the forward biasing of the junction between the partitioned HV_DEPFET's 5408 p-type drain (Pos-Neg pin 5402), and the DN-well 5410 ($V_{Higher-Driver}$ node 5414), turns on two parasitic PNP transistors in the HV_DEPFETs 5408 (see FIG. 13B). The resistor 5433 reduces base to emitter voltages ($V_{BE}$) of these transistors by reducing the voltage from the Pos-Neg pin 5402 (HV_DEPFET's 5408 p-type drain) to the DN-well 5410. The resistor 5433 makes it so that the deep N well is not connected directly to the $V_{Higher-Driver}$ node 5414. In other respects, the ESD protection circuit 5400 of FIG. 54 operates in much the same way as the circuit shown in FIG. 15, and described above.

Figure 55:
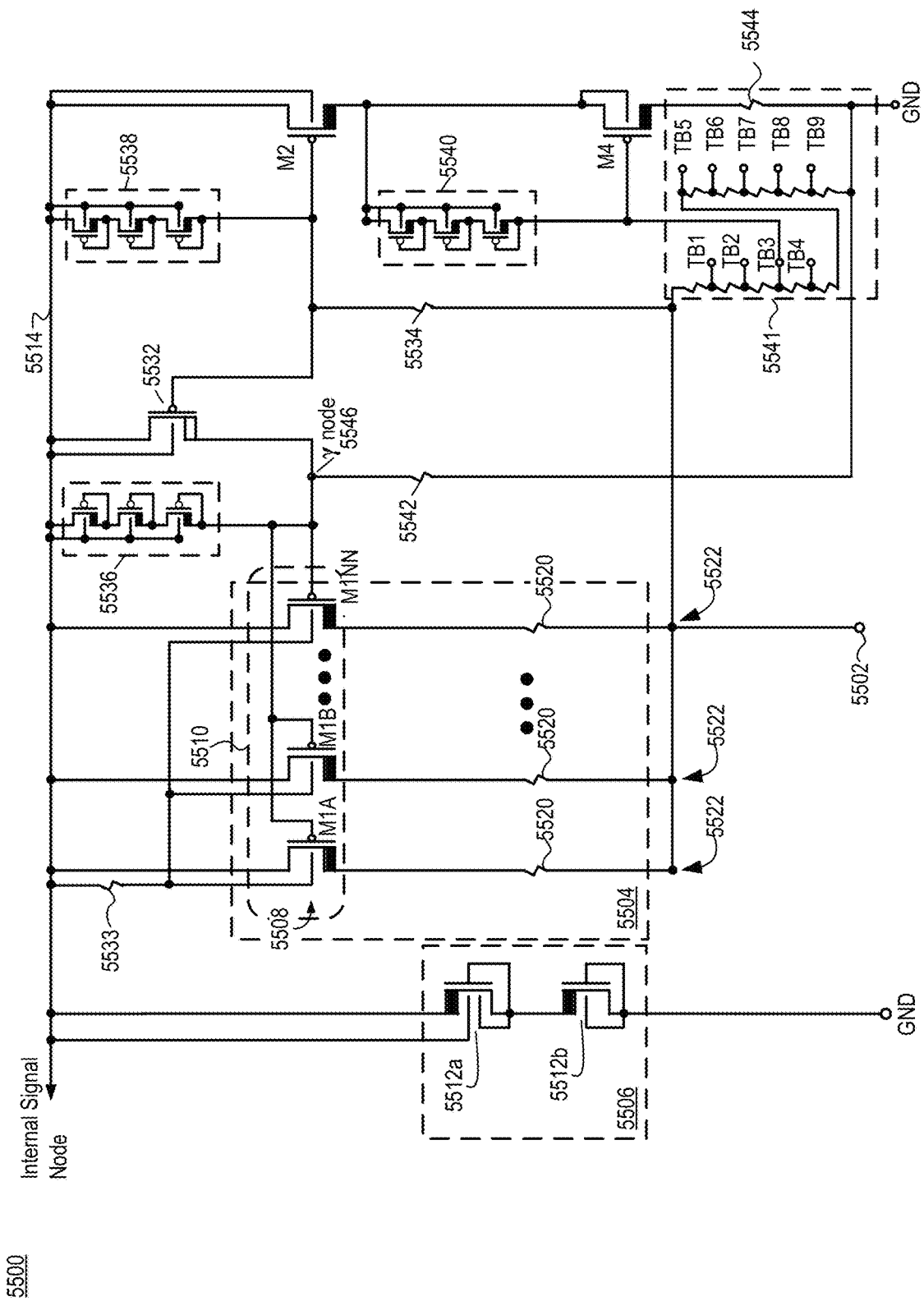
FIG. 55 is a schematic diagram illustrating an embodiment of the ESD protection circuit of FIG. 16A and further including an added DN-well resistor to reduce parasitic bipolar junction transistor currents.

During normal operation, during times when the Pos-Neg pin 5402 is not driven by a signal that is external to the chip, positive voltages that are applied to the $V_{Higher-Driver}$ node 5414 by the chip's internal circuitry, are transferred to the Pos-Neg pin. This is because the partitioned HV_DEPFETs 5408 will be turned ON when the $V_{Higher-Driver}$ node 5414 is positive. Those HV_DEPFETs 5408 will pass the $V_{Higher-Driver}$ node 5414 to the Pos-Neg pin 5402. FIG. 55 is a schematic diagram illustrating another embodiment of the ESD protection circuit similar to that of FIG. 16A and further including an added DN-well resistor to reduce parasitic bipolar junction transistor currents. Referring to FIG. 55 the ESD protection circuit 5500 generally includes a PFET clamp 5504 having a plurality of parallel circuits 5522 or sets coupled between a Pos-Neg pin 5502 and a $V_{Higher-Driver}$ node 5514, and an NFET clamp 5506 including a first, isolated HV_DENFET 5512a and a second, non-isolated HV_DENFET 5512b coupled in series between the PFET clamp 5504 and ground (GND). Each of the plurality of parallel circuits 5522 of the PFET clamp 5504 include at least one HV_DEPFET 5508 formed in a DN-well 5510 and at least one ballasting resistor 5520. The $V_{Higher-Driver}$ node 5514 is generally coupled to an internal signal node to pass voltages to and from the Pos-Neg pin 5502 during normal operation. Additionally, the ESD protection circuit 5500 further includes a shut off-acceleration transistor 5532 and a bias network with a higher-of-two-voltages circuit including DN-well biasing transistors M2, M4, and a relatively high impedance (1.25MΩ) resistor 5534. A number of pull-up strings, each having three series connected transistors that are connected in series with the gates of M1A through M1NN, M2 and M4. In the embodiment shown a first pull-up string 5536 is coupled to the gates of M1A through M1NN, a second pull-up string 5538 is coupled to the gate of M2, and a third pull-up string 5540 is coupled to the gate of M4. These pull-up strings 5536, 5538, 5540, limit the source to gate voltages of transistors M1A through M1NN, M2 and M4, to no more than 5V to prevent gate dielectric failure of the transistors. The γ node 5546 of transistors M1A through M1NN are further connected to ground through a high impedance (8MΩ) resistor 5542. The resistor 5542 helps to avoid having more than 5V across the gate oxides of transistors M1A through M1NN.

FIG. 55 is a schematic diagram illustrating another embodiment of the ESD protection circuit similar to that of FIG. 16A and further including an added DN-well resistor 5533 to reduce parasitic bipolar junction transistor currents. Referring to FIG. 55 the ESD protection circuit 5500 generally includes a PFET clamp 5504 having a plurality of parallel circuits 5522 or sets coupled between a Pos-Neg pin 5502 and a $V_{Higher-Driver}$ node 5514, and a NFET clamp 5506 including a first, isolated HV_DENFET 5512a and a second, non-isolated HV_DENFET 5512b coupled in series between the PFET clamp 5504 and ground (GND). Each of the plurality of parallel circuits 5522 of the PFET clamp 5504 include at least one HV_DEPFET 5508 formed in a DN-well 5510 and at least one ballasting resistor 5520. The $V_{Higher-Driver}$ node 5514 is generally coupled to an internal signal node to pass voltages to and from the Pos-Neg pin 5502 during normal operation. Additionally, the ESD protection circuit 5500 further includes a shut off-acceleration transistor 5532 and a bias network with a higher-of-two-voltages circuit including DN-well biasing transistors M2, M4, and a relatively high impedance (1.25MΩ) resistor 5534 through which the gate of the DN-well biasing transistors M2, and the gate of the shut off-acceleration transistor 5532 are connected to the Pos-Neg pin 5502. A number of pull-up strings, each having three series connected transistors that are connected in series with the gates of M1A through M1NN, M2 and M4. In the embodiment shown a first pull-up string 5536 is coupled to the gates of M1A through M1NN, a second pull-up string 5538 is coupled to the gate of M2, and a third pull-up string 5540 is coupled to the gate of M4. These pull-up strings 5536, 5538, 5540, limit the source to gate voltages of transistors M1A through M1NN, M2 and M4, to no more than 5V to prevent gate dielectric failure of the transistors. The γ node 5546 of transistors M1A through M1NN are further connected to ground through a high impedance (8MΩ) resistor 5542. The resistor 5542 aids in pulling down the voltage of the γ node 5546 when the Pos-Neg pin 5502 is at voltages greater than ground potential.

The ESD protection circuit 5500 further includes a voltage divider 5541 including a number of relatively high impedance (1.25MΩ) resistors with transistor bias points TB1 through TB9 to adjust or optimize a voltage applied to the gate of HV_DEPFET M4 that comes from between the Pos-Neg pin 5502 voltage and the ground. A limiting resistor 5544 coupled between a drain of the HV_DEPFET M4 and ground enables the DN-well 5510 to be pulled slightly below ground potential when the Pos-Neg pin 5502 goes below ground.

The ESD protection circuit 5500 of FIG. 55 differs from the ESD protection circuit 1600 of FIG. 16A in that it includes a resistor 5533 between the $V_{Higher-Driver}$ node 5514 and the DN-well 5510 underlying the HV_DEPFETs 5508 that connect the Pos/Neg pin 5502 and the $V_{Higher-Driver}$ node. This resistor can have, for example, a value of 100Ω. The resistor 5533 reduces parasitic bipolar junction transistor currents when the voltage of the $V_{Higher-Driver}$ node 5514 is less than a voltage of the Pos-Neg pin 5502. In such forward biasing instances, the forward biasing of the junction between the partitioned HV_DEPFET's 5508 p-type drain (Pos-Neg pin 5502), and the DN-well 5510 ($V_{Higher-Driver}$ node 5514), turns on two parasitic PNP transistors in the HV_DEPFETs 5508 (see FIG. 13B). The resistor 5533 reduces base to emitter voltages ($V_{BE}$) of these transistors by reducing the voltage from the Pos-Neg pin 5502 (HV_DEPFET's 5508 p-type drain) to the DN-well 5510. The resistor 5533 makes it so that the deep N well is not connected directly to the $V_{Higher-Driver}$ node 5514.

In other respects, the ESD protection circuit 5500 of FIG. 55 operates in much the same way as the circuit shown in FIG. 16A, and described above.

Figure 56:
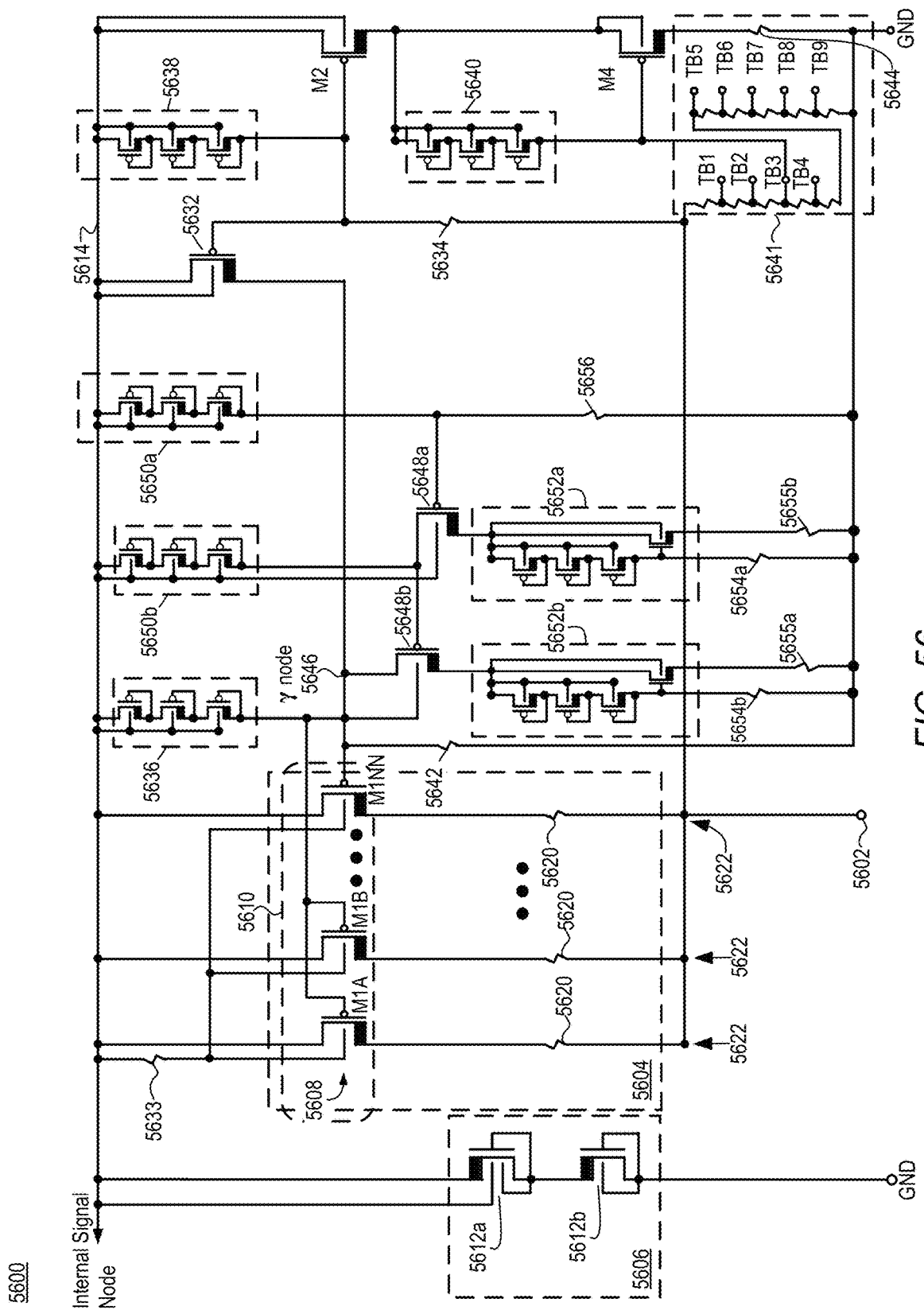
FIG. 56 is a schematic diagram illustrating an embodiment of the ESD protection circuit of FIG. 16B with a turn on acceleration network and further including an added DN-well resistor.

FIG. 56 is a schematic diagram illustrating another embodiment of the ESD protection circuit similar to that of FIG. 16B and further including an added DN-well resistor 5633 to reduce parasitic bipolar junction transistor currents. Referring to FIG. 56 the ESD protection circuit 5600 generally includes a PFET clamp 5604 having a plurality of parallel circuits 5622 or sets coupled between a Pos-Neg pin 5602 and a $V_{Higher-Driver}$ node 5614, and a NFET clamp 5606 including a first, isolated HV_DENFET 5612a and a second, non-isolated HV_DENFET 5612b coupled in series between the PFET clamp 5604 and ground (GND). Each of the plurality of parallel circuits 5622 of the PFET clamp 5604 include at least one HV_DEPFET 5608 formed in a DN-well 5610 and at least one ballasting resistor 5620. The $V_{Higher-Driver}$ node 5614 is generally coupled to an internal signal node to pass voltages to and from the Pos-Neg pin 5602 during normal operation. Additionally, the ESD protection circuit 5600 further includes a shut off-acceleration transistor 5632 and a bias network with a higher-of-two-voltages circuit including DN-well biasing transistors M2, M4, and a relatively high impedance (1.25MΩ) resistor 5634 through which the gate of the DN-well biasing transistors M2, and the gate of the shut off-acceleration transistor 5632 are connected to the Pos-Neg pin 5602. A number of pull-up strings, each having three series connected transistors, which are connected in series with the gates of M1A through M1NN, M2 and M4. In the embodiment shown a first pull-up string 5636 is coupled to the gates of M1A through M1NN, a second pull-up string 5638 is coupled to the gate of M2, and a third pull-up string 5640 is coupled to the gate of M4. These pull-up strings 5636, 5638, 5640, limit the source to gate voltages of transistors M1A through M1NN, M2 and M4, to no more than 5V to prevent gate dielectric failure of the transistors.

The ESD protection circuit 5600 further includes a voltage divider 5641 including a number of relatively high impedance (1.25MΩ) resistors with transistor bias points TB1 through TB9 to adjust or optimize a voltage applied to the gate of HV_DEPFET M4 that comes from between the Pos-Neg pin 5602 voltage and the ground. A limiting resistor 5644 coupled between a drain of the HV_DEPFET M4 and ground enables the DN-well 5610 to be pulled slightly below ground potential when the Pos-Neg pin 5602 goes below ground.

The ESD protection circuit 5600 of FIG. 56 differs from that shown in FIG. 55 in that it further includes a turn on acceleration circuit for the HV_DEPFETs 5608 of the PFET clamp 5604. Generally, the acceleration circuit includes a first stage having a first HV_DEPFET 5648a, and a second stage having a second HV_DEPFET 5648b. Gates of the HV_DEPFETs 5648a, 5648b, are coupled to $V_{Higher-Driver}$ node 5614 through pull-up strings 5650a, 5650b, and coupled between the γ node 5646 and ground through Cascode transistors 5652a, 5652b, high impedance (8MΩ) resistors 5654a, 5654b and 500Ω ballast resistors 5655a, 5655b. Each pull-up string 5650a, 5650b, includes three diode connected HV_DEPFETs. The γ node 5646 of transistors M1A through M1NN are further connected to ground through a high impedance (8MΩ) resistor 5642 to avoid having more than 5V across the gate oxides of transistors M1A through M1NN. The gate of the first HV_DEPFET 5648a is further coupled to ground through a high impedance (8MΩ) resistor 5656. The DN-well of the first HV_DEPFET 5648a is couple to the $V_{Higher-Driver}$ node 5614. The gate of the second HV_DEPFET 5648b is coupled to the source of the first HV_DEPFET 5648a. The source and DN-well of the second HV_DEPFET 5648b is coupled to the γ node 5646.

The source and DN-well of first cascode HV_DEPFET 5652a is connected to the drain of HV_DEPFET 5648a, and the drain of first cascode HV_DEPFET 5652a is connected to ground through resistor 5655a. The source of first cascode HV_DEPFET 5652a is further connected to ground through second, third, and fourth cascode HV_DEPFETs 5652a and resistor 5654a. The DN-wells of second, third, and fourth cascode HV_DEPFETs 5652a are connected to the source of first cascode HV_DEPFETs 5652a. The gates of second, third, and fourth cascode HV_DEPFETs 5652a are connected to their respective drains. The source of second cascode HV_DEPFET 5652a is connected to the source of first cascode HV_DEPFET 5652a. The drain of second cascode HV_DEPFET 5652a is connected to the source of third cascode HV_DEPFET 5652a. The drain of third cascode HV_DEPFET 5652a is connected to the source of fourth cascode HV_DEPFET 5652a. The drain of fourth cascode HV_DEPFET 5652a is connected to resistor 5654a. The other end of resistor 5654a is connected to ground.

Similarly, the source and DN-well of first cascode HV_DEPFET 5652b is connected to the drain of HV_DEPFET 5648b, and the drain of first cascode HV_DEPFET 5652b is connected to ground through resistor 5655b. The source of first cascode HV_DEPFET 5652b is further connected to ground through second, third, and fourth cascode HV_DEPFETs 5652b and resistor 5654b. The DN-wells of second, third, and fourth cascode HV_DEPFETs 5652b are connected to the source of first cascode HV_DEPFETs 5652b. The gates of second, third, and fourth cascode HV_DEPFETs 5652b are connected to their respective drains. The source of second cascode HV_DEPFET 5652b is connected to the source of first cascode HV_DEPFET 5652b. The drain of second cascode HV_DEPFET 5652b is connected to the source of third cascode HV_DEPFET 5652b. The drain of third cascode HV_DEPFET 5652b is connected to the source of fourth cascode HV_DEPFET 5652b. The drain of fourth cascode HV_DEPFET 5652b is connected to resistor 5654b. The other end of resistor 5654b is connected to ground.

When the voltage on the Pos-Neg pin 5602 goes to voltages above ground, resistor 5656 pulls the voltage on the gate of HV_DEPFETs 5648a toward ground and controls the turn on acceleration circuit for the HV_DEPFETs 5608. When the voltage on the Pos-Neg pin 5602 goes to voltages above ground, resistor 5656 pulls the voltage on the gate of HV_DEPFET 5648a toward ground, turns on HV_DEPFET 5648a and, through HV_DEPFET 5648a, turns on HV_DEPFET 5648b. HV_DEPFET 5648b then pulls down on the gates of HV_DEPFETs 5608, thus accelerating the turn on of HV_DEPFETs 5608.

Like the ESD protection circuit 5500 of FIG. 55, the ESD protection circuit 5600 of FIG. 56 includes a resistor 5633 between the $V_{Higher-Driver}$ node 5614 and the DN-well 5610 underlying the HV_DEPFETs 5608 that connect the Pos/Neg pin 5602 and the $V_{Higher-Driver}$ node. This resistor can have, for example, a value of 100Ω. The resistor 5632 reduces parasitic bipolar junction transistor currents when the voltage of the $V_{Higher-Driver}$ node 5614 is less than a voltage of the Pos-Neg pin 5602. In such forward biasing instances, the forward biasing of the junction between the partitioned HV_DEPFET's 5608 p-type drain (Pos-Neg pin 5602), and the DN-well 5610 ($V_{Higher-Driver}$ node 5614), turns on two parasitic PNP transistors in the HV_DEPFETs 5608 (see FIG. 13B). The resistor 5633 reduces base to emitter voltages ($V_{BE}$) of these transistors by reducing the voltage from the Pos-Neg pin 5602 (HV_DEPFET's 5608 p-type drain) to the DN-well 5610. The resistor 5633 makes it so that the deep N well is not connected directly to the $V_{Higher-Driver}$ node 5614.

In other respects, the ESD protection circuit 5600 of FIG. 56 operates in much the same way as the circuit shown in FIG. 16B, and described above.

Figure 57:
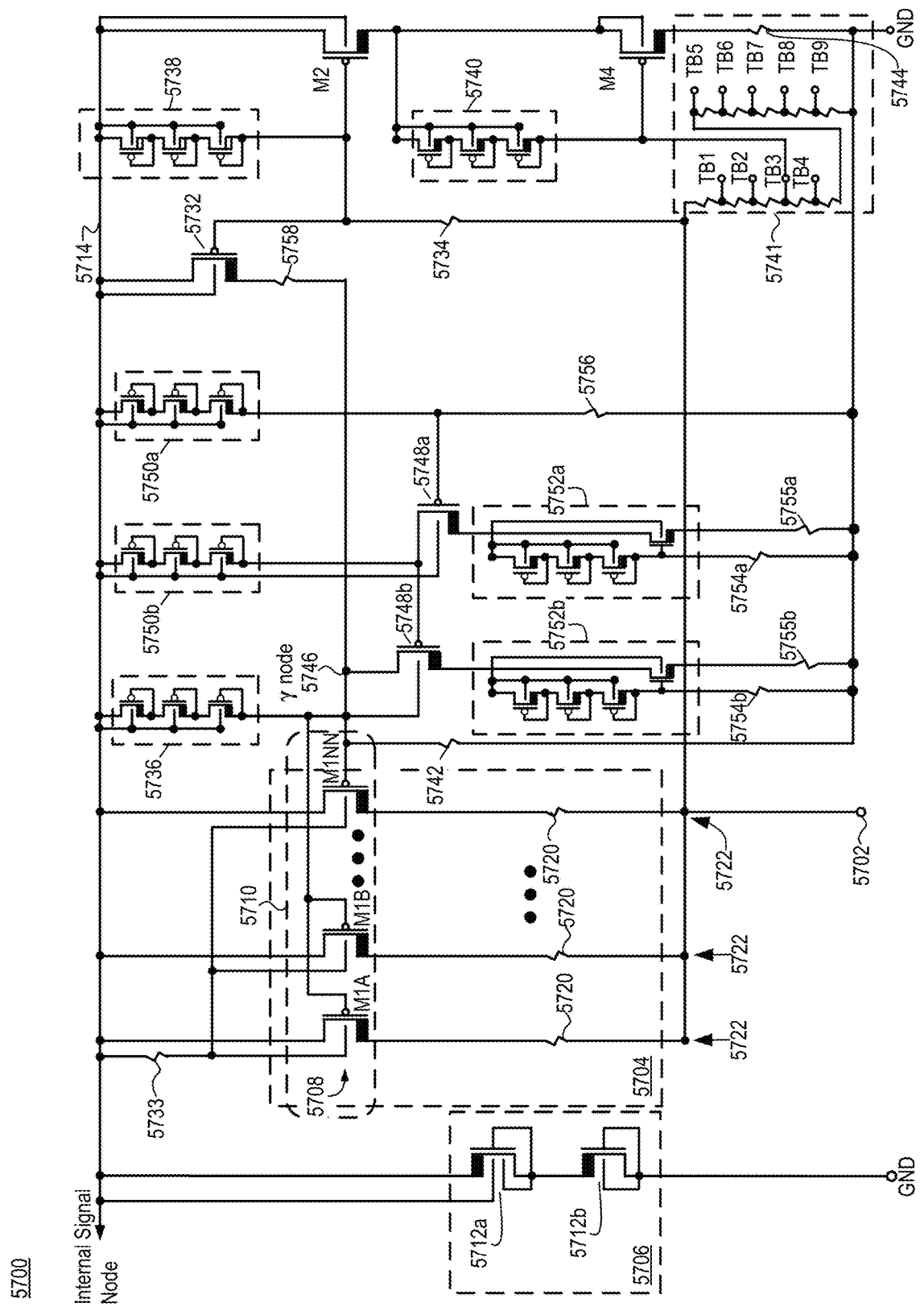
FIG. 57 is a schematic diagram illustrating an embodiment of the ESD protection circuit of FIG. 16C with a turn on acceleration network modified for negative voltage clamping and further including an added DN-well resistor.

FIG. 57 is a schematic diagram illustrating another embodiment of the ESD protection circuit similar to that of FIG. 16C and further including an added DN-well resistor to reduce parasitic bipolar junction transistor currents. Referring to FIG. 57 the ESD protection circuit 5700 generally includes a PFET clamp 5704 having a plurality of parallel circuits or sets 5722 coupled between a Pos-Neg pin 5702 and a $V_{Higher-Driver}$ node 5714, and a NFET clamp 5706 including a first, isolated HV_DENFET 5712a and a second, non-isolated HV_DENFET 5712b coupled in series between the PFET clamp 5704 and ground (GND). Each of the plurality of parallel circuits 5722 of the PFET clamp 5704 include at least one HV_DEPFET 5708 formed in a DN-well 5710 and at least one ballasting resistor 5720. The $V_{Higher-Driver}$ node 5714 is generally coupled to an internal signal node to pass voltages to and from the Pos-Neg pin 5702 during normal operation. Additionally, the ESD protection circuit 5700 further includes a shut off-acceleration transistor 5732 and a bias network with a higher-of-two-voltages circuit including DN-well biasing transistors M2, M4, and a relatively high impedance (1.25MΩ) resistor 5734 through which the gate of the DN-well biasing transistors M2, and the gate of the shut off-acceleration transistor 5732 are connected to the Pos-Neg pin 5702. A number of pull-up strings, each having three series connected transistors, which are connected in series with the gates of M1A through M1NN, M2 and M4. In the embodiment shown a first pull-up string 5736 is coupled to the gates of M1A through M1NN, a second pull-up string 5738 is coupled to the gate of M2, and a third pull-up string 5740 is coupled to the gate of M4. These pull-up strings 5736, 5738, 5740, limit the source to gate voltages of transistors M1A through M1NN, M2 and M4, to no more than 5V to prevent gate dielectric failure of the transistors.

The ESD protection circuit 5700 further includes a voltage divider 5741 including a number of relatively high impedance (1.25MΩ) resistors with transistor bias points TB1 through TB9 to adjust or optimize a voltage applied to the gate of HV_DEPFET M4 that comes from between the Pos-Neg pin 5702 voltage and the ground. A limiting resistor 5744 coupled between a drain of the HV_DEPFET M4 and ground enables the DN-well 5710 to be pulled slightly below ground potential when the Pos-Neg pin 5702 goes below ground.

The ESD protection circuit 5700 of FIG. 57 differs from that shown in FIG. 56 in that it further includes a resistor 5758 coupled between the γ-node 5746 and the shut off acceleration transistor 5732 to enable connecting a sensor circuit for accelerated sensing of large negative pulses to the γ node. Suitable sensor circuits can include one of those shown in FIGS. 17A and 17B described above. The γ node 5746 of transistors M1A through M1NN are further connected to ground through a high impedance (8MΩ) resistor 5742 to avoid having more than 5V across the gate oxides of transistors M1A through M1NN.

The ESD protection circuit 5700 of FIG. 57 also differs from that shown in FIG. 55 in that it also further includes a turn on acceleration circuit for the HV_DEPFETs 5708 of the PFET clamp 5704. Generally, the acceleration circuit includes a first stage having a first HV_DEPFET 5748a, and a second stage having a second HV_DEPFET 5748b. Gates of the HV_DEPFETs 5748a, 5748b, are coupled to V$_{Higher-Driver}$ node 5714 through pull-up strings 5750a, 5750b, and coupled between the γ node 5746 and ground through Cascode transistors 5752a, 5752b, high impedance (8MΩ) resistors 5754a, 5754b and 500Ω ballast resistors 5755a, 5755b. Each pull-up string 5750a, 5750b, includes three diode connected HV_DEPFETs. The gate of the first HV_DEPFET 5748a is further coupled to ground through a high impedance (8MΩ) resistor 5756. The DN-well of the first HV_DEPFET 5748a is couple to the V$_{Higher-Driver}$ node 5714. The gate of the second HV_DEPFET 5748b is coupled to the source of the first HV_DEPFET 5748a. The source and DN-well of the second HV_DEPFET 5748b is coupled to the γ node 5746.

The source and DN-well of first cascode HV_DEPFET 5752a is connected to the drain of HV_DEPFET 5748a, and the drain of first cascode HV_DEPFET 5752a is connected to ground through resistor 5755a. The source of first cascode HV_DEPFET 5752a is further connected to ground through second, third, and fourth cascode HV_DEPFETs 5752a and resistor 5754a. The DN-wells of second, third, and fourth cascode HV_DEPFETs 5752a are connected to the source of first cascode HV_DEPFETs 5752a. The gates of second, third, and fourth cascode HV_DEPFETs 5752a are connected to their respective drains. The source of second cascode HV_DEPFET 5752a is connected to the source of first cascode HV_DEPFET 5752a. The drain of second cascode HV_DEPFET 5752a is connected to the source of third cascode HV_DEPFET 5752a. The drain of third cascode HV_DEPFET 5752a is connected to the source of fourth cascode HV_DEPFET 5752a. The drain of fourth cascode HV_DEPFET 5752a is connected to resistor 5754a. The other end of resistor 5754a is connected to ground.

Similarly, the source and DN-well of first cascode HV_DEPFET 5752b is connected to the drain of HV_DEPFET 5748b, and the drain of first cascode HV_DEPFET 5752b is connected to ground through resistor 5755b. The source of first cascode HV_DEPFET 5752b is further connected to ground through second, third, and fourth cascode HV_DEPFETs 5752b and resistor 5754b. The DN-wells of second, third, and fourth cascode HV_DEPFETs 5752b are connected to the source of first cascode HV_DEPFETs 5752b. The gates of second, third, and fourth cascode HV_DEPFETs 5752b are connected to their respective drains. The source of second cascode HV_DEPFET 5752b is connected to the source of first cascode HV_DEPFET 5752b. The drain of second cascode HV_DEPFET 5752b is connected to the source of third cascode HV_DEPFET 5752b. The drain of third cascode HV_DEPFET 5752b is connected to the source of fourth cascode HV_DEPFET 5752b. The drain of fourth cascode HV_DEPFET 5752b is connected to resistor 5754b. The other end of resistor 5754b is connected to ground.

When the voltage on the Pos-Neg pin 5702 goes to voltages above ground, resistor 5756 pulls the voltage on the gate of HV_DEPFETs 5748a toward ground and controls the turn on acceleration circuit for the HV_DEPFETs 5708. When the voltage on the Pos-Neg pin 5702 goes to voltages above ground, resistor 5756 pulls the voltage on the gate of HV_DEPFET 5748a toward ground, turns on HV_DEPFET 5748a and, through HV_DEPFET 5748a, turns on HV_DEPFET 5748b. HV_DEPFET 5748b then pulls down on the gates of HV_DEPFETs 5708, thus accelerating the turn on of HV_DEPFETs 5708.

Like the ESD protection circuits of FIGS. 55 and 56, the ESD protection circuit 5700 of FIG. 57 includes a resistor 5733 between the V$_{Higher-Driver}$ node 5714 and the DN-well 5710 underlying the HV_DEPFETs 5708 that connect the Pos/Neg pin 5702 and the V$_{Higher-Driver}$ node. This resistor can have, for example, a value of 100Ω. The resistor 5732 reduces parasitic bipolar junction transistor currents when the voltage of the V$_{Higher-Driver}$ node 5714 is less than a voltage of the Pos-Neg pin 5702. In such forward biasing instances, the forward biasing of the junction between the partitioned HV_DEPFET's 5708 p-type drain (Pos-Neg pin 5702), and the DN-well 5710 (V$_{Higher-Driver}$ node 5714), turns on two parasitic PNP transistors in the HV_DEPFETs 5708 (see FIG. 13B). The resistor 5733 reduces base to emitter voltages (V$_{BE}$) of these transistors by reducing the voltage from the Pos-Neg pin 5702 (HV_DEPFET's 5708 p-type drain) to the DN-well 5710. The resistor 5733 makes it so that the deep N well is not connected directly to the V$_{Higher-Driver}$ node 5714.

In other respects, the ESD protection circuit 5700 of FIG. 57 operates in much the same way as the circuit shown in FIG. 16C, and described above.

In some instances, the normal operation signals on the Pos-Neg pin are accompanied by high frequency high voltage noise. For example, a 10 KHz 0 to 12V signal may be accompanied by 100 KHz 40V peak to peak noise. An example of such a signal and noise is shown in FIG. 58.

Figure 58:
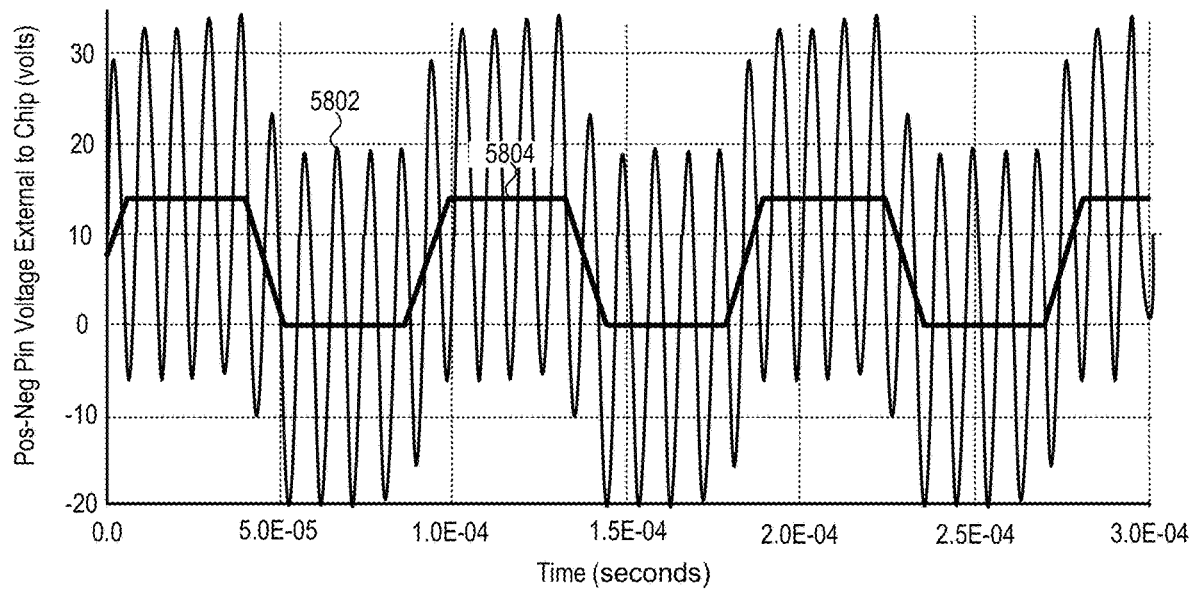
FIG. 58 are waveforms illustrating a signal and noise typically encountered on the Pos-Neg pin.

Referring to FIG. 58, the noise is 40V peak to peak ~100 KHz sinusoid superimposed on a regular Pos-Neg pin type signal. The signal and noise together are shown as a sinusoid 5802. The square wave 5804 does not actually exist, but rather represents the useful signal that must be "derived" from the sinusoid 5802. The sinusoid 5802 is the noise-leaden signal that comes to the chip from the Pos-Neg pin or internal signal node. For signals going from the Pos-Neg pin into the chip, the information contained in the high frequency sinusoid 5802 ("Signal+Noise") needs to be transformed into the low frequency digital signal, represented by square wave 5804.

In the presence of high frequency noise, any of the ESD protection circuits described above or the improved ESD protection circuits described below continue to provide primary protection from ESD events, and also continue to be used as a conduit or signal path for signals going from the chip to the external bus. Generally, the signal placed upon the V$_{Higher-Driver}$ node by the chip (from an internal signal node) are strong enough with sufficiently low impedance to overcome any noise on the Pos-Neg pin. For signals input into the chip from the Pos-Neg pin, a low pass filter, such as that shown in FIG. 59, is used to filter the noise from the low frequency square wave signal 5804 on the Pos-Neg pin from the noise-leaden high frequency sinusoid 5802.

Figure 59:
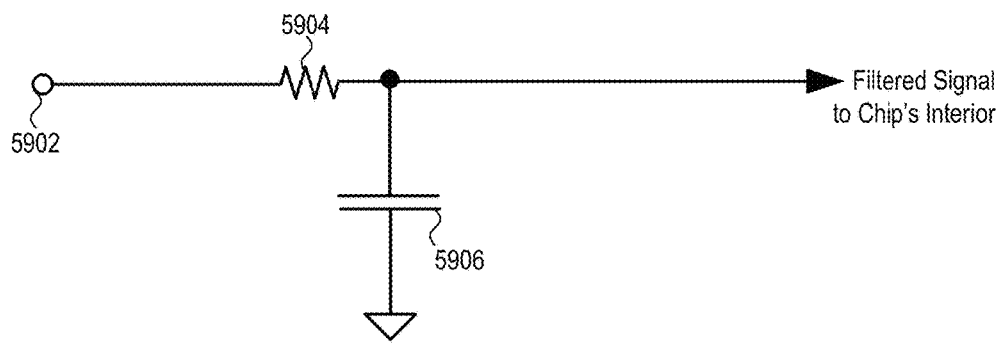
FIG. 59 is a schematic diagram illustrating an embodiment of a low pass filter suitable for filtering the noise typically encountered on the Pos-Neg pin in the ESD protection circuit.

Referring to FIG. 59 the low pass filter 5900 can either be a discrete circuit coupled between a LIN bus and a Pos-Neg pin of an ESD protection circuit, or, as in the embodiment shown, be coupled between the Pos-Neg pin 5902 and an interior of a chip embodying the ESD protection circuit. Generally, the low pass filter 5900 includes a resistor 5904 coupled between the Pos-Neg pin 5902 and the interior of a chip, and a capacitor 5906 coupled between the chip side of the resistor and ground. The resistance of the resistor 5904 is set sufficiently low to overcome or avoid current loading of a follow-on higher-of-two-voltages circuit (not shown in this figure). The filter RC time constant is selected to block frequencies of about 40 KHz and higher. For example, in one embodiment the RC time constant is set at 3.5 μsec, or barely fast enough to pass 15 KHz sine wave. By way of a non-limiting example, these criteria for resistance and RC time constant can be met by a resistor 5904 having a resistance of about 350KΩ, and a HV capacitor 5906 having a capacitance of about 15 pF.

Figure 60:
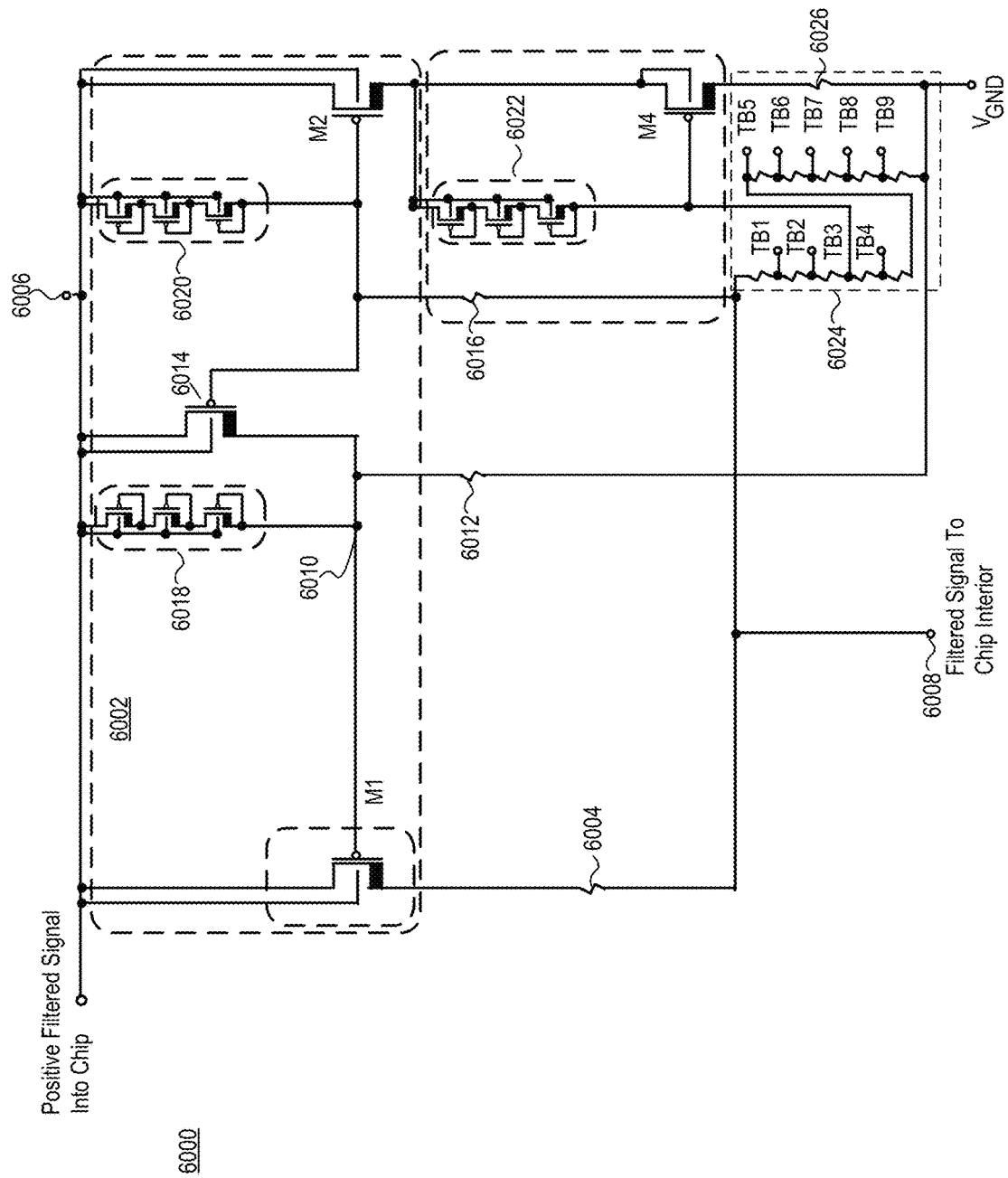
FIG. 60 is a schematic diagram illustrating an embodiment of a signal input section higher circuit suitable for use with an ESD protection circuit of FIG. 16A-C and the low pass filter of FIG. 59.

FIG. 60 is a schematic diagram illustrating an embodiment of a signal input/higher-voltage selection circuit 6000 for accepting the filtered signal from the low pass filter of FIG. 59 and suitable for use in conjunction with any of the ESD protection and signal passing circuits described herein. Referring to FIG. 60 the signal input/higher-voltage selection circuit 6000 generally includes a first HV_DEPFET M1 formed in a DN-well 6002 and coupled in series with a ballasting resistor 6004 between a $V_{Higher-Driver}$ node 6006 and a circuit input 6008. A gate of the first HV_DEPFET M1 is coupled to a γ node 6010 and through a high impedance (8MΩ) resistor 6012 to ground. The resistor 6012 helps to avoid having more than 5V across the gate oxide of transistor M1. The circuit input 6008 is coupled through the low pass filter 5900 of FIG. 59 to a Pos-Neg pin of the chip. The $V_{Higher-Driver}$ node 6006 is generally coupled to an internal signal node to pass a positive filtered signal into the chip during normal operation. The input/higher-voltage selection circuit 6000 further includes a shut off-acceleration transistor 6014 and a bias network with a higher-of-two-voltages circuit including transistor M1, DN-well biasing transistors M2, M4, and a relatively high impedance (1.25MΩ) resistor 6016 through which gates of the DN-well biasing transistors are connected to the circuit input 6008. Additionally, the input/higher-voltage selection circuit 6000 further includes a number of pull-up strings, each having three series connected transistors that are connected in series with the gates of transistors M1, M2 and M4. In the embodiment shown a first pull-up string 6018 is coupled to the gate of transistor M1, a second pull-up string 6020 is coupled to the gate of transistor M2, and a third pull-up string 6022 is coupled to the gate of transistor M4 to limit the source to gate voltages of the transistors to prevent gate dielectric failure. A voltage divider 6024 including a number of relatively high impedance (1.25MΩ) resistors with transistor bias points TB1 through TB9 to adjust or optimize a voltage applied to the gate of HV_DEPFET M4. A limiting resistor 6026 coupled between a drain of M4 and ground enables the DN-well 6002 to be pulled slightly below ground potential when the circuit input 6008 goes below ground.

The filtered signal from the low pass filter 5900 of FIG. 59 bound for the chip's interior, may be fed into the circuit of FIG. 60 in order to ensure that the signal that goes into the chip has a voltage that is always greater than or equal to ground. The higher-voltage selection portion of the circuit 6000 of FIG. 60 operates similarly to the higher-voltage selection networks used in the circuits of FIG. 15, FIG. 16A and FIG. 16A's follow on circuits. Generally, the embodiment of the circuit 6000 shown in FIG. 60 handles currents which are much smaller than the currents of the circuit of FIGS. 16A, 16B and 16C. However, the functioning of the circuit of FIG. 60 can be improved in the same ways FIGS. 16B and 16C improve the functioning of the circuit 16A.

One non-limiting exemplary application of the ESD protection circuit 1300 of FIG. 13A is that of using the circuit in an automotive environment. In such a case, the Pos-Neg pin 1302 (also generally known as a LIN bus pin) is used, for example, as a connection to a Local Interconnect Network (LIN) physical circuit or LIN bus system. Such a LIN bus system commonly serves as a signaling and communication network among devices that are used in the monitoring and control of engine-related components. One such engine-related component is a battery used for starting an internal combustion engine and for supplying electrical power to other components in the automotive system. An intelligent battery sensor system may connect to a LIN bus system through the Pos-Neg pin 1302.

Figure 61:
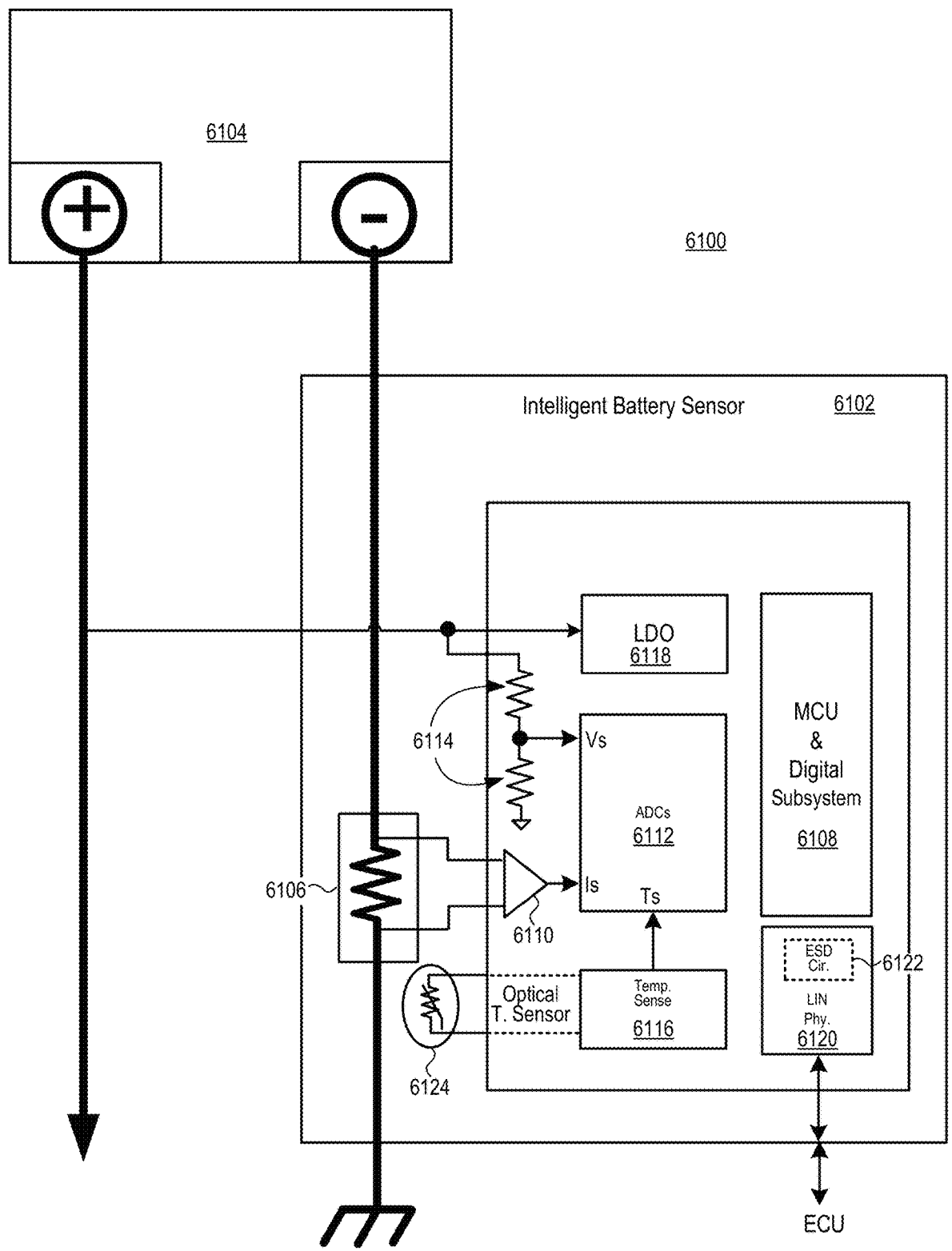
FIG. 61 is a block diagram of an embodiment of an intelligent battery sensor system including an embodiment of one of the ESD protection circuits described herein.

FIG. 61 is a block diagram of an embodiment of an intelligent battery sensor (IBS) system including one of the ESD protection and signal passing circuits described herein, and useful in many automotive applications. Referring to FIG. 61, in the embodiment shown the IBS system 6100 includes an IBS 6102 coupled to a positive terminal of a battery 6104 and, across a shunt resistor 6106 coupled between a negative terminal of the battery and a chassis ground. The IBS 6102 can be integrally formed as a programmable system on a chip or a single integrated circuit chip. The IBS 6102 includes a control unit 6108; a differential amplifier 6110 connected across the shunt resistor 6106 to sample current from or into the battery 6104; a number of analog-to-digital-converters (ADCs) 6112 coupled to the differential amplifier and through a voltage divider 6114 to the positive terminal of the battery; an on-chip temperature sensing circuit 6116; a low dropout regulator (LDO) 6118 coupled to the positive terminal of the battery to power the IBS; and a LIN physical layer or circuit (LIN Phy) 6120 through which the IBS connects to a LIN bus and to an engine control unit (ECU) in the automobile. Generally, the LIN Phy 6120 includes one of the ESD protection and signal passing circuits 6122 described herein. Optionally, as in the embodiment shown, the IBS 6102 further includes an optical temperature sensor 6124 coupled to the temperature sensing circuit 6116 to detect a temperature of the shunt resistor 6106 or an electrical cable connecting the negative terminal of the battery to chassis ground.

Generally, the IBS system 6100 functions to measure the battery 6104 voltage, current and temperature of the IBS 6102 and/or shunt resistor 6106 or cabling, and from these to calculate a state-of-charge, state-of-health, state-of-function and an internal resistance ($R_{int}$) of the battery, from an age, number or cycles remaining or power storing capacity of the batter can be determined.

Figure 62A:
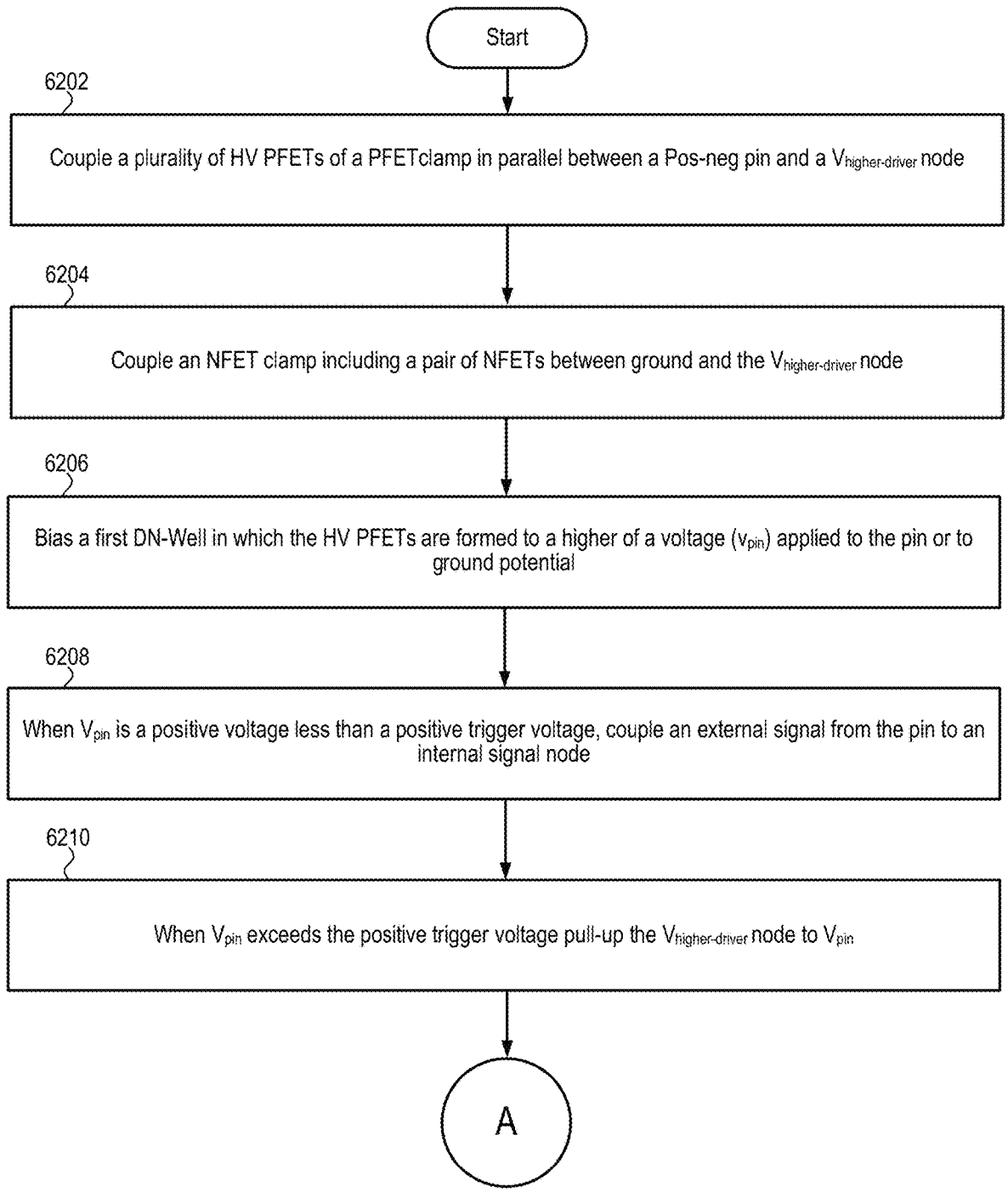
FIGS. 62A and 62B are a flowchart illustrating a method of operating an ESD protection circuit to pass signals therethrough while protecting against both positive and negative ESD events.
Figure 62B:
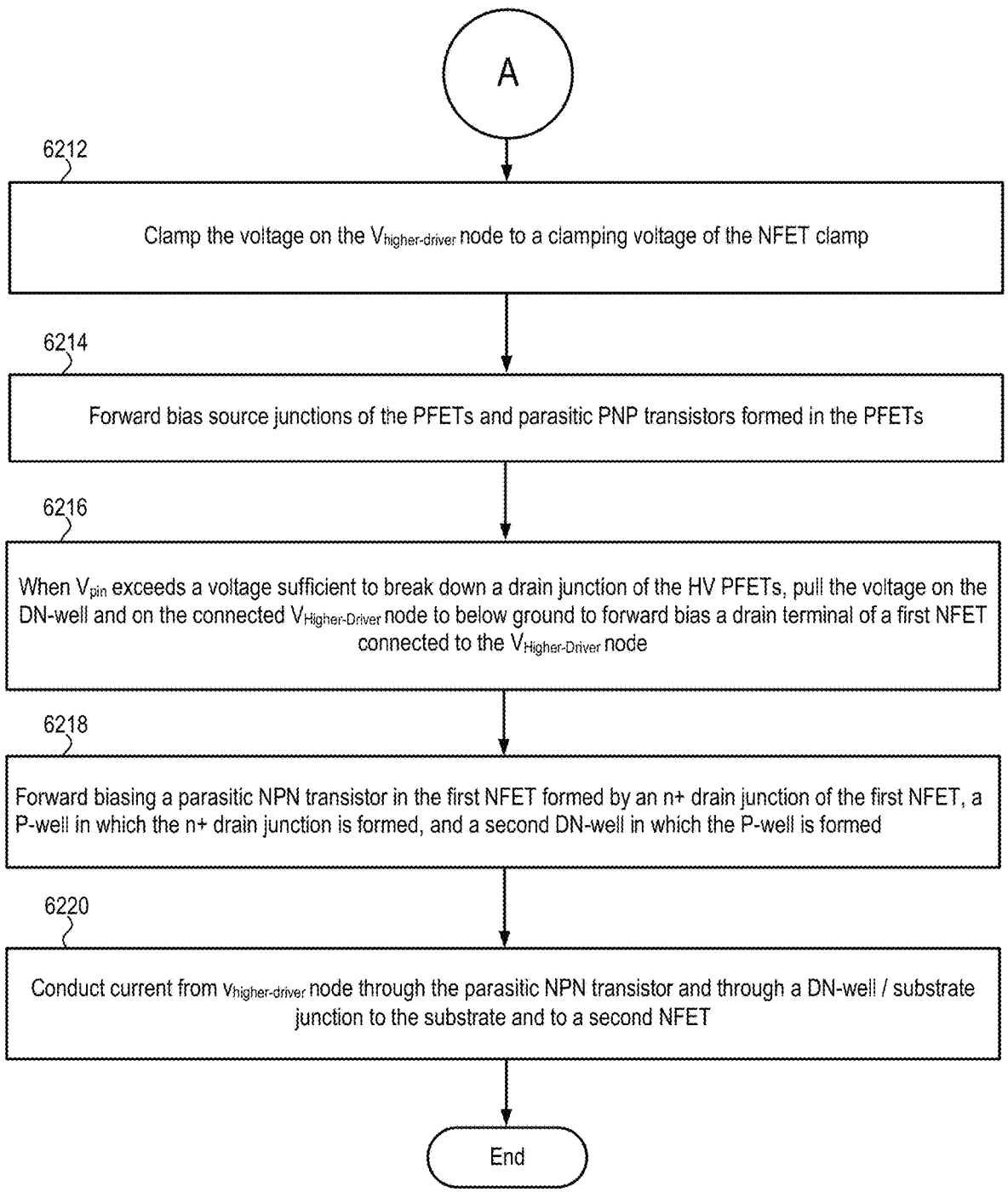

FIGS. 62A and 62B are a flowchart illustrating a method of operating an ESD protection circuit to pass signals therethrough while protecting against both positive and negative ESD events. Referring to FIG. 62, the method begins with coupling a plurality of HV_DEPFETs of a PFET clamp in parallel between a pin to be protected and a $V_{Higher-Driver}$ node in the circuit, each of the HV_DEPFETs coupled to the pin through one of a plurality of ballast resistors (6202). Next, an NFET clamp including a pair of NFETs coupled in between ground and the $V_{Higher-Driver}$ node (6204). A first DN-well in which the HV_DEPFETs are formed is biased through the $V_{Higher-Driver}$ node to a higher of a voltage ($V_{pin}$) applied to a pin or to ground potential (6206).

When $V_{pin}$ is a positive voltage less than a positive trigger voltage, an external signal is coupled from the pin through the HV_DEPFETs to an internal signal node in the circuit coupled to the a $V_{Higher-Driver}$ node (6208). When $V_{pin}$ exceeds the positive trigger voltage the voltage of the $V_{Higher-Driver}$ node is pulled-up to $V_{pin}$ through the HV_DEPFETs (6210). The voltage on the $V_{Higher-Driver}$ node is then clamped to a clamping voltage of the NFET clamp (6212). Source junctions of the HV_DEPFETs and parasitic PNP transistors formed by the source junctions of the HV_DEPFETs, the first DN-well and a substrate in which the circuit is formed are forward biased (6214). A MOSFET current through the HV_DEPFETs and a parasitic current through the parasitic PNP transistors then brings $V_{pin}$ down to the clamped voltage on the $V_{Higher-Driver}$ node.

When $V_{pin}$ exceeds a negative trigger voltage by a large enough amount to break down a drain junction of one or more of the HV_DEPFETs the voltage of the $V_{Higher-Driver}$ node is pulled down to less than ground potential. This pulling down of the $V_{Higher-Driver}$ node voltage occurs because the $V_{Higher-Driver}$ node is connected to the deep N-well that forms the body of the HV_DEPFETs with the drain junction that is being broken down. The HV_DEPFET drain P+ to deep N-well body junction is breaking down. The deep N-well body is connecting to the drain P+ through the breakdown event. Pulling the voltage on the deep N-well body and on the connected $V_{Higher-Driver}$ node to below ground forward biases a drain terminal of a first NFET connected to the $V_{Higher-Driver}$ node (6216). This forward biasing of the drain terminal forward biases a parasitic NPN transistor in the first NFET formed by an n+ drain junction of the first NFET, a P-well in which the n+ drain junction is formed, and a second DN-well in which the P-well is formed (6218); and conducts current from $V_{Higher-Driver}$ node through the parasitic NPN transistor and through a junction between the second DN-well and a substrate in which the circuit is formed to the substrate and to a second NFET connected between first NFET and ground (6220). As a result, the drain terminal of the first NFET is effectively shorted to ground and a voltage of the $V_{Higher-Driver}$ node is substantially held to ground potential or slightly below.

Figure 63:
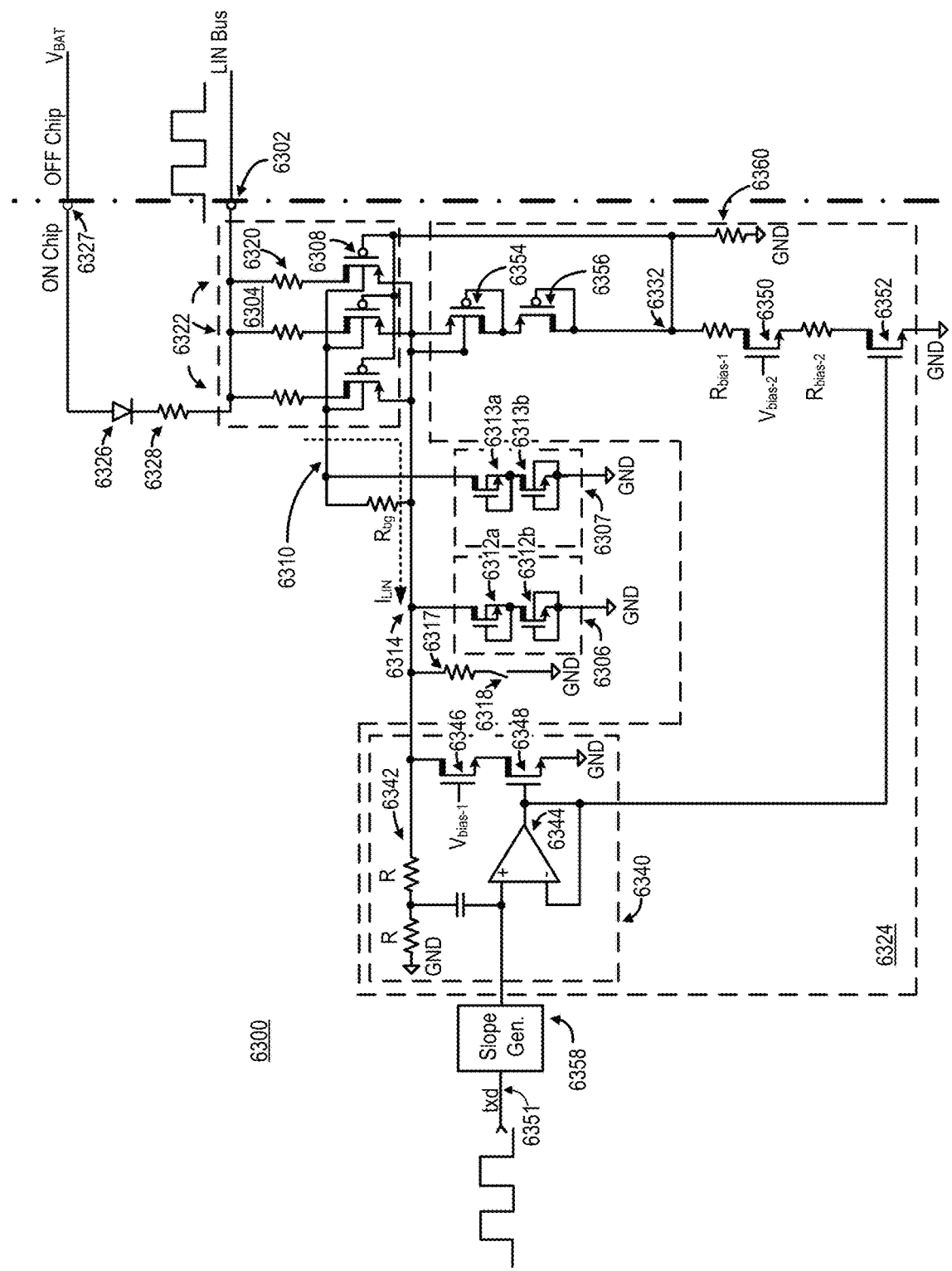
FIG. 63 is a schematic diagram illustrating another embodiment of the ESD protection and signal passing circuit similar to that of FIG. 13A.

FIG. 63 is a schematic diagram illustrating another embodiment of the ESD protection and signal passing circuit (ESD protection circuit 6300) similar to that of FIG. 13A. Referring to FIG. 63, the ESD protection circuit 6300, like the circuit shown in FIG. 13A, generally includes a driver circuit 6340 for driving or biasing a DN-well 6310 for HV_DEPFETs 6308 of a PFET clamp 6304 though a $V_{Driver}$ node 6314 and DN-well biasing resistor (Rbg). The control circuit 6324 further includes a number of HV_DENFETs and NFETs coupled in series with a number of biasing resistors ($R_{bias-1}$, $R_{bias-2}$) between a Vgate node 6332 and ground for biasing the HV_DEPFETs 6308 of the PFET clamp. The driver circuit 6340 includes a resistor-capacitor (RC) filter 6342 coupled between a first, non-inverting input of a differential amplifier 6344, a ground node (GND), and an HV_DENFET 6346 connected in series with an NFET 6348 coupled between the $V_{Driver}$ node 6314 and ground. The HV_DENFET 6346 is gated by a first biasing voltage ($V_{Bias-1}$) and NFET 6348 is gated by an output of the differential amplifier 6344.

The number of NFETs and HV_DENFETs of the gate biasing or control circuit 6324 includes a first HV_DENFET 6350 coupled to the Vgate node 6332 through a first biasing resistor ($R_{bias-1}$) and gated by a second biasing voltage ($V_{Bias-2}$). A second HV_DENFET 6352 coupled in series with the first HV_DENFET 6350 through a second biasing resistor ($R_{bias-2}$) and to ground is gated by the output of the inverting differential amplifier 6344. Generally, as in the embodiment shown, the gate biasing or control circuit 6324 further includes a pair of series diode-connected HV_DEPFETs 6354, 6356, connected to the sources of the HV_DEPFETs 6308 and the $V_{Driver}$ node 6314, and to the Vgate node 6332 to limit the voltage developed between the $V_{Driver}$ node 6314 and the Vgate node 6332 to prevent damage to the gate dielectrics of the HV_DEPFETs 6308 of the PFET clamp 6304.

Generally, the ESD protection circuit 6300 further includes, in addition to the gate biasing or control circuit 6324 and the PFET clamp 6304, a first NFET clamp 6306 including a first, isolated HV_DENFET 6312a and a second, non-isolated HV_DENFET 6312b coupled in series between the PFET clamp 6304 and ground (GND). As in the embodiments described above, the PFET clamp 6304 includes a plurality of parallel circuits 6322 or sets coupled between the Pos-Neg pin 6302 and the $V_{Driver}$ node 6314, each of the plurality of parallel circuits 6322 of the PFET clamp 6304 having a plurality of HV_DEPFET 6308 formed in a DN-well 6310 and at least one ballasting resistor 6320. The DN-well 6310 in which the HV_DEPFETs 6308 are formed can include a shared DN-well, wherein the DN-well is shared among the HV_DEPFETS 6308. The other HV_DEPFETS of the gate control circuit 6324 may share one or more other separate DN-wells, as in the embodiment shown.

Additionally, the ESD protection circuit 6300 can further include a DN-well biasing resistor (Rbg), through which a $V_{Driver}$ node 6314 is coupled to the DN-well 6310 in which the HV_DEPFETs 6308 of the PFET clamp 6304 is formed. The resistance of the biasing resistor (Rbg) is selected to reduce current from a parasitic bipolar junction transistor formed between the P+ drain nodes of at least one of the HV_DEPFETs 6308, the DN-well 6310, and the underlying P-substrate. The value of the resistor can be, by way of a non-limiting example, about 100Ω. Common non-limiting exemplary values may also range from 0Ω to 1,000Ω.

The chip on which the ESD protection circuit 6300 resides can further include a signal receiving or transmitting circuit, such as a slope generator 6358, coupled to an internal signal node 6351, and to or from which a voltage signal can be passed through the ESD protection circuit 6300 to the Pos-Neg pin 6302.

On the left side of FIG. 63, resistor 6317, and switch 6318 can be used to ground the voltage on the $V_{Driver}$ node 6314. This grounding step is used during testing of the circuit 6300 and during testing of the part in which the circuit resides, after manufacture and prior to the shipping of the part.

On the right side of the FIG. 63, diode 6326 and series resistor 6328 are connected in series between the VBAT pin 6327 and the Pos-Neg pin 6302, and are used to pull up the voltage on the LIN Bus node 6314 when it is desired that the ESD protection circuit 6300 outputs a logic "one" on the LIN BUS pin (Pos-Neg pin 6302).

Generally, the ESD protection circuit 6300 further includes, in addition to the circuitry of 1300, a second NFET clamp 6307 including a first, isolated HV_DENFET 6313a and a second, non-isolated HV_DENFET 6313b coupled in series between the DN-well 6310 (1310 in FIG. 13A) for the HV_DEPFETs 6308 (1308 in FIG. 13A) of the PFET clamp 6304 (1304 in FIG. 13A) and ground (GND). The purpose of this second NFET clamp 6307 is to ensure that the voltage of DN-well 6310 (1310 in FIG. 13A) for the HV_DEPFETs 6308 (1308 in FIG. 13A) of the PFET clamp 6304 (1304 in FIG. 13A) does not go to dangerously high voltages when the LIN Bus voltage goes to high positive voltages in an ESD event, and also to ensure that the voltage of DN-well 6310 (1310 in FIG. 13A) for the HV_DEPFETs 6308 (1308 in FIG. 13A) of the PFET clamp 6304 (1304 in FIG. 13A) does not go to large negative voltages when the LIN Bus voltage goes to large negative voltages in an ESD event.

In the event of a large negative voltage being applied to the LIN Bus, the P-type drains of the HV_DEPFETs 6308 (1308 in FIG. 13A) of the PFET clamp 6304 (1304 in FIG. 13A) will break down to the DN-well 6310 (1310 in FIG. 13A) for the HV_DEPFETs 6308 (1308 in FIG. 13A), and will pull the voltage of the DN-well 6310 (1310 in FIG. 13A) to a voltage below the ground (GND) voltage. With second NFET clamp 6307 connected to the DN-well 6310 (1310 in FIG. 13A), both the DN-well 6310 (1310 in FIG. 13A) and the drain of first, isolated HV_DENFET 6313a in second NFET clamp 6307 will forward bias to their respective surrounding p-type diffusions. In the cases of both the DN-well 6310 (1310 in FIG. 13A) and the drain of first, isolated HV_DENFET 6313a in second NFET clamp 6307, these forward biases will result in conduction to the p-type substrate and to ground, the forward biasing of the DN-well 6310 (1310 in FIG. 13A) being direct to the substrate, and the forward biasing of the drain of first, isolated HV_DEN-FET 6313a in second NFET clamp 6307 connecting to the p-type substrate via the vertical NPN bipolar junction transistor formed by the N+ drain of first, isolated HV_DENFET 6313a in second NFET clamp 6307, the P-well underlying that drain, and the DN-well underlying that P-well. The DN-well underlying HV_DENFET 6313a then forward biases to the p-type substrate, and connects the drain of first, isolated HV_DENFET 6313a in second NFET clamp 6307 to the grounded (GND) p-type substrate.

To a lesser extent the first NFET clamp 6306 will also participate in grounding the large negative voltage on the LIN Bus. This will occur due to the turning on of the PNP lateral transistors between the drains and sources of the HV_DEPFETs 6308 when the voltage on the DN-well 6310 gets pulled to less than the voltage on the HV_DEPFET 6308 sources. The pulled down voltage on the HV_DEPFET 6308 sources will pull down the voltage on the $V_{Driver}$ node 6314 and will forward bias the drain of HV_DENFET 6312a in first NFET clamp 6306.

The ESD protection circuit 6300 also further includes, in addition to the circuitry of FIG. 13A 1300, a resistor 6360 between the gates (6332) of the HV_DEPFETs 6308 (1308 in FIG. 13A) of the PFET clamp 6304 (1304 in FIG. 13A), and ground (GND). The purpose of this resistor 6360 is to provide a constant connection from the gates (6332) of the HV_DEPFETs 6308 (1308 in FIG. 13A) of the PFET clamp 6304 (1304 in FIG. 13A), and ground (GND). This constant connection ensures that the HV_DEPFETs 6308 (1308 in FIG. 13A) of the PFET clamp 6304 (1304 in FIG. 13A) are turned ON and conducting when the LIN Bus voltage is greater than the ground (GND) voltage, and that the HV_DEPFETs 6308 (1308 in FIG. 13A) of the PFET clamp 6304 (1304 in FIG. 13A) are turned OFF and not conducting when the LIN Bus voltage is less than the ground (GND) voltage. A non-limiting exemplary value for resistor 6360 is 8MΩ.

During normal operation, with the LIN Bus 6302 voltage between the voltages of roughly +1V and +40V, the second HV_DENFET 6352 can be turned on via the raising of the output voltage of differential amplifier 6344. The first HV_DENFET 6350 has its gate biased (through $V_{bias-2}$) such that first HV_DENFET 6350 is also turned on. In this way, the voltage of Vgate node 6332 is pulled down to the higher of either the ground voltage or to roughly 1 volt below the voltage of the $V_{Driver}$ node 6314. (HV_DEPFETs 6354 and 6356 keep the voltage on the Vgate node 6332 to within roughly a volt of the voltage on the $V_{Driver}$ node 6314.) With the voltage on the Vgate node 6332, either less than the voltage on the LIN Bus 6302 by an HV_DEPFET threshold voltage, or less than the voltage on the $V_{Driver}$ node 6314 by an HV_DEPFET threshold voltage, HV_DEPFETs 6308 are turned on, and the voltage on the $V_{Driver}$ node 6314 and the voltage of the LIN Bus 6302 are brought to the same value. When the LIN Bus 6302 voltage is less than 0 volts and the source voltages of HV_DEPFETs 6308 (same node as the $V_{Driver}$ node 6314) are not greater than the ground voltage, the HV_DENFET 6352 current path will not cause the HV_DEPFETs 6308 to turn on. This is because the source voltage of HV_DENFET 6352 is at ground voltage. Grounding the gates of HV_DEPFETs 6308, while the sources and drains of HV_DEPFETs 6308 are at ground voltage or lower voltages, turns off the HV_DEPFETs 6308. Similarly, when the sources and drains of HV_DEPFETs 6308 are at ground voltage or lower voltages, resistor 6360 cannot turn on HV_DEPFETs 6308. This is because resistor 6360 is connected to ground and cannot apply the negative gate voltages to the Vgate node 6332 that would be required for turning on HV_DEPFETs 6308.

Figure 64:
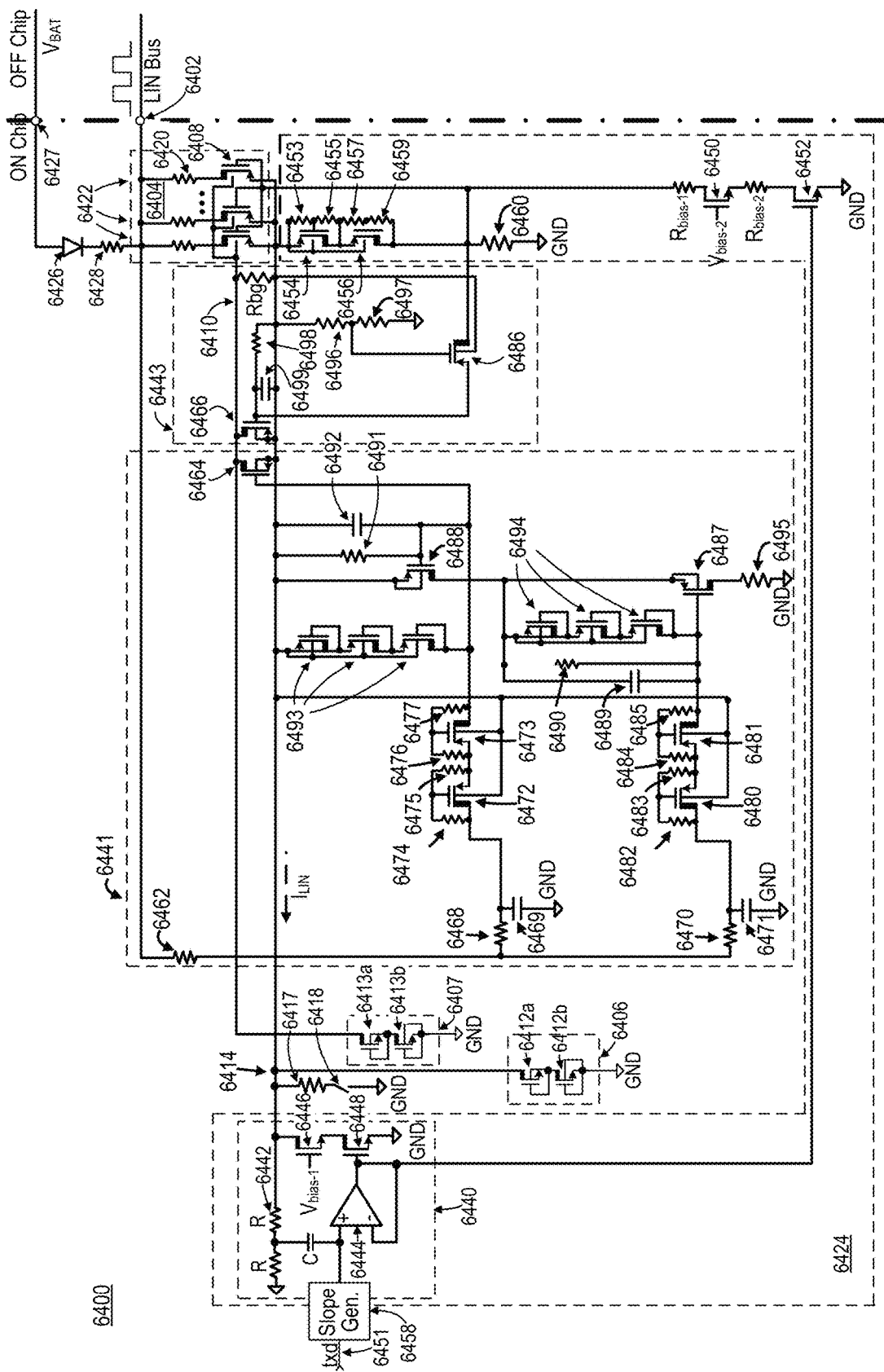
FIG. 64 is a schematic diagram illustrating another embodiment of the ESD protection and signal passing circuit similar to that of FIG. 63.

FIG. 64 is a schematic diagram illustrating another embodiment of the ESD protection and signal passing circuit (ESD protection circuit 6400) similar to that of FIG. 63. Referring to FIG. 64, the ESD protection circuit 6400, like the circuit shown in FIG. 63, generally includes a driver circuit 6440 for driving or biasing a DN-well 6410 for HV_DEPFETs 6408 of a PFET clamp 6404 though a $V_{Driver}$ node 6414 and DN-well biasing resistor (Rbg). The control circuit 6424 further includes a number of HV_DENFETs and NFETs coupled in series with a number of biasing resistors ($R_{bias-1}$, $R_{bias-2}$) between a Vgate node 6432 and ground for biasing the HV_DEPFETs 6408 of the PFET clamp. The driver circuit 6440 includes a resistor-capacitor (RC) filter 6442 coupled between a first, non-inverting input of a differential amplifier 6444, a ground node (GND) and an HV_DENFET 6446 connected in series with an NFET 6448. The HV_DENFET 6446 and NFET 6448 series combination is coupled between the $V_{Driver}$ node 6414 and ground. The HV_DENFET 6446 is gated by a first biasing voltage ($V_{Bias-1}$) and NFET 6448 is gated by an output of the differential amplifier 6444.

The number of NFETs and HV_DENFETs of the gate biasing or control circuit 6424 includes a first HV_DENFET 6450 coupled to the Vgate node 6432 through a first biasing resistor ($R_{bias-1}$) and gated by a second biasing voltage ($V_{Bias-2}$). A second HV_DENFET 6452, coupled in series with the first HV_DENFET 6450 through a second biasing resistor ($R_{bias-2}$) and to ground, is gated by the output of the inverting differential amplifier 6444. Generally, as in the embodiment shown, the gate biasing or control circuit 6424 further includes a pair of series diode-connected HV_DEPFETs 6454, 6456, connected to the sources of the HV_DEPFETs 6408 and the $V_{Driver}$ node 6414, and to the Vgate node 6432 to limit the voltage developed between the $V_{Driver}$ node and the Vgate node 6432. This voltage limiting is done to prevent damage to the gate dielectrics of the HV_DEPFETs 6408 of the PFET clamp 6404. The voltages on the gates of HV_DEPFETs 6454 and 6456 are optimized by adjusting the values of resistors 6453, 6455, 6457, and 6459 that are sequentially connected in series from the $V_{Driver}$ node 6414 to the Vgate node 6432. The gate of HV_DEPFET 6454 is connected to the node that connects resistor 6453 to resistor 6455. The gate of HV_DEPFET 6456 is connected to the node that connects resistor 6457 to resistor 6459.

Generally, the ESD protection circuit 6400 further includes, in addition to the gate biasing or control circuit 6424 and the PFET clamp 6404, a first NFET clamp 6406 including a first, isolated HV_DENFET 6412a and a second, non-isolated HV_DENFET 6412b coupled in series between the PFET clamp 6404 and ground (GND). The ESD protection circuit 6400 includes, a second NFET clamp 6407 including a first, isolated HV_DENFET 6413a and a second, non-isolated HV_DENFET 6413b coupled in series between the DN-well 6410 for the HV_DEPFETs 6408 of the PFET clamp 6404 and ground (GND). The purpose of this second NFET clamp 6407 is to ensure that the voltage of DN-well 6410 for the HV_DEPFETs 6408 of the PFET clamp 6404 does not go to dangerously high voltages when the LIN Bus voltage goes to high positive voltages in an ESD event, and also to ensure that the voltage of DN-well 6410 for the HV_DEPFETs 6408 of the PFET clamp 6404 does not go to large negative voltages when the LIN Bus voltage goes to large negative voltages in an ESD event.

In the event of a large negative voltage being applied to the LIN Bus, the P-type drains of the HV_DEPFETs 6408 of the PFET clamp 6404 will break down to the DN-well 6410 for the HV_DEPFETs 6408, and will pull the voltage of the DN-well 6410 to a voltage below the ground (GND) voltage. With second NFET clamp 6407 connected to the DN-well 6410, both the DN-well 6410 and the drain of first, isolated HV_DENFET 6413*a* in second NFET clamp 6407 will forward bias to their respective surrounding p-type diffusions. In the cases of both the DN-well 6410 and the drain of first, isolated HV_DENFET 6413*a* in second NFET clamp 6407, these forward biases will result in conduction to the p-type substrate and to ground, the forward biasing of the DN-well 6410 being direct to the substrate, and the forward biasing of the drain of first, isolated HV_DENFET 6413*a* in second NFET clamp 6407 connecting to the p-type substrate via the vertical NPN bipolar junction transistor formed by the N+ drain of first, isolated HV_DENFET 6413*a* in second NFET clamp 6407, the P-well underlying that drain, and the DN-well underlying that P-well. The DN-well underlying HV_DENFET 6413*a* then forward biases to the p-type substrate, and connects the drain of first, isolated HV_DENFET 6413*a* in second NFET clamp 6407 to the grounded (GND) p-type substrate.

To a lesser extent the first NFET clamp 6406 will also participate in grounding the large negative voltage on the LIN Bus. This will occur due to the turning on of the PNP lateral transistors between the drains and sources of the HV_DEPFETs 6408 when the voltage on the DN-well 6410 gets pulled to less than the voltage on the HV_DEPFET 6408 sources. The pulled down voltage on the HV_DEPFET 6408 sources will pull down the voltage on the $V_{Driver}$ node 6414 and will forward bias the drain of HV_DENFET 6412*a* in first NFET clamp 6406.

As in the embodiments described above, the PFET clamp 6404 includes a plurality of parallel circuits 6422 or sets coupled between the Pos-Neg pin 6402 and the $V_{Driver}$ node 6414, each of the plurality of parallel circuits 6422 of the PFET clamp 6404 having a plurality of HV_DEPFET 6408 formed in a DN-well 6410 and at least one ballasting resistor 6420. The DN-well 6410 in which the HV_DEPFETs 6408 are formed can include a shared DN-well, wherein the DN-well is shared among the HV_DEPFETS 6408. The other HV_DEPFETS of the gate control circuit 6424 may share one or more other separate DN-wells, as in the embodiment shown.

Additionally, the ESD protection circuit 6400 can further include a DN-well biasing resistor (Rbg), through which a $V_{Driver}$ node 6414 is coupled to the DN-well 6410 in which the HV_DEPFETs 6408 of the PFET clamp 6404 is formed. The resistance of the biasing resistor (Rbg) is selected to reduce current from a parasitic bipolar junction transistor formed between the P+ drain nodes of at least one of the HV_DEPFETs 6408, the DN-well 6410, and the underlying P-substrate. The value of the resistor can be, by way of a non-limiting example, about 100Ω. Common non-limiting exemplary values may also range from 0Ω to 1,000Ω.

The chip on which the ESD protection circuit 6400 resides can further include a signal receiving or transmitting circuit, such as a slope generator 6458, coupled to an internal signal node 6451, and to or from which a voltage signal can be passed through the ESD protection circuit 6400 to the Pos-Neg pin 6402.

On the left side of FIG. 64, resistor 6417, and switch 6418 can be used to ground the voltage on the $V_{Driver}$ node 6414. This grounding step is used during testing of the circuit 6400 and of the part in which the circuit resides. The testing is done after manufacture and prior to the shipping of the part.

On the right side of the FIG. 64, diode 6426 and series resistor 6428 are connected in series between the VBAT pin 6427 and the Pos-Neg pin 6402, and are used to pull up the voltage on the LIN BUS pin (Pos-Neg pin 6402) when it is desired that the ESD protection circuit 6400 outputs a logic "one" on the LIN BUS pin (Pos-Neg pin 6402).

Additional components in the circuit of FIG. 64, which are not in the circuit of FIG. 63, are intended to overcome noise problems in the LIN Bus signal. In addition to its intended signal component, the LIN Bus signal may have noise components that could be as large as 80 volts peak to peak (a non-limiting example) with frequencies as high as 20 GHz (a non-limiting example). In the presence of high-frequency, high-voltage noise on the LIN Bus, it may be advantageous, during positive voltage excursions of the LIN Bus, to allow the P-type drains of the HV_DEPFETs 6408 to forward bias to their underlying DN-well, node 6410. Forward biasing this P-drain to DN-well junction may more quickly raise the voltage of the DN-well, than would occur if attempts were made to raise the voltage of the DN-well by turning on HV_DEPFETs 6408, thereby raising the voltage of the $V_{Driver}$ node 6414, and then using the raised voltage on the $V_{Driver}$ node 6414 to raise the voltage of the DN-well, node 6410. This would be true even if the resistance of the Rbg resistor were set at a very low value or shorted entirely (0 ohms). The slow response of the $V_{Driver}$ node 6414 is due to the relatively large capacitance that is connected to the node.

Thus, if high frequency noise conditions are anticipated, it may be advantageous to make the value of resistor Rbg relatively large and let the p-type drains of the HV_DEPFETs 6408, forward bias to the DN-well, node 6410, in order to more quickly raise the voltage of the DN-well, node 6410.

Unfortunately, letting the p-type drains of the HV_DEPFETs 6408, forward bias to the DN-well, node 6410, also turns on a parasitic PNP bipolar junction transistor comprised of the p-type drains of the HV_DEPFETs 6408, the DN-well, node 6410, and the P-type substrate. This can significantly raise the substrate voltage and trigger latch up. Even if latch up is not triggered, having high substrate voltages may disrupt voltage levels in other devices on the chip. Accurate analog operation in these disrupted devices will be prevented.

Moreover, leaving the DN-well, node 6410, to bias itself or to be biased through a large resistance Rbg resistor, when the LIN Bus pin is making a noise-provoked fast transition from a large positive voltage to a large negative voltage will capacitively couple a large amount of negative charge into the DN-well, node 6410. This negative charge will attempt to bias the DN-well, node 6410, to a large negative voltage. However, the DN-well, node 6410, will instead forward bias to the substrate and will inject large amounts of electrons into the substrate. In addition to possibly inducing latch up, these minority electrons can inhibit the DN-well, node 6410, from going to large positive voltages when the LIN Bus voltage is next pulled towards a large positive voltage by the noise on the LIN Bus. If the capacitance from the p-type drains of the HV_DEPFETs 6408 to the DN-well node 6410 is relatively large, the amount of minority electrons that are injected into the substrate can be large.

The minority electrons that are in the substrate will diffuse back toward the DN-well, node 6410, and will tend to pull it down in voltage. This voltage pull down can inhibit the rise in voltage on the DN-well, node 6410, when the LIN Bus next goes positive in voltage. The minority electrons going into the DN-well, node 6410, will constitute a current from the DN-well, node 6410, to ground. That DN-well, node 6410, will become the base of a PNP bipolar junction transistor, the transistor having an emitter formed by the p-type drains of the HV_DEPFETs 6408, a base formed by the DN-well 6410, and a collector formed by the grounded P-type substrate. The minority electrons diffusing from the substrate into the DN-well, node 6410 base, constitute a base current for that PNP bipolar junction transistor. That PNP transistor could have a Beta of 15 (a non-limiting example). That Beta would indicate that 15 times as much current could run from the p-type drains of the HV_DEPFETs 6408, to the substrate, as minority electron diffusion current that could run from the substrate into the DN-well, node 6410, base. As these diffusion currents can also persist for relatively long periods of time, on the order of micro-seconds for example ($10^{-6}$ seconds, non-limiting example), the minority electrons diffusing from the substrate into the DN-well, node 6410, base, could stop the p-type drains of the HV_DEPFETs 6408, from reaching the positive voltages that they would otherwise reach when the LIN Bus attempts to rise in voltage. In short, with large fast noise voltage transitions on the LIN Bus, leaving the DN-well, node 6410, to bias itself or to be biased through a large resistance Rbg resistor, can result in clipping of the positive voltages that would otherwise occur on the LIN Bus.

In the presence of high frequency, high amplitude, noise on the LIN Bus, sensing of the LIN Bus signal is done through averaging the LIN Bus's high frequency, high amplitude voltage, to arrive at an averaged signal (to arrive at the useful average DC component of the LIN Bus signal). Unfortunately, circuits that clip the high frequency, high positive voltage peaks of the voltage on the LIN Bus, result in the filtered LIN Bus average signal always just looking like a logic "zero." No useful information can be derived from such a signal.

In order to overcome the above analog sensing problems, and also to mitigate risks of latch up, the circuit of FIG. 64 attempts to prevent the DN-well, node 6410, from strongly forward biasing to the substrate when the average LIN Bus signal voltage is appreciably below ground potential but is carrying high frequency, high amplitude, noise. The circuit also attempts to prevent the p-type drains of the HV_DEPFETs 6408, from strongly forward biasing to the underlying DN-well, node 6410, when the average LIN Bus voltage is at a high positive value.

In addition to the circuitry 6300 of FIG. 63, the circuitry of FIG. 64 has circuit 6441 for grounding the DN-well node 6410 when negative voltage transitions on the LIN Bus pin would otherwise capacitively couple the voltage on the DN-well node 6410 to negative values. The circuit is configured such that the DN-well node 6410 is grounded when the averaged (filtered) voltage on the LIN Bus goes to levels that are less than ground potential by at least a negative voltage margin value.

The FIG. 64 circuitry also has a circuit 6443 for connecting the DN-well node 6410, for the HV_DEPFETs 6408 of the PFET clamp 6404, to the $V_{Driver}$ node 6414 when the averaged (filtered) voltage on the $V_{Driver}$ node 6414 goes to levels that are greater than ground potential by at least a positive voltage margin value.

The negative voltage margin value and the positive voltage margin value are each adjustable.

Circuit 6441 grounds the $V_{Driver}$ node 6414 and the DN-well node 6410 when the average value of the LIN Bus voltage is less than the ground potential by a negative voltage margin. Resistor 6462 couples resistors 6468 and 6470 to the LIN Bus pin 6402. The other ends of resistors 6468 and 6470 couple respectively to the non-grounded ends of capacitors 6469 and 6471. Capacitors 6469 and 6471 each have one end connected to ground. The non-grounded ends of capacitors 6469 and 6471 couple respectively to the drains of HV_DEPFETs 6472 and 6480. Sources of HV_DEPFETs 6472 and 6480 couple respectively to sources of HV_DEPFETs 6473 and 6481. Resistors 6474 and 6482 connect from drain to gate of HV_DEPFETs 6472 and 6480 respectively. Resistors 6475 and 6483 connect from sources to gates of HV_DEPFETs 6472 and 6480 respectively. Resistors 6476 and 6484 connect from sources to gates of HV_DEPFETs 6473 and 6481 respectively. Resistors 6477 and 6485 connect from drains to gates of HV_DEPFETs 6473 and 6481 respectively. Deep N-wells of HV_DEPFETs 6472, 6480, 6473, and 6481 connect to the $V_{Driver}$ node 6414. The drain of HV_DEPFET 6473 connects to the gates of HV_DEPFETs 6488 and 6464. The drain of HV_DEPFET 6481 connects to the gate of HV_DEPFET 6487. Capacitor 6492 and parallel resistor 6491 connect from gate to source of HV_DEPFET 6488. Capacitor 6489 and parallel resistor 6490 connect from gate to source of HV_DEPFET 6487.

Three diode connected HV_DEPFETs 6493 (each with gate connected to drain) are in series with each other. The first diode connected HV_DEPFET 6493 has its drain connected to the second diode connected HV_DEPFET 6493 transistor's source. The second diode connected HV_DEPFET 6493 has its drain connected to the third diode connected HV_DEPFET 6493 transistor's source. The first diode connected HV_DEPFET 6493 has its source connected to the $V_{Driver}$ node 6414. The third diode connected HV_DEPFET 6493 has its drain connected to the gates of HV_DEPFETs 6488 and 6464.

Three diode connected HV_DEPFETs 6494 (each with gate connected to drain) are in series with each other. The first diode connected HV_DEPFET 6494 has its drain connected to the second diode connected HV_DEPFET 6494 transistor's source. The second diode connected HV_DEPFET 6494 has its drain connected to the third diode connected HV_DEPFET 6494 transistor's source. The first diode connected HV_DEPFET 6494 has its source connected to the source of HV_DEPFET 6487. The third diode connected HV_DEPFET 6494 has its drain connected to the gate of HV_DEPFET 6487.

The drain of HV_DEPFET 6487 is connected to ground through resistor 6495. The deep N-wells of HV_DEPFETs 6487, 6488, and 6464 are connected to their respective sources.

Average values of the LIN Bus voltage are determined by resistor 6468 and capacitor 6469, and also by resistor 6470 and capacitor 6471. The non-grounded ends of capacitors 6469 and 6471 take on the average voltage of the LIN Bus 6402. Resistor 6468 and capacitor 6469 form a low pass filter, and resistor 6470 and capacitor 6471 also form a low pass filter. RC time constants of these filters may, for example, be set at 5 micro-seconds (non-limiting examples).

HV_DEPFETs 6472 and 6473 and resistors 6474, 6475, 6476, and 6477 may be configured to not pass current until the LIN Bus voltage at the non-grounded end of capacitor 6469 reaches a voltage that is below the voltage of the gate of HV_DEPFET 6488 by, for example, 10 volts or more (non-limiting example). This LIN Bus voltage could be, for example −10 volts relative to ground.

Similarly, HV_DEPFETs 6480 and 6481 and resistors 6482, 6483, 6484, and 6485 may be configured to not pass current until the LIN Bus voltage at the non-grounded end of capacitor 6471 reaches a voltage that is below the voltage of the gate of HV_DEPFET 6487 by, for example, 5 volts or more (non-limiting example). This LIN Bus voltage could be, for example −5 volts relative to ground.

In this way, HV_DEPFETs 6487 and 6488 will turn on when the LIN Bus voltage reaches a HV_DEPFET threshold voltage below −5 volts and −10 volts respectively (non-limiting exemplary values). Turning on HV_DEPFETs 6487 and 6488 grounds the $V_{Driver}$ node 6414. Also, HV_DEPFET 6464 is configured to turn on when HV_DEPFET 6488 turns on. Turning on HV_DEPFET 6464 connects the DNWell node 6410 to the $V_{Driver}$ node 6414. This grounds the DNWell node 6410 when the LIN Bus 6402 reaches a voltage that is −10 volts below ground (non-limiting exemplary value), and helps to prevent the DNWell node's, 6410, voltage from going far below ground potential.

HV_DEPFETs 6493 and 6494 are configured to prevent the gate voltages of HV_DEPFETs 6488 and 6487 from going too far in voltage below their respective source voltages (source voltages of HV_DEPFETs 6488 and 6487). Preventing such voltage excursions prevents damage to HV_DEPFETs' 6488 and 6487 gate dielectrics. Capacitors 6492 and 6489 and resistors 6491 and 6490 provide voltage filtering and stabilization to the gate voltages of HV_DEPFETs 6488 and 6487. Resistor 6495 has, for example, a fairly small value of 20 ohms (non-limiting example) and somewhat retards the speed of the grounding of the voltage on the $V_{Driver}$ node 6414.

HV_DEPFETs 6487 and 6488 are used instead of a single HV_DEPFET so that when the $V_{Driver}$ node 6414 is at high voltages, voltages that could damage a single transistor by putting too much voltage between the single transistor's source and drain nodes, HV_DEPFETs 6487 and 6488 form a Cascode pair. Such a Cascode pair can safely share the voltage from the $V_{Driver}$ node 6414 to the ground (GND) node between the two HV_DEPFETs 6487 and 6488. By using a Cascode configuration, HV_DEPFET 6487 and HV_DEPFET 6488 can each have roughly half of the voltage from the $V_{Driver}$ node 6414 to the ground node (GND) between their source and drain nodes.

HV_DEPFETs 6472 and 6473 and resistors 6474, 6475, 6476, and 6477, and HV_DEPFETs 6480 and 6481 and resistors 6482, 6483, 6484, and 6485 may be adjusted to apply the necessary gate voltages to HV_DEPFETs 6488 and 6487 to make it so that HV_DEPFETs 6488 and 6487 will roughly evenly share the $V_{Driver}$ node 6414 to ground (GND) voltage when the LIN Bus voltage and the $V_{Driver}$ node 6414 are at their maximum values.

Circuit 6443 connects the DN-well node 6410, for the HV_DEPFETs 6408 of the PFET clamp 6404, to the $V_{Driver}$ node 6414 when the averaged (filtered) voltage on the $V_{Driver}$ node 6414 goes to levels that are greater than ground potential by at least a positive voltage margin value.

The gate of HV_DEPFET 6466 is connected to, and the gate's voltage is controlled by, capacitor 6499, resistor 6498, and the source of HV_DEPFET 6486. The other end of capacitor 6499 and the other end of resistor 6498 are both connected to the $V_{Driver}$ node 6414. The drain of HV_DEPFET 6486 is connected to the Vgate node 6432, HV_DEPFET's 6486 DN-well is connected to the $V_{Driver}$ node 6414, and the HV_DEPFET's gate node is connected to the center divider node of a resistor divider. That resistor divider is connected between the $V_{Driver}$ node 6414 and ground. The resistor divider is formed by a resistor 6496 that connects from the center divider node of the resistor divider to the VDriver node 6414 and by a resistor 6497 that connects from the center divider node of the resistor divider to ground.

HV_DEPFET 6466 is configured to turn on and connect the DN-well node 6410, for the HV_DEPFETs 6408 of the PFET clamp 6404, to the $V_{Driver}$ node 6414 when the gate voltage of HV_DEPFET 6466 is pulled to below the HV_DEPFET's source voltage, the $V_{Driver}$ node 6414 voltage. HV_DEPFET 6466 will also turn on and connect the DN-well node 6410, for the HV_DEPFETs 6408 of the PFET clamp 6404, to the $V_{Driver}$ node 6414 when the gate voltage of HV_DEPFET 6466 is pulled to below the HV_DEPFET's 6466 drain voltage, the voltage of the DN-well node 6410, for the HV_DEPFETs 6408.

The role of HV_DEPFET 6486 is to connect the gate of HV_DEPFET 6466 to the Vgate node 6432 when the voltage of the $V_{Driver}$ node 6414 is a positive voltage margin value greater than ground. When the LIN Bus 6402 voltage is significantly greater than ground, the voltage on the Vgate node 6432 is commonly pulled toward ground by the $R_{Bias-1}$ resistor, the NFET 6450, the $R_{Bias-2}$ resistor, and the NFET 6452. As described below, resistor 6460 can also pull the Vgate node 6432 toward ground.

The ESD protection circuit 6400 also further includes, in addition to the circuitry of FIG. 13A 1300, a resistor 6460 between the gates (6432) of the HV_DEPFETs 6408 (1308 in FIG. 13A) of the PFET clamp 6404 (1304 in FIG. 13A), and ground (GND). The purpose of this resistor 6460 is to provide a constant connection from the gates (6432) of the HV_DEPFETs 6408 (1308 in FIG. 13A) of the PFET clamp 6404 (1304 in FIG. 13A), and ground (GND). This constant connection ensures that the HV_DEPFETs 6408 (1308 in FIG. 13A) of the PFET clamp 6404 (1304 in FIG. 13A) are turned ON and conducting when the LIN Bus voltage is greater than the ground (GND) voltage, and that the HV_DEPFETs 6408 (1308 in FIG. 13A) of the PFET clamp 6404 (1304 in FIG. 13A) are turned OFF and not conducting when the LIN Bus voltage is less than the ground (GND) voltage. A non-limiting exemplary value for resistor 6460 is 8MΩ.

During normal operation, with the LIN Bus 6402 voltage between the voltages of roughly +1V and +40V, the second HV_DENFET 6452 can be turned on via the raising of the output voltage of differential amplifier 6444. The first HV_DENFET 6450 has its gate biased (through $V_{bias-2}$) such that first HV_DENFET 6450 is also turned on. In this way, the voltage of Vgate node 6432 is pulled down to the higher of either the ground voltage or to roughly 1 volt below the voltage of the $V_{Driver}$ node 6414. (HV_DEPFETs 6454 and 6456 keep the voltage on the Vgate node 6432 to within roughly a volt of the voltage on the $V_{Driver}$ node 6414.) With the voltage on the Vgate node 6432, either less than the voltage on the LIN Bus 6402 by an HV_DEPFET threshold voltage, or less than the voltage on the $V_{Driver}$ node 6414 by an HV_DEPFET threshold voltage, HV_DEPFETs 6408 are turned on, and the voltage on the $V_{Driver}$ node 6414 and the voltage of the LIN Bus 6402 are brought to the same value. When the LIN Bus 6402 voltage is less than 0 volts and the source voltages of HV_DEPFETs 6408 (same node as the $V_{Driver}$ node 6414) are not greater than the ground voltage, the HV_DENFET 6452 current path will not cause the HV_DEPFETs 6408 to turn on. This is because the source voltage of HV_DENFET 6452 is at ground voltage. Grounding the gates of HV_DEPFETs 6408, while the sources and drains of HV_DEPFETs 6408 are at ground voltage or lower voltages, turns off the HV_DEPFETs 6408. Similarly, when the sources and drains of HV_DEPFETs 6408 are at ground voltage or lower voltages, resistor 6460 cannot turn on HV_DEPFETs 6408. This is because resistor 6460 is connected to ground and cannot apply the negative gate voltages to the Vgate node 6432 that would be required for turning on HV_DEPFETs 6408.

The values of capacitor 6499 and resistor 6498 can be set so that the voltage on the gate of HV_DEPFET 6466 will vary relatively slowly. Capacitor 6499 provides a path for high frequency components of the voltage on the gate of HV_DEPFET 6466 to be shorted to the $V_{Driver}$ node 6414. This can stabilize the voltage on the gate of HV_DEPFET 6466 so that the voltage on that gate only varies slowly. Resistor 6498 may be set to a relatively high value, or even to an infinite value (open circuit). Values of resistor 6496 and resistor 6497 may be chosen such that the voltage on the $V_{Driver}$ node 6414 will be at a desired value, greater than ground, when HV_DEPFET 6486 turns on, pulls down the gate of HV_DEPFET 6466, and connects the DN-well node 6410 to the $V_{Driver}$ node 6414. In this way, the voltage of the DN-well node 6410 is pulled up to the voltage of the $V_{Driver}$ node 6414 when the voltage of the $V_{Driver}$ node 6414 is at a desired high voltage above ground. As a non-limiting example, this desired voltage above ground could be 10 volts.

Simultaneously with setting the relative values of resistor 6496 and resistor 6497 in a way that sets the voltage on the $V_{Driver}$ node 6414 at a desired value when HV_DEPFET 6486 turns on, the values of resistor 6496 and resistor 6497 may be chosen high enough to prevent undesirable levels of leakage currents from the $V_{Driver}$ node 6414 to ground.

Figure 65A:
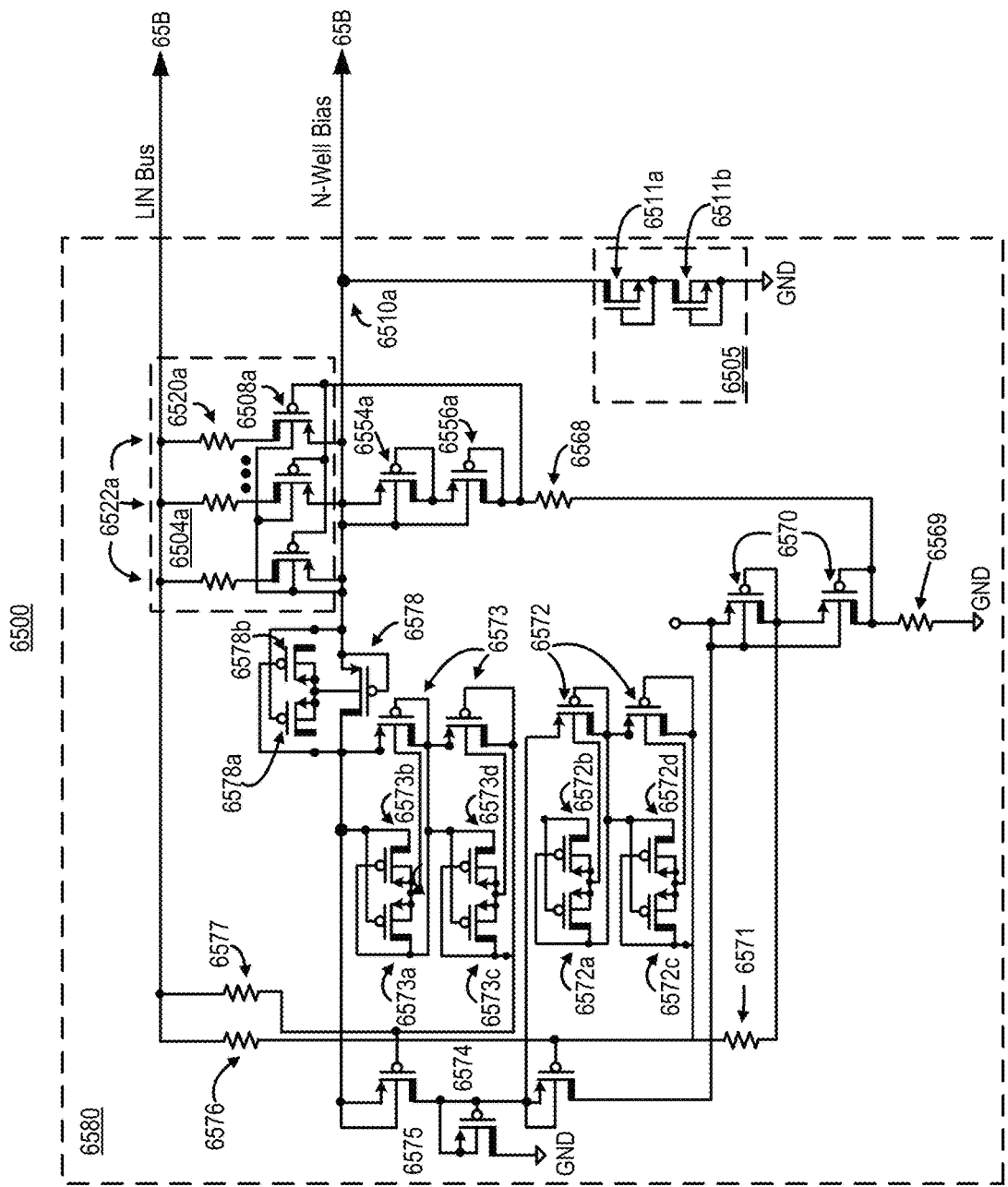
FIGS. 65A and 65B are a schematic diagram illustrating another embodiment of the ESD protection and signal passing circuit similar to that of FIG. 63.
Figure 65B:
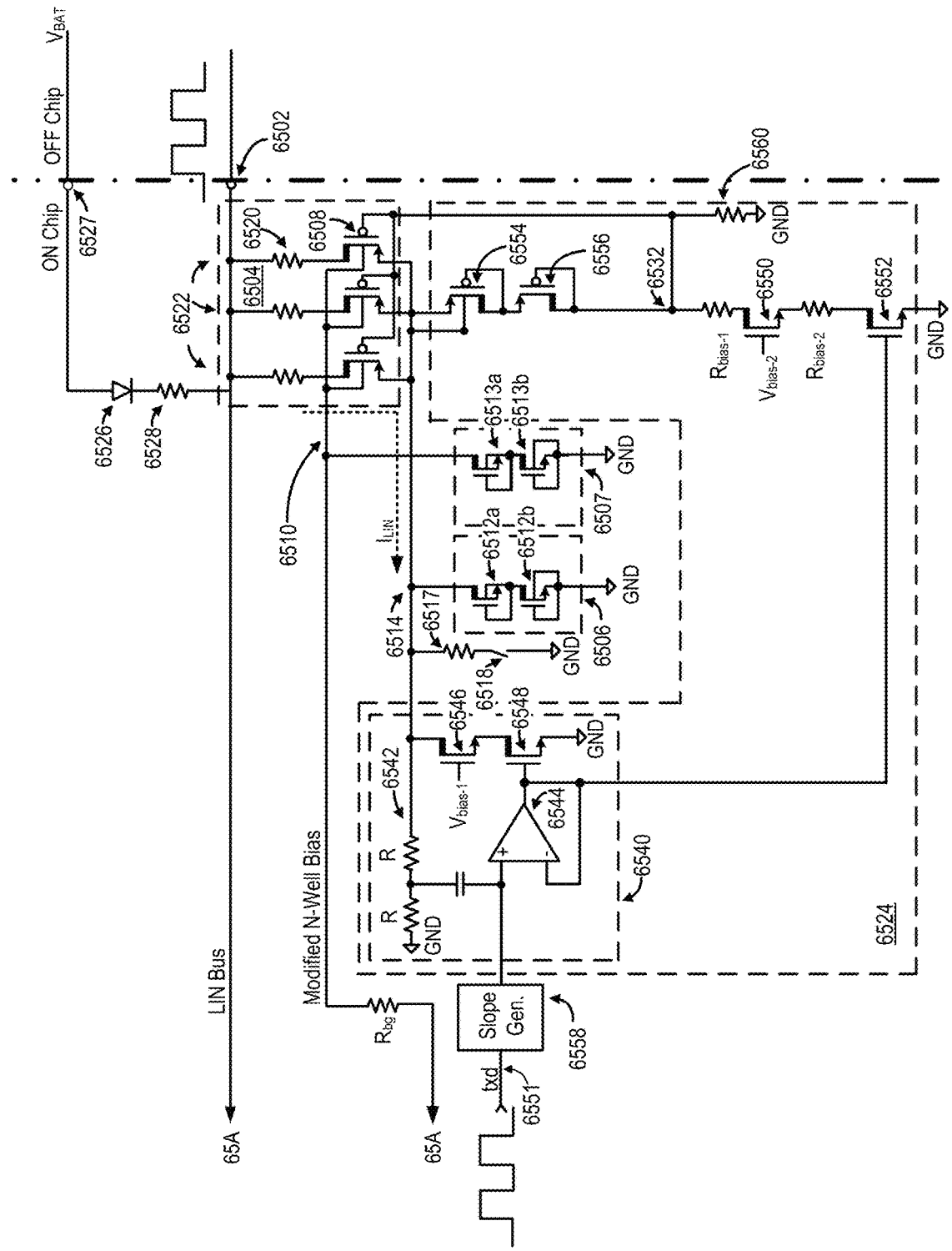

FIGS. 65A and 65B are a schematic diagram illustrating another embodiment of the ESD protection and signal passing circuit (ESD protection circuit 6500) similar to that of FIG. 63. Referring to FIGS. 65A AND 65B, the ESD protection circuit 6500, like the circuit shown in FIG. 63, generally includes a driver circuit 6540 for driving or biasing a $V_{Driver}$ node 6514 for HV_DEPFETs 6508 of a PFET clamp 6504. The control circuit 6524 further includes a number of HV_DENFETs and NFETs coupled in series with a number of biasing resistors ($R_{bias-1}$, $R_{bias-2}$) between a Vgate node 6532 and ground for biasing the gates of the HV_DEPFETs 6508 of the PFET clamp 6504. The driver circuit 6540 includes a resistor-capacitor (RC) filter 6542 coupled between a first, non-inverting input of a differential amplifier 6544, a ground node (GND), and an HV_DENFET 6546 connected in series with an NFET 6548 coupled between the $V_{Driver}$ node 6514 and ground. The HV_DENFET 6546 is gated by a first biasing voltage ($V_{Bias\ 1}$) and NFET 6548 is gated by an output of the differential amplifier 6544.

The number of NFETs and HV_DENFETs of the gate biasing or control circuit 6524 includes a first HV_DENFET 6550 coupled to the Vgate node 6532 through a first biasing resistor ($R_{bias-1}$) and gated by a second biasing voltage ($V_{Bias-2}$). A second HV_DENFET 6552 coupled in series with the first HV_DENFET 6550 through a second biasing resistor ($R_{bias-2}$), and to ground, is gated by the output of the inverting differential amplifier 6544.

The ESD protection circuit 6500 also further includes, in addition to the circuitry of FIG. 13A 1300, a resistor 6560 between the gates (6532) of the HV_DEPFETs 6508 (1308 in FIG. 13A) of the PFET clamp 6504 (1304 in FIG. 13A), and ground (GND). The purpose of this resistor 6560 is to provide a constant connection from the gates (6532) of the HV_DEPFETs 6508 (1308 in FIG. 13A) of the PFET clamp 6504 (1304 in FIG. 13A), and ground (GND). This constant connection ensures that the HV_DEPFETs 6508 (1308 in FIG. 13A) of the PFET clamp 6504 (1304 in FIG. 13A) are turned ON and conducting when the LIN Bus 6502 voltage is greater than the ground (GND) voltage, and that the HV_DEPFETs 6508 (1308 in FIG. 13A) of the PFET clamp 6504 (1304 in FIG. 13A) are turned OFF and not conducting when the LIN Bus 6502 voltage is less than the ground (GND) voltage. A non-limiting exemplary value for resistor 6560 is 8MΩ.

During normal operation, with the LIN Bus 6502 voltage between the voltages of roughly +1V and +40V, the second HV_DENFET 6552 can be turned on via the raising of the output voltage of differential amplifier 6544. The first HV_DENFET 6550 has its gate biased (through $V_{bias-2}$) such that first HV_DENFET 6550 is also turned on. In this way, the voltage of Vgate node 6532 is pulled down to the higher of either the ground voltage or to roughly 1 volt below the voltage of the $V_{Driver}$ node 6514. (HV_DEPFETs 6554 and 6556 keep the voltage on the Vgate node 6532 to within roughly a volt of the voltage on the $V_{Driver}$ node 6514.) With the voltage on the Vgate node 6532, either less than the voltage on the LIN Bus 6502 by an HV_DEPFET threshold voltage, or less than the voltage on the $V_{Driver}$ node 6514 by an HV_DEPFET threshold voltage, HV_DEPFETs 6508 are turned on, and they bring the voltages on the $V_{Driver}$ node 6514 and on the LIN Bus 6502 to the same value. When the LIN Bus 6502 voltage is less than 0 volts and the source voltages of HV_DEPFETs 6508 (same node as the $V_{Driver}$ node 6514) are not greater than the ground voltage, the HV_DENFET 6552 current path will not cause the HV_DEPFETs 6508 to turn on. This is because the source voltage of HV_DENFET 6552 is at ground voltage. Grounding the gates of HV_DEPFETs 6508, while the sources and drains of HV_DEPFETs 6508 are at ground voltage or lower voltages, turns off the HV_DEPFETs 6508. Similarly, when the sources and drains of HV_DEPFETs 6508 are at ground voltage or lower voltages, resistor 6560 cannot turn on HV_DEPFETs 6508. This is because resistor 6560 is connected to ground and cannot apply the negative gate voltages to the Vgate node 6532 that would be required for turning on HV_DEPFETs 6508.

Generally, as in the embodiment shown, the gate biasing or control circuit 6524 further includes a pair of series diode-connected HV_DEPFETs 6554, 6556, connected to the sources of the HV_DEPFETs 6508 and the $V_{Driver}$ node 6514, and to the Vgate node 6532 to limit the voltage developed between the $V_{Driver}$ node 6514 and the Vgate node 6532 to prevent damage to the gate dielectrics of the HV_DEPFETs 6508 of the PFET clamp 6504.

The ESD protection circuit 6500 further includes, in addition to the gate biasing or control circuit 6524 and the PFET clamp 6504, several NFET clamps. A first NFET clamp 6506 including a first, isolated HV_DENFET 6512*a* and a second, non-isolated HV_DENFET 6512*b* is coupled in series between the sources of HV_DEPFETs 6508 of the PFET clamp 6504 and ground (GND). A second NFET clamp 6507 includes a first, isolated HV_DENFET 6513*a* and a second, non-isolated HV_DENFET 6513*b* coupled in series between the DN-well 6510 for the HV_DEPFETs 6508 of the PFET clamp 6504 and ground (GND). A third NFET clamp 6505 includes a first, isolated HV_DENFET 6511*a* and a second, non-isolated HV_DENFET 6511*b* coupled in series between the DN-well 6510*a* for the HV_DEPFETs 6508*a* of the PFET clamp 6504*a* and ground (GND).

The purpose of the second NFET clamp 6507 is to ensure that the voltage of DN-well 6510 for the HV_DEPFETs 6508 of the PFET clamp 6504 does not go to dangerously high voltages when the LIN Bus 6502 voltage goes to high positive voltages in an ESD event, and is also to ensure that the voltage of DN-well 6510 for the HV_DEPFETs 6508 of the PFET clamp 6504 does not go to large negative voltages when the LIN Bus 6502 voltage goes to large negative voltages in an ESD event.

The purpose of the third NFET clamp 6505 is to ensure that the voltage of DN-well 6510*a* for the HV_DEPFETs 6508*a* of the PFET clamp 6504*a* does not go to dangerously high voltages when the LIN Bus 6502 voltage goes to high positive voltages in an ESD event, and is also to ensure that the voltage of DN-well 6510*a* for the HV_DEPFETs 6508*a* of the PFET clamp 6504*a* does not go to large negative voltages when the LIN Bus voltage goes to large negative voltages in an ESD event.

In the event of a large negative voltage being applied to the LIN Bus 6502, the P-type drains of the HV_DEPFETs 6508 of the PFET clamp 6504 will break down to the DN-well 6510 for the HV_DEPFETs 6508, and will pull the voltage of the DN-well 6510 to a voltage below the ground (GND) voltage. With second NFET clamp 6507 connected to the DN-well 6510, both the DN-well 6510 and the drain of first, isolated HV_DENFET 6513*a* in second NFET clamp 6507 will forward bias to their respective surrounding p-type diffusions. In the cases of both the DN-well 6510 and the drain of first, isolated HV_DENFET 6513*a* in second NFET clamp 6507, these forward biases will result in conduction to the p-type substrate and to ground, the forward biasing of the DN-well 6510 being direct to the substrate, and the forward biasing of the drain of first, isolated HV_DENFET 6513*a* in second NFET clamp 6507 connecting to the p-type substrate via the vertical NPN bipolar junction transistor formed by the N+ drain of first, isolated HV_DENFET 6513*a* in second NFET clamp 6507, the P-well underlying that drain, and the DN-well underlying that P-well. The DN-well underlying HV_DENFET 6513*a* then forward biases to the p-type substrate, and connects the drain of first, isolated HV_DENFET 6513*a* in second NFET clamp 6507 to the grounded (GND) p-type substrate.

To a lesser extent the first NFET clamp 6506 will also participate in grounding large negative voltages on the LIN Bus 6502. This will occur due to the turning on of the PNP lateral bipolar junction transistors between the drains and sources of the HV_DEPFETs 6508 when the voltage on the DN-well 6510 gets pulled to less than the voltage on the HV_DEPFET 6508 sources. The pulled down voltage on the HV_DEPFET 6508 sources will pull down the voltage on the $V_{Driver}$ node 6514 and will forward bias the drain junctions of HV_DENFET 6512*a* in first NFET clamp 6506.

Similarly, in the event of a large negative voltage being applied to the LIN Bus 6502, the P-type drains of the HV_DEPFETs 6508*a* of the PFET clamp 6504*a* will break down to the DN-well 6510*a* for the HV_DEPFETs 6508*a*, and will pull the voltage of the DN-well 6510*a* to a voltage below the ground (GND) voltage. With third NFET clamp 6505 connected to the DN-well 6510*a*, both the DN-well 6510*a* and the drain of first, isolated HV_DENFET 6511*a* in third NFET clamp 6505 will forward bias to their respective surrounding p-type diffusions. In the cases of both the DN-well 6510*a* and the drain of first, isolated HV_DENFET 6511*a* in third NFET clamp 6505, these forward biases will result in conduction to the p-type substrate and to ground, the forward biasing of the DN-well 6510*a* being direct to the substrate, and the forward biasing of the drain of first, isolated HV_DENFET 6511*a* in third NFET clamp 6505 connecting to the p-type substrate via the vertical NPN bipolar junction transistor formed by the N+ drain of first, isolated HV_DENFET 6511*a* in third NFET clamp 6505, the P-well underlying that drain, and the DN-well underlying that P-well. The DN-well underlying HV_DENFET 6511*a* then forward biases to the p-type substrate, and connects the drain of first, isolated HV_DENFET 6511*a* in third NFET clamp 6505 to the grounded (GND) p-type substrate.

As in the embodiments described above, the PFET clamp 6504 includes a plurality of parallel circuits 6522 or sets coupled between the Pos-Neg pin 6502 and the $V_{Driver}$ node 6514, each of the plurality of parallel circuits 6522 of the PFET clamp 6504 having a plurality of HV_DEPFET 6508 formed in a DN-well 6510 and at least one ballasting resistor 6520. The DN-well 6510 in which the HV_DEPFETs 6508 are formed can include a shared DN-well, wherein the DN-well is shared among the HV_DEPFETS 6508. The other HV_DEPFETS of the gate control circuit 6524 may share one or more other separate DN-wells, as in the embodiment shown.

The chip on which the ESD protection circuit 6500 resides can further include a signal receiving or transmitting circuit, such as a slope generator 6558, coupled to an internal signal node 6551, and to or from which a voltage signal can be passed through the ESD protection circuit 6500 to the Pos-Neg pin 6502.

Resistor 6517 and switch 6518 can be used to ground the voltage on the $V_{Driver}$ node 6514. This grounding step is used during testing of the circuit 6500 and in the testing of the part in which the circuit resides. Testing is done after manufacture and prior to the shipping of the part.

Diode 6526 and series resistor 6528 are connected in series between the VBAT pin 6527 and the Pos-Neg pin 6502, and are used to pull up the voltage on the LIN Bus node 6502 (Pos-Neg pin 6502) when it is desired for the ESD protection circuit 6500 to output a logic "one" on the LIN BUS pin (Pos-Neg pin 6502).

Generally, the ESD protection circuit 6500 further includes, in addition to the circuitry of 6300, auxiliary circuitry 6580 for providing biasing to DN-well node 6510 for the HV_DEPFETs 6508 of the PFET clamp 6504. Providing biasing to DN-well node 6510 is done through the N-Well Bias node 6510*a*.

Similar to circuitry illustrated in the embodiments described above, auxiliary circuitry's 6580 PFET clamp 6504*a* includes a plurality of parallel circuits or sets 6522*a* coupled between the Pos-Neg pin (LIN Bus pin) 6502 and the N-Well Bias node 6510*a*, each of the plurality of parallel circuits 6522*a* of the PFET clamp 6504*a* having a plurality of HV_DEPFET 6508*a* formed in a DN-well 6510*a* and at least one ballasting resistor 6520*a*. The DN-well 6510*a* in which the HV_DEPFETs 6508*a* are formed can include a shared DN-well, wherein the DN-well is shared among the HV_DEPFETS 6508*a*.

Additionally, the ESD protection circuit 6500 can further include a DN-well biasing resistor ($R_{bg}$), through which the N-Well Bias node 6510*a* is coupled to the DN-well 6510

(Modified N-Well Bias node) in which the HV_DEPFETs 6508 of the PFET clamp 6504 is formed. The resistance of the biasing resistor (Rbg) is selected to reduce current from a parasitic bipolar junction transistor formed between the P+ drain nodes of at least one of the HV_DEPFETs 6508, the DN-well 6510, and the underlying P-substrate. The value of the resistor can be, by way of a non-limiting example, about 100Ω. Common non-limiting exemplary values may also range from 0Ω to 1,000Ω.

Auxiliary circuitry 6580 for providing biasing to DN-well node 6510 (Modified N-Well Bias node) solves two potential problems by the way that it provides biasing to DN-well node 6510 (Modified N-Well Bias node).

First, in circuits such as the embodiments shown in FIGS. 16A, 16B, 16C, and other similar embodiments, if the LIN Bus 6502 pin undergoes large positive and negative noise pulses, commonly caused by external noise injected into the LIN Bus 6502 node, the P-type drain to DN-Well junctions, between the LIN Bus 6502 pin and the DN-Wells underlying HV_DEPFETs 1608, will capacitively couple negative voltages onto the DN-Wells underlying HV_DEPFETs 1608. The negative voltages coupled onto the DN-Wells underlying HV_DEPFETs 1608 will cause forward biasing from the DN-Wells underlying the HV_DEPFETs 1608, to the p-type substrate. This forward biasing can cause injection of large numbers of electrons into the p-type substrate. These substrate electrons can cause various significant problems during circuit operation.

Although circuits, such as the embodiments shown in FIGS. 16A, 16B, 16C, and other similar embodiments, provide for recovering the HV_DEPFETs' 1608 DN-Well voltages to at least ground potential (GND) after noise driven negative voltage events, even short duration forward biasing of the DN-Well to p-type substrate junctions in these circuits can cause significant problems. Short duration forward biasing of the DN-Well to p-type substrate junctions can inject large amounts of electrons into the substrate. These electrons diffuse through the substrate and can linger for considerable time.

Nor are circuits such as the embodiments shown in FIGS. 13A, 13B, 13C, 63, 64, and other similar embodiments immune from this problem. Those circuits do not explicitly provide for preventing DN-well negative voltage excursions, and do not explicitly provide for rapidly recovering, to at least ground potential (GND), the voltages of the DN-Wells underlying HV_DEPFETs 1308, 6308, and 6408, when DN-Well negative voltage excursions occur. Instead, those circuits rely on the forward biasing of junctions between N-type nodes (DN-Wells, N+ clamp drains, etc.) and the p-type substrate to recover the DN-Well voltages to near ground potential (GND).

The second problem, that the circuit of FIGS. 65A AND 65B solves, is the behavior, in circuits like those shown in FIGS. 13A, 16A, 16B, 16C, 54, 55, 56, 57, 63, 64 and similar circuits, to have a gap in voltage between the voltages where the LIN Bus 6502 pin is providing the DN-Well bias, and where the ground node (GND) is providing the DN-Well bias. (This DN-Well bias is applied to the DN-Well underlying HV_DEPFETs for example 1308, 6308, and 6408.) This gap in voltage can cause undesirable jumps, discontinuities, in LIN Bus voltage as the LIN Bus 6502 voltage is increased from ground potential to an HV_DEPFET threshold voltage above ground potential (GND). More specifically, the LIN Bus voltage discontinuities occur, for example, when the LIN Bus voltage is rising from 0 volts to a value that is greater than an HV_DEPFET threshold voltage above ground potential. When the LIN Bus voltage is less than an HV_DEPFET threshold voltage above ground potential, the HV_DEPFETs, for example HV_DEPFETs 1308, 6308, and 6408, are OFF and the DN-well (1310, 6310, and 6410) voltage is typically at 0 volts. As the LIN Bus voltage exceeds an HV_DEPFET threshold voltage above ground potential, the HV_DEPFETs 1308, 6308, and 6408, turn on and a significant current runs from the LIN Bus to the DN-well node (1310, 6310, and 6410). As the current charges the DN-well node, the current causes the LIN Bus voltage to momentarily stop rising, or to momentarily drop. (Such a momentary drop has been observed in measurements and may be partially caused by the HV_DEPFETs' threshold voltages dropping due to the drop in body effect as the voltage of the DN-well node rises.)

The FIGS. 65A AND 65B ESD protection circuit 6500, with its DN-well node 6510 biasing circuitry 6580, overcomes both of these problems. HV_DEPFETs 6570 are two HV_DEPFETs, the first with its drain connected to the source of the second. The source of the first HV_DEPFET 6570 is connected to a low impedance power supply, Vbias-3. The drain of first HV_DEPFET 6570 provides Vbias-4, while the drain of second HV_DEPFET 6570 provides Vbias-5. Resistor 6569 connects from the drain of second HV_DEPFET 6570 to ground (GND). The gates of HV_DEPFETs 6570 are connected to their respective drains. The DN-wells of HV_DEPFETs 6570 are connected to the Vbias-3 supply. As noted in FIGS. 65A AND 65B, bias voltages Vbias-3, Vbias-4 and Vbias-5 can have exemplary non-limiting values of 3.6V, 2.8V, and 2.0V respectively.

Vbias-5 is connected, via resistor 6568, to the gates of HV_DEPFETs 6508*a*. In this way, HV_DEPFETs 6508*a* will be OFF when the LIN Bus 6502 voltage is less than an HV_DEPFET threshold voltage above the nominal 2.0V bias of Vbias-5 (or about 2.8V with a −0.8V HV_DEPFET threshold voltage, a non-limiting example value).

The drain of the first of two HV_DEPFETs 6574 is connected to the Vbias-3 node. The source of the first HV_DEPFET 6574 is connected to the drain of the second HV_DEPFET 6574 and the source of the second HV_DEPFET 6574 is connected to the drain of HV_DEPFET 6578. The gate of the first HV_DEPFET 6574 is connected through resistor 6571 to the Vbias-4 node. The gate of the first HV_DEPFET 6574 is also connected through resistor 6576 to the LIN Bus pin 6502. The gate of the second HV_DEPFET 6574 is connected through resistor 6577 to the LIN Bus pin 6502. The DN-wells of HV_DEPFETs 6574 are connected to their respective sources. The gate and source of HV_DEPFET 6578 are connected to the N-Well Bias node 6510*a*.

Resistors 6576 and 6577 make it so that the gates of first and second HV_DEPFETs 6574 are not directly connected to the LIN Bus pin 6502. Avoiding such direct connections helps to prevent voltage excursions on the LIN Bus pin 6502 from damaging the gate dielectrics of first and second HV_DEPFETs 6574. Resistor 6576 and resistor 6571 form a voltage divider that can be adjusted to optimize the gate voltage on first HV_DEPFET 6574.

The DN-well of HV_DEPFET 6578 is connected to the sources and DN-wells of HV_DEPFETs 6578*a* and 6578*b*. The gate of HV_DEPFET 6578*a* is connected to the drain of HV_DEPFET 6578*b*, and the gate of HV_DEPFET 6578*b* is connected to the drain of HV_DEPFET 6578*a*. The drain of HV_DEPFET 6578*a* is connected to the drain of HV_DEPFET 6578, and the drain of HV_DEPFET 6578*b* is connected to the source of HV_DEPFET 6578. In this configuration, HV_DEPFETs 6578*a* and 6578*b* apply the higher of HV_DEPFET 6578's drain voltage and source voltage to the DN-well of HV_DEPFET 6578.

If the drains of HV_DEPFETs 6578*a* and 6578*b* have nearly the same voltages on them, with the two voltages being within an HV_DEPFET threshold voltage of each other, then the bias on the DN-wells of HV_DEPFETs 6578, 6578*a* and 6578*b* will be provided by the forward biasing of one or more of the P to DN-well source and or drain junctions of HV_DEPFETs 6578, 6578*a* and 6578*b*. Such forward biasing will be weak forward biasing as opposed to strong forward biasing, and is preferable to the strong forward biasing that could otherwise occur if HV_DEPFET's 6578 drain were to be more positively biased than HV_DEPFET's 6578 source and the DN-well of HV_DEPFET 6578 were directly connected to HV_DEPFET's 6578 source. With the drains of HV_DEPFETs 6578*a* and 6578*b* having nearly the same voltages on them, the bias on the DN-wells of HV_DEPFETs 6578, 6578*a* and 6578*b* will be provided by the forward biasing of either HV_DEPFET's 6578 P source junction to the HV_DEPFET's DN-well or by the forward biasing of HV_DEPFET's 6578 P drain junction to the HV_DEPFET's DN-well or by the forward biasing of HV_DEPFET's 6578*a* P drain junction to the HV_DEPFET's DN-well or by the forward biasing of HV_DEPFET's 6578*b* P drain junction to the HV_DEPFET's DN-well. Again, such weak forward biasing is preferable to the strong forward biasing that could otherwise occur if HV_DEPFET's 6578 drain were to be more positively biased than HV_DEPFET's 6578 source and the DN-well of HV_DEPFET 6578 were directly connected to HV_DEPFET's 6578 source.

Two series connected HV_DEPFETs 6572 connect between the gate and source of first HV_DEPFET 6574. The drain of first HV_DEPFET 6572 connects to the gate of first HV_DEPFET 6574. The source of first HV_DEPFET 6572 connects to the drain of second HV_DEPFET 6572. The source of second HV_DEPFET 6572 connects to the source of first HV_DEPFET 6574. The gates of HV_DEPFETs 6572 connect to their respective drains.

The DN-well of first HV_DEPFET 6572 is connected to the sources and DN-wells of HV_DEPFETs 6572*c* and 6572*d*. The gate of HV_DEPFET 6572*c* is connected to the drain of HV_DEPFET 6572*d*, and the gate of HV_DEPFET 6572*d* is connected to the drain of HV_DEPFET 6572*c*. The drain of HV_DEPFET 6572*c* is connected to the drain of first HV_DEPFET 6572, and the drain of HV_DEPFET 6572*d* is connected to the source of first HV_DEPFET 6572. In this configuration, HV_DEPFETs 6572*c* and 6572*d* apply the higher of first HV_DEPFET 6572's drain voltage and source voltage to the DN-well of first HV_DEPFET 6572.

If the drains of HV_DEPFETs 6572*c* and 6572*d* have nearly the same voltages on them, with the two voltages being within an HV_DEPFET threshold voltage of each other, then the bias on the DN-wells of first HV_DEPFET 6572, and HV_DEPFETs 6572*c* and 6572*d* will be provided by the forward biasing of one or more of the P to DN-well source and or drain junctions of first HV_DEPFET 6572, and HV_DEPFETs 6572*c* and 6572*d*. Such forward biasing will be weak forward biasing as opposed to strong forward biasing, and is preferable to the strong forward biasing that could otherwise occur if first HV_DEPFET's 6572 drain were to be more positively biased than first HV_DEPFET's 6572 source and the DN-well of first HV_DEPFET 6572 were directly connected to first HV_DEPFET's 6572 source. With the drains of HV_DEPFETs 6572*c* and 6572*d* having nearly the same voltages on them, the bias on the DN-wells of first HV_DEPFET 6572, and HV_DEPFETs 6572*c* and 6572*d* will be provided by the forward biasing of either first HV_DEPFET's 6572 P source junction to the HV_DEPFET's DN-well or by the forward biasing of first HV_DEPFET's 6572 P drain junction to the HV_DEPFET's DN-well or by the forward biasing of HV_DEPFET's 6572*c* P drain junction to the HV_DEPFET's DN-well or by the forward biasing of HV_DEPFET's 6572*d* P drain junction to the HV_DEPFET's DN-well. Again, such weak forward biasing is preferable to the strong forward biasing that could otherwise occur if first HV_DEPFET's 6572 drain were to be more positively biased than first HV_DEPFET's 6572 source and the DN-well of first HV_DEPFET 6572 were directly connected to first HV_DEPFET's 6572 source.

The DN-well of second HV_DEPFET 6572 is connected to the sources and DN-wells of HV_DEPFETs 6572*a* and 6572*b*. The gate of HV_DEPFET 6572*a* is connected to the drain of HV_DEPFET 6572*b*, and the gate of HV_DEPFET 6572*b* is connected to the drain of HV_DEPFET 6572*a*. The drain of HV_DEPFET 6572*a* is connected to the drain of second HV_DEPFET 6572, and the drain of HV_DEPFET 6572*b* is connected to the source of second HV_DEPFET 6572. In this configuration, HV_DEPFETs 6572*a* and 6572*b* apply the higher of second HV_DEPFET 6572's drain voltage and source voltage to the DN-well of second HV_DEPFET 6572.

If the drains of HV_DEPFETs 6572*a* and 6572*b* have nearly the same voltages on them, with the two voltages being within an HV_DEPFET threshold voltage of each other, then the bias on the DN-wells of second HV_DEPFET 6572, and HV_DEPFETs 6572*a* and 6572*b* will be provided by the forward biasing of one or more of the P to DN-well source and or drain junctions of second HV_DEPFET 6572, and HV_DEPFETs 6572*a* and 6572*b*. Such forward biasing will be weak forward biasing as opposed to strong forward biasing, and is preferable to the strong forward biasing that could otherwise occur if second HV_DEPFET's 6572 drain were to be more positively biased than second HV_DEPFET's 6572 source and the DN-well of second HV_DEPFET 6572 were directly connected to second HV_DEPFET's 6572 source. With the drains of HV_DEPFETs 6572*a* and 6572*b* having nearly the same voltages on them, the bias on the DN-wells of second HV_DEPFET 6572, and HV_DEPFETs 6572*a* and 6572*b* will be provided by the forward biasing of either second HV_DEPFET's 6572 P source junction to the HV_DEPFET's DN-well or by the forward biasing of second HV_DEPFET's 6572 P drain junction to the HV_DEPFET's DN-well or by the forward biasing of HV_DEPFET's 6572*a* P drain junction to the HV_DEPFET's DN-well or by the forward biasing of HV_DEPFET's 6572*b* P drain junction to the HV_DEPFET's DN-well. Again, such weak forward biasing is preferable to the strong forward biasing that could otherwise occur if second HV_DEPFET's 6572 drain were to be more positively biased than second HV_DEPFET's 6572 source and the DN-well of second HV_DEPFET 6572 were directly connected to second HV_DEPFET's 6572 source.

Two series connected HV_DEPFETs 6573 connect between the gate and source of second HV_DEPFET 6574. The drain of first HV_DEPFET 6573 connects to the gate of second HV_DEPFET 6574. The source of first HV_DEPFET 6573 connects to the drain of second HV_DEPFET 6573. The source of second HV_DEPFET 6573 connects to the source of second HV_DEPFET 6574. The gates of HV_DEPFETs 6573 connect to their respective drains.

The DN-well of first HV_DEPFET 6573 is connected to the sources and DN-wells of HV_DEPFETs 6573*c* and 6573*d*. The gate of HV_DEPFET 6573*c* is connected to the drain of HV_DEPFET 6573*d*, and the gate of HV_DEPFET 6573*d* is connected to the drain of HV_DEPFET 6573*c*. The second drain of HV_DEPFET 6573*c* is connected to the drain of first HV_DEPFET 6573, and the drain of HV_DEPFET 6573*d* is connected to the source of first HV_DEPFET 6573. In this configuration, HV_DEPFETs 6573*c* and 6573*d* apply the higher of first HV_DEPFET 6573's drain voltage and source voltage to the DN-well of first HV_DEPFET 6573.

If the drains of HV_DEPFETs 6573*c* and 6573*d* have nearly the same voltages on them, with the two voltages being within an HV_DEPFET threshold voltage of each other, then the bias on the DN-wells of first HV_DEPFET 6573, and HV_DEPFETs 6573*c* and 6573*d* will be provided by the forward biasing of one or more of the P to DN-well source and or drain junctions of first HV_DEPFET 6573, and HV_DEPFETs 6573*c* and 6573*d*. Such forward biasing will be weak forward biasing as opposed to strong forward biasing, and is preferable to the strong forward biasing that could otherwise occur if first HV_DEPFET's 6573 drain were to be more positively biased than first HV_DEPFET's 6573 source and the DN-well of first HV_DEPFET 6573 were directly connected to first HV_DEPFET's 6573 source. With the drains of HV_DEPFETs 6573*c* and 6573*d* having nearly the same voltages on them, the bias on the DN-wells of first HV_DEPFET 6573, and HV_DEPFETs 6573*c* and 6573*d* will be provided by the forward biasing of either first HV_DEPFET's 6573 P source junction to the HV_DEPFET's DN-well or by the forward biasing of first HV_DEPFET's 6573 P drain junction to the HV_DEPFET's DN-well or by the forward biasing of HV_DEPFET's 6573*c* P drain junction to the HV_DEPFET's DN-well or by the forward biasing of HV_DEPFET's 6573*d* P drain junction to the HV_DEPFET's DN-well. Again, such weak forward biasing is preferable to the strong forward biasing that could otherwise occur if first HV_DEPFET's 6573 drain were to be more positively biased than first HV_DEPFET's 6573 source and the DN-well of first HV_DEPFET 6573 were directly connected to first HV_DEPFET's 6573 source.

The DN-well of second HV_DEPFET 6573 is connected to the sources and DN-wells of HV_DEPFETs 6573*a* and 6573*b*. The gate of HV_DEPFET 6573*a* is connected to the drain of HV_DEPFET 6573*b*, and the gate of HV_DEPFET 6573*b* is connected to the drain of HV_DEPFET 6573*a*. The drain of HV_DEPFET 6573*a* is connected to the drain of second HV_DEPFET 6573, and the drain of HV_DEPFET 6573*b* is connected to the source of second HV_DEPFET 6573. In this configuration, HV_DEPFETs 6573*a* and 6573*b* apply the higher of second HV_DEPFET 6573's drain voltage and source voltage to the DN-well of second HV_DEPFET 6573.

If the drains of HV_DEPFETs 6573*a* and 6573*b* have nearly the same voltages on them, with the two voltages being within an HV_DEPFET threshold voltage of each other, then the bias on the DN-wells of second HV_DEPFET 6573, and HV_DEPFETs 6573*a* and 6573*b* will be provided by the forward biasing of one or more of the P to DN-well source and or drain junctions of second HV_DEPFET 6573, and HV_DEPFETs 6573*a* and 6573*b*. Such forward biasing will be weak forward biasing as opposed to strong forward biasing, and is preferable to the strong forward biasing that could otherwise occur if second HV_DEPFET's 6573 drain were to be more positively biased than second HV_DEPFET's 6573 source and the DN-well of second HV_DEPFET 6573 were directly connected to second HV_DEPFET's 6573 source. With the drains of HV_DEPFETs 6573*a* and 6573*b* having nearly the same voltages on them, the bias on the DN-wells of second HV_DEPFET 6573, and HV_DEPFETs 6573*a* and 6573*b* will be provided by the forward biasing of either second HV_DEPFET's 6573 P source junction to the HV_DEPFET's DN-well or by the forward biasing of second HV_DEPFET's 6573 P drain junction to the HV_DEPFET's DN-well or by the forward biasing of HV_DEPFET's 6573*a* P drain junction to the HV_DEPFET's DN-well or by the forward biasing of HV_DEPFET's 6573*b* P drain junction to the HV_DEPFET's DN-well. Again, such weak forward biasing is preferable to the strong forward biasing that could otherwise occur if second HV_DEPFET's 6573 drain were to be more positively biased than second HV_DEPFET's 6573 source and the DN-well of second HV_DEPFET 6573 were directly connected to second HV_DEPFET's 6573 source.

Two series connected HV_DEPFETs 6556*a* and 6554*a* connect between the gates and sources of HV_DEPFETs 6508*a*. The drain of HV_DEPFET 6556*a* connects to the gates of HV_DEPFETs 6508*a*. The source of HV_DEPFET 6556*a* connects to the drain of HV_DEPFET 6554*a*. The source of HV_DEPFET 6554*a* connects to the sources of HV_DEPFETs 6508*a*. The gates of HV_DEPFETs 6556*a* and 6554*a* connect to their respective drains. The DN-wells of HV_DEPFETs 6556*a* and 6554*a* are connected to the sources of HV_DEPFETs 6508*a*.

For LIN Bus 6502 voltages of 2.8V or less (or one −0.8V HV_DEPFET threshold voltage below the 3.6V of the Vbias-3 supply, non-limiting exemplary values) HV_DEPFETs 6574 will both be ON. Under that condition, HV_DEPFETs 6574 will pass 3.6V (non-limiting exemplary value) to the drain of HV_DEPFET 6578. With the single HV_DEPFET threshold voltage drop of HV_DEPFET 6578, the HV_DEPFET 6578 will pass a voltage of 2.8V (non-limiting exemplary value) to the N-Well Bias node 6510*a*. Thus, when the voltage on the LIN Bus 6502 drops through 2.8V (non-limiting exemplary value) the voltage provided to the N-Well Bias node 6510*a* smoothly switches from being provided by the LIN Bus 6502 to being provided by HV_DEPFET 6578. When the voltage on the LIN Bus 6502 rises through 2.8V (non-limiting exemplary value) the voltage provided to the N-Well Bias node 6510*a* smoothly switches from being provided by the HV_DEPFET 6578 to being provided by the LIN Bus 6502.

HV_DEPFETs 6554*a* and 6556*a* are provided to prevent gates of HV_DEPFETs 6508*a* from going too far negative in voltage with respect to the sources of HV_DEPFETs 6508*a*.

The first important issue is that the voltage provided by the LIN Bus 6502 and the HV_DEPFETs 6508*a* is the same as the voltage provided by the HV_DEPFET 6578 at the switching voltage.

The second important issue is that with the minimum voltage of the N-Well Bias node 6510*a* being at the switching voltage (2.8 volts exemplary non-limiting value) and not at ground voltage (GND), the circuit is less susceptible to having the N-Well Bias node voltage 6510*a*, and the Modified N-Well Bias node voltage 6510, go to less than ground when the voltage on the LIN Bus 6502 quickly goes from a positive voltage to a large negative voltage. With the DN-well node 6510 biasing circuitry 6580, capacitive coupling of negative voltages from the LIN Bus 6502 to the N-Well Bias node voltage 6510*a* and to the Modified N-Well Bias node 6510 will be less likely to cause the voltages of the N-Well Bias node 6510*a* and the Modified N-Well Bias node 6510, to go to less than ground (GND).

DN-well node 6510 biasing circuitry 6580 also includes a grounding transistor 6575 to prevent the voltage of the node between HV_DEPFETs 6574 from going appreciably below ground if too much current is drawn from the Vbias-3 supply.

HV_DEPFET pairs 6572 and 6573 are provided to prevent the gates of HV_DEPFETs 6574 from going too far negative in voltage with respect to their respective sources. This prevents damage to the gate dielectrics of HV_DEPFETs 6574.

An important consideration in the design and operation of the DN-well node 6510 biasing circuitry 6580, is that variations in the threshold voltages of the HV_DEPFETs do not alter the fact that, at the switching point in LIN Bus 6502 voltage, where the voltage provided to the N-Well Bias node 6510*a* switches from being provided by the LIN Bus 6502 to being provided by HV_DEPFET 6578, or where the voltage provided to the N-Well Bias node 6510*a* switches from being provided by the HV_DEPFET 6578 to being provided by the LIN Bus 6502, the voltage provided by the LIN Bus 6502 and by the HV_DEPFETs 6508*a* is the same as the voltage provided by the HV_DEPFET 6578. At the switching point, the voltage provided to node 6510*a* by HV_DEPFET 6578 has the value of $(V_{bias-3}-|V_{TP}|)$ and the voltage provided to node 6510*a* by the HV_DEPFETs 6508*a* has the value of $(V_{bias-5}+|V_{TP}|)$, which is the same as $(V_{bias-3}-2|V_{TP}|+|V_{TP}|)$ and the same as $(V_{bias-3}-|V_{TP}|)$. Thus, despite changes in $V_{TP}$, both voltage sources provide a voltage value of $(V_{bias-3}-|V_{TP}|)$ at the switching point.

Thus, embodiments of a positive and negative voltage ESD protection and signal passing circuit, and methods for operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. An electrostatic discharge (ESD) protection circuit comprising:
   a p-channel field-effect transistor (PFET) clamp coupled to a pin to be protected from positive and negative ESD events, the PFET clamp including a plurality of PFETs in a first DN-well;
   an n-channel field-effect transistors (NFET) clamp coupled between ground and the pin through the PFET clamp, the NFET clamp including a plurality of NFETs coupled in series; and
   a bias network for biasing a voltage of the first DN-well to substantially equal a voltage on the pin when the voltage on the pin is greater than ground potential, and equal to ground potential when the voltage of the pin is less than ground potential,
   wherein the plurality of PFETs are coupled in parallel between the pin and the NFET clamp, each of the plurality of PFETs coupled to the pin though one of a plurality of ballast resistors.

2. The circuit of claim 1 wherein the bias network comprises a voltage Higher-Driver ($V_{Higher-Driver}$) node between the PFET clamp and the NFET clamp through which the first DN-well is biased, and wherein the $V_{Higher-Driver}$ node is coupled to an internal signal node in an integrated-circuit (IC) including the ESD protection circuit to pass signals to and from the pin into the IC through the PFET clamp and the $V_{Higher-Driver}$ node.

3. The circuit of claim 2 wherein the bias network further comprises a higher-of-two-voltages circuit (higher-circuit) having a first input coupled to ground, second input coupled to the pin, and an output node coupled to the $V_{Higher-Driver}$ node, and wherein the higher-circuit is configured to couple a higher of a voltage on the first input or the second input to the output node.

4. The circuit of claim 3 wherein the higher-circuit comprises a Cascoded pair of a first and a second DN-well biasing transistors coupled between the $V_{Higher-Driver}$ node, and through a limiting resistor, to ground, wherein a gate of the first DN-well biasing transistor is coupled to the pin through a high impedance resistor, and a gate of the second DN-well biasing transistor is coupled to the pin through a voltage divider coupled between the pin and ground.

5. The circuit of claim 4 further comprising a shut-off acceleration transistor coupled between a gate node (γ node) of the plurality of PFETs of the PFET clamp and the $V_{Higher-Driver}$ node to shut off the plurality of PFETs when a voltage on the pin is less than ground potential.

6. The circuit of claim 5 further comprising a number of pull-up strings, each having a plurality of series connected transistors, to limit gate to source voltages ($V_{GS}$) of the plurality of PFETs, and the first and second DN-well biasing transistors.

7. The circuit of claim 6 wherein the number of pull-up strings include a first pull-up string coupled between the $V_{Higher-Driver}$ node and the γ node, a second pull-up string coupled between the $V_{Higher-Driver}$ node and a gate of the first DN-well biasing transistor, and a third pull-up string coupled between a source of the second DN-well biasing transistor and a gate of the second DN-well biasing transistor.

8. The circuit of claim 7 wherein a gate of the shut-off acceleration transistor is coupled to the gate of the first DN-well biasing transistor.

9. The circuit of claim 6 wherein a number of the plurality of PFETs, first and second DN-well biasing transistors, the shut-off acceleration transistor and the plurality of series connected transistors in the number of pull-up strings include a high voltage drain extended PFET (HV_DEPFET).

10. The circuit of claim 1 wherein the NFET clamp comprises:
an isolated NFET coupled to the PFET clamp, and having an n+ source isolated from a body of the isolated NFET by a source P-well and by a second DN-well surrounding the source P-well; and
a non-isolated NFET coupled in series between the isolated NFET and ground, and having an n+ source which is not isolated from a body of the non-isolated NFET but is formed in a source P-well in a p-type substrate.

11. The circuit of claim 10 wherein at least one of the isolated NFET or the non-isolated NFET includes a high voltage drain extended NFET (HV_DENFET).

12. A system comprising an intelligent battery sensor (IBS) coupled to a positive terminal of a battery in an automobile, and, across a shunt resistor coupled between a negative terminal of the battery and a chassis ground, the IBS including a Local Interconnect Network (LIN) physical circuit through which the IBS connects to an engine control unit (ECU) in the automobile through a LIN bus, the LIN physical circuit including an electrostatic discharge (ESD) protection circuit comprising:
a p-channel field-effect transistor (PFET) clamp coupled to a pin to be protected from positive and negative ESD events, the PFET clamp including a plurality of PFETs in a first DN-well;
an n-channel field-effect transistors (NFET) clamp coupled between ground and the pin through the PFET clamp, the NFET clamp including a plurality of NFETs coupled in series; and
a bias network for biasing a voltage of the DN-well to substantially equal a voltage on the pin when the voltage on the pin is greater than ground potential, and equal to ground potential when the voltage of the pin is less than ground potential,
wherein the plurality of PFETs are coupled in parallel between the pin and the NFET clamp, each of the plurality of PFETs coupled to the pin through one of a plurality of ballast resistors.

13. The system of claim 12 wherein the bias network comprises a voltage Higher-Driver ($V_{Higher-Driver}$) node between the PFET clamp and the NFET clamp through which the first DN-well is biased, and wherein the $V_{Higher-Driver}$ node is coupled to an internal signal node in an integrated-circuit (IC) including the ESD protection circuit to pass signals to and from the pin into the IC through the PFET clamp and the $V_{Higher-Driver}$ node.

14. The system of claim 13 wherein the bias network further comprises a higher-of-two-voltages circuit (higher-circuit) having a first input coupled to ground, second input coupled to the pin, and an output node coupled to the $V_{Higher-Driver}$ node, and wherein the higher-circuit is configured to couple a higher of a voltage on the first input or the second input to the output node.

15. The system of claim 14 wherein the higher-circuit comprises a Cascoded pair of a first and a second DN-well biasing transistors coupled between the $V_{Higher-Driver}$ node, and through a limiting resistor, to ground, wherein a gate of the first DN-well biasing transistor is coupled to the pin through a high impedance resistor, and a gate of the second DN-well biasing transistor is coupled to the pin through a voltage divider coupled between the pin and ground.

16. The system of claim 15 further comprising a shut-off acceleration transistor coupled between a gate node (7 node) of the plurality of PFETs of the PFET clamp and the $V_{Higher-Driver}$ node to shut off the plurality of PFETs when a voltage on the pin is less than ground potential.

17. The system of claim 12 wherein the NFET clamp comprises:
an isolated NFET coupled to the PFET clamp, and having an n+ source isolated from a body of the isolated NFET by a source P-well and by a second DN-well surrounding the source P-well; and
a non-isolated NFET coupled in series between the isolated NFET and ground, and having an n+ source which is not isolated from a body of the non-isolated NFET but is formed in a source P-well in a p-type substrate.

18. A method of operating an electrostatic discharge (ESD) circuit, the method comprising:
coupling a plurality of p-channel field-effect transistors (PFETs) of a PFET clamp in parallel between a pin to be protected and a $V_{Higher-Driver}$ node in the circuit, each of the plurality of PFETs is coupled to the pin through one of a plurality of ballast resistors;
coupling an n-channel field-effect transistor (NFET) clamp between ground and the $V_{Higher-Driver}$ node, the NFET clamp including a pair of NFETs coupled in series;
biasing through the $V_{Higher-Driver}$ node a first DN-well in which the plurality of PFETs are formed to a higher of a voltage ($V_{pin}$) applied to a pin or to ground potential; and
when $V_{pin}$ is a positive voltage less than a positive trigger voltage, coupling an external signal from the pin through the plurality of PFETs to an internal signal node in the circuit coupled to the a $V_{Higher-Driver}$ node.

19. The method of claim 18 further comprising when $V_{pin}$ exceeds the positive trigger voltage:
pulling-up the voltage of the $V_{Higher-Driver}$ node to $V_{pin}$;
clamping the voltage on the $V_{Higher-Driver}$ node to a clamping voltage of the NFET clamp;
forward biasing source junctions of the plurality of PFETs to the first DN-well coupled to the $V_{Higher-Driver}$ node; and
forward biasing parasitic PNP transistors formed by the source junctions of the plurality of PFETs, the first DN-well and a substrate in which the circuit is formed,
whereby a MOSFET current through the plurality of PFETs and a parasitic current through the parasitic PNP transistors brings $V_{pin}$ down to the clamped voltage on the $V_{Higher-Driver}$ node.

20. The method of claim 18 further comprising when $V_{pin}$ exceeds a negative trigger voltage large enough to break down a drain junction of one or more of the plurality of PFETs pulling-down the voltage of the $V_{Higher-Driver}$ node to less than ground potential;
forward biasing a drain terminal of a first NFET connected to the $V_{Higher-Driver}$ node;
forward biasing a parasitic NPN transistor in the first NFET formed by an n+ drain junction of the first NFET, a P-well in which the n+ drain junction is formed, and a second DN-well in which the P-well is formed; and conducting current from $V_{Higher\text{-}Driver}$ node through the parasitic NPN transistor and through a junction between the second DN-well and a substrate in which the circuit is formed to the substrate and to a second NFET connected between first NFET and ground, whereby the drain terminal of the first NFET is shorted to ground and a voltage of the $V_{Higher\text{-}Driver}$ node is substantially held to ground potential.

\* \* \* \* \*